United States Patent [19]

Matelan et al.

[11] Patent Number: 4,870,704
[45] Date of Patent: Sep. 26, 1989

[54] MULTICOMPUTER DIGITAL PROCESSING SYSTEM

[75] Inventors: M. Nicholas Matelan, Dallas; Thomas G. Leete, Plano; Leslie Zsohar, Carrollton; Michael K. Blanchard, Bedford; Abdolreza Naeini, Carrollton; Jacob Hsu, Farmers Branch; Dennis K. Smith, Forth Worth, all of Tex.

[73] Assignee: Flexible Computer Corporation, Dallas, Tex.

[21] Appl. No.: 666,991

[22] Filed: Oct. 31, 1984

[51] Int. Cl.$^4$ ............................................ G06F 15/00
[52] U.S. Cl. .................................. 364/200; 364/228.1; 364/228.7; 364/230
[58] Field of Search ... 364/200 MS File, 900 MS File; 371/9, 10, 11

[56] References Cited

U.S. PATENT DOCUMENTS

| | | | |
|---|---|---|---|
| 4,219,873 | 8/1980 | Kober et al. | 364/200 |
| 4,228,496 | 10/1980 | Katzman et al. | 364/200 |
| 4,245,306 | 1/1981 | Besemer et al. | 364/200 |
| 4,263,649 | 4/1981 | Lapp, Jr. | 364/200 |
| 4,404,628 | 9/1983 | Angelo | 364/200 |
| 4,417,303 | 11/1983 | Korowitz et al. | 364/200 |
| 4,456,965 | 6/1984 | Graber et al. | 364/900 |
| 4,472,771 | 9/1984 | Bienvenu et al. | 364/200 |
| 4,484,273 | 11/1984 | Stiffler et al. | 364/200 |
| 4,490,785 | 12/1984 | Strecker et al. | 364/200 |
| 4,495,569 | 1/1985 | Kagawa | 364/200 |
| 4,495,571 | 1/1985 | Staplin, Jr. et al. | 364/200 |
| 4,543,630 | 9/1985 | Neches | 364/200 |
| 4,564,900 | 1/1986 | Smitt | 364/200 |
| 4,577,273 | 3/1986 | Hopper et al. | 364/200 |
| 4,733,352 | 3/1988 | Nakamura et al. | 364/200 |

OTHER PUBLICATIONS

"VME Bus Specification Manual", Revision A, Oct. 1981, Motorola.
IBM Synchronous Data Link Control General Information, Third Edition, 1979, IBM Corporation.
Katsuki et al., "Pluribus-An Operational Fault-Tolerant Multiprocessor," Proceedings of the IEEE, vol. 66, No. 10, Oct. 1978, pp. 1146-1159.

*Primary Examiner*—Gareth D. Shaw
*Assistant Examiner*—Jonathan C. Fairbanks
*Attorney, Agent, or Firm*—Hubbard, Thurman, Turner & Tucker

[57] ABSTRACT

A multiple computer digital processing system including several Local Buses positioned orthogonally to a Common Bus. Each Local Bus is connected to the Common Bus through a plugably connected Common Bus interface card to provide a transfer of information between Local Buses across the Common Bus. Computer cards, memory cards and other device cards may be plugably connected to the Local Bus to communicate with each other via the Local Buses and Common Bus. The number and types of cards connected and even the number of Local Buses connected to the Common Bus may be varied according to the requirements of each application. Additionally, the Common Bus includes a shared memory accessible by all devices and an InterComputer Interrupt circuit providing interrupts to the computer cards. Further the computer cards are plugably connectable to a Peripheral Bus to provide communications with peripheral devices located externally to the system. All cards connected to the Local Buses and Common Bus include monitor circuits connected through a Test Bus to a System Monitor that configures the system according to the cards connected and the application requirements, detects errors, monitors performance, and provides fault tolerant repair capability under operator supervision.

9 Claims, 57 Drawing Sheets

LOCAL BUS BUFFER

PERIPHERAL BUS ADDRESS DECODE

LOCAL BUS ADDRESS PARITY GENERATOR/CHECKER

LOCAL BUS ADDRESS DECODE

PERIPHERAL BUS BUFFER

PERIPHERAL BUS ADDRESS PARITY
GENERATOR / CHECKER

RM MONITORING FOR LOCAL BUS AND
PERIPHERAL BUS REQUESTER/ARBITER

INTERNAL BUS BUFFER AND PERIPHERAL BUS ADDRESS TRANSLATION

DATA PARITY GENERATOR/CHECKER

INTERRUPT HANDLER

LOCAL BUS REQUESTER/ARBITER

PERIPHERAL BUS REQUESTER/ARBITER

ACCESS CONTROL
STROBE AND SYNC SIGNAL
OUTPUT

ACCESS CONTROL
STROBE AND SYNC SIGNAL
OUTPUT

ACCESS CONTROL ERROR SIGNAL OUTPUT

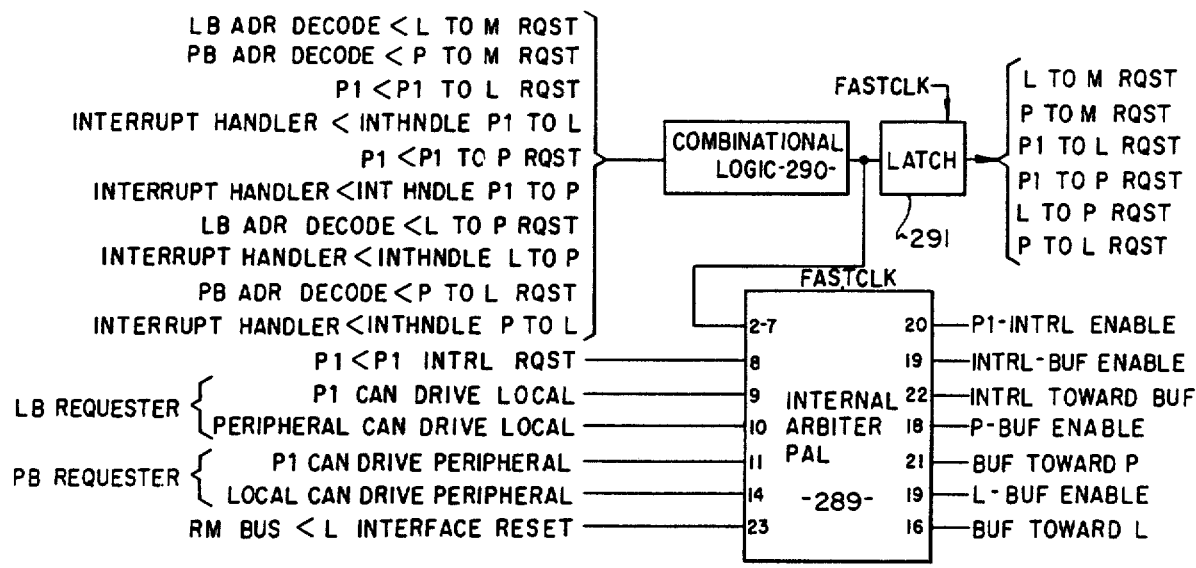
INTERNAL ARBITER
*FIG. 24*
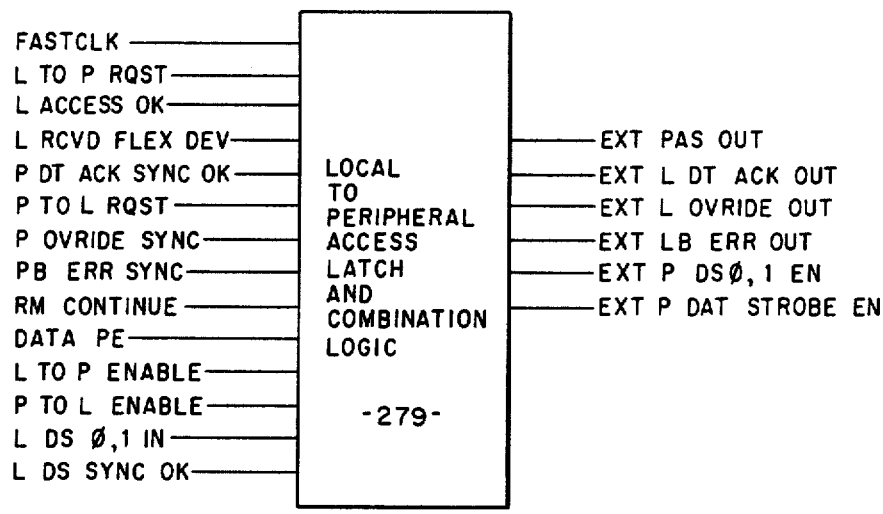
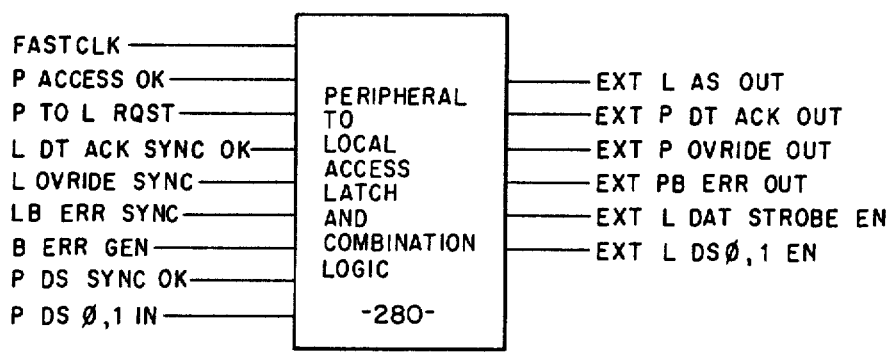
LOCAL TO PERIPHERAL AND PERIPHERAL TO LOCAL
ACCESS CONTROL
*FIG. 20A*

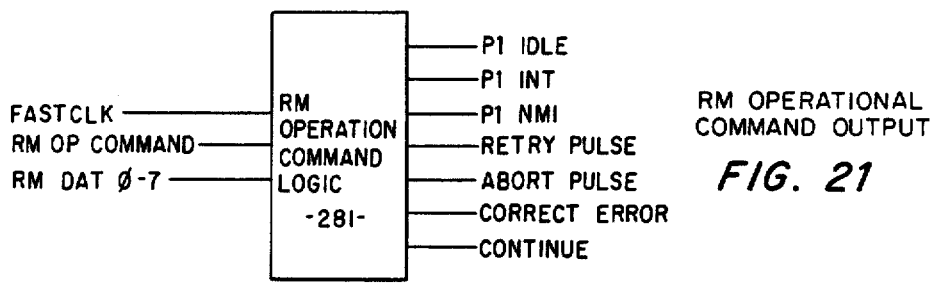
RM OPERATIONAL
COMMAND OUTPUT
FIG. 21
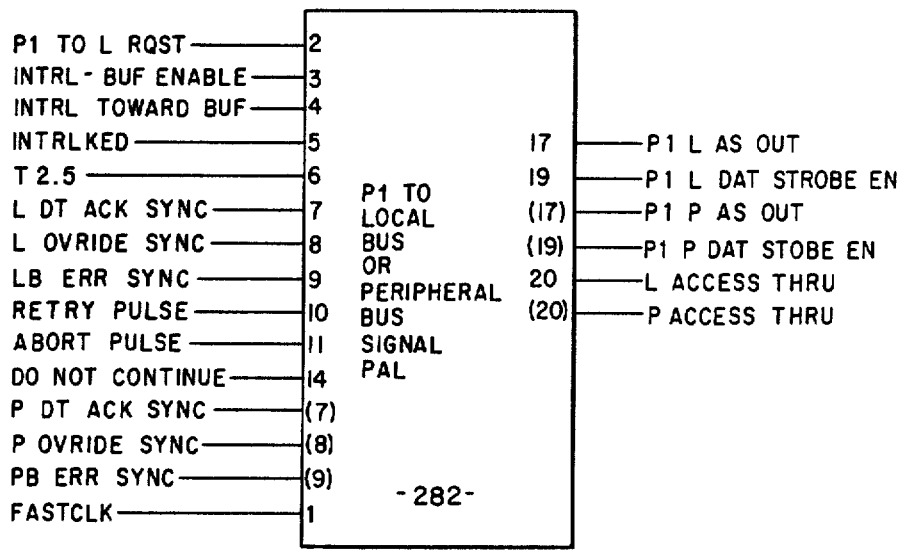
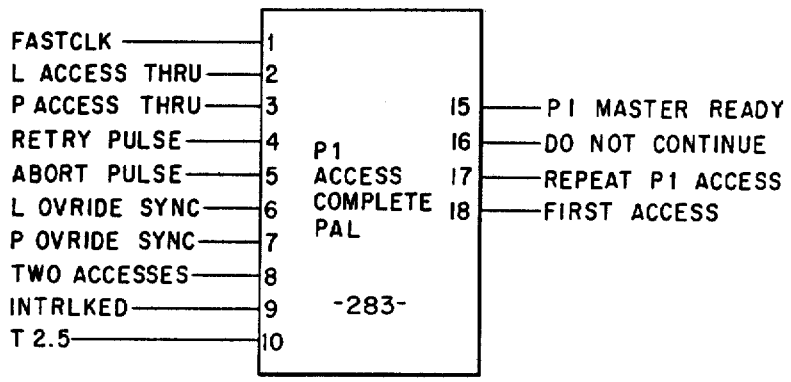
P1 TO PERIPHERAL AND LOCAL BUS CONTROL
FIG. 22

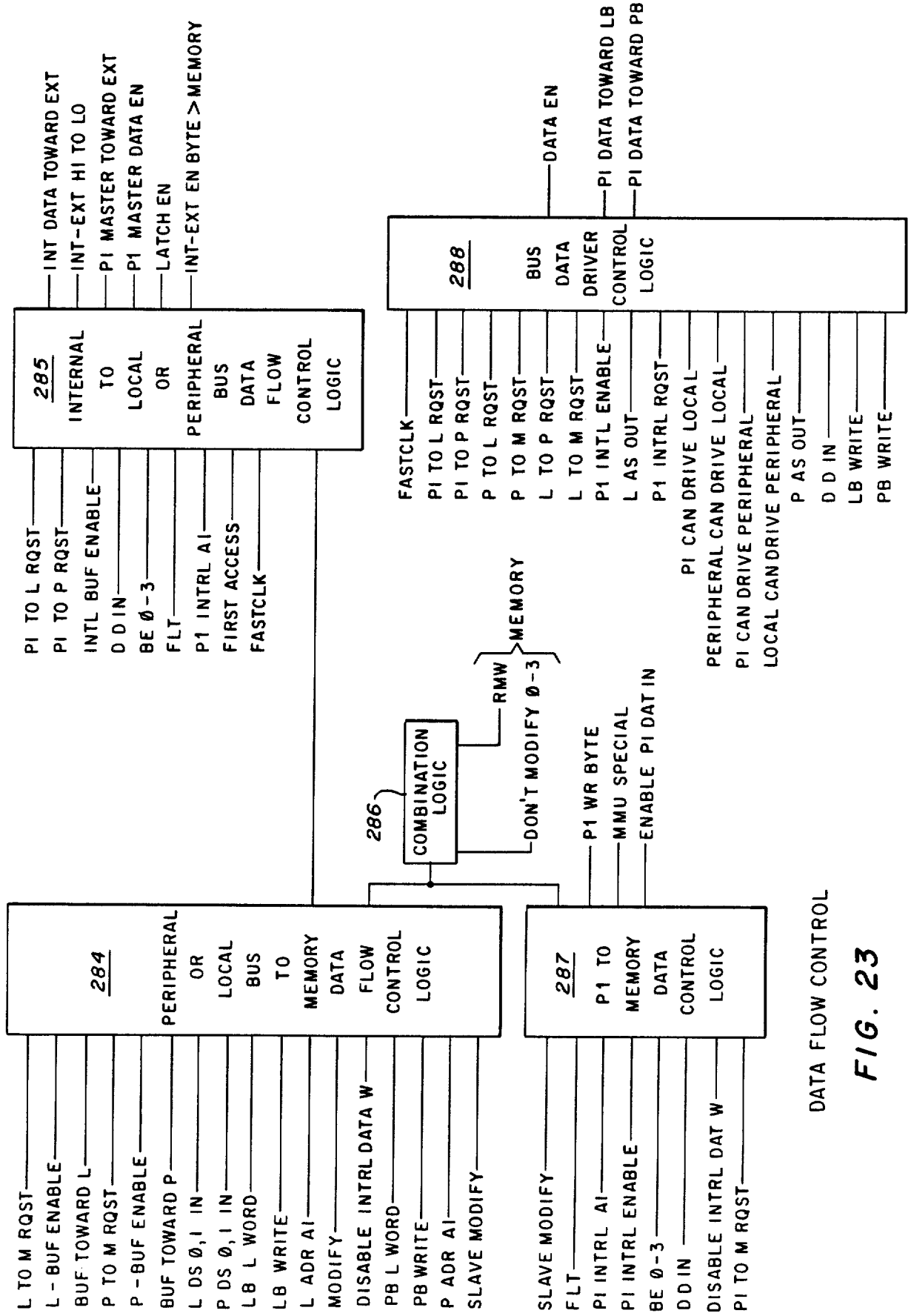
FIG. 23 DATA FLOW CONTROL

ADDRESS PROCESSING

MEMORY

CLOCK CIRCUITRY

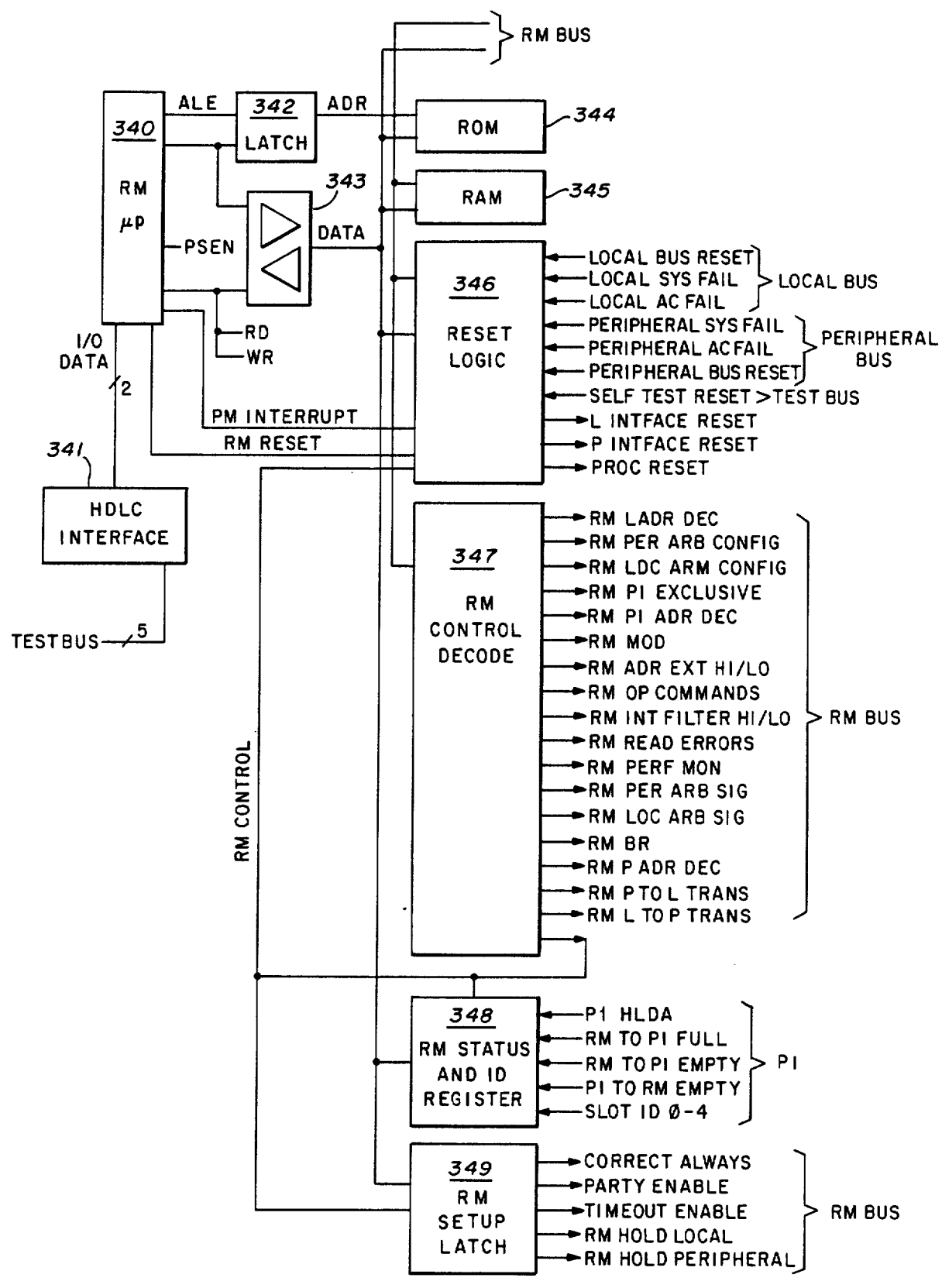
FIG. 29 — RESOURCE MONITOR

MODE 2 NON-INTERLOCKED WRITE TO FAST MEMORY

MODE 2 NON-INTERLOCKED WRITE TO LOCAL BUS

MODE 2 NON-INTERLOCKED READ FROM FAST MEMORY

MODE 2 NON-INTERLOCKED READ FROM LOCAL BUS

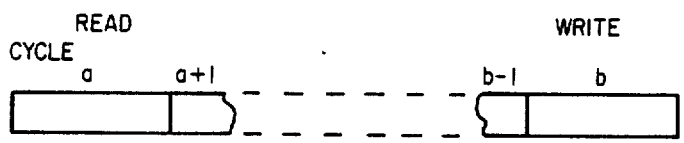

REQUESTOR DRIVES:
A0I-A3I
AM0-AM5

AEC0-AEC7

ECCADDRPRES*

LONGWORD
DS0, DSI
SID0-SID3

INTLK

RESPONDER DRIVES:
ACK
COMPLETE
(ERROR)
(RETRY)
RNTRQ0-3
D00-D31
DEC0-DEC6
ECCDATPRES*

A0I-A3I
AM0-AM5
D00-D31
AEC0-AEC7
DEC0-DEC6
ECCADDRPRES*
ECCDATPRES*
LONGWORD
DS0, DSI
SID0-SID3
WRITE
TNTRQ0-3

ACK
COMPLETE
(ERROR)

RNTRQ0-3

( ) - INDICATES NORMALLY
       INACTIVE SIGNAL

INTERLOCKED OPERATIONS
READ - MODIFY - WRITE TO FM

FIG. 35

REQUEST CYCLES
REQUESTOR

A0I-A3I, AM0-AM5, D00-D31
AEC0-AEC7, DEC0-DEC6,
ECC PRESENT, LONGWORD,
DS0-DSI, SID0-SID3, BI
RESPONSE, WRITE, INTERLOCK

RESPONDER

ACK, ERROR, (COMPLETE),
(WAIT),(RETRY),(OVRIDE),
(CORR ERR)

REQUEST CYCLE REPEATED IF
RESPONDER ASSERTS RETRY

RESPONSE CYCLES
REQUESTOR

A00-A3I, AM0-AM05
SID0-SID3, RESPONSE

RESPONDER

ACK, ERROR
NTRQ0-NTRQ3

( ) - INDICATES NORMALLY
       INACTIVE SIGNAL

MODE 2  INTERLOCKED ACCESSES TO A LOCAL BUS

FIG. 36

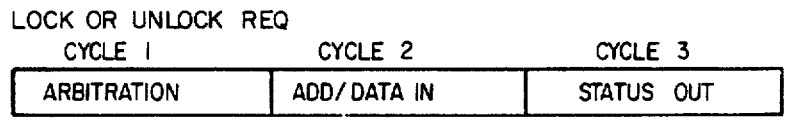
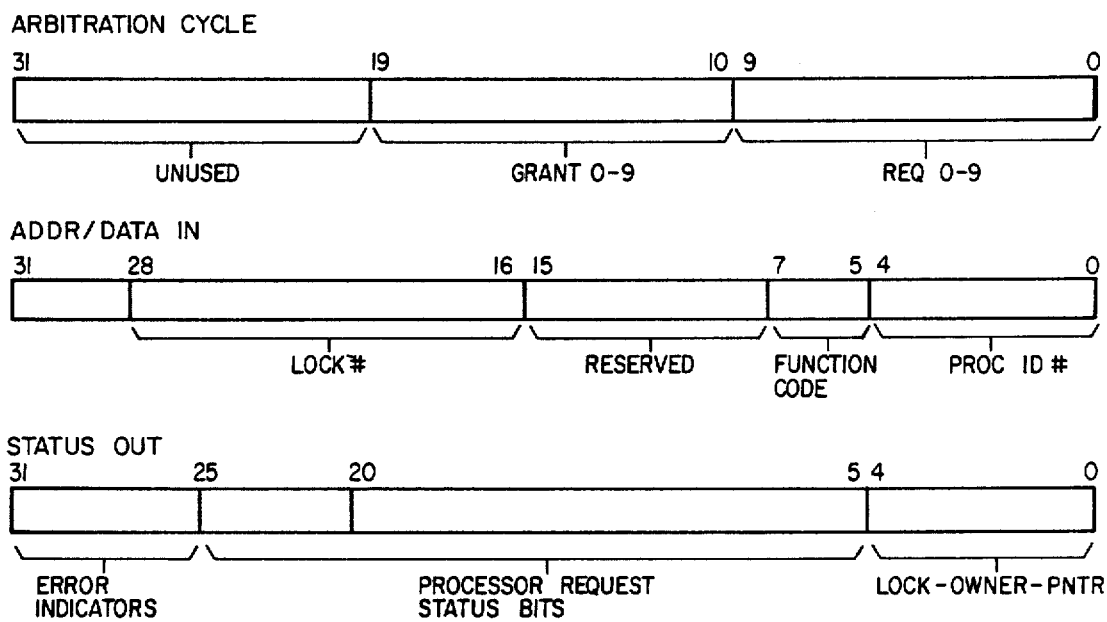
FIG. 38
FIG. 39

COMMON CONTROL CARD

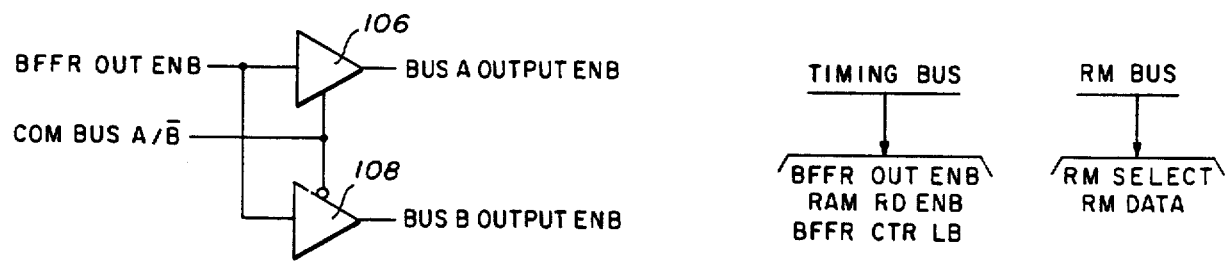
FIG. 46A
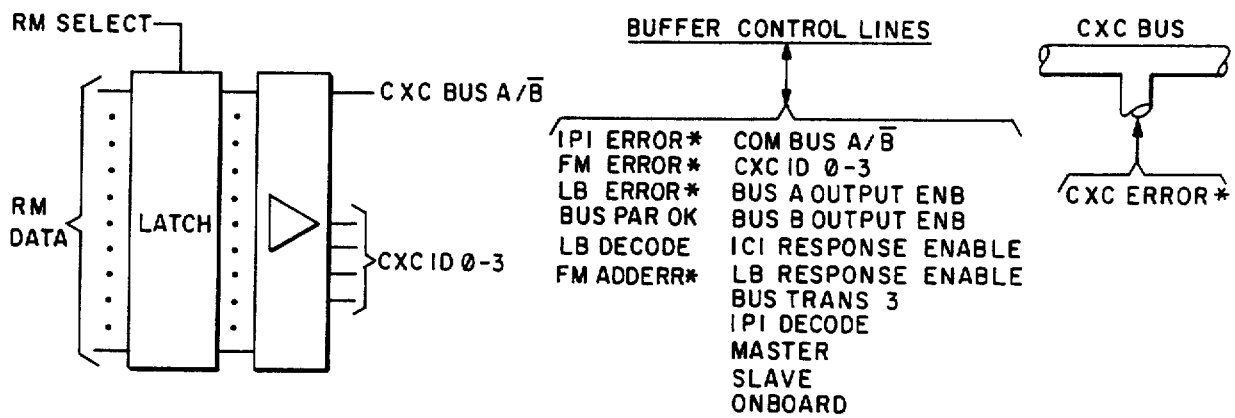
FIG. 46B
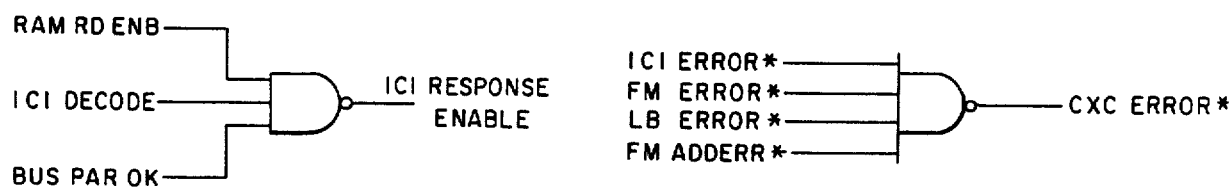
FIG. 46C
FIG. 46D
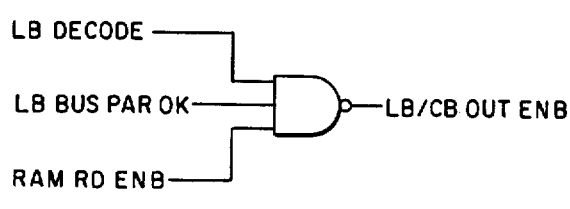
FIG. 46E
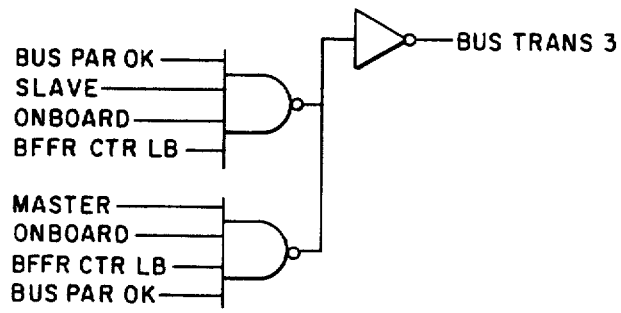
FIG. 46F

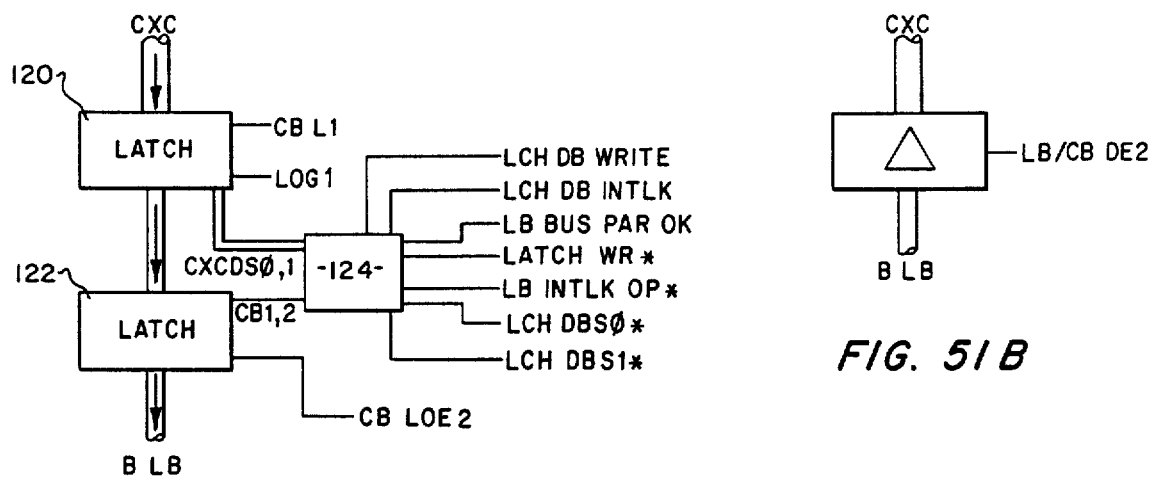
FIG. 51A
FIG. 51B
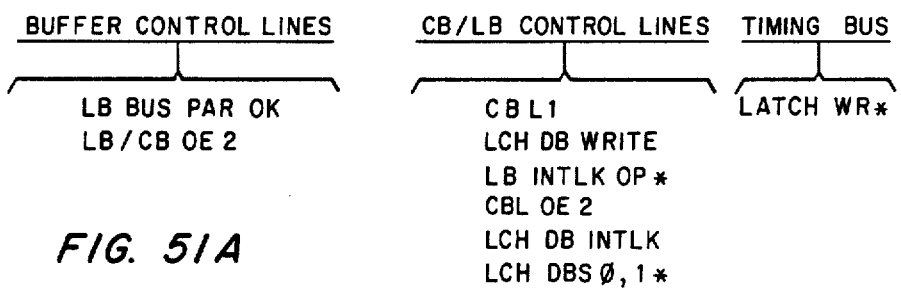
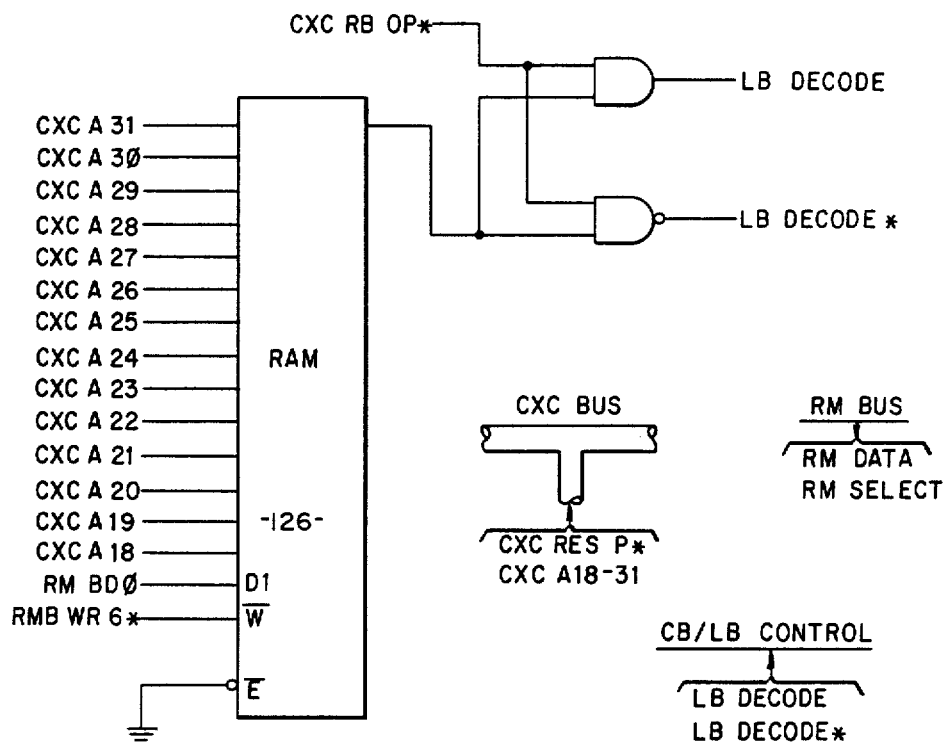
FIG. 52

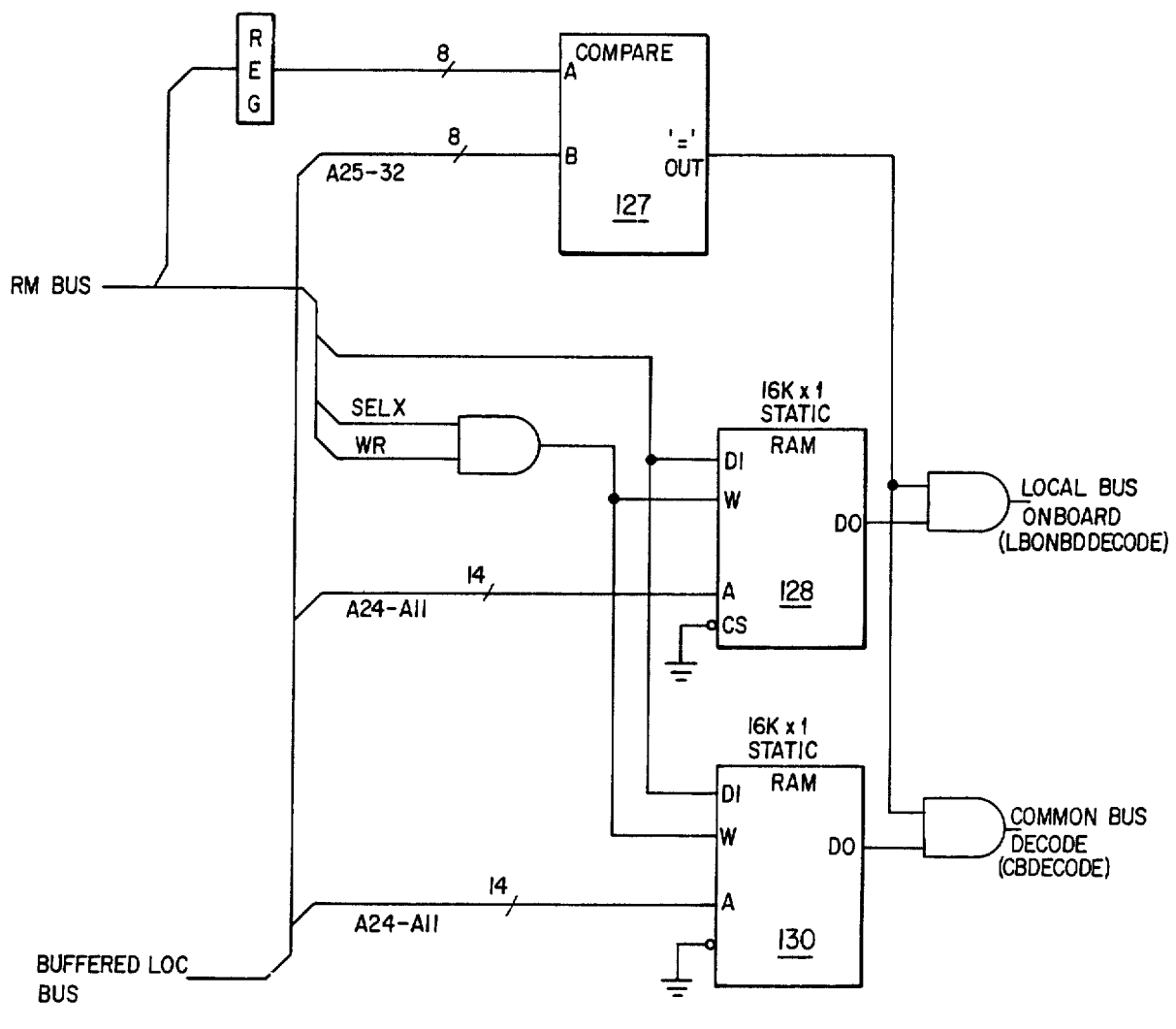
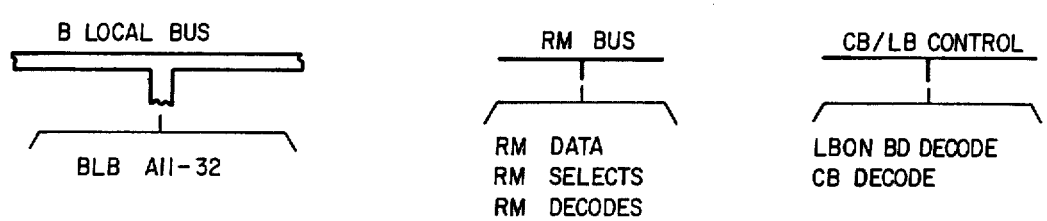
FIG. 53

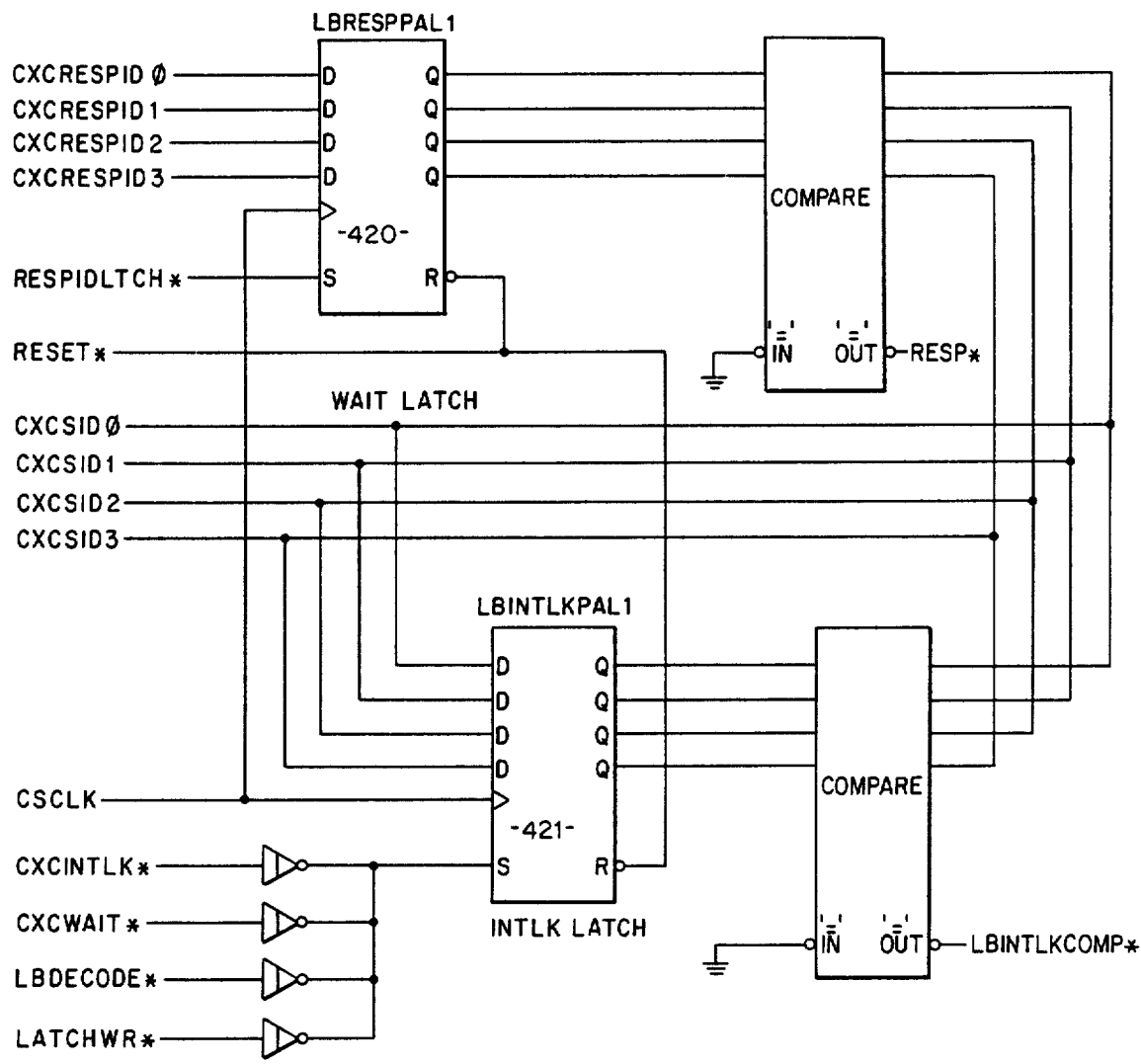
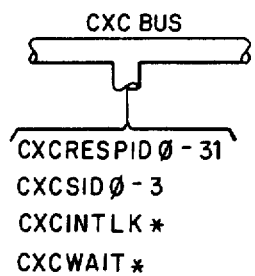
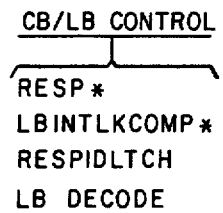
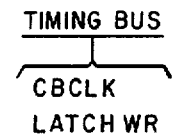
FIG. 56

INTERRUPT RECEIVER

TIMER 1

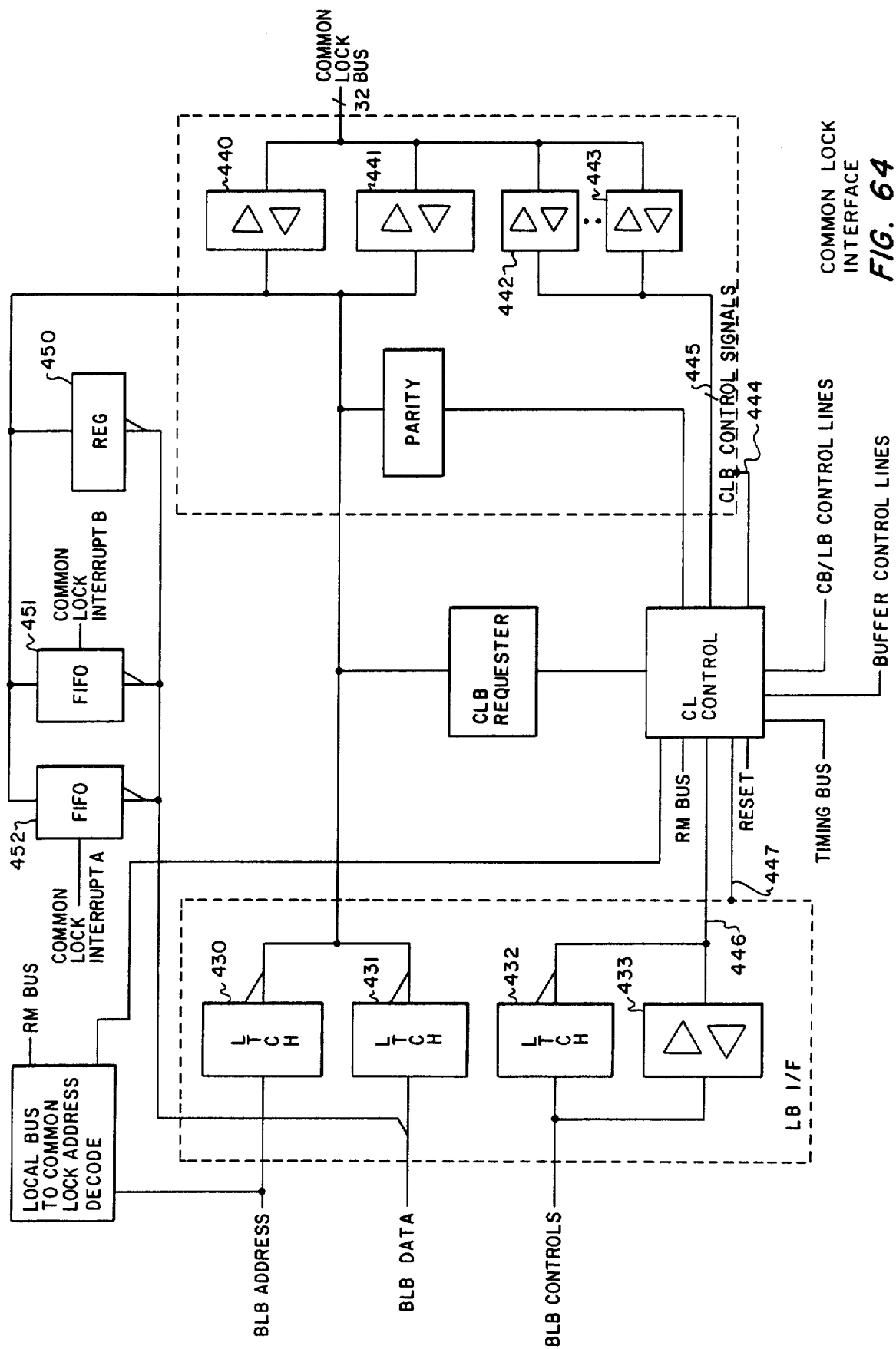

RESOURCE MONITOR

HDLC INTERFACE

ICI ADDRESS DECODE AND CONTROL LOGIC

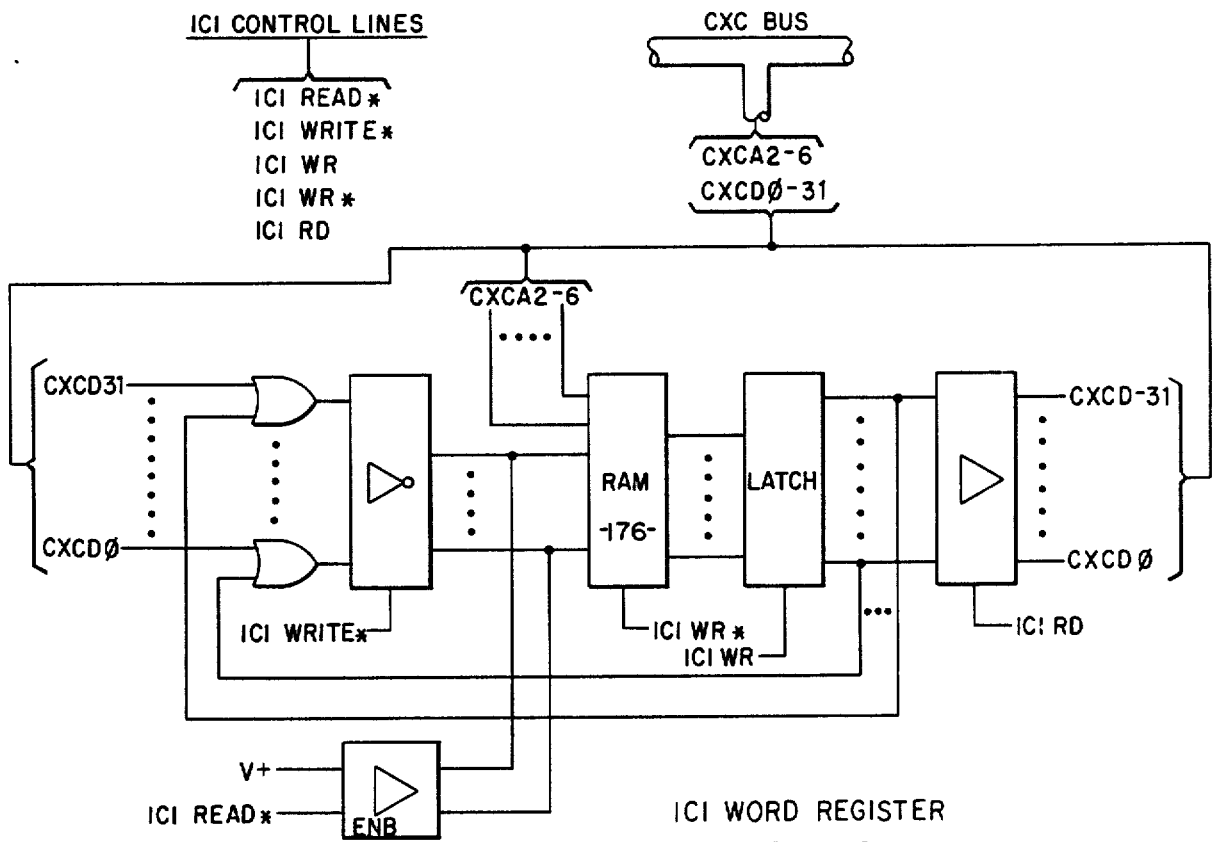
FIG. 68 — ICI WORD REGISTER
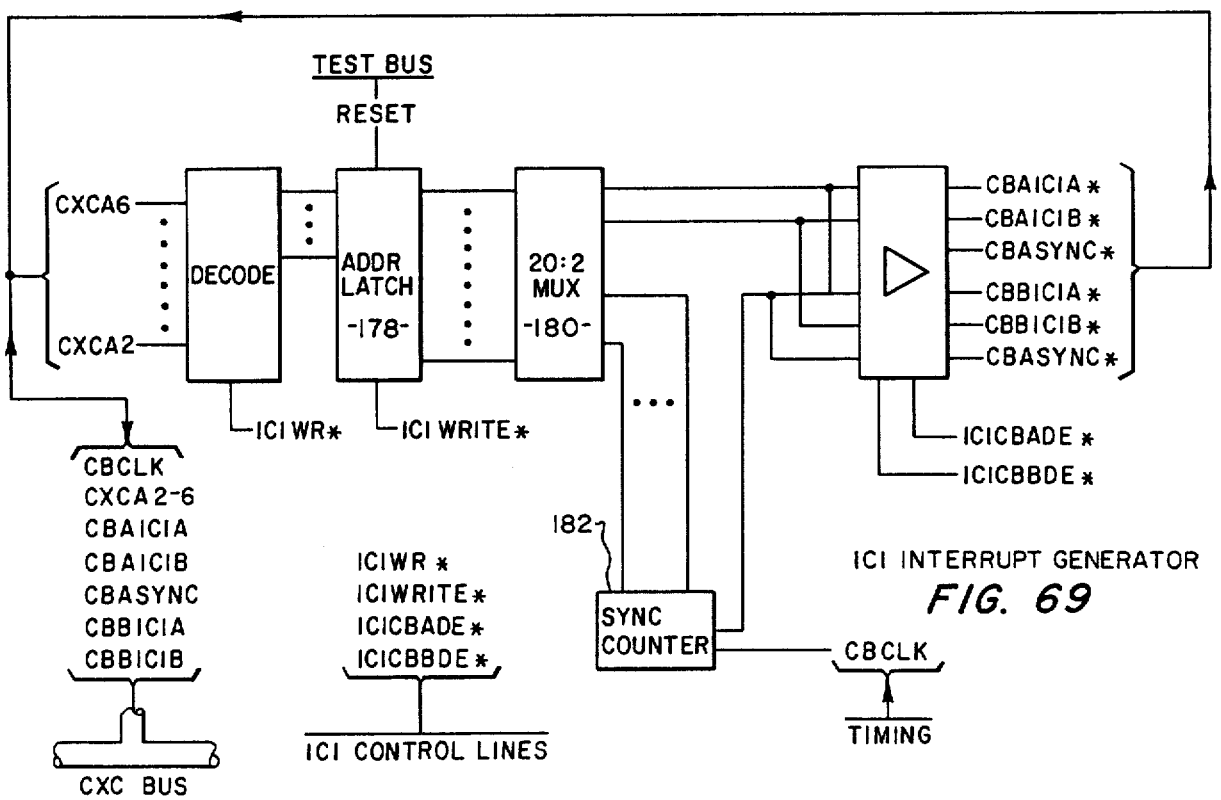
FIG. 69 — ICI INTERRUPT GENERATOR

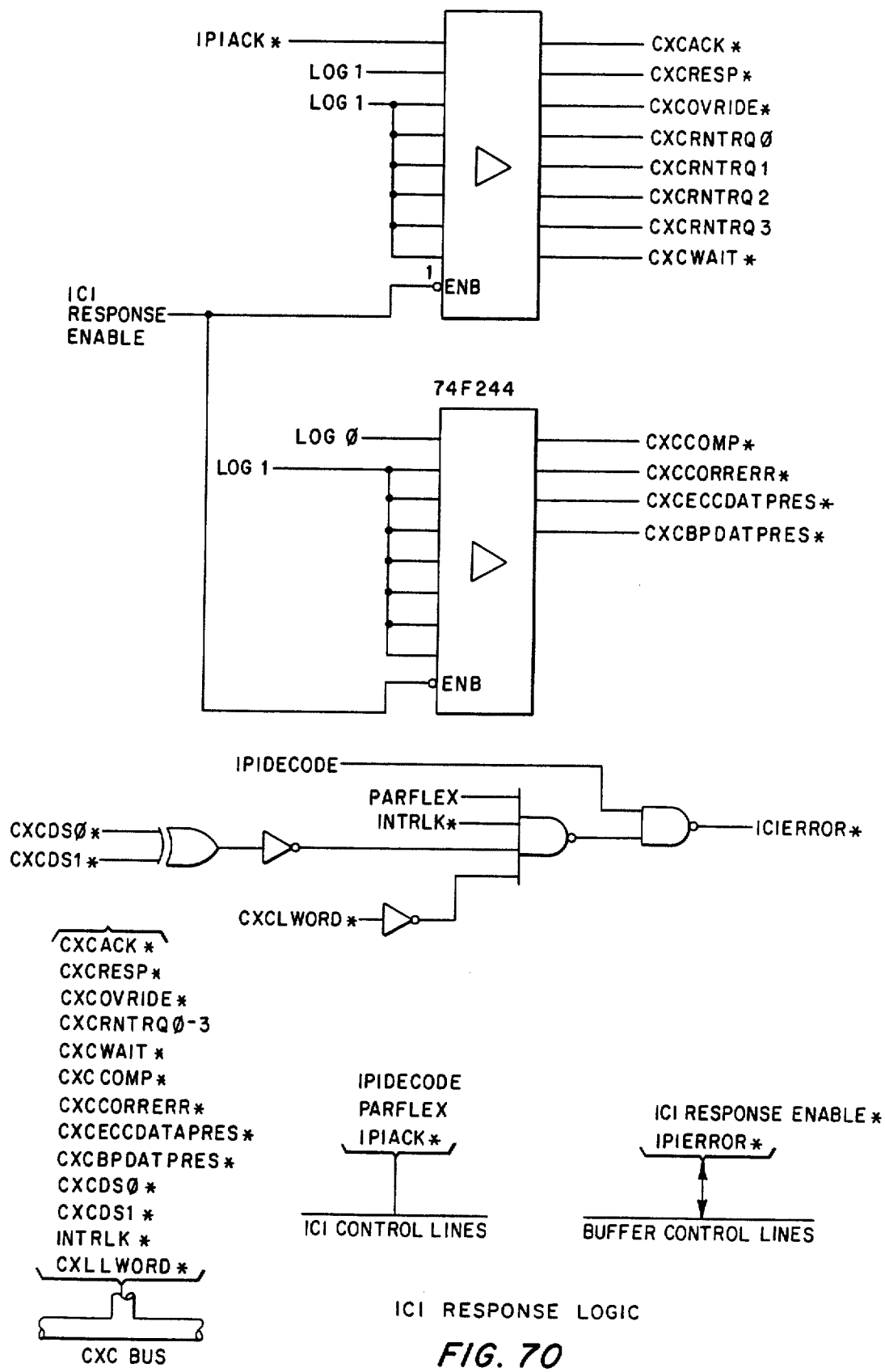
FIG. 70 ICI RESPONSE LOGIC

COMMON LOCK ARBITER

FAST MEMORY

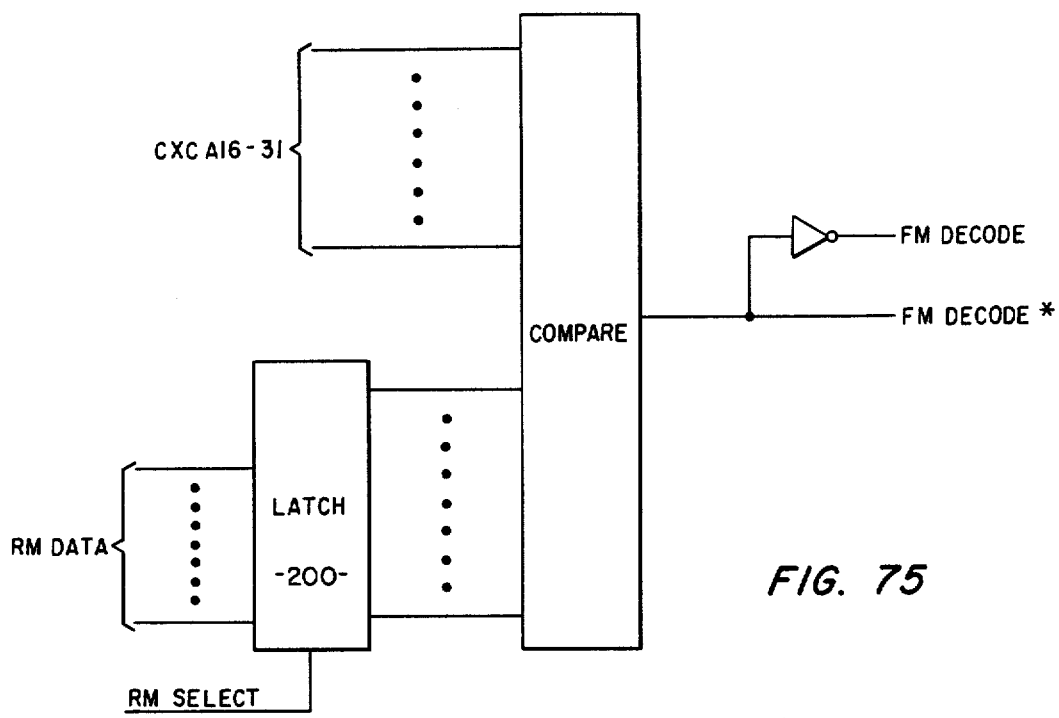
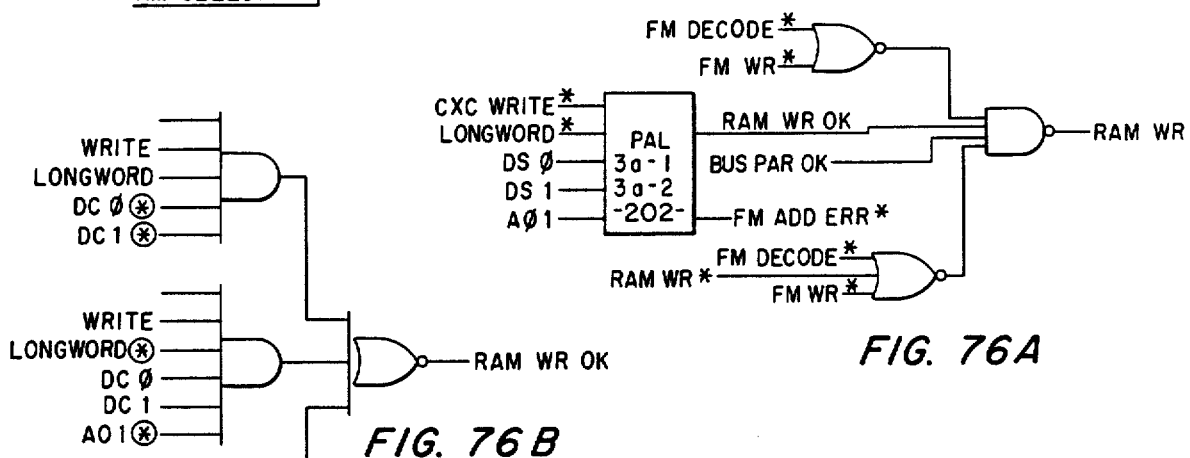
FIG. 75
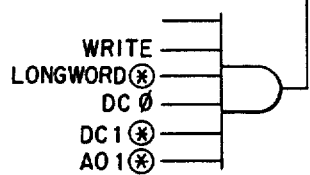
FIG. 76A
FIG. 76B
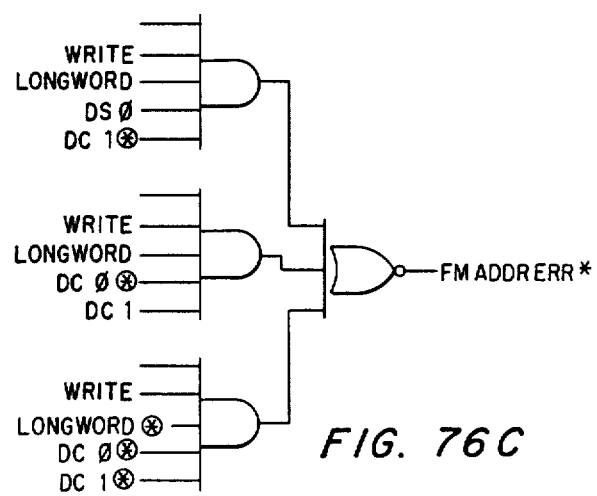
FIG. 76C

MULTICOMPUTER DIGITAL PROCESSING SYSTEM

BACKGROUND OF THE INVENTION

I. Field of the Invention

This invention relates to data processing systems and specifically to multiple computers that communicate with one another via information buses.

II. Description of the Prior Art

Most existing computers in their different forms are sequential Von Neumann machines that perform only one step at a time. This leads to excessive delays in multi-user systems. Since the 1940s emphasis has been placed on increasing computer speeds with faster and denser circuit components. There are many computer experts and researchers trying to redesign the basics of computer structure to overcome heretofore sequential processing limitations. Conventional stored program computers are generally composed in three main parts - a Central Processing Unit (CPU), Common Memory and an Input/Output section. When such conventional computers were first introduced they could only run one program at a time. A Central Processing Unit (CPU) when operating in sequential fashion will execute only one instruction at a time. However, with the advent of semiconductors and later intergrated circuitry, CPUs have become fast enough to efficiently enable time sharing in their execution of instructions. This has lead to the development of multi-tasking operating systems allowing several programs to run in a time shared mode within one computer. Further development of these operating systems progressed from time-sharing memory to simulating large main memories by swapping data with rotating storage components and, thereby, providing a virtual memory operating system.

This has not been accomplished without its problems and that the added burden of simulation accomplished with such operating systems takes its toll in available memory and computing power. Inherently, as operating systems increase in capability, the host computer using such an operating system decreases in capability, a result certainly not desired. For this reason and many others there has been a continuing need for increasing more powerful and faster Central Processing Units. There are, however, practical factors of space, time and technology limiting the execution speed that a single CPU can attain.

In an approach to resolve some of these problems, CPUs have attained increased performance and speed not only as a result of advances in integrated circuit technology but also by adding processors together. In such a CPU with many processors, each processor accomplishes certain tasks but retains appearance of a single CPU architecture with greatly increased performance. Another approach providing more power of speed is the attachment of Auxiliary Processing Units to a Central Processor. This offers additional freedom of implementation and may allow processes to execute concurrently (at the same instant in time). Most attached processing systems, however, tie input/output and scheduling functions directly to the main CPU disallowing direct programmability of the attached processors.

In such a system the CPUs communicate via an Information Bus which is several signal lines connected in parallel to the CPUs. The Information Bus must include a signal protocol which defines what the different signals mean and the timing of the signals. Such an Information Bus is the VME Bus including the VME protocol definition. This Information Bus has been established as a standard and interfacing to the VME Bus has been made easier through products such as the XVME-080 Intelligent Prototyping Module by XYCOM that provides a means to interface a CPU to the VME Bus.

However, the VME Bus does include certain disadvantages. One disadvantage is the difficulty of passing a large amount of information traffic between a multiple of CPUs in a short time frame. While typing multiple VME buses together may seem to solve this difficulty, a contention problem results when a first CPU on a first VME Bus attempts to access a second CPU on a second VME Bus at the time the second CPU is attempting to access the first CPU. The present invention removes this difficulty while providing for high speed information transfer between several CPUs in a short time frame.

It is an object of the present invention to provide an arrangement that facilitates communication between a multiple of computer units.

It is also an object of the present invention to provide an arrangement that includes scalable units permitting system configurations of varying size and capabilities and further permitting ease of system reconfiguration by providing plugably connectable units such as computer cards, memory cards, and other cards that may be connected to or removed from an information transfer bus arrangement that provides fast and efficient communications between the connected units.

It is a further object of the invention to provide a monitor arrangement permitting a system unit to individually or collectively monitor and control the operation of the system.

SUMMARY OF THE INVENTION

In an embodiment of the present invention, the data processing system includes several Local Buses that provide the parallel transfer of information. Each of these Local Buses include several Local Bus connectors. Further, the system includes a Common Bus that is orthogonally positioned relative to the Local. Buses and contains Common Bus connectors that are positioned in line with the Local Bus connectors. In an embodiment, the Common Bus and Local Bus configuration is contained within a single housing. In a variation of this embodiment, several cabinets may be connected together by jumpering either the Local Buses of one cabinet to another cabinet or the Common Bus from one cabinet to another or both. The system further includes plugably connectable cards such as a Bus Interface Card that plugably connects a Local Bus to the Common Bus by connection to both the Common Bus connector and the Local Bus connector. This system further includes computer cards that are plugably connectable to the Local Bus along with memory cards and peripheral device cards which may also be plugably connectable to the Local Bus. The computer cards, memory cards and peripheral device cards connected to the Local Buses may communicate with each other via the Local Bus and to other Local Buses via the Common Bus. The bus interface cards connecting each Local Bus to the Common Bus provide a Common Bus protocol for the transfer of information between Local Buses over the Common Bus. Further these cards provide arbitration to determine which Local Bus gains access to the Common Bus for information transfers. In this embodiment, all devices connected to the buses may access one another by merely addressing one another since all devices are assigned addresses within one address space. Additionally, this system includes a shared memory device accessible to all devices connected to the Local Buses, an InterComputer Interrupt device also accessible by all devices and providing interrupts to the computer cards connected to the Local Buses, and a lock device that is capable of providing status information of all devices connected to the system and further receiving requests to access and providing grants of access to these devices. In one embodiment, the shared memory, common lock and InterComputer Interrupt devices are contained within the bus interface cards. However, the shared memory, InterComputer Interrupt device and lock device may physically be located anywhere within the data processing system since they are addressably accessible as all devices connected to the system.

The number and types of cards that are connected to the Common Bus and Local Buses are determined by the requirements of the application. Since the computer cards, memory cards and peripheral cards are plugably connectable to the Local Buses, the number and types of these cards may be changed by merely adding or removing cards to the Local Buses. Even the number of Local Buses may be increased or decreased by adding or removing the bus interface cards connecting these Local Buses to the Common Bus. Also in an embodiment, the computer cards include an interface to a Peripheral Bus which is connectable to peripheral devices external to the system cabinet. The Peripheral Bus connection can also serve to provide a further bus interconnection between two or more computer cards in the same cabinet. This may be advantageous when there is an excessive amount of traffic between these two cards. A Peripheral Bus connection between these two cards will relieve bus traffic over the Local Buses and Common Bus.

The bus interface cards provide arbitration between the Local Bus and the Common Bus in a unique manner. Firstly, since there is a single address space, access from the Local Bus to the Common Bus is obtained by merely addressing an address space of a device on another Local Bus or a device resident on the Common Bus. The arbitration within the bus interface card is provided by the address decode circuitry which detects when access to the Common Bus is required. The bus interface cards are linked together such that they will arbitrate requests for Common Bus access to provide orderly access to the Common Bus resource. One unique feature of the invention is that the address decode circuitry is programmable, therefore, the address of the Common Bus, Common Bus devices, other Local Buses and other Local Bus devices are programmable and thus alterable by the operator. The bus interface device further defines bus protocol and bus cycles. In the preferred embodiment, the arbitration for the next bus cycle is determined concurrently with the transfer of information of the current cycle. Further, the bus interface cards may be programmed to allow READ ONLY access to devices accessible via the Common Bus. Further, the bus interface cards may be programmed to prevent access to certain devices of the system.

The bus interface cards in defining the protocol, will define information transfers to be within a single Common Bus cycle. In order to provide for information transfers that require more than a single bus cycle, an interlock signal is defined by the protocol. In one embodiment, the shared memory is connected to and addressable from the Common Bus and includes several memory segments, each segment capable of being interlocked by a device. When interlocked, the shared memory segment will only respond to an access by that device. However, Common Bus information transfers are permitted with the remaining memory segments during these interlock periods. Therefore, the Common Bus will not be obstructed during a multiple of non-interruptable transfers of information to the shared memory segments.

Another aspect of the bus protocol is the WAIT and RETRY signals. The WAIT signal is used to respond to a requesting device when the responding device will take more than one bus cycle to complete the transaction. When the requesting device receives a WAIT signal, the requesting device enters a state wherein it only is accessible by the responding device that issued the WAIT signal. During this time, the requesting device responds to other attempted accesses by issuing a RETRY signal. When the responding device provides the information to the requesting device, the requesting device leaves the WAIT state and resumes normal operation. Concurrently with this WAIT state, information transfers over the Common Bus are maintained between the other devices. The device receiving a RETRY signal also enters into a state wherein it monitors the bus for the identifier of the device sending the RETRY signal. Once that identifier has been received then the device receiving the RETRY will reinitiate its bus transmission to the device that sent the RETRY signal. A further protocol signal that is provided is an OVERRIDE signal. The OVERRIDE signal is used to resolve bus contentions between the Common Bus and Local Bus and between the Local Bus and Peripheral Bus. In an embodiment, the Common Bus transfer rate is much faster than the Local Bus transfer rate and when the Common Bus is attempting to access a Local Bus and that Local Bus is attempting to access the Common Bus, the bus interface device will transmit an OVERRIDE signal to the device on the Local Bus attempting to access the Common Bus. Upon receiving the OVERRIDE signal, the device resident on the Local Bus will cease bus transmissions and surrender control of the Local Bus to the bus interface device permitting the transfer of information from the Common Bus. Since the Common Bus transaction will only last for a single Common Bus cycle, the control of the Local Bus is promptly returned to the Local Bus device. Likewise, when an OVERRIDE signal is issued from a Peripheral Bus device to a Local Bus device, the Local Bus device will surrender control of the Local Bus to permit the transfer of information from the Peripheral Bus to the Local Bus.

The implementation of this bus protocol and the arbitration scheme as described provides a contention avoidance system permitting a more efficient use of the information transfer bus resources.

The data processing system further includes a common lock device that provides the status information of devices connected to the system and further receives requests for access and grants access to these devices. In one embodiment, these common lock devices are located on each Local Bus and are addressable on the Local Bus permitting devices resident on that Local Bus to request access to devices on the Common Bus or other Local Buses without having to access the Common Bus or other Local Buses to determine if these devices are available. In one embodiment, the common lock devices resident on each Local Bus include registers dedicated to each computer card connected to the Local Bus. When a computer card requests access to any shared device, that request is arbitrated together with the other requests for that device and a grant of access is according transmitted. In one mode of operation, upon receiving a grant the computer card would be interrupted by the lock device relieving the computer card of the requirement to continually poll to determine when the device is available. Also, the computer card may access the register information of the lock device to determine the status, and poll the availability of other devices. The lock arrangement thus resolves contention problems relative to devices.

An InterComputer Interrupt device is also provided in one embodiment that, in an embodiment, is resident upon the Common Bus, but, may be connectable to any Local Bus and still be addressable by all devices. The InterComputer Interrupt device provides a means for generating an interrupt to any computer card connected to the system by the accessing of an InterComputer Interrupt register that has been designated for that computer card. In this embodiment, a device desiring to interrupt a computer card merely inputs data into that computer card designated register in the InterComputer Interrupt device. In this embodiment, the information that is being written into the register is actually ORed with the contents of this register. The InterComputer Interrupt device generates the interrupt at the time information is written into the register. The interrupt is cleared when the interrupted device reads its register. In one embodiment, the InterComputer Interrupt device provides a hardwired interrupt to the computer card. In another embodiment, the INTERRUPT signal is time division multiplexed and transmitted to the bus interface card for the Local Bus containing the computer card to be interrupted. The interface bus card then demultiplexes the INTERRUPT signal and provides the interrupt directly to the computer card.

In one embodiment of the present invention, the system includes cards that each have a Resource Monitor circuit interconnected to each other and further connected to a System Monitor by a Test Bus. The System Monitor and Resource Monitors on the cards provide a means to initialize the cards defining address spaces, arbitration schemes, identifiers, etc. in accordance with a predetermined configuration. In this embodiment, the System Monitor is connectable to a mass storage device which contains several different configurations. Upon initialization, and operator may specify a specific configuration or the System Monitor may poll the system to determine the existing cards and then determine the configuration in accordance with the available resources. The Resource Monitors on each card include circuitry to monitor and control the individual operations of the cards. The System Monitor connected to these Resource Monitors includes the means to perform an evaluation of the system operation while the system is active. Included in this capability is the ability to detect and correct errors on the buses, to detect failures on the cards, to intervene by stopping operation of the card, correcting the error and then restarting the card and effectively replacing a failed card by another available card in the system by loading the stayed information of the failed card into the new card, reconfiguring the new cards address and starting the card at the point where the failed card failed. In one embodiment, performance evaluation occurs in one of the computer cards located in the system communicating with the Resource Monitors via the System Monitor and Tes Bus.

In a further embodiment of the system, the Common Bus includes a Common Bus timing card that includes propogation lines for each bus interface card that are configured to provide the TIMING signals to each bus interface card at approximately the same time by providing on the timing card propogation lines that have similar characteristics to the propogation lines of the Common Bus but to provide the equivalent physical distances to all bus interface cards.

In a still further embodiment, the plugably connectable cards are provided in a configuration that permits insertion of the cards into the system while the system is operating. In one configuration the power pins of the bus connectors extend to a higher profile than the signal pins, thus permitting the power to be applied to the card being inserted before the signal pins are engaged. In a preferred embodiment, once the power pins are engaged, a power circuit permits regulated power distribution to the circuitry on the card and providing a first indication to one inserting the card that the power pins have engaged and a second indication of when the signal pins may be engaged. In another embodiment, the Common Bus is dual redundant and the Interface Buses are configured to provide for simultaneous transfers of information on the redundant buses.

In one embodiment, of the present invention, the data processing system includes the first information bus with a first protocol and connected to several second information buses by several interface units. In this configuration, a computer device connected to one of the second information buses may communicate via the first information bus to a computer device on a separate second information bus. In this embodiment, the first information bus is a high speed information transfer bus relative to the second information buses. In addition, in this embodiment, the interface units provide control of access to the first information bus by the second information buses, provide a memory accessible on the first information bus, and provide an interrupt device located on the first information bus. The first information bus memory is a fast access memory that may be accessed by any device connected on any of the second information buses. Since the first information bus is a fast transfer bus, the memory is limited to single transactions for access under ordinary conditions. However, a single accessing device may interlock a segment of the first bus memory to perform a READ-MODIFY-WRITE operation. The interrupt circuitry connected to the first information bus also provides for interrupt generation to the computational devices connected to the second buses. This interrupt circuitry includes interrupt registers for each of the devices connected. These registers may be written into by any of the other devices. If one computational device desires to transmit an interrupt to another computational device, the first computational device merely writes into the register of the interrupt circuitry for that second computational device. The writing into the register will generate the interrupt to the second computational device. This interrupt will be cleared when the second computational device reads its interrupt register. The combination of the interrupt circuitry and the first bus memory provide an efficient means to transfer information between devices connected on separate second buses by providing a means for one computational device to "mailbox" information into the memory and then signal the presence of that information by raising the interrupt for the intended device. Upon responding to the interrupt, the intended device can then read the interrupt register and determine who initiated the interrupt and can also read the memory location to obtain the information. The computational units connected to the second buses are provided with means to control peripheral devices external to the data processing system by interfacing to several third information buses. Additionally, in this embodiment, all the bus interfaces together with all the computational devices include individual unit monitoring circuits that are connected to a fourth bus which connects these monitoring units to a system monitor. The system monitor through these individual monitor units and the fourth bus provide means to configure the data processing system, and monitor and evaluate the performance of the system. Because of these features and other unique features of this invention, this data processing system has the flexibility to be configured to efficiently perform any different and varied applications.

In one embodiment, a data processing system is provided that includes a Common Bus which includes several signal lines with a transfer of power, address, data, control and interrupt information in accordance with a Common Bus protocol that defines the timing and formats of the transfer of address, data control and interrupt information and response formats to indicate the completion of these information transfers. Normally, these transfers occur between a requestor device and a responder device amongst a plurality of devices connected to the Common Bus. In accordance with the Common Bus protocol, some of the control information provided includes an INTERLOCK signal from the requestor to the responder defining an interlock period wherein the responder locks out all other information transferred to it except for the information transfers with the requestor until the requestor information transfer does not include the interlock control signal. This permits the requestor to perform a READ-MODIFY-WRITE operation without an intervening information transfer. During this interlock period the responder transmits a RETRY control signal to all devices attempting access. All these devices attempting access and receiving this RETRY control signal store the identifier code of the device sending the RETRY control signal (i.e. the responder). These other devices then lockout all other access attempts to them responding with RETRY signals and monitor all of the information transfers on the Common Bus to determine if the responders identifier code is contained in any of these control signals. Upon the occurrence of the responders identifier code, these units reinitiate their attempted information transfers to the responder device.

The Common Bus protocol also includes a WAIT control signal that is sent from the responder in response to an access from a requestor and defines a requestor WAIT period wherein the requestor locks out all attempted accesses by responding to these attempted accesses with a RETRY control signal and then monitors the control signals representing a source identifier code for the responders identifier code. The requestor then responds only to the accesses containing the responders source identifier code and remains in the WAIT period until the responder has transmitted a COMPLETE control signal indicating a completion of the information transaction.

The Common Bus protocol further includes an OVERRIDE control signal defining a process wherein a device receiving the OVERRIDE control signal relinquishes control of the bus until the device issuing the OVERRIDE control signal has completed its bus transaction. At the completion of this intervening bus transaction, the device receiving the OVERRIDE is restored to control over the bus.

Also among the control signals is a TYPE control signal indicating that the device transmitting this TYPE signal will properly respond to the INTERLOCK, RETRY, WAIT, COMPLETE and OVERRIDE control signals. Since these protocol signals are essential for efficient operation of the Common Bus, only devices transmitting this TYPE signal will have access to the Common Bus. Additionally, this Common Bus includes several connectors connected in parallel to the signal lines of the Common Bus and in line with the Local Bus connectors.

In one embodiment, at least two Local Buses are provided that also include several signal lines for the transfer of power, address, data, control and interrupt information in accordance with a Local Bus protocol that defines the timing and formats for these information transfers and a response format to define an information transfer between a requestor and a responder device connected to the Local Buses. This Local Bus protocol also defines an interlock signal between a requestor and a responder that permits the requestor to perform an interlock operation such as the READ-MODIFY-WRITE operation as previously discussed. Also the Local Bus protocol includes the OVERRIDE control signal that permits a device not having control of this Local Bus to obtain control of the Local Bus by ending the OVERRIDE signal to the device having bus control. As before, the device having this control will relinquish this control until after the transaction of the device sending the OVERRIDE signal wherein the originally controlling device will then reestablish control over the Local Bus. Also included is a TYPE control signal. Additionally, each of the Local Buses includes several connectors coupled to the bus permitting parallel access to the signal lines of the Local Bus. In the preferred embodiment the signal lines of the Local Bus are positioned approximately orthogonally to the signal lines of the Common Bus.

In this embodiment, a Peripheral Bus is furthered included that contains several signal lines for the transfer of power, address, data control and interrupt information in accordance with a Peripheral Bus protocol that is similar to the Local Bus protocol.

Further, a Test Bus is provided that includes several lines for the serial transfer of information. The Test Bus is connected to a selected group of Local Bus connectors.

Each of these Local Bus connectors are positioned to receive a computer unit. This computer unit further includes a connection to a Peripheral Bus such that when connected the computer unit is connected to both a Peripheral Bus and the Local Bus. The computer units include a Resource Monitor circuit connected to the Test Bus through the Local Bus connector. The Resource Monitor is provided for controlling and monitoring the computer unit circuitry in a manner to be described. The computer unit further includes a processor for independently executing instructions on data. The processor is connected to the Resource Monitor (RM) and a computer unit Internal Bus and further includes a processor address decode circuit for receiving a processor address space from the Resource Monitor and providing a signal to the processor when an address on the Internal Bus is within this processor address space. A computer unit clock is also included for providing timing signals to the computer unit circuitry. A Peripheral Bus gate circuit is provided for controlling the transfer of information between the Peripheral Bus connected to the computer unit and a computer unit Internal Peripheral Bus. Also a Local Bus gate circuit is provided for controlling the transfer of information between the Local Bus and a computer unit Internal Local Bus. A Peripheral Bus address decoding circuit is provided for receiving Peripheral Bus signals including a Peripheral Bus address, comparing these address signals with a computer unit Peripheral Bus address space provided by the Resource Monitor and providing an indicating signal when the received address is within this address space. Likewise, a Local Bus address decoding circuit is provided that receives the Local Bus addresses and provides an indication when the received address is within a computer unit Local Bus address that has been provided by the Resource Monitor. A Peripheral Bus interface circuit is provided that is connected to the Internal Local Bus and the Internal Peripheral Bus and stores information representing address translation information that is provided by the Resource Monitor. When a Peripheral Bus address is received on the Internal Peripheral Bus, a translated address is then provided to the Internal Local Bus. An Internal Bus gate circuit is connected to the Internal Local Bus and through this Peripheral Bus address interface circuit to the Internal Peripheral Bus to provide the connection to the Internal Bus in order to control the information transfer between the Internal Peripheral Bus, the Internal Local Bus and the Internal Bus.

The computer unit further includes an interrupt handler that receives interrupt signals from either Peripheral Bus or the Local Bus and generates signals to the processor indicating the reception of the interrupt. Further, the interrupt handler generates response signals to indicate acknowledgement of the receipt of the interrupt.

A Local Bus requestor and arbiter circuit is provided for receiving signals from the processor or the Peripheral Bus indicating a request for access to the Local Bus and for receiving signals from the Resource Monitor to designate which one of several arbitration lines to transmit this request. An arbitration circuit receives the request and provides a grant on the same line on which the request is received. The Resource Monitor is also connected and controls the arbitration circuit such that one of several arbitration schemes may be implemented in order to determine which of the received request is granted access. Likewise, a Peripheral Bus requestor and arbiter circuit is provided that functions in a manner similar to that of the Local Bus requestor and arbiter circuit. As before the Resource Monitor controls the operation of the arbitration lines and also determines which of several arbitration schemes is implemented.

The computer unit further includes an access control circuit that provides several control signals to regulate the transfer of information between the processor, a memory within the computer unit, the Local Bus and the Peripheral Bus. Included is a Peripheral Bus control circuit that receives control signals from the processor representing a request for generating information transfer on the Peripheral Bus. This circuitry then transmits the request to the Peripheral Bus requestor and generates signals for the information transfer in accordance with the Peripheral Bus protocol. Upon receiving the Peripheral Bus grant from the requestor the Peripheral Bus control circuit will generate signals to the Peripheral Bus gate for transferring this information to the Peripheral Bus. Further, in response to information on the Peripheral Bus, this control circuitry will generate signals to the Peripheral Bus gate means and the Internal Bus gate means to receive the information from the Peripheral Bus and upon receiving an indication from the Peripheral Bus address decode circuit, generate several synchronization signals to the processor or the memory to receive the information from the Peripheral Bus. Additionally, this Peripheral Bus control circuitry generates control signals to initiate a Local Bus transfer and to the Local Bus gate circuitry for the transfer of information from the Peripheral Bus to the Local Bus when the Peripheral Bus address is contained within the Local Bus address space. The Peripheral Bus control circuitry further transmits a request for access to the Local Bus requestor and generates a response on the Peripheral Bus to respond to the received Peripheral Bus information. Upon receiving the grant to the Local Bus, the Peripheral Bus control circuitry then generates the appropriate control signals for the Local Bus transfer.

Additionally, a Local Bus controls circuit is included for receiving control signals from either the processor or the Local Bus representing a request for generation of an information transfer on the Local Bus. The control circuit then transmits the request to the Local Bus requestor and generates signals for the information transfer on the Local Bus in accordance with the Local Bus protocol. The Local Bus control circuit generates control signals to the Local Bus gate circuit for transferring the information to the Local Bus upon receiving the Local Bus grant from the Local Bus requestor and arbiter circuit. Additionally, in response to information on the Local Bus, the Local Bus control circuit generates control signals to the Local Bus gate circuit and internal gate circuit for receiving the information from the Local Bus. This information includes address information which is decoded by the Local Bus address decode circuit and in accordance with an indication from the address decode circuit, the Local Bus control circuit generates synchronization signals to either the processor or the memory to receive information from the Local Bus. Further, the Local Bus control circuit generates control signals to initiate a Peripheral Bus transfer by generating control signals to the Peripheral Bus gate circuit for transfer of information from the Local Bus to the Peripheral Bus, transmitting a request to the Peripheral Bus requestor, generating a response on the Local Bus to respond to the received Local Bus information and then generating control signals to the Peripheral Bus buffer for gating the information onto the Peripheral Bus in accordance with a grant from the Peripheral Bus requestor.

Also included is an Internal Bus control circuit for regulating the information flow on the Internal Bus by controlling the access to the Internal Bus by the processor, the memory, the Internal Peripheral Bus and the Internal Local Bus. The Internal Bus control circuit further includes an internal arbiter for arbitrating access to the Internal Bus by the processor, the Local Bus address decoder, the Peripheral Bus address decoder, the interrupt handler, the Local Bus requestor and the Peripheral Bus requestor. The arbiter further generates grants in accordance with a predetermined arbitration scheme and provides enabling signals to the Internal Bus gate logic to permit the information transfer over the Internal Bus.

The control unit further includes an address processing circuit that provides an address interface between the processor and the Internal Bus and further includes an address modifier circuit that is initialized by the Resource Monitor and provides additional address information for information transfers over the Local Bus or the Peripheral Bus. The address interface is connected to the Internal Bus and the processor and provides several noncontiguous address spaces for the processor. In this preferred embodiment, each noncontiguous address space may contain word sizes that are different than other of these noncontiguous address spaces. In other words, one noncontiguous address space may contain 16 bit data words while another noncontiguous address space may contain 32 bit words.

Lastly, the computer unit includes a memory for the storage of information and is connected to the Internal Bus and a memory control circuit. The memory control circuit is connected to receive control signals from the access control circuit that enables information to be read from and written to the memory via the Internal Bus. Furthermore, the memory control circuit generates an access to the memory upon every operation cycle completing the access if the memory is being accessed by the Internal Bus or providing a REFRESH signal to the memory if the memory is not being accessed by the Internal Bus.

In the preferred embodiment, a Common Bus control unit is connected to both a connector of the Local Bus and a connector of the Common Bus. In this embodiment, the Common Bus connector is located adjacent to the Local Bus connector such that a single printed circuit card may connect to both to provide an interface between the Common Bus and the Local Bus. The Common Bus control unit includes a Common Bus buffer circuit for gating the transfer of information between a Common Bus and an Internal Common Bus in accordance with received control signals. Additionally, a Local Bus buffer circuit is provided that gates information between the Local Bus and a buffered Local Bus in accordance with received control signals. A Common Bus requestor circuit is included that receives signals indicating request for access to the Common Bus and transmits these requests on one of several request lines, the line is selected by the Common Bus control unit Resource Monitor. As before, the grant for a specific request is received on the same line that transmits the request.

The Common Bus control unit further includes a Common Bus to Local Bus address decode circuit for receiving control bus addresses, comparing these addresses with an address space from the Resource Monitor and upon determining that the received addresses within this address space generating a signal indicating that this transfer from the Common Bus is to be made to the Local Bus. Likewise, a Local Bus to Common Bus address decode circuit is provided that receives a Local Bus address and determines when this address is within an address space provided by the Resource Monitor and when such a condition occurs indicates that the information present on the Local Bus is to be transferred to the Local Bus.

A Common Bus/Local Bus interface circuit is further provided that latches information for transfer from the Common Bus to the buffered Local Bus and gates information from the buffered Local Bus to the Common Bus in accordance with the received control signals. A Local Bus requestor and arbiter is further provided that receives signals indicating request for access to the Local Bus and transmits these requests on an arbitration line that is selected by the Common Bus control unit Resource Monitor to an arbitration circuit that includes an arbitration scheme provided by the Resource Monitor. The arbitration circuit then grants a request over the same line upon which the request was received in accordance with this arbitration scheme. It should be noted that only one Local Bus arbitration circuit will be functioning when a computer unit is connected on a Local Bus with a Common Bus control unit even though both units contain arbitration circuits. The actual operation of the arbitration circuit is controlled by the Resource Monitors on these individual units.

The Common Bus control unit further includes a protocol circuit that in response to information on the connected Local Bus generates control signals to the Local Bus buffer for receiving the information onto the buffered Local Bus, receives an indication from the Local Bus to Common Bus address decode means and in accordance with such indication transmits a request for Common bus access to the Common Bus requestor and generates control signals to the Common Bus/Local Bus interface for transferring the information from the Local Bus to the Internal Common Bus and generating a response on the buffered Local Bus along with the control signals to transfer the information from the buffered Local Bus to the Local Bus in response to the initial information on the Local Bus. This circuitry also generates control signals to the Common Bus buffer for gating the information from the Internal Common Bus to the Common Bus in accordance with a grant from the Common Bus requestor. Furthermore, in response to information on the Common Bus, the protocol circuitry generates control signals to the Common Bus buffer to receive information from the Common Bus onto the Internal Common Bus. This circuitry also receives the indication from the Common Bus to the Local Bus address decode circuit and in accordance with such indication transmits a request for Local Bus access to the Local Bus requestor and generates control signals to the Common Bus/Local Bus interface circuits for latching information from the Internal Common Bus to the buffered Local Bus and further generates a Common Bus response on the Internal Common Bus, generating control signals to the Common Bus buffer to provide for the transfer of this response information from the Internal Common Bus to the Common Bus. The protocol circuitry also generates control signals to the Local Bus buffer to gate the information on the buffered Local Bus to the Local Bus in accordance with the GRAN signal from the Local Bus requestor.

The Common Bus control unit further includes a clock to provide the timing to the Common Bus control unit circuitry. Additionally, the Common Bus control unit Resource Monitor is provided to perform controlling and monitoring functions of the Common Bus control unit and is further connected to the Test Bus.

A common lock interface circuit is provided that is connected to the buffered Local Bus and responds to addresses specified by the Resource Monitor and provides status information for individual system addressable devices and is further connected to a Lock Bus to transmit request for access to these devices and further receives grants in response to such requests. In the Common Bus control unit, a common lock arbitration circuit is provided that is connected to the Local Bus to receive these lock requests and provides grants in accordance with an arbitration scheme provided by the Resource Monitor.

The Common Bus control unit further includes a Common Bus request arbitration circuit that receives requests for access to the Common Bus and grants these requests in accordance with an arbitration scheme provided for by the Resource Monitor.

The Common Bus control unit further includes an InterComputer interrupt control circuit that includes a interrupt control address decode circuit for receiving addresses from the Common Bus and determining when the received address within an address space provided by the Resource Monitor for the interrupt control circuitry. The addresses to the interrupt control circuitry are used to indicate one of several interrupt word registers that are each assigned to one of the interruptable devices connected to the data processing system and specifically, in this embodiment, connected to several Local Buses. In a write operation, the contents of the interrupt word register is ORed with the information on the Common Bus and this ORed result is stored back into the register. Alternately, for a read operation, the contents of the register is placed on the Information Bus and the register is cleared. Upon writing into an interrupt word register, an interrupt generation circuit generates a time division multiplex signal that includes an interrupt in accordance with the received address, and therefore the device assigned to the interrupt word register. The interrupt control circuit further includes interrupt response logic to generate response signals to the received Common Bus access.

Lastly, the Common Bus control unit includes an InterComputer interrupt interface for receiving the interrupt time division multiplex signal and demultiplexing the interrupt signal to produce an interrupt that is transmitted on the Local Bus to the designated computer unit. In this embodiment, the multiplexing and demultiplexing of the INTERRUPT signals is performed in accordance with information from the Resource Monitor that, in effect, provides the address time slot information for each of the designated computer units.

In the data processing system, only one Common Bus control unit is used to connect the Common Bus to one of the Local Buses. The interface for the rest of the Local Buses to the Common Bus is provided by separate Common Bus access units. In the preferred embodiment, the Common Bus access units and the Common Bus control unit are interchangeable among the connectors provided for the Local Bus and Common Bus. Each of the Common Bus access units include a Common Bus buffer circuit, a Local Bus buffer circuit, a Common Bus requestor circuit, a Common Bus to Local Bus address decode circuit, a Local Bus to Common Bus address decode circuit, a Common Bus/Local Bus interface circuit, a Local Bus requestor and arbiter circuit, a protocol circuit, a Resource Monitor, a clock, a lock interface circuit, and an InterComputer interrupt interface circuit as does the Common Bus control unit. Additionally, the Common Bus access unit includes a Common Bus memory that includes a Common Bus memory address decode circuit for receiving the Common Bus address signals and then determining when the Common Bus memory is being addressed by comparing the received address with a Common Bus memory address space that is provided by the access unit Resource Monitor. Upon determining the received addresses within this address space, a signal is generated that indicates that the information on the Common Bus is to be transferred to the Common Bus memory. The Common Bus memory further includes interface logic for receiving the address decode signal and generating access signals to the Common Bus memory to access the Common Bus information. The Common Bus memory further includes response logic that generates signals on the Common Bus in response to the initial Common Bus transfer.

The data processing system also includes a system monitor that includes a first processor for transferring information via the Test Bus to the Resource Monitors of the computer units, the Common Bus access units and the Common Bus control unit. Further, this first processor is connected to at least one environmental sensor, a address specification device, a real time clock, a power relay for controlling power to the data processing system, a mass memory for storing program information including the configuration information for each Common Bus control unit, Common Bus access unit, and computer unit. The first processor further includes a memory that stores the program on instructions to transfer the configuration information via the Test Bus to each of the Resource Monitors and for monitoring the system operation through these Resource Monitors. The first processor is further connected to an operator terminal to provide information to and receive information from an operator. The program for the first processor further regulates power to the data processing system via the power relay in accordance with information received from the environmental sensor. This first processor is connected by a first and second data buffers to a second processor. In the preferred embodiment, the first and second data buffers are FIRST IN/FIRST OUT buffers that are unidirectional. One data buffer is for the transfer of information from the second processor to the first processor, and conversely the other provides information from the first processor to the second processor. The second processor is also connected to a separate address specification device, a Network Bus and a second processor memory which includes instructions for the transfer of information with the first processor by the two data buffers and also for the transfer of information via the Network Bus. In the preferred embodiment, several data processing systems can be connected together via this Data Bus enabling system monitors for each of the data processing systems to intercommunicate.

BRIEF DESCRIPTION OF THE DRAWINGS

The novel features believed characteristic of the invention are set forth in the claims. The invention itself, however, as well as other features and advantages thereof will be best understood by reference to the detailed description that follows when read in conjunction with the accompanying drawings, wherein:

FIG. 20A is a block diagram of the computer card local to peripheral and peripheral to local access control signals.

FIG. 21 is a block diagram of the computer card resource monitor operational command output.

FIG. 22 is a block diagram of the computer card P1 to peripheral and Local Bus control circuits.

FIG. 23 is a block diagram of the computer card data flow control signals.

FIG. 24 is a block diagram of the computer card internal arbiter.

FIG. 29 is a block diagram of the computer card resource monitor.

FIG. 35 is a signal transaction chart for an interlocked READ-MODIFY-WRITE operation to fast memory on the Common Bus.

FIG. 36 is a signal transaction chart for an interlocked access to a Local Bus over the Common Bus.

FIG. 37 is a chart illustrating the three cycles of a common lock transaction.

FIG. 38 is a diagram for the three cycles in a common lock transaction.

FIG. 39 is a cycle chart for the master write cycle.

FIGS. 46A, 46B, 46C, 46E, 46F are schematic diagrams of the buffer control circuitry for the Common Bus card.

FIG. 51A is a schematic diagram of the Common Bus to Local Bus buffer and control.

FIG. 51B is a schematic diagram of the buffered Local Bus to Common Bus interface.

FIG. 52 is a schematic diagram of the Common Bus to Local Bus address decode circuitry.

FIG. 53 is a schematic diagram of the Local Bus address decode circuitry.

FIG. 56 is a schematic diagram of the Local Bus/Common Bus response and interlock compare circuitry.

FIG. 64 is a block diagram of the Common Bus card common lock interface.

FIG. 68 is a schematic diagram of the computer control card InterComputer Interrupt word register.

FIG. 69 is a schematic diagram of the InterComputer Interrupt generator circuitry.

FIG. 70 is a schematic diagram of the common control card InterComputer Interrupt response logic.

FIG. 75 is a schematic diagram of the fast memory address decode logic.

FIG. 76A is a schematic diagram of the fast memory control circuit.

FIGS. 76B and 76C are schematic diagrams of the programmed array logic contained in block 202 of FIG. 76A.

DESCRIPTION OF THE PREFERRED EMBODIMENT

INTRODUCTION

Figure 1:
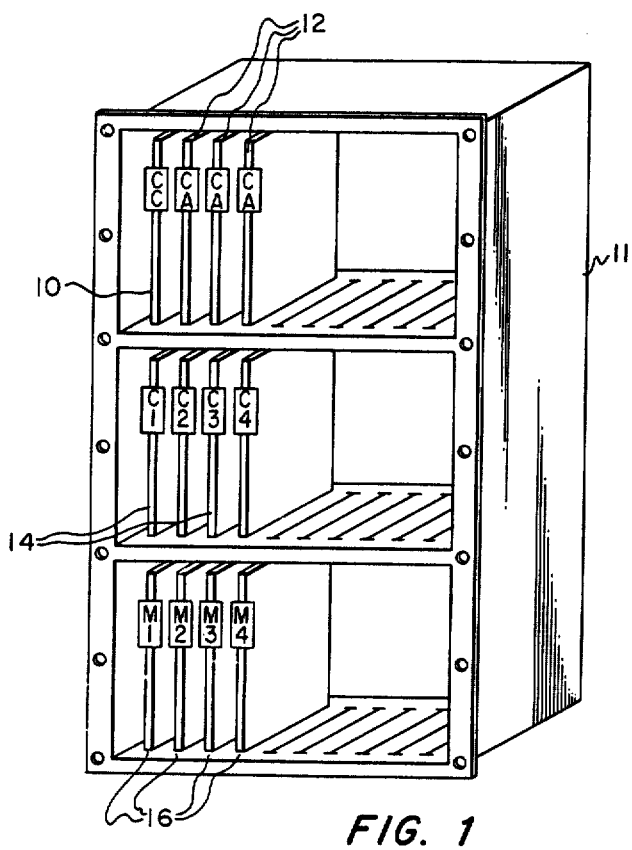
FIG. 1 is a pictorial view of a data processing system cabinet including several card slots for receiving Common Bus cards, computer cards and memory cards.

The purpose of this invention is to provide a family of general purpose digital computers intended to satisfy the control requirements of system integraters in industrial automation. The primary needs for these system developers, following the requirement for competitive price and performance are flexibility, expandability, maintainability, useful software tools, and independence from vendor operating system idiosyncrasies. This invention is a multicomputer which is a collection of closely interconnected computers, each computer commonly being referred to as a node, that are inherently flexible and expandable in design. In the preferred embodiment, the digital computers are 32 bit devices with each node consisting of processing, memory and external interface facilities for data input and output. Nodes may communicate, under program control, with each other by passing data through a shared common memory. Access to this common memory is strictly arbitrated to guarantee exclusive use. Under the present embodiment this invention can support up to 20 multitasking computer nodes. Further, this invention can connect several multiple computer configurations through network circuitry. Further, memory for the system is provided in increments allowing each node to be sized independently. The invention further includes self-test hardware and software that provides for the continuous monitoring of each node. Failures can be located using data collected from the system at any time of occurrence enhancing the systems maintainability. The self-test capability can also be linked via the network circuitry. Performance evaluation can be performed using information from the self-test system to characterize the behavior of the executing programs. The multi-computer system supports several software development tools including the Unix 1 Program Development System Environment and the Edison Operating System Design language. The specific attributes of this invention include providing a directly programmable Multi-Instruction Stream/Multi-Data Stream multi-computer with unlimited hardware expansion in processing power, memory and input/output requiring a minimum of software modification for different applications. The invention includes a Standard/Portable software development environment and concurrent programming tools for the development of austere and fast run-time environments. The hardware and software system is structured such that it does not dictate any specific implementation techniques or styles. The invention does include an open input/output architecture that is based on an established standard bus structure and protocol. The multicomputing system is easily reconfigured to fit many applications and includes automatic and continuous self-testing for enhanced reliability. This self-testing further includes the capability to provide fault tolerant configurations.

The key to the flexibility of the Applicant's invention is that it provides for hardware building blocks to be assembled. There are three main building blocks: computers, memory, and input/output. In the simplest form a computer (Central Processing Unit or CPU) is connected to a memory and also to an Input/Output Unit. The present invention provides that the CPU's may be connected to Dedicated Memories and Dedicated Input/Output devices and further be connected together with common memory. Using the physical structure of the Applicant's invention, the user can combine several computers, local memories, or input/output devices in varied architectures to meet specific user applications. The Applicant's invention provides that these building blocks can be assembled within a multicomputer cabinet and further provides for the interconnection of these multicomputer cabinets to enable one to build a multicomputer system of virtually any size. In its preferred embodiment, the power of a single multicomputer cabinet includes on one hand a configuration including one of the largest memories available for a commercial computer and in another configuration to a computer with a processing power as large as the largest mainframe computers available to date. In its present form, the invention is a closely coupled system of computers that provides for concurrent execution of programs or processes. Concurrency is defined as the collection of sequential processes that execute on separate processors at exactly the same instant and time. In its present configuration a single multicomputer cabinet can support up to twenty 32 bit computers or 160 megabytes of memory or any variety or combinations of these or other building blocks. Furthermore, the Applicant's invention provides for computer communication through shared memory, interprocessor messaging or networking. The most common method of communication is the use of common memory as a mailbox. The Applicant's invention includes a hardware configuration that solves the problem of mutual contention for this mailbox area. By a scheme of fair hardware arbitration, the burden of software overhead is reduced resulting in a very fast and easily reconfigurable communications structure. In the following detailed description references are made to appendixes A-G. These appendixes though not printed are available in the case file for those persons skilled in the art desiring additional information contained therein.

Computer Building Block

In the Applicant's invention the Computer Building Block is a 32 bit computer contained on one printed circuit card and provides a full 32 bit Data Bus and full 32 bit Address capability. In the preferred embodiment, one of the computer cards includes a National Semiconductor 32032 Microprocessing System with hardware to support floating point arithmetic along with memory management, memory protection and multitasking and multiuser capability. In addition, one megabyte of on-board Random Access Memory (RAM) protected by Error Correction Code Logic is provided. Further, the computer includes a Local Bus Interface and an External Bus Interface which includes a 32 bit/16 bit VME Bus input/output interface.

Memory Building Blocks

Two types of memory are provided. The first is mass memory which is intended for local memory use on the Local Bus. In the preferred embodiment, the mass memory is contained on a card that includes 1-8 megabyes of error corrected RAM. The second memory is the high performance memory and is a card containing 128 kilobytes to 2 megabytes of high speed error corrected RAM memory that can either be dedicated on a Local Bus or shared on a Common Bus.

Input/Output

Input/output devices may be interfaced to the invention through the VME Bus Interfaces provided on the computer cards. Since the VME Bus Interface is a standard, which is herein incorporated by reference, several different types of input/output devices may be interfaced easily.

Self-Test

The self-test system of the Applicant's invention is implemented as fully automatic and continuous and interfaces with each and every circuit card in the system via a separate Test Bus. Each card in the system includes a self test microcomputer that continually checks the functions of the card to which it is attached. The self test system is driven from the system console and will perform automatic shutdown and restart functions when required. The system diagnostic and fault isolation option provides fault diagnosis and isolation. When a malfunction is detected the fault is diagnosed and isolated to the lowest replaceable module unit. This self-test system also provides performance analysis capability to enable one to evaluate run time conditions.

Communications

The invention includes two basic communications building blocks which are the Common Access Card and the Common Control Card. The Common Access Card provides a Local Bus to Common Bus interface and further includes 128 kilobytes of high performance commonly shared memory. This card also provides hardware for interprocessor synchronization. The Common Control Card also provides a Local Bus to Common Bus interface and provides Arbitration of access to conditional critical regions of communications. Therefore, only one Common Control Card is necessary in a single cabinet. However, for redundant full tolerant operations two or more cards may be used.

Physical Arrangements

Figure 2:
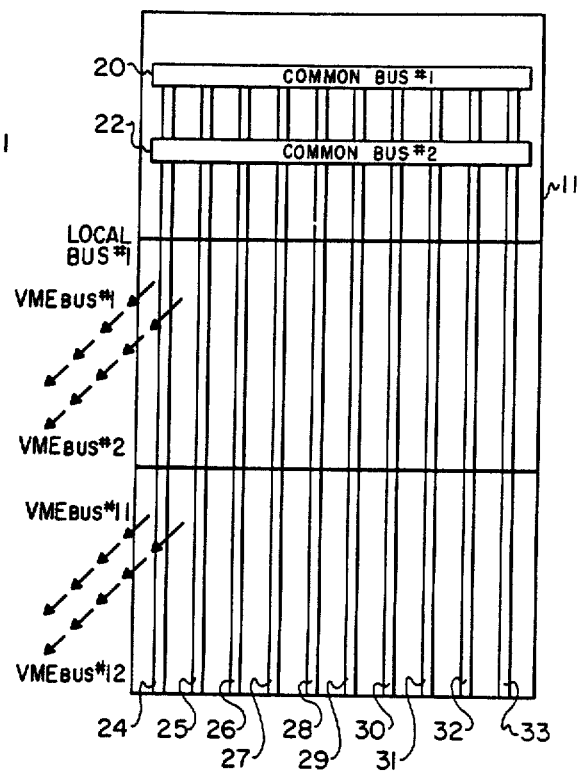
FIG. 2 is a diagram illustrating the orthogonal location of the Local Buses relative to the Common Buses and further, the location of the Peripheral Buses.

In the preferred embodiment the multicomputer hardware blocks area arranged in two units. The first unit is a Card Cage that contains the Common Control and Common Access Cards and the Computer and Memory Cards. The second configuration is a second Card Cage which is sized to contain input and output circuit devices. FIG. 1 is an illustration of the multicomputer Card Cage containing a Common Control Card 10, Common Access Cards 12, Computer Cards 14, and Memory Cards 16. In the preferred embodiment, this is a rack mountable Card Cage of three rows by ten columns per row of card capacity. FIG. 2 illustrates the back plane of the multicomputer Card Cage. In this configuration, 10 Local Buses 24-33 are shown horizontally connecting the two bottom rows of cards to the top row of cards which are connected by the vertically spanning Common Buses 20 and 22. The top row is provided for the interconnection of the Common Control and Common Access Cards. The bottom two rows are provided for the interconnection of the Computer and Memory Cards. It should be apparent to one skilled in the art that any number of Common Buses or Local Buses may be provided in a physical configuration.

Figure 3:
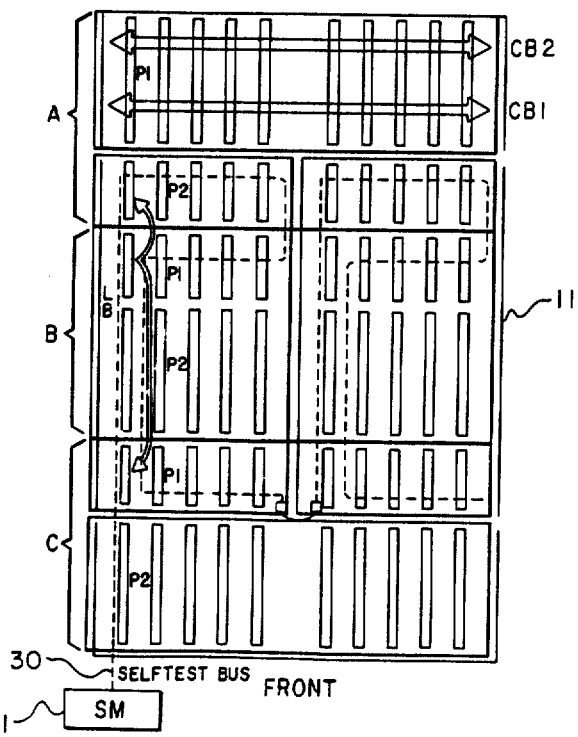
FIG. 3 is an illustration of the back plane of the data processing system illustrating the location of the self test bus.

The Self-Test Bus is depicted in FIG. 3. FIG. 3 illustrates a front view of the physical cabinet showing the P1 and P2 connectors for each of the card rows. In the preferred embodiment the Common Access Card and the Common Control Cards each are connected to the Dual Redundant Common Buses via the P1 connector and are connected to the their respective Local Buses by their P2 connectors. The Self-Test Bus 30 is connected to a System Monitor 31 and is interconnected to all of the cards in the card cabinet via the Bus 30 interconnecting with the P1 connectors as shown.

Using this physical configuration the User can implement Computer Cards and Memory Cards on the various Local Buses together with the Common Control and Common Access Cards on the Common Bus for varied configurations having different number of computers and different sizes of memory. On one extreme the bottom two rows of the cabinet may include one Computer Card with the remaining slots totally filled with Memory Cards resulting in a single computer with very large memory capacity. On the other hand, the bottom two rows may be filled with computer cards with the top row being filled with a single Common Access or Common Control Card and the remainder with Common Access Cards yielding a system including 20 processors communicating with a Common Bus including a Common Shared Memory Resource. Again, the user is provided the means to include external or peripheral interfaces through the VME Bus Interface contained on the Computer Card.

Self-Test

The Self-Test Bus and related circuitry is used to initialize the multicomputer system at program load time. Each module in the multicomputer system contains upper and lower Address Registers and in initial program loading by the Self Test System, the computers Local Memories and Common Memories can be software programmed to be addressable anywhere within a 4 gigabyte Address Space. Along with the initial program load capability, the Self Test Circuitry provides for automatic shutdown and restart by software that may reside in the multicomputer system or in the system monitor.

The Self-Test mechanism also provides automatic continuous diagnostics. Each Computer Memory and Common Card in the system contains a separate and distinct Self-Test Microprocessor that is interconnected to the Self-Test mechanism via the Self-Test Bus. This Self-Test Microprocessor continually diagnoses each card to which it is attached and this information is transmitted to the Self-Test mechanism via the Bus over by the Self-Test Bus. Self-Test software resident in the Performance Monitor is capable of detecting faults and isolating that fault to allow ease of maintenance. Aside from maintenance, that failed component may be turned off and the system allowed to proceed in a degraded mode.

A third capability of the Self-Test mechanism is performance evaluation. Performance evaluation can be implemented by the use of tracers or tracks provided by accessing the hardware onboard each card via the Self-Test Microcomputers. Tracing how and when a software process communicates with all other software processes running in the multicomputers allows for an overall behavior of this software execution to be monitored. Another aspect of the Self-Test hardware is the capability to provide a fault tolerance system wherein the Self-Test mechanism will detect a fault and provide for the reprogramming of the cards, which must include Redundant Cards with the functional aspects of the failed components.

The multicomputer system consists of several nodes interconnected by the Common Bus. Each node consisting of a processor connected to a Local Bus. The Common Bus is unbounded and allows instructions to originate from either side (the Common Bus side or the Local Bus side). Thus, a Local Bus can be used to host one or more processors accessing the Common Bus to gain access to a shared memory resident on the Common Bus or the Local Bus can provide a means where one processor on one Local Bus can access the Common Bus and further access another processor on a separate Local Bus.

This multicomputing system is designed around the shared conditional critical region (Shared Common Memory) as a directly supported method of interprocess communication. A problem with this method is its interaction with processors that receive interrupts. If an interrupt occurs while process owns a shared resource, either the interrupt must wait until the shared resource is released or the shared resource is tied up while the interrupt is being served. In one case the interrupt is delayed and in the other case all devices seeking to gain access to the shared resource must wait. The present system solves this contention problem by providing that all accesses can take only one bus cycle and accesses requiring more than bus cycle may only restrict access to a small portion of the shared resource.

Another aspect of this system architecture is the WAIT and RETRY signals. When accessing the Common Bus if the accessed device is busy performing some operation then the access device will send a RETRY signal to the accessing device. The accessing device will then wait until the access device identifier appears on the Common Bus signifying the completion of this operation and then retry the access to the accessed device. A device may also send a WAIT signal which indicates to the accessing device that the accessed device cannot complete the transaction within one bus cycle but will initiate a transaction with the accessing device at a later time to complete the transaction. The accessing device then enters the WAIT mode, sending RETRY signals to other devices attempting to access it, until the access device initiates a transaction with the accessing device.

A third feature of the architecture of the system architecture is the use of an OVERRIDE signal. If a device on the Common Bus side seeks to gain access of a Local Bus and the Local Bus MASTER is attempting to seek control of the Common Bus, the Common Bus device can issue an OVERRIDE which will be interpreted by the Local Bus MASTER as a command to relinquish control of the Local Bus and permit the Common Bus to complete its transaction. Since the Common Bus is much faster than the Local Bus, the Common Bus transaction will be completed within the single bus cycle. Afterwards the control is returned to the Local Bus MASTER.

LOCAL BUS

The Local Bus is capable of supporting several computer cards, memory cards and input/output interfaces together with the interface to the Common Bus. In the preferred embodiment, each card slot on the Local Bus will have an encoded binary pattern that can be read by that card to determine its identifier. This identifier is used by the card to identify itself to the system so that the system can configure itself dynamically.

The Local Bus itself is based upon the VME bus specification published by Motorola Microsystems Publications Department, July 1982 and is hereby incorporated by reference. This specification defines an interfacing system for using interconnecting data processing, data storage and peripheral data control devices in a closely coupled configuration. The Local Bus of the present system is virtually identical to the VME bus with the exception of certain additional signals to be discussed. A signal list for the Local Bus is contained in Appendix E. The signals of the Local Bus not contained in the VME bus specification include the ADDRESS ERROR CORRECTION and DATA ERROR CORRECTION signals which are 8 and 6 bits respectively. The ADDRESS ERROR CORRECTION PRESENT and DATA ERROR CORRECTION PRESENT signals are also additional signals and signify the presence of the ADDRESS ERROR CORRECTION and DATA ERROR CORRECTION information respectively. The ADDRESS PARITY PRESENT and the DATA PARITY PRESENT are also two additional signals that indicate the presence of parity information. There are several control signals that have been added to the Local Bus not contained in the VME bus specification. They include the OVERRIDE, INTERLOCK, FLEX DEVICE, and CORRECTION ERROR signals. The OVERRIDE signal is a signal that permits the Common Bus interface to gain control of the Local Bus when the Common Bus interface attempts a transaction. This is required since the Common Bus is much faster than the Local Bus and forcing the Common Bus to wait while the Local Bus performs transactions (i.e. causing the Common Bus to await the normal arbitration) would be a waste of the high speed Common Bus resource. Therefore, in a situation where a MASTER of the Local Bus is attempting to perform a transaction on the Local Bus to the Common Bus and at the same time a Common Bus interface is attempting to gain access to the Local Bus, the Common Bus interface will raise the OVERRIDE signal instead of the ACKNOWLEDGE signal in response to the request from the MASTER, causing the MASTER who has control of the Local Bus to relinquish this control so that the Common Bus interface can complete its transaction. Since all Common Bus transactions are completed within a single bus transaction cycle, the Local Bus will only be occupied for one transaction cycle by the Common Bus interface. The OVERRIDE signal is also used to resolve contention for transactions between the Peripheral Bus, connected in the preferred embodiment to an interface connecting the Local Bus, and the Local Bus.

The next signal is the INTERLOCK signal which permits a Local Bus device to perform a transaction on the Common Bus that involves more than one bus cycle. As previously mentioned all transactions on the Common Bus must be completed within one bus transaction cycle, however certain operations require more than a single bus transaction cycle and must be non-interrupted transactions with the device on the Common Bus. The INTERLOCK signal provides this capability by allowing the device on the Local Bus to lock out all other accesses to the device on the Common Bus while the Common Bus still provides information transfers between other devices. The architecture of the Applicant's invention is so arranged that a single device on the Local Bus can only INTERLOCK a small portion of a resource on the Common Bus. Therefore, even though a portion of the resource on the Common Bus is INTERLOCKED the Common Bus and remaining resources on the Common Bus are free for access by other devices. When the Local Bus device that has INTERLOCKED the Common Bus resource ag in accesses the Common Bus resource without the INTERLOCK line active, the Common Bus resource will leave the INTERLOCK state after the completion of the transaction and will permit transactions with other devices to that portion of the resource. The FLEX DEVICE signal is a signal that permits a universal computer card or other device resident on the Local Bus to generate an INTERRUPT through the InterComputer Interrupt circuitry resident on the Common Bus. As discussed, the device desiring to generate the INTERRUPT merely writes in the Address space bf the InterComputer Interrupt Word Register that has been dedicated to the device to be interrupted. Merely writing into the contents of this register will generate the INTERRUPT as previously explained. The CORRECT ERROR signal indicates the existence of an error on the transmission and signifies that the error has been corrected by the receiver. This error indication is recorded by the self-test circuitry of the transmitter.

The Test Bus consisting of 6 bus lines, the slot identifier consisting of 4 bits, the InterComputer Interrupt lines consisting of 4 lines, and the system reset line are additional to the VME bus specifications. The Test Bus consists of two differentially driven bus signals each consisting of 2 lines a piece. Additionally, the Test Bus includes a Test Bus Reset and a Test Bus A/B line to signify which of Test Bus A or Test Bus B is active. The slot identifier contains the identification information for the card connected to that specific slot. This information is read and used by the Resource Monitor resident on the card. The InterComputer Interrupt lines include an Interrupt A line, Interrupt B line an Clear Interrupt A line and a Clear Interrupt B line that provide interrupts from the InterComputer Interrupt circuitry to the two cards located on the Local Bus. The Local Reset line is a line that originates from the Performance Monitor to reset the entire Common Bus/Local Bus system. However, in one embodiment, the System Monitor may command via the Test Bus selected card Resource Monitors to ignore the Local Reset line. This unique feature enables one or more cards to be selectively Reset via this Reset line without interferring with the operation of functioning cards.

Since the Common Bus resource devices and the Local Bus resource devices reside in the same address space, i.e. the Common Bus has a different set of addresses within the same address space than the Local Bus devices, the Local Bus devices must specifically be mapped in this overall address space. The addressed map determines the physical addresses of all devices that reside on the Local Bus as well as determining range of addresses for Common Bus devices. Each of the computer cards on the Local Bus, however, must present a different base address for its onboard memory to the Local Bus. This must be done to allow Local Bus devices such as an Input/Output DMA (Direct Memory Access) device to address these memories uniquely. The Computer card will address its local memory beginning at address 0, but the memory will appear elsewhere in the address space to all other devices on the Local Bus including the other Computer card. For example, two techniques for addressing are 24 bit addressing with the address modifiers and 32 bit addressing. Table I illustrates the address map for a 24 bit address space.

| Address Range | Address Modifiers | Devices |
| --- | --- | --- |
| 000000-0FFFFF | 3A, 3B, 3D, 3E | CPU Onboard Memory |
| 100000-7FFFFF | 3A. 3B, 3D, 3E | Local Memory |
| 800000-DFFFFF | 14, 10 | Common Bus Memory |
| E00000-EFFFFF | 39, 3D | Common I/O |
| F00000-FEFFFF | 39, 3D | Local I/O |
| FF0000-FFFFFF | 29, 2D | Short Addr. Local I/O |

The address modifiers (from the VME bus standard) are standard VME bus address modifiers except for codes 10-17. Code 10 is defined as the Common Memory standard address for privileged data. Code 11 is the Common Input/Output standard address for privileged data. Code 12 is the Common standard address for nonprivileged data and Code 13 is the Common Input/Output standard address for nonprivileged data. Code 14 is the Common Memory extended address for privileged data and Code 15 is the Common Input/Output extended address for privileged memory. Code 16 is the Common Memory extended address for nonpriviledged data and Code 17 is the Common Input/Output extended address for nonpriviledged memory. Table II contains the address space for a Local Bus 32 bit address map.

| Address Range | Device |
| --- | --- |
| 00000000-000FFFFF | CPU Onboard Memory |
| 00100000-7FFFFFFF | Local Memory |
| 80000000-FFDFFFFF | Common Memory |
| FFE00000-FFFFFFFF | Common I/O |
| FFF00000-FFFFFFFF | Local I/O |

When multiple computer cards are used on the Local Bus, a choice may be made on how to handle Local Bus interrupt requests. One technique would be to allow one processor to handle all interrupts and mask all interrupts to the other processor. The other technique would be to split the interrupts according to the interrupt level, with different processors handling different interrupts. It should be noted that these are the interrupts that are provided by the Local Bus through the VME bus specification and do not include the InterComputer Interrupts from the Common Bus Interface which are provided by the dedicated lines previously discussed.

Computer Universal Card

The Computer Universal Card includes a fully functional 32 bit computer. These cards may be implemented in a stand alone mode or used in networks with other computer cards or even as multicomputer units. These computer cards, in the preferred embodiment, are provided as distributed remote controllers serving a multicomputer system. These cards are connected to the Local Bus as previously described.

Figure 4:
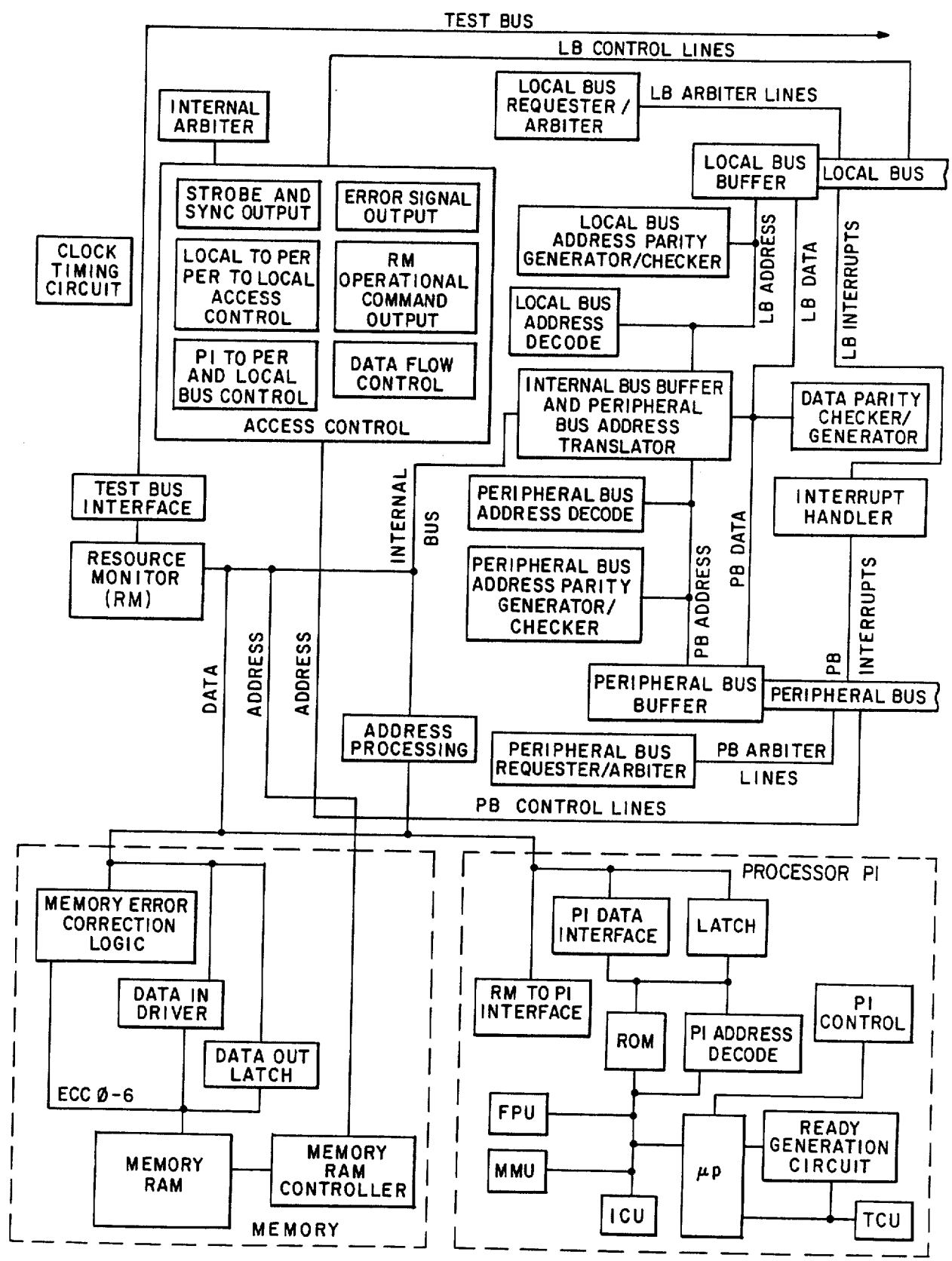
FIG. 4 is a block diagram of the universal computer card.

FIG. 4 is a functional block diagram of the Universal Computer Card. The Universal Computer Card is connected to the Local Bus and Peripheral Bus by the Local Bus Buffer and Peripheral Bus Buffer shown. The Local Bus Card interface includes a Local Bus Requestor/Arbiter, Local Bus Address Parity Generator/Checker and Local Bus Address Decode circuits. The Local Bus Requestor/Arbiter requests access to the Local Bus and when designated by the Resource Monitor acts as the Arbiter for the Local Bus. The Local Bus Address Parity Generator/Checker performs the generation of error detection parity bits for outgoing information and checks parity bits for incoming information from the Local Bus. The Local Bus Address Decode circuit determines when the messages on the Local Bus are destined for this specific Universal Computer Card. The Address Decode, Address Parity Generator/Checker, and Requestor/Arbiter functions are also provided for the Peripheral Bus as shown. Additionally, a Data Parity Check/Generator is connected to the Data Lines from both the Local Bus and the Peripheral Bus and provides the error detection parity bit generation and check functions for the Data Lines. This data information together with the Local Bus Addresses and Peripheral Bus Addresses are cònnected to an Internal Bus Buffer and Peripheral Bus Address Translator which provides access to the remainder of the card through the Internal Bus. The Address translation function of the Internal Bus Buffer enables the Resource Monitor to configure the Universal Computer Card to respond to one set of addresses from the Peripheral Bus to access a resource contained on the Universal Computer Card actually within a different internal address space. In other words, the same resource will be accessed by a first address through the Local Bus and a second address through a Peripheral Bus. This will provide a means to interface with external input/output devices or even external computers connected by the Peripheral Bus that have specific external address requirements that may not be compatible with the existing address space allocations for resources of the Universal Computer Card.

Additionally, an Interrupt Handler circuit is provided to interface to both the Local Bus Interrupts and the Peripheral Bus Interrupts. The Interrupts from the Common Bus (i.e., the InterComputer Interrupts, ICI) are interfaced through the Local Bus. The control of the access to the Local Bus and Peripheral Bus together with the control of access to the Internal Bus is provided by the Access Control functional block.

This Computer Card further includes a Processor P1 which further includes the National Semiconductor 32032 microprocessor family of devices. This microprocessor has its own ROM (as shown) and is connected to the Internal Address and data Bus through a P1 Data Interface and a Latch. Addressing of the P1 processor is provided through the Address Processing functional block also shown. Additionally, the Universal Computer Card includes a Memory Block with a Memory RAM Controller connected to the Address Bus and the actual Memory RAM connected through a Data In Driver and Data Out Latch to the data lines of the Internal Bus. The memory also includes Memory Error Correction Logic.

The Resource Monitor is connected to the External Test Bus through the Test Bus Interface and through the Resource Monitor Bus is able to initialize, control and evaluate the performance of the different functional areas of the Universal Computer Card. Lastly, this card includes the Clock Timing circuit to provide synchroneous timing of all the functions on the card. It should be noted that FIG. 4 does not illustrate the internal control line connections. These connections are illustrated in the individual figures for each of the functional blocks.

Figure 5:
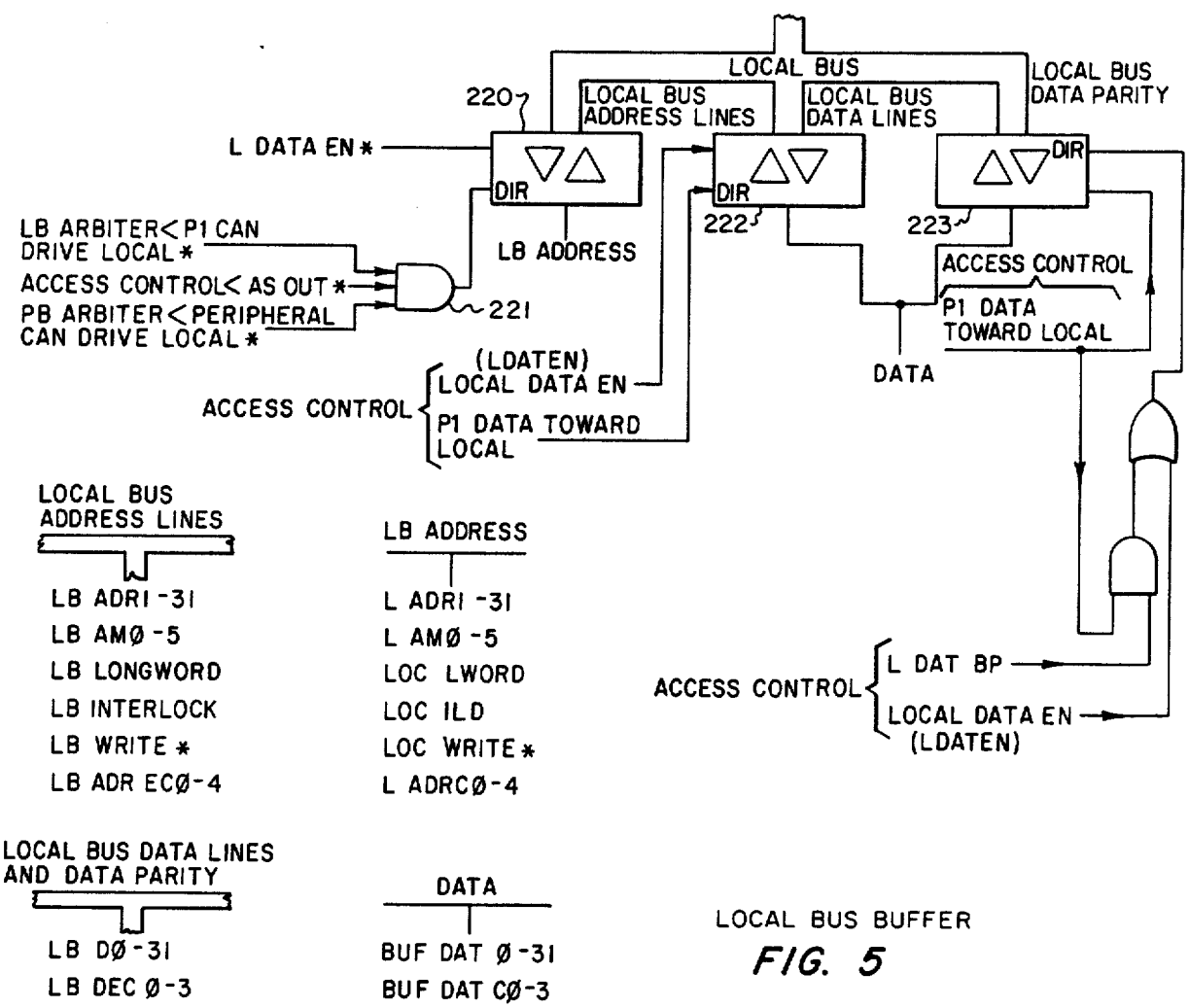
FIG. 5 is a schematic diagram of the computer card Local Bus buffer.

FIG. 5 discloses the Local Bus Buffer circuitry. This circuitry includes a bidirectional Address Driver 220 connected to the Local Bus and controlled by the LOCAL DATA ENABLE (LDATEN), and AND gate 221 which provides the buffer direction as a function of P1 CAN DRIVE LOCAL, LOCAL ADDRESS STROBE OUT (L AS OUT), and PERIPHERAL CAN DRIVE LOCAL signals. The LOCAL DATA EN and P1 DATA TOWARD LOCAL control the Local Bus Data line bidirectional buffer 222. Buffer 223 provided for the Local Bus Data parity is enabled by the signal P1 DATA TOWARD LOCAL and the direction of information flow of this bidirectional buffer is provided as a combinational logic function of P1 DATA TOWARD LOCAL and the LOCAL DATA BYTE PARITY (L DAT BP) and LOCAL DATA EN signals.

Figure 6:
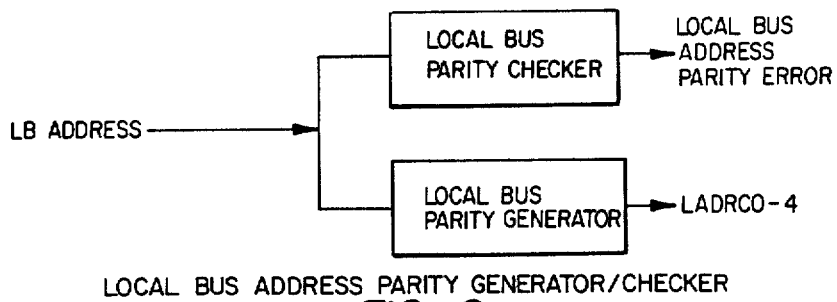
FIG. 6 is a block diagram of the computer card Local Bus address parity/generator checker.

FIG. 6 illustrates the generation of the Local Bus Address Parity on line L ADRC0-4 and the LOCAL BUS ADDRESS PARITY ERROR from the LB ADDRESS.

Figure 7:
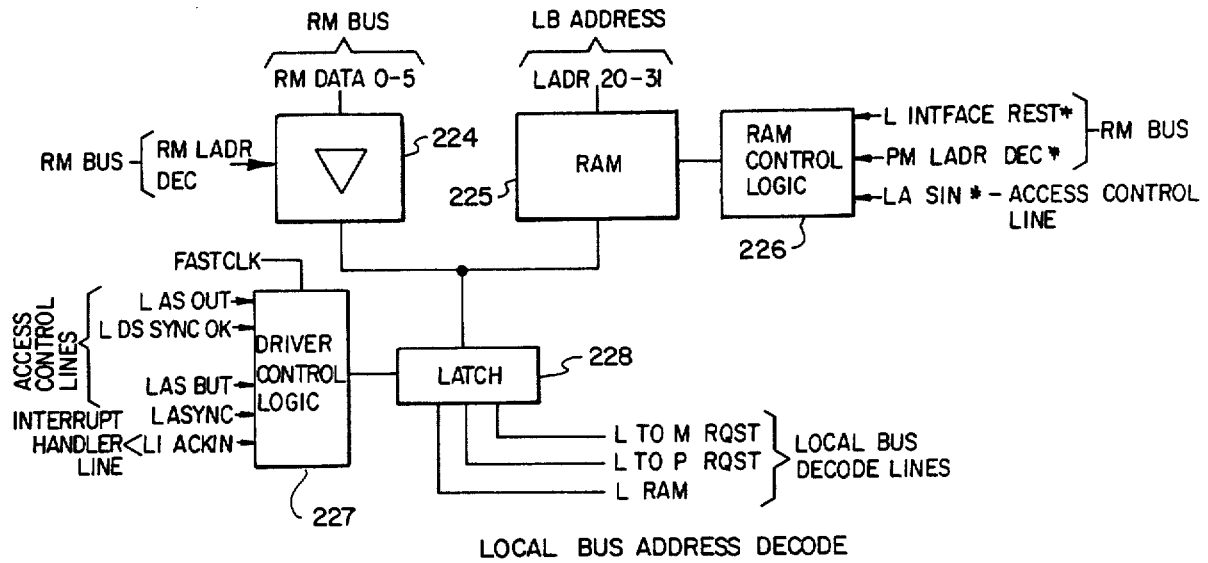
FIG. 7 is a block diagram of the computer card Local Bus address decode circuit.

FIG. 7 illustrates the Address Decoding circuitry for the Local Bus. The addresses are received to the RAM 225 and decoded to provide one of three decode line signals, LOCAL TO MEMORY REQUEST (L TO M RQST), LOCAL TO PERIPHERAL REQUEST (L TO P RQST), or LOCAL RAM (L RAM). The LOCAM RAM signal is used to designate specific areas of the card MEMORY RAM. The functioning of the RAM 225 is controlled by the RAM control logic 226 with inputs from the RM Bus and Access Control as shown. The output latch 228 of the Local Bus decode lines is controlled by driver control logic 227 with inputs from the Interrupt Handler and the Access Control Function. The driver control logic 227 is provided to synchronize the operation of latch 228 with the internal clock FASTCLK. The Resource Monitor controls the Address Decode function by designating the contents of the RAM 225. This is done upon initialization of the card wherein the Resource Monitor loads data into RAM 225 through buffer 224 controlled by the RESOURCE MONITOR LOCAL ADDRESS DECODE (RM L ADR DEC) signal. Therefore, the different decode lines may be software programmable to respond to different Local Bus addresses. In the initialization mode the RAM control logic 226 and driver 224 are controlled by the Resource Monitor to load the RAM 225 with data from the Resource Monitor Data Bus. After initialization the RAM control logic 226 is controlled by the access control function of the card and the RAM is used in a READ ONLY mode wherein the address information L ADR 20-31 is used to address specific data within the RAM 225 that determines the output of the address decode latch 228. In the preferred embodiment, RAM 225 is a 74S189 bipolar RAM that provides tristate output. Therefore, there are no special strobes required but merely the enables from RAM control logic.

Figure 9:
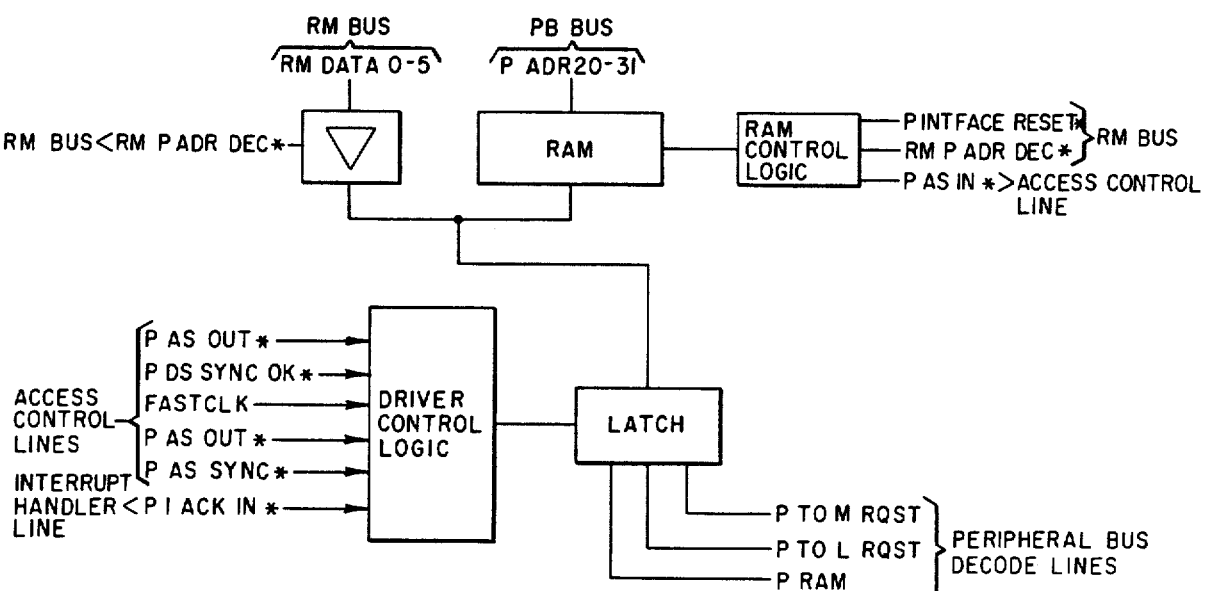
FIG. 9 is a block diagram of the computer card Peripheral Bus address decode circuit.
Figure 8:
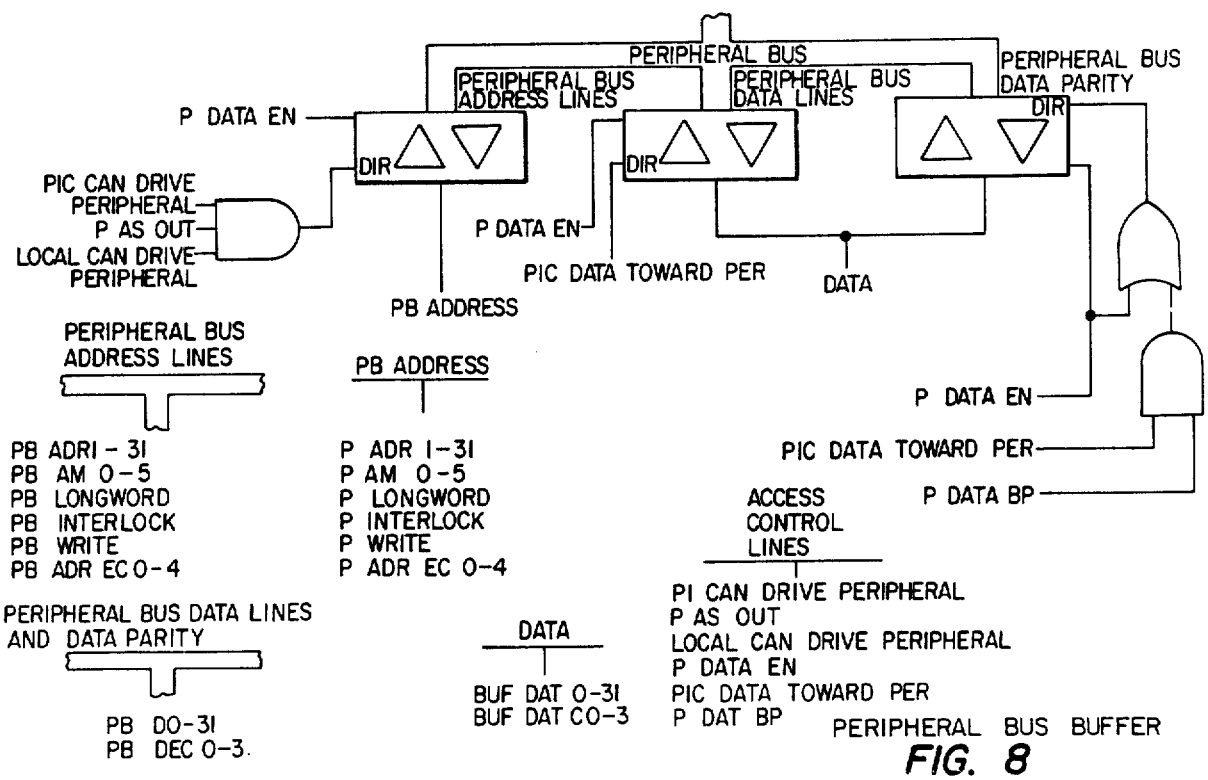
FIG. 8 is a schematic diagram of the computer card Peripheral Bus buffer.
Figure 10:
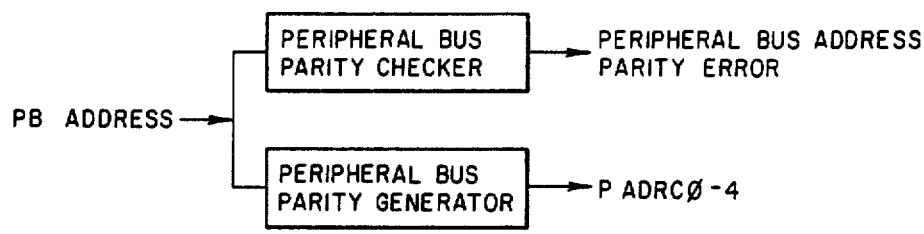
FIG. 10 is a block diagram of the computer card Peripheral Bus address parity generator/checker.

FIG. 8 illustrates the Peripheral Bus buffer. The circuitry for this buffer is similar to that disclosed in FIG. 5 with the different control signals indicated. Likewise, in FIG. 9, the Peripheral Bus Address Decode circuitry is illustrated and is also similar to the Local Bus Address Decode Circuitry of FIG. 7 in operation with the different signals indicated. The Peripheral Bus Address Parity Generator/Checker is illustrated in FIG. 10 and produces the PERIPHERAL BUS ADDRESS PARITY ERROR and the PERIPHERAL BUS ADDRESS PARITY signals (P ADRCO-4).

Figure 11:
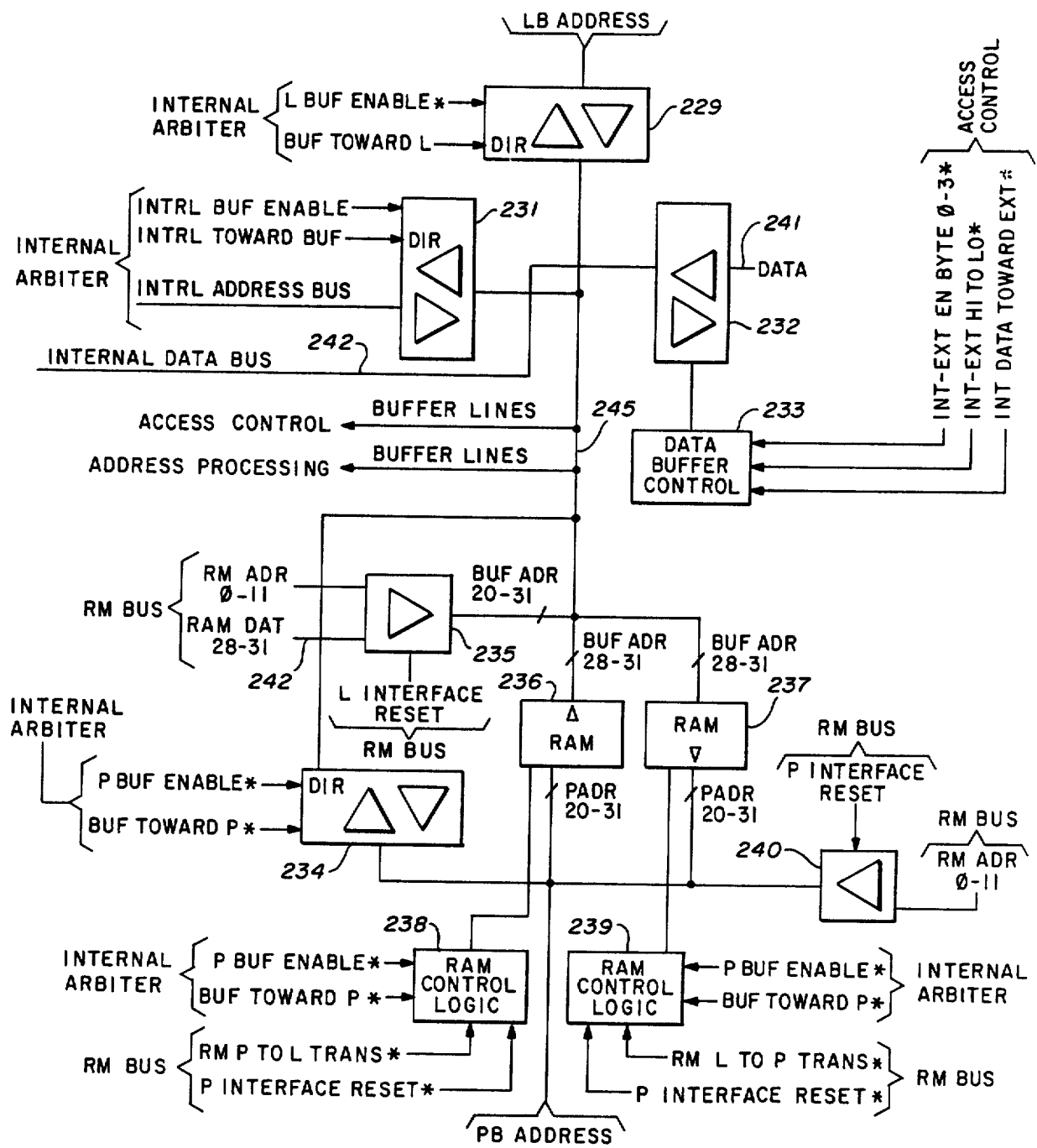
FIG. 11 is a schematic diagram of the computer card internal bus buffer and Peripheral Bus address translation circuit.

FIG. 11 illustrates the Internal Bus buffer and Peripheral Bus Address translation circuitry. Buffer 229 is a bidirectional buffer controlled by the Internal Arbiter as shown and connects the Local Bus Address line to the Internal Address buffer 231. The Data buffer 232 is also controlled by the Data Buffer Control 233 from Access Control with signals as shown. The data line 241 is connected to both the Peripheral Bus and the Local Bus as previously discussed. This data is input to the bidirectional buffer 232 which provides data over the Internal Data Bus 242. The Peripheral Bus Address lines are connected to a bidirectional buffer 234 and two RAMS 236 and 237. The Internal Arbiter controls the bidirectional buffer 234. RAMS 236 and 237 provide the address translation function previously discussed. During initialization the Resource Monitor is able to load the contents of RAMS 236 and 237 via driver 235 and the Resource Monitor Data line 242. By loading data at prescribed address location in RAMS 236 and 237, the Resource Monitor is able to provide the address translation by providing the means to change the address from the Peripheral Bus address lines to the address the Resource Monitor loaded data prescribes. This translated address will be output on the address lines 245 connected to the Internal Address buffer 231. The information on lines 245 is the translated address. RAMS 236 and 237 are bipolar RAMS similar to the RAM 225 of the Local Bus Address controller previously discussed and are controlled by the RAM control logic circuits 238 and 239 to provide data input during initialization and output translated addresses during normal operation.

Figure 12:
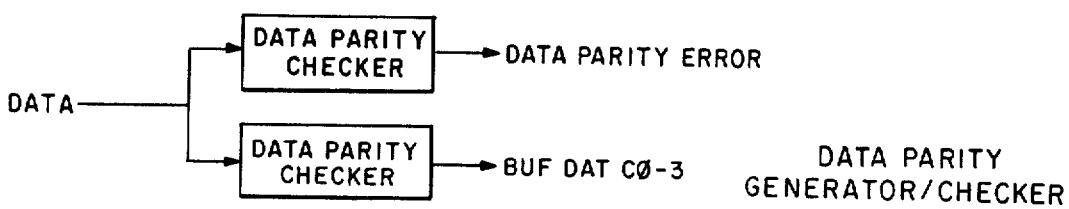
FIG. 12 is a block diagram of the computer card data parity generator/checker.

FIG. 12 illustrates the Data Parity Generator/Checker which is similar to the Parity Generator/Checker for the Local Bus and the Peripheral Bus previously discussed.

Figure 13:
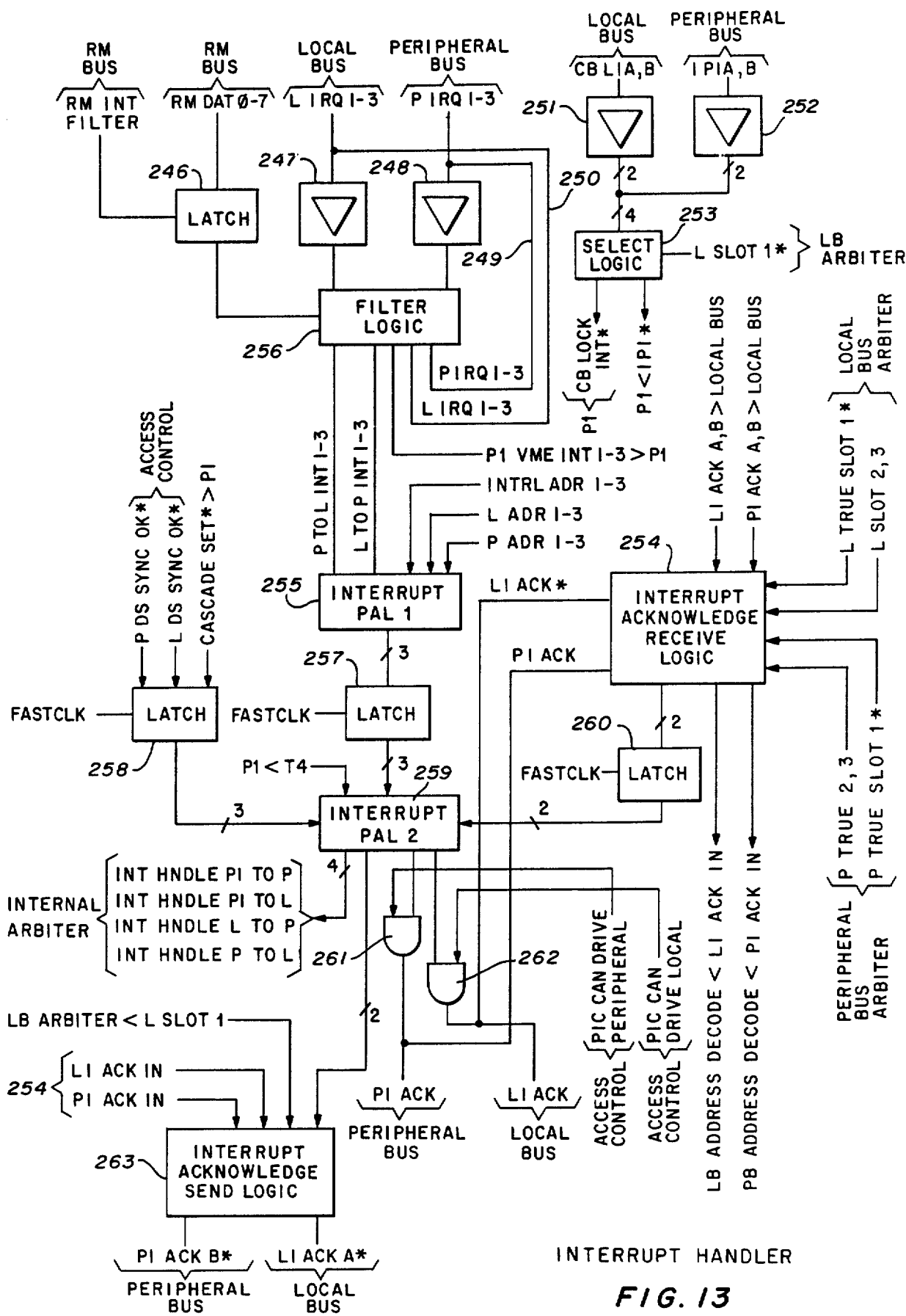
FIG. 13 is a schematic diagram of the computer card interrupt handler.

The Interrupt Handler logic is illustrated in FIG. 13. The Interrupt Handler interfaces to the LOCAL BUS INTERRUPTS (LIRQ1-3) and the PERIPHERAL BUS INTERRUPTS (PIRQ1-3) through drivers 247 and 248. Additionally, the Interrupt Handler interfaces to the CONTROL BUS INTERRUPTS (CBLIA,B) obtained from the Local Bus lines and the equivalent interrupts (IPIA,B) obtained from the Peripheral Bus lines input to buffers 251 and 252 respectively. These interrupt signals are connected to Select logic 253 to output the appropriate signals through the processor P1 indicating the occurrence of a system interrupt. LIRQ1-3 and PIRQ1-3 are input through buffers 247 and 248 respectively to a filter 256. The operation of this filter is controlled by the Resource Monitor through latch 246. During initialization the Resource Monitor through latch 246 will set the contents of the filter logic 256. The operation of this filter is controlled by the Resource Monitor through latch 246. During initialization the Resource Monitor through latch 246 will set the contents of the filter logic 256. In the preferred embodiment, filter logic 256 includes AND gates which are enabled by the contents of latch 246. The output of the filter logic 256 includes lines 249 and 250 which provide for the retransmission of Interrupts LIRQ1-3 and PIRQ1-3 over lines 249 and 250 as shown. The output of filter logic 256 is also connected to the INTERRUPT HANDLER PAL (PROGRAMMED ARRAY LOGIC) 255. In operation Interrupt PAL 255 receives three sets of inputs. The lower 3 bits of the internal address, the Local Bus Address and the Peripheral Bus Address. These bits are used to identify the level of interrupt. In the preferred embodiment only 3 levels of interrupts are interfaced even though the VME specification includes 7 possible interrupt levels. The output of Interrupt PAL 255 provides the description of the interrupt. These 3 possibilities are (1) the Internal Processor P1, serving an interrupt from either the Peripheral or Local Bus, (2) a device on the Local Bus serving an interrupt from the Peripheral Bus (i.e. the Interrupt Handler is serving as the agent for handling the interrupt to the device on the Local Bus), (3) a device on the Peripheral Bus serving an interrupt from a device on the Local Bus (i.e. the Interrupt Handler acting as an agent for the Peripheral Bus device). This Interrupt PAL 255 thus acts as an interrupt decoder to determine if the logic on this Universal Card is to respond to the interrupt. In other words, if the interrupt is not intended for this specific Universal Card, the Interrupt Handler logic acts in a daisy chain fashion as specified by the VME Bus specification. The output of Interrupt PAL 255 is input to latch 257 which provides synchronization with the board clock to synchronize the input t the Interrupt Control PAL 259. The Interrupt Control PAL provides an output to the internal arbiter of INTERRUPT HANDLER P1 to PERIPHERAL BUS (INT HAN- DLE P1 TO P), INTERRUPT HANDLER P1 to LOCAL BUS (INT HANDLE P1 TO L), INTERRUPT HANDLER LOCAL BUS TO PERIPHERAL BUS (INT HANDLE L TO P), and INTERRUPT HANDLER PERIPHERAL BUS to LOCAL BUS (INT HANDLE P TO L). The Interrupt Control PAL 259 is connected to the Interrupt Acknowledge Receive Logi 254 which provides the ACKNOWLEDGE signal input, the card address, and signals signifying reception of the ACKNOWLEDGE input signals to the address decode circuits and provide acknowledge information to the Interrupt Control PAL 259 so that in addition to providing the signals to the Internal Arbiter the Interrupt Control PAL 259 can provide the INTERRUPT ACKNOWLEDGE signals to the INTERRUPT ACKNOWLEDGE SEND LOGIC 263 and the two AND gates 261 and 262 to provide both the acknowledgement of a received interrupt and to perform the VME specified daisy chain function previously discussed. The Interrupt Control PAL 259 is further connected to latch 258 so that the output of the Control PAL 259 to the Internal Arbter will be synchronized. The contents of the Interrupt Handler PAL 255 and the Interrupt Control PAL 259 are contained in the Appendix C.

Figure 14:
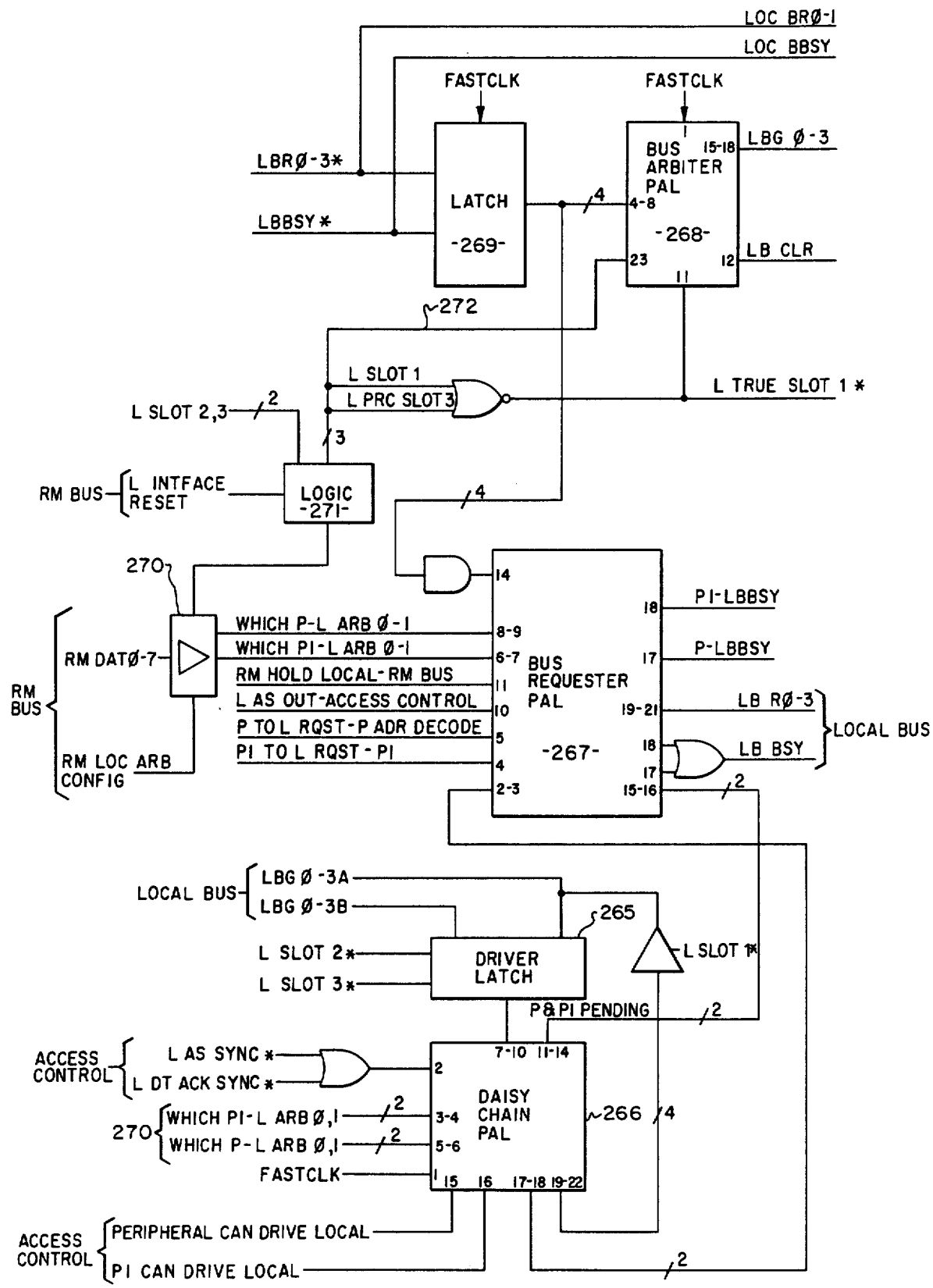
FIG. 14 is a schematic diagram of the computer card Local Bus requester/arbiter circuit.
Figure 15:
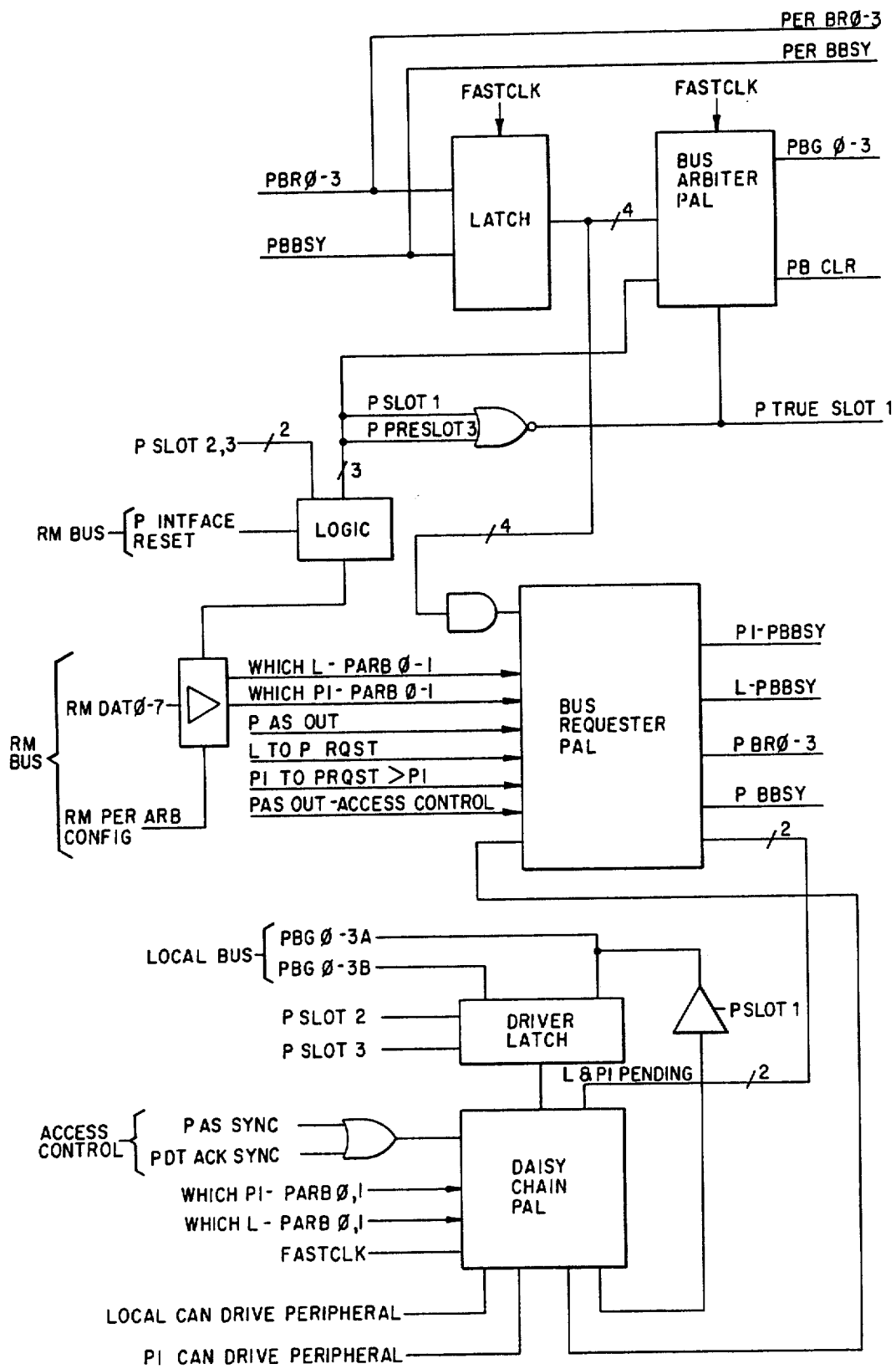
FIG. 15 is a schematic diagram of the computer card Peripheral Bus requester/arbiter circuit.

FIGS. 14 and 15 illustrate the Local Bus Requestor/Arbiter and Peritheral Bus Requestor/Arbiter. Since the Requestor/Arbiter circuit is basically the same for both the Local Bus and the Peripheral Bus (with different control signals is shown) only the Local Bus Requestor/Arbiter of FIG. 14 will be discussed. The Local Bus Requestor includes a Bus Requestor PAL 267 that receives requests for the Local Bus from the P1 processor, the Peripheral Address Decode circuit, and the Access Control circuit. The Resource Monitor is also connected to Bus Requestor PAL 267 bus provides data input through buffer 270 specify which of the bus request lines are to be used by this Universal Card. The output of Bus Requestor PAL 267 are the REQUESTS and BUSY signals for the Peripheral and Local Buses. Bus Requestor PAL 267 is also connected to a Daisy Chain PAL 266 further connected to driver latch 265 connected to receive the Local Bus Grants from the Local Bus The Daisy Chain PAL 266 provides the Daisy Chain function specified by the VME Bus protocol to pass on any bus grants that are not intended for this specific card. The RM Bus is further connected to Bus Arbiter PAL 268 which provides the arbitration function for the Local Bus, if so designated by the Resource Monitor. It should be noted that the Resource Monitor can change the arbitration sequence within Bus Arbiter PAL 268 to be either a round robin arbitration or a priority arbitration as designated by line 272 from the Resource Monitor. The Bus Arbiter PAL 268 receives the arbitration selection from latch 271 which includes the Resource Monitor data lines, the Local Bus interface reset signal and the card slot location information. The contents of Bus Arbiter PAL 268 and Bus Requestor PAL 267 are contained in Appendix C. It should be noted that the Bus Requestor PAL contents merely implements the VME Requestor functions as outlined in the VME specification. The Daisy Chain PAL 266 also implements the daisy chain function of the VME Bus as specified passing on bus grants not intended for this card but indicating the reception of bus grants for this card by the connection to Bus Requestor PAL 267.

Figure 16:
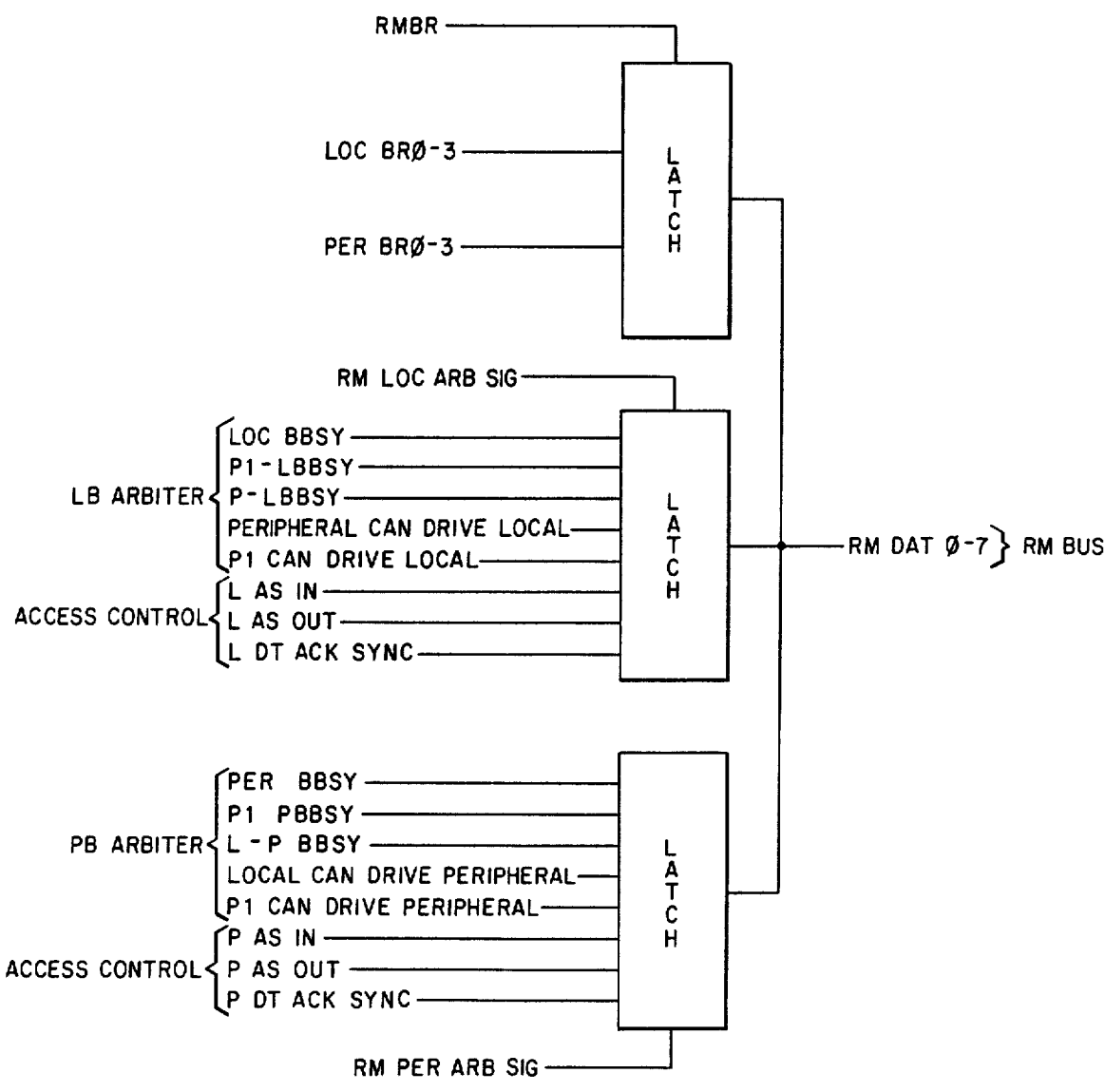
FIG. 16 is a schematic diagram of the computer card resource monitoring circuitry for the Local Bus and Peripheral Bus requester/arbiter circuits.

FIG. 16 illustrates the RM monitoring circuitry for the Local Bus and Perithperal Bus Requestor/Arbiters. This circuitry provides for the specific output signals from these arbiters to be input as data over the RM Bus.

Figure 17:
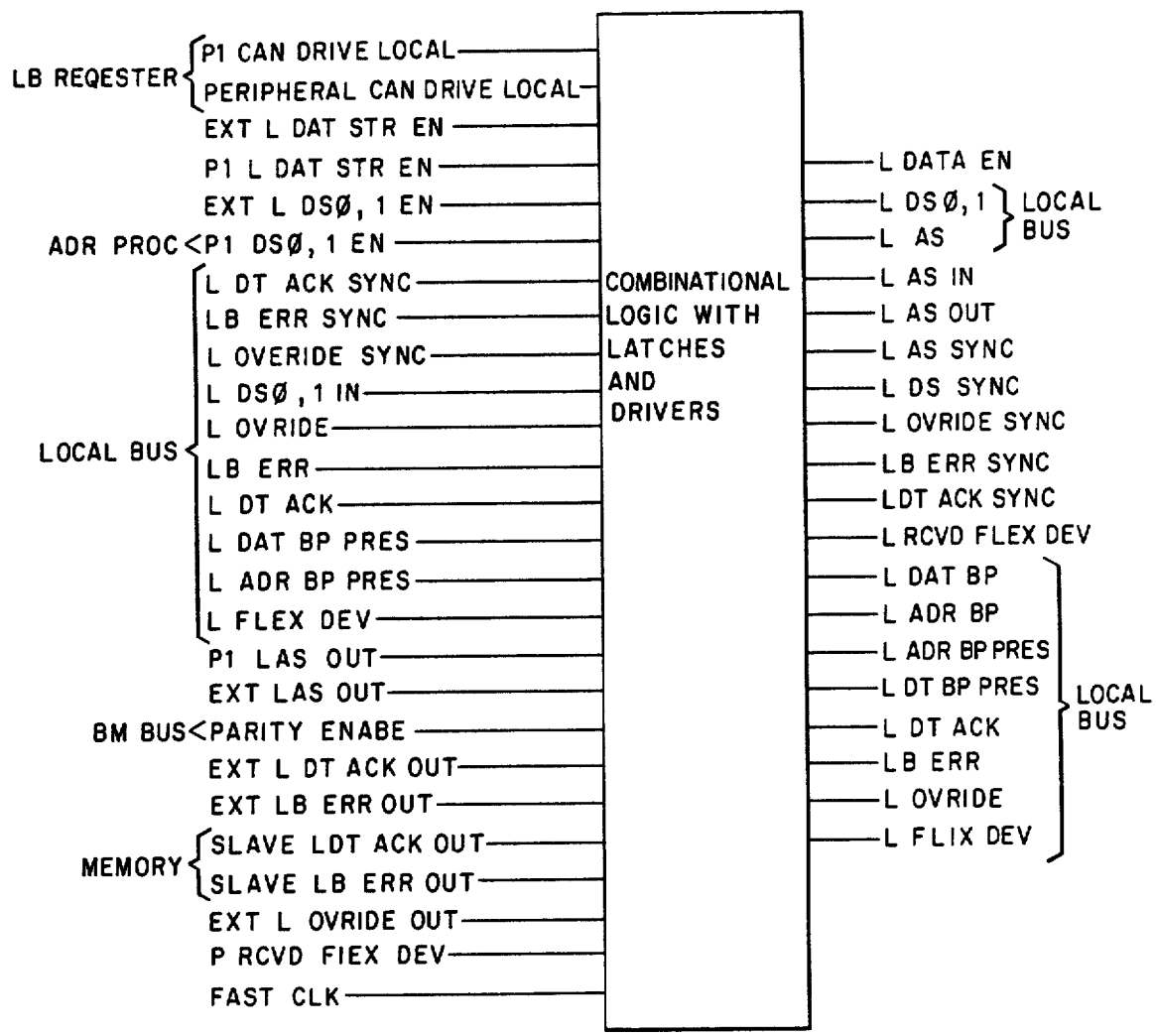
FIG. 17 is a block diagram illustrating the access control strobe and sync signal outputs for the Local Bus.
Figure 18:
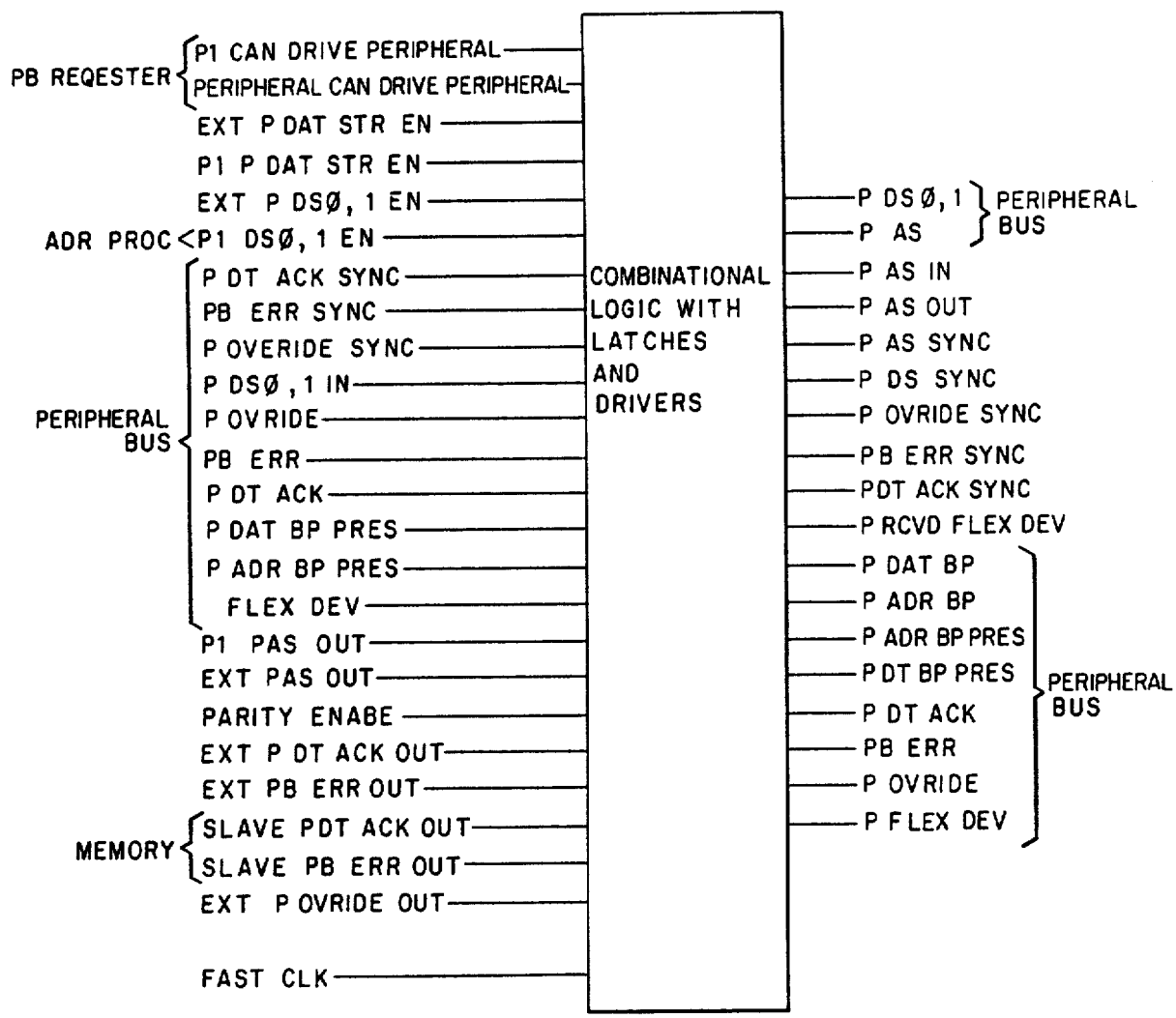
FIG. 18 is a block diagram illustrating the access control strobe and sync signal outputs for the Peripheral Bus.

In the Access Control circuit, FIGS. 17 and 18 illustrate the functional signal inputs and outputs for the Local Bus and Peripheral Bus Strobe and Sync logic. The contents of both FIGS. 17 and 18 provide these signals as prescribed by the VME Bus Protocol. Additionally, in FIG. 17, the DATA ENABLE (L DATA EN), the LOCAL ADDRESS STROBE OUT (L AS OUT), the LOCAL BUS ADDRESS STROBE SYNC (L AS SYNC), the LOCAL BUS DATA SYNC (L DS SYNC), LOCAL BUS OVERRIDE SYNC (L OVRIDE SYNC), LOCAL BUS ERROR SYNC (LB ERR SYNC), LOCAL BUS DATA ACKNOWLEDGE SYNC (L DT ACK SYNC), and the LOCAL BUS RECEIVE FLEX DEVICE (L RCVD FLEX DEV) signals are provided. Similar signals are provided in FIG. 18 for the Peripheral Bus. The timing for the LOCAL BUS ADDRESS BYTE PARITY (L ADR BP) and the LOCAL BUS BYTE PARITY PRESENT (L ADR BP PRES) signals are the same as the timing for the address signals. The timing for the LOCAL BUS DATA BYTE PARITY (L DAT BP) and the LOCAL BUS DATA BYTE PARITY PRESENT signal (L DAT BP PRES) is the same as the timing for the data signals The LOCAL BUS FLEX DEVICE (L FLEX DEV) and LOCAL BUS RECEIVED FLEX DEVICE (L RCVD FLEX DEV) signals is the same as the other address signals. The timing for the OVERRIDE signals (L OVRIDE SYNC) and (L OVRIDE) signals is the same as the BUS ERROR signals for the VME protocol. This timing is true for the signals provided in FIG. 18 for the Peripheral Bus. Even though the Peripheral Bus is normally discussed in terms of a strict VME Bus protocol, the Peripheral Bus interface on the Universal Card is provided to enable interfacing to a device that will provide these extra signals that permit the additional bus capabilities provided.

Figure 19:
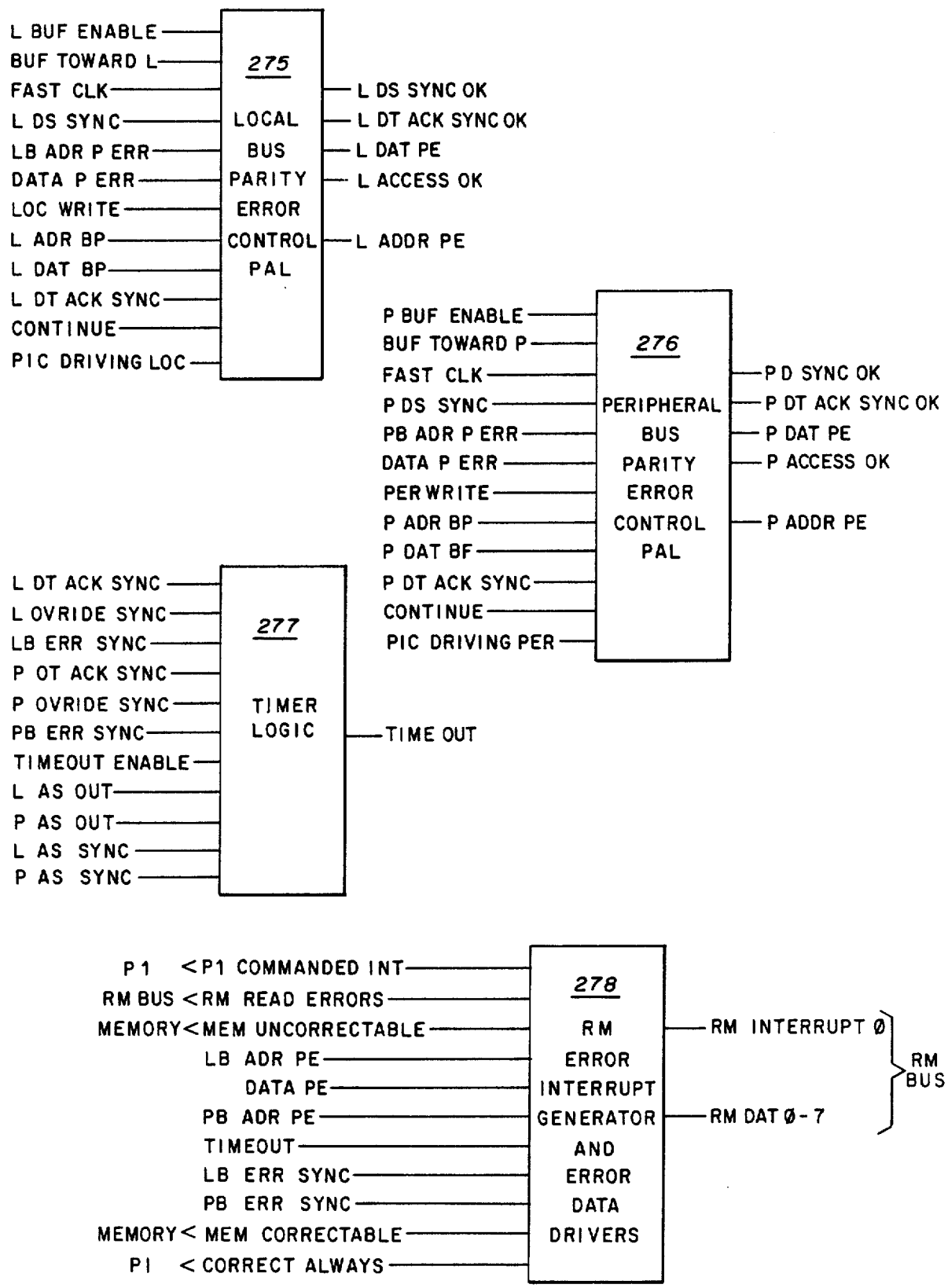
FIG. 19 is a block diagram illustrating the access control error signal output.

FIG. 19 illustrates the input and output signals for several PALs whose contents are contained within Appendix C. PAL 275 and 276 are the Local Bus Parity Error control and Peripheral Bus Parity Error control PALs. These circuits provide the control signals as shown. The Local Bus Parity Control PAL 275 provides the LOCAL BUS DATA STROBE SYNC OKAY (L DS SYNC OK) signal indicating the valid reception of address and data information from another master. The LOCAL BUS DATA ACKNOWLEDGE SYNC OKAY (L DT ACK SYNC OKAY) signal indicates that this card is the master and this card has received a valid acknowledge from the slave device. The LOCAL BUS DATA PARITY ERROR (L DAT PE) and LOCAL BUS ADDRESS PARITY ERROR (L ADDR PE) signals indicate the occurrence of address and parity errors. The LOCAL BUS ACCESS OKAY (L ACCESS OKAY) signal indicates the reception of a valid data synchronization signal and is provided as a go ahead to the on card memory. Timer logic 277 provides a TIMEOUT signal then the card is in the master mode and has transmitted a request and has not received an Acknowledge within a specified time. The TIMEOUT signal merely signifies an error condition on the bus. The Resource Monitor Error Interrupt Generator and Error Data Driver logic 278 provides an interrupt to the Resource Monitor upon the occurrence of several error conditions that are listed as inputs. In the preferred embodiment logic 278 includes and OR logic function of these error conditions together with a means to provide the Resource Monitor data word indicating the occurrence of the error conditions.

Figure 20B:
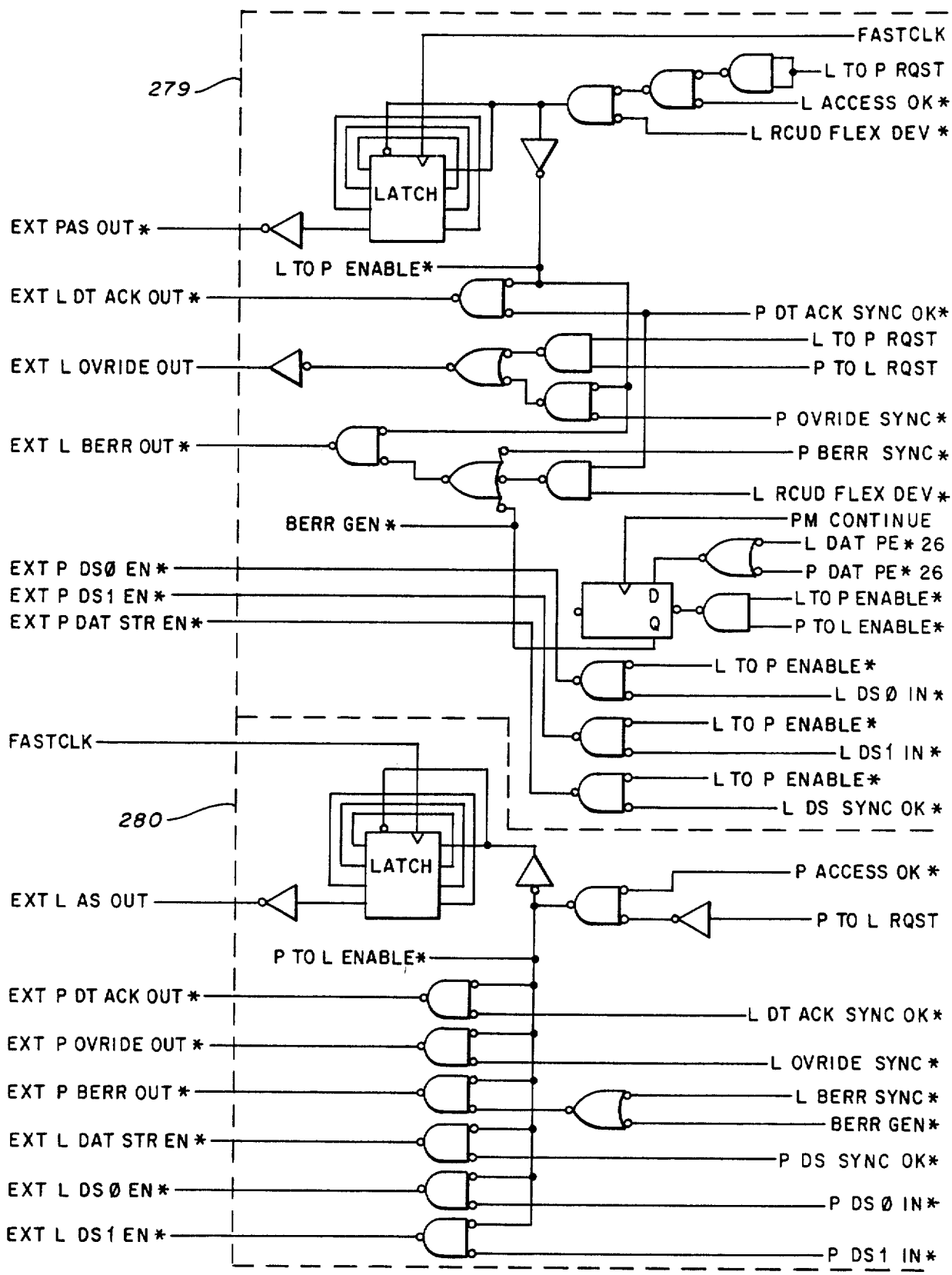
FIG. 20B is a schematic diagram of blocks 279 and 280 of FIG. 20A.

FIG. 20A illustrates the Local to Peripheral and Peripheral to Local Access control and combination logic that provides the control signals shown enabling advice on the Local Bus to access the Peripheral Bus and a device on the Peripheral Bus to access the Local Bus. Both the circuits in 279 and 280 provide the output signals in conformance with the VME bus protocol. In other words, the logic 279 and 280 performs the interface function allowing as an example to Local Bus device to appropriately interface to the Peripheral Bus. FIG. 20B is the schematic diagram of logic 279 and 280.

FIG. 21 illustrates the generation of the illustrated command signals from the Resource Monitor Data bus.

FIG. 22 illustrates the P1 to Local Bus or Peripheral Bus signal PAL 282 and the P1 access complete to Peripheral Bus or Local Bus PAL 283. In simple terms, PALs 282 and 283 provide the P1 processor means to access either the Local Bus or Peripheral Bus by performing the VME protocol as per the VME bus specification. Specifically, the PAL 282 provides the address and data strobes out and look for the acknowledge back from the Peripheral or Local Buses via the DATA ACKNOWLEDGE OVERRIDE or BUS ERROR signals. The PAL 282 then provides the ACCESS THROUGH signal which is connected to PAL 283. PAL 283 examines the condition status of the access to determine if the access is in fact complete by looking for an override, a multi-access or an interlock condition. In an override condition the process will not continue. In a multiple access the logic outputs signal to REPEAT THE ACCESS (REPEAT P1 ACCESS). In an interlock mode the address strobe line will remain down preventing other devices from using that bus. The contents of PALs 282 and 283 are contained in Appendix C.

FIG. 23 illustrates the access Control Data Control Signal logic. The Peripheral or Local Bus to Memory Data Flow Control Logic 284 is connected to combination logic 286 which is also connected to the P1 to memory data control logic 287. Combinational logic 286 produces a READ-MODIFY-WRITE signal and the DON'T MODIFY signals for the memory. Logic 284 is also connected to the Internal to Local or Peripheral Bus Data Flow Control logic 285 and provides the access control signals to permit access to the Local and Peripheral Bus from the internal card resources. The Peripheral or Local Bus to memory data flow control logic 284 specifically tells the memory error control logic and memory control logic how to handle this access since the capability is provide on this card to do a 16 bit write into a 32 bit address space requiring a READ-MODIFY WRITE condition where the first 16 bits are read then the error correction data is computed for the first 16 bits with the second 16 bits to be written into the memory and lastly the full 32 bit corrected data is written into the memory. Logic 284 also provides signals to the Internal to Local or Peripheral Bus Data Flow Control Logic 285 which merely provides the directional signals and buffer enable signals to facilitate data flow on the card. The P1 to memory data control logic 287 provides an interface between the P1 processor and the memory control to enable the P1 processor to access memory. The combinational logic 286 produces the DON'T MODIFY signals to prevent access during a READ-MODIFY WRITE (RMW) operation as discussed. The bus data driver control logic 288 controls the enable and direction of the data buffer and insures that the buffer is not turned on until the addressed on the buses have been decoded to determine the data is actually being sent to the card.

FIG. 24 illustrates the internal arbiter and consists of combinational logic 290 connected to latch 291 and further connected to an internal arbiter PAL 289. Combinational logic 290 performs a preliminary arbitration function by preventing a condition which includes three possible contingents. Therefore the internal arbiter PAL 289 connected to the combinational logic 290 will only have to arbitrate between two contingents. The latch 291 provides the request signals illustrated synchronized with the internal timing. The internal arbiter PAL 289 provides for the processor P1 to have top priority and also provides P1 priority when there are no contingents for the bus. The outputs of PAL 289 are enable and direction lines to the appropriate buffers. The combination of these enable lines is also used by the logic on the card to signify events. The contents of the internal arbiter PAL 289 is contained in Appendix C.

Figure 25:
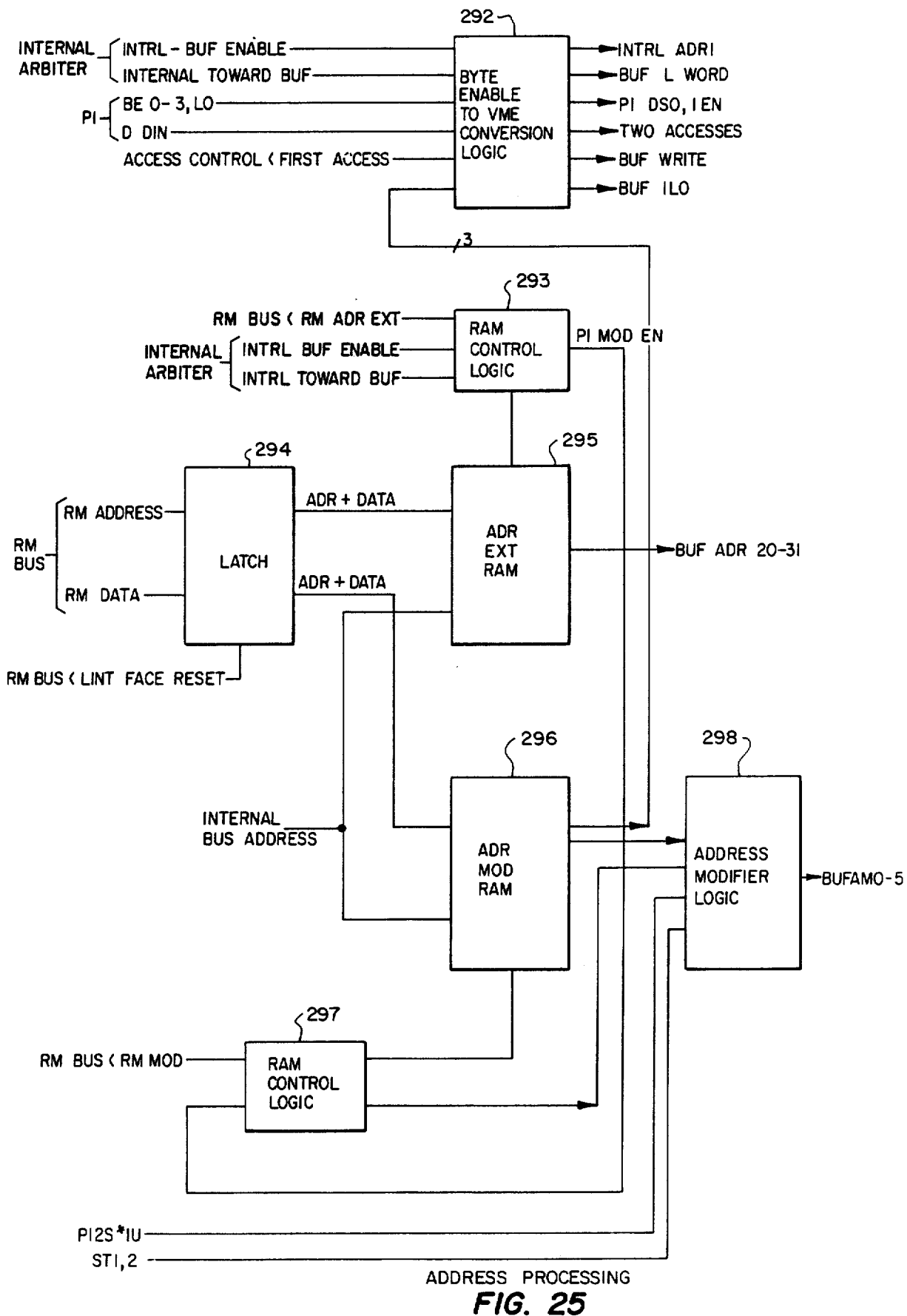
FIG. 25 is a schematic block diagram of the computer card address processing circuitry.

FIG. 25 illustrates the Address Processing circuitry which provides for the Address Interface between the Internal Bus and the Bus for the processor P1. In this preferred embodiment, the process P1 includes a 24 bit Address Bus, but the Internal Arbiter is a 32 bit Address Bus. The Address Processing circuitry provides this additional 8 bit addressing. The additional 8 bit addressing is provided by RAM 295 which is initialized by the Resource Monitor through latch 294. Since the P1 processor provides a 24 bit bus and the VME bus is a 32 bit bus the additional 8 bits are used to enable the output of the P1 processor to be contained in 1 megabyte blocks that may be addressed in a noncontiguous fashion within a gigabyte address space. Normally, a function of this type would be preselected by the user setting dip switch positions. In this preferred embodiment, the RAM 295 is programmed by the Resource Monitor to perform the same function in a software manner. This enables several processors communicating to each other to each access different 1 megabyte blocks of the 4 gigabyte address space. The address modifier RAM 296 is provided to interface with the address modifier logic 298 to provide the VME specified address modifier bits BUFAM0-5. The address modifier is specified in the VME bus specification and is used to describe the type of access (i.e. input/output, supervisory access, etc.). RAM control logic 293 and 297 are used to control the address extension RAM 295 and address modifier RAM 296 respectively in initializing the contents of these RAMS through the Resource Monitor Bus containing the address and data through latch 294. The address modifier logic 298 is further connected to P1 to receive the SUPERVISORY ACCESS/USER ACCESS (S/U) signal and the STATUS BITS (ST1, 2) signals used by the address modifier logic to set BUFAM0-5. One output from the address modifier RAM 296 is provided to the bit enable to VME conversion logic 292. This logic is provided to interface to the processor P1 to take the byte enable output of the processor P1 and provide the DATA STROBE signals (DS 0,1) and the long word indication to the VME Bus. In addition, this logic is useful in providing for interfacing to a 16 bit VME Bus or a 32 bit VME Bus. In the case of a 16 bit VME Bus, 2 accesses may be required to access a 32 bit word. This indication is provided by the logic 292. The combination of the byte enable to VME conversion logic 292 and the remainder of the address processing circuitry make it possible to access 16 bit address buses or 32 bit address buses on 1 megabyte address boundaries. In other words, the Resource Monitor can specify that within a one megabyte boundary that the data contained therein is 16 bits of length or 32 bits of length.

Figure 26:
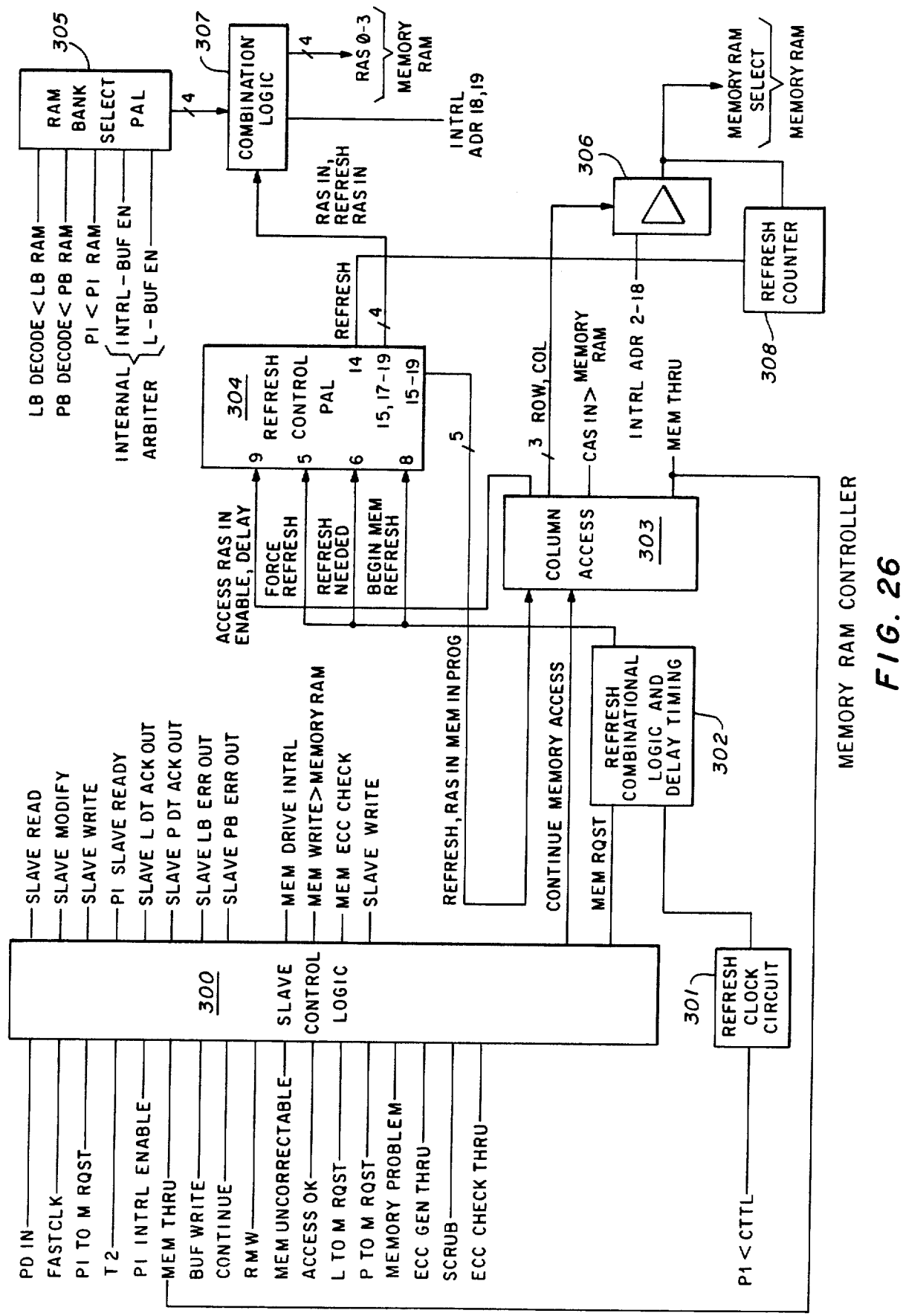
FIG. 26 is a block diagram of the computer card memory RAM controller circuitry.

The memory RAM controller is illustrated in FIG. 26 and consists of the slave control logic 300 that provides an interface to the processor P1, the Peripheral Bus, and the Local Bus to the memory controller. The slave control logic 300 thus provides the signals to the memory circuitry to enable either of the three devices to access the memory. Furthermore, the slave control logic provides the means for any of these three devices to perform the READ-MODIFY-WRITE operation that is required then accessing 16 bits of a 32 bit word as previously described. Refresh clock circuit 301 provides the REFRESH signal at the rate required by the memory for one row at a time. The remaining memory RAM control circuitry provides access to the memory RAM plus performing the REFRESH function. This controller logic implements this function by causing an access to the RAM on the beginning of every operation. If the RAM is actually accessed then this circuitry provides the control signals for such an access and since the memory will not be accessed again within a certain period defined by the operation cycle of the circuitry, the memory is refreshed during this period after access if required. If the operation is not an access of the memory then this circuitry provides a REFRESH signal.

Figure 27:
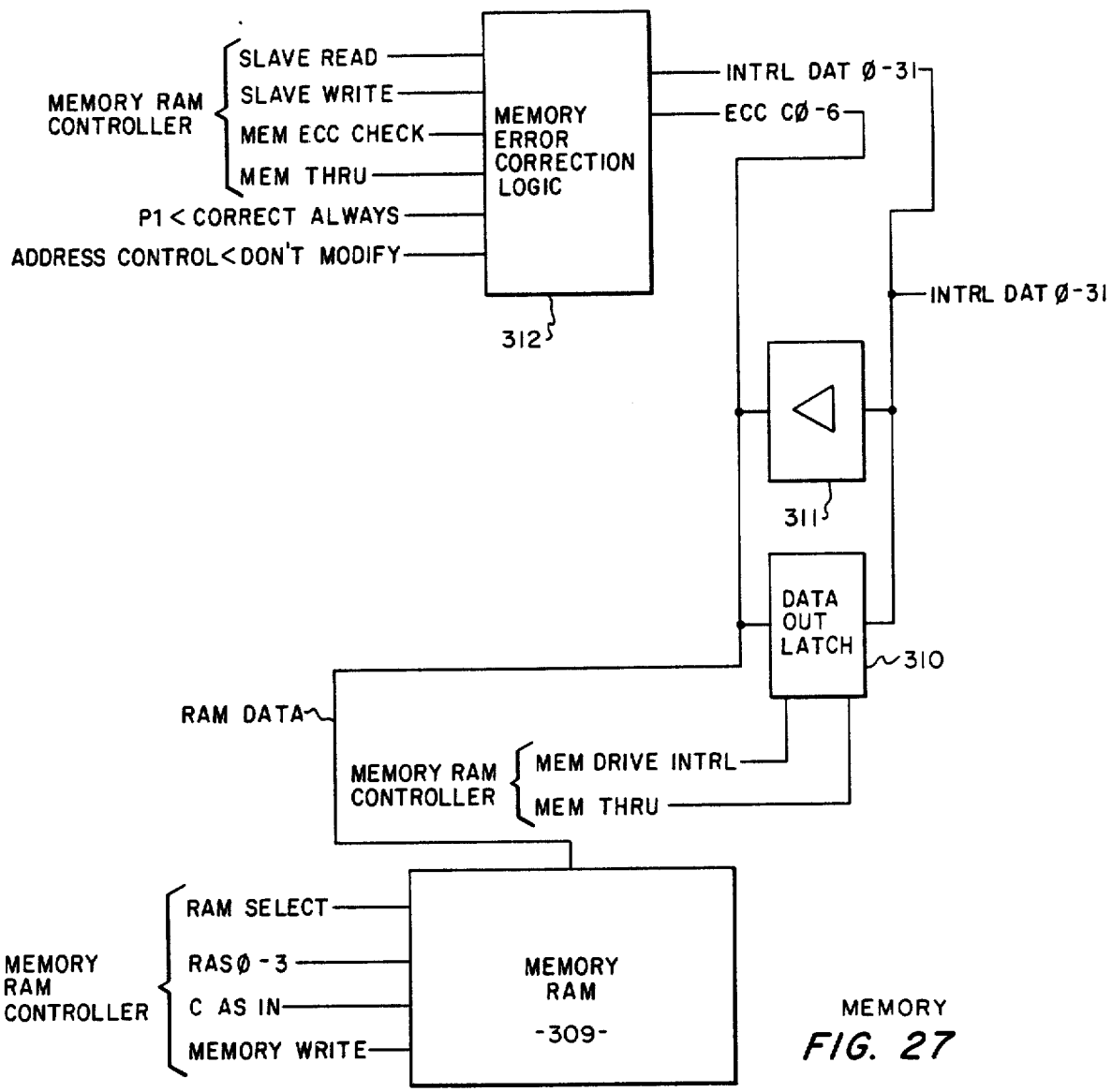
FIG. 27 is a block diagram of the computer card memory.

The remaining portions of the memory circuitry is illustrated in FIG. 27 and consists of the memory RAM 309 connected to an input data buffer 311 and the data output latch 310 together with the memory error correction logic 312. The operation of this memory is asynchronous in the preferred embodiment.

Figure 28:
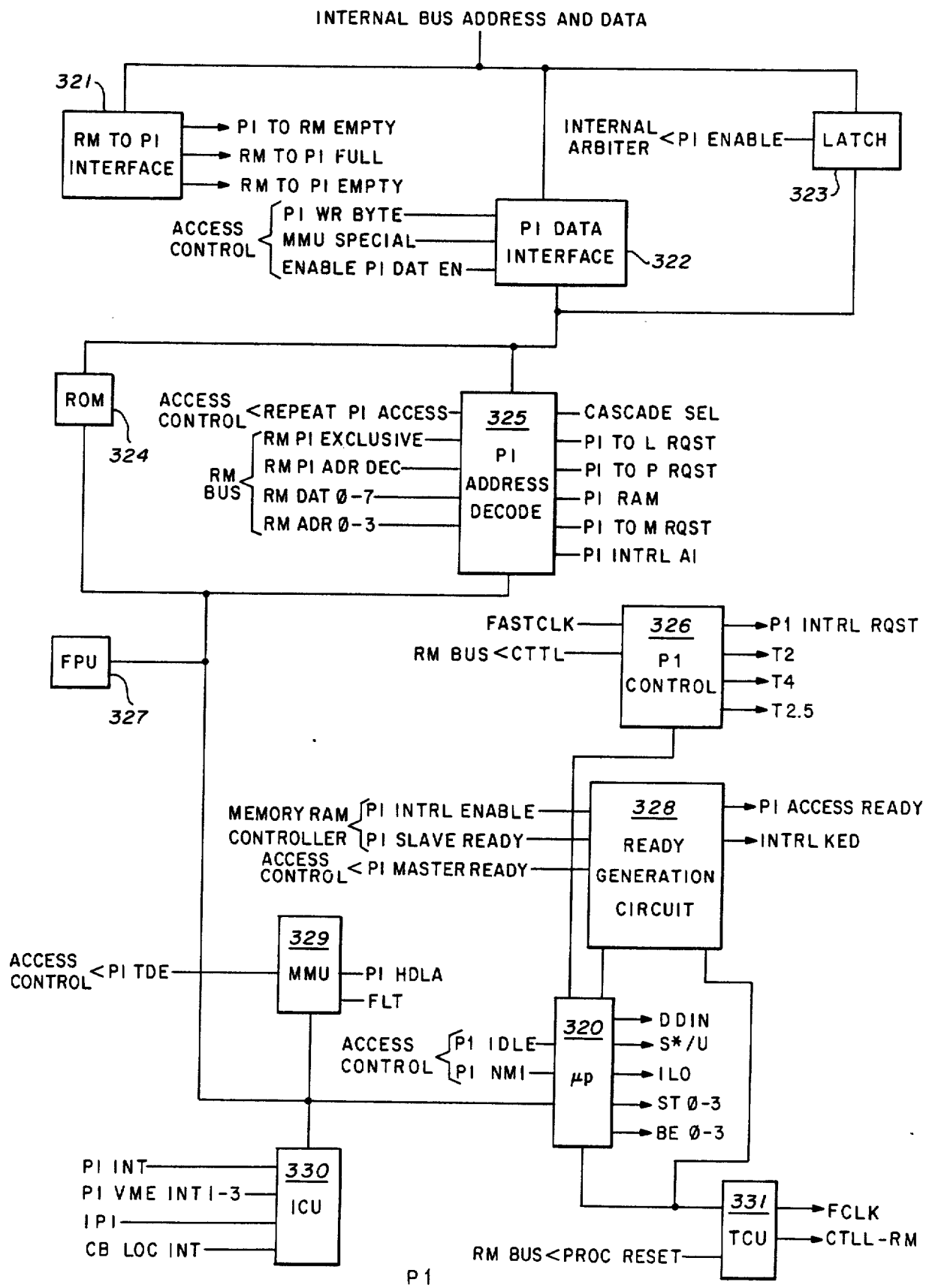
FIG. 28 is a block diagram of the computer card processer.

The P1 processor is illustrated in FIG. 28 and consists of a National Semiconductor 16201 as the Timing and Control Unit (TCU) 331, the National Semiconductor 3032 as the microprocessor 320, a 16082 as the Memory Management Unit (MMU) 329, the 16202 as the Interrupt Control Unit (ICU) 330 and a 16081 as the Floating Point Unit (FPU) 327 connected together. Control logic 326 provides control signals to the P1. The Address Decode for P1 is provided by the Address Decode circuitry 325. This microprocessor in the preferred embodiment includes a program ROM 324. A data interface is provided by circuit 322 to provide byte swapping across internal data bus lines. A Resource Monitor is interfaced to the processor P1 circuit through circuitry 321 to provide the control signals as shown.

The Resource Monitor is illustrated in FIG. 29 and consists an INTEL 8344 microprocessor 340 connected to an HDLC Interface 341. This interface is identical to the HDLC Interface of the Common Bus illustrated in FIG. 65. Like the Resource Monitor for the Common Bus circuitry, the Resource Monitor for the Universal Computer Card is connected to an Address Latch 342 and a bidirectional data buffer 343 to interface to a ROM 344 or RAM 345 and Reset logic 346 to provide the RESET signals to control the Universal Computer Card during the RESET process. The RM Control Decode circuitry 347 decodes the address from the Resource Monitor microprocessor 340 to provide the control signals as shown. The Resource Monitor status and identifier (ID) register 348 receives status information plus the slot ID as shown. It should be noted that the slot ID can be reconfigured by the Resource Monitor since the actual identification of the card is an output of the Resource Monitor even though the slot ID is hardwired as a card input. The Resource Monitor through system configuration may alter the actual ID of the card internally. Lastly, the RM setup latch 349 is provided for control and initialization of the Universal Computer Card.

Figure 30:
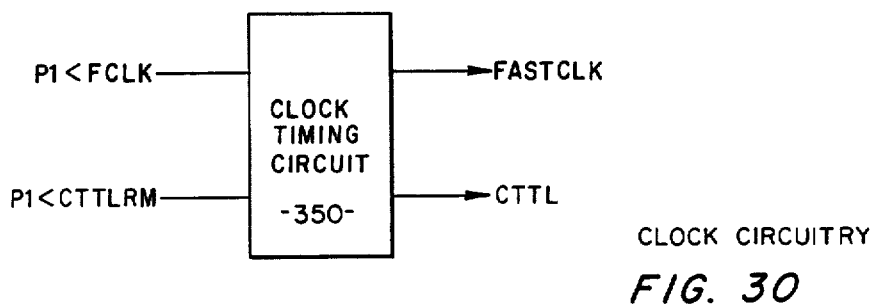
FIG. 30 is a block diagram of the computer card clock circuitry.

The clock circuitry is illustrated in FIG. 30 and provides the FAST CLOCK signal (FAST CLK) and CTTL clock outputs from the FCLT and CTTLRM inputs from the processor P1.

COMMON BUS

The processors connected on the Local Buses are connected via the Local Bus to a Common Bus. The Common Bus permits the Local Bus processors to share both input/output devices located on other Local Buses and memory located on the Common Bus. The information transfers over the Common Bus are similar to the VME Bus as specified in the *VME Bus Specification Manual*, Revision A, October 1981, herein incorporated by reference. By using Common Lock devices, processors can synchronize their access to shared resources such as input/output devices and regions of shared common memory without interferring with other processors' operations. Therefore, the Common Bus is able to provide a high speed communication path between devices on different Local Buses. All accesses on the Common Bus are synchronized and occur with the simultaneous transfer of full 32 bit data and full 32 bit address fields. The Common Bus is provided as a dual redundant Common Bus for reliability in the preferred embodiment. While data transfers take place on the Common Bus, this bus also includes groups of signals for bus arbitration, error detection, clock distribution, and control information to support the data transfers. The Common Bus also provides a means for computer elements to interrupt each other via the InterComputer Interrupt device. Appendix A contains a signal description for the signals on the Common Bus including the Common Lock Bus and InterComputer Interrupt Lines. The Common Bus operation is optimized for high speed and high bus traffic conditions. All Common Bus accesses are one bus cycle in length. Accesses from one processor (or node) to another node on the Local Bus or interlock operations to common memory require more than one bus cycle. However, only one bus cycle is used to transfer the command information before the Common Bus is released for use by other nodes. When the destination device completes the requested access or command it generates a second bus cycle to report the data or results to the requesting device. Likewise, the accessing node generates additional bus cycles to complete the interlock operation. The Common Bus is released after every cycle. The interface between the Local Bus and the Common Bus is provided through either a Common Control Card or a Common Access Card. The Common Access Card detects the addressing of the Common Bus by devices on the Local Bus and provides the protocol to permit this access. It gains access to the Common Bus through the arbitration scheme and thus requires no special operation by the Local Bus requestor. The Common Access Card contains the arbitration circuitry, the Common Lock circuitry and Fast Memory. The Common Control Card also contains the circuitry to allow the Local Bus to access the Common Bus via the Common Bus arbitration circuitry, and further includes Common Lock and the InterComputer Interrupt circuitry. Additionally, the Common Control Card contains the Common Bus Arbiter Control circuits and the Common Lock Arbiter Control circuits that provide master control of the arbitration circuitry and Common Lock circuitry at the Local Bus interfaces.

The following is a discussion of the four different types of transfers on the Common Bus. It is important to understand that the Common Bus transactions are between logic resident upon either the Common Access Cards or Common Control Card. These transactions are transparent to the nodes on the Local Bus. The first is the noninterlock write to shared common Fast Memory.

Figure 31:
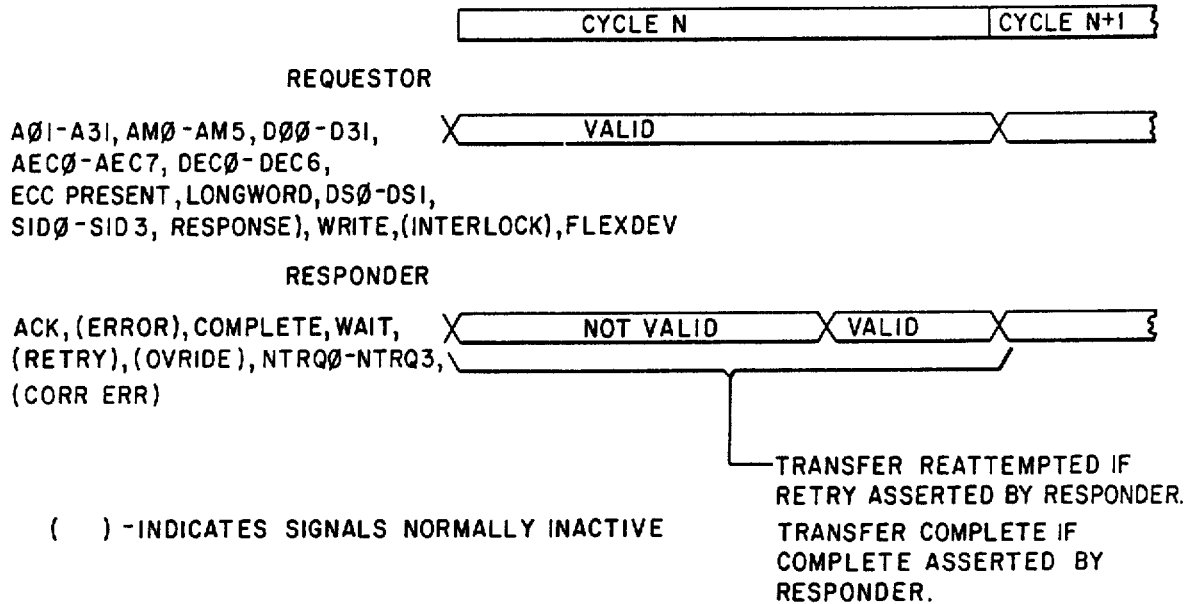
FIG. 31 is a timing chart illustrating a non-interlocked write to fast memory Common Bus transfer.

A noninterlock write to Fast Memory begins after a grant has been received to allow access to the Common Bus by a device on a Local Bus. A write operation is performed as shown in FIG. 31 with the originator of the cycle driving the address lines and the address modifiers that provides supplemental address information to indicate the destination element for the transfer. Address error correction information is also provided to be used by the destination element to verify valid address information. This field is qualified with the ECC ADDRESS PRESENT (ECCADDRPRES*) signal. The originator also provides DATA to be transferred to the destination element with DATA ERROR CORRECTION information for use by the destination element to verify the valid data. This DATA ERROR CORRECTION information is also qualified by the ECC DATA PRESENT (ECCDATPRES*) signal. If the transfer includes a 32 bit word, the LONG WORD is used in conjunction with the DS0 and DS1 signals to indicate length or location of the bits to be transferred. The SID0 to SID3 lines are also driven to provide the identifier of the element originating the transfer operation. The WRITE line is active and the RESPONSE and INTERLOCK lines are inactive.

The destination element will drive the ACKNOWLEDGE line, COMPLETE line and TNTNRQ0-3 lines to indicate its identifier. Additionally, the destination device will drive the ERROR line to indicate the occurrence of an error, or the RETRY line if the destination element is currently busy. The WAIT line, the OVERRIDE line and CORRECT ERROR line are inactive. The OVERRIDE signal is provided to avoid a possible contention problem between two devices located on two Local Buses attempting to access each other at approximately the same time. In accordance with the existing VME protocol, a fatal bus error will occur. With this invention the OVERRIDE signal will be transmitted to one of the Local Buses resulting in the Local Bus Master (which is normally a computer) surrendering control to the overriding device (the Local Bus to Common Bus Interface) thus allowing the completion of the transaction. After this single cycle, the control of that Local Bus is returned to the Local Bus Master who may initiate the second transaction. In a normal transfer the reception of the ACKNOWLEDGE and COMPLETE signals from the destination device indicate a valid transfer. If an ERROR was made the destination device will send an ACKNOWLEDGE and ERROR signal. If the destination device is busy the destination device will send an ACKNOWLEDGE and RETRY signal. The RETRY signal indicates that the common memory operation was interlocked. In that case, the requesting device records the identifier of the destination device. The requesting device will then initiate a time out period and monitor the TNTRQ0-3 and RNTRQ0-3 (TRANSMIT NEW TRANSMIT REQUEST and RECEIVE NEXT TRANSMIT REQUEST) lines on the Common Bus for every bus cycle.

The common memory segment which issued this RETRY signal will eventually receive the final cycle of the interlocked transfer. On that transfer, the common memory circuitry will place the identification of the destination device either on the TNTRQ0-3 or RNTRQ0-3 lines of the bus. The requesting device which attempted to access this common memory segment and which was issued a RETRY signal was monitoring the TNTRQ and RNTRQ lines recognizes the identifier and reinitiates its transfer request. If the requesting device timer times out before the identifier is recognized on the TNTRQ or RNTRQ lines, then the requestor will reinitiate its request. If more than one requesting device was issued a RETRY, then when the TNTRQ or RNTRQ identifier is transmitted, these requesting devices will all attempt access to the Common Bus at the same time. This multiple access is arbitrated by the Common Bus arbitration circuitry which will grant access to each of the requesting devices in accordance with the arbitration scheme stored in the arbitration circuitry.

Figure 32:
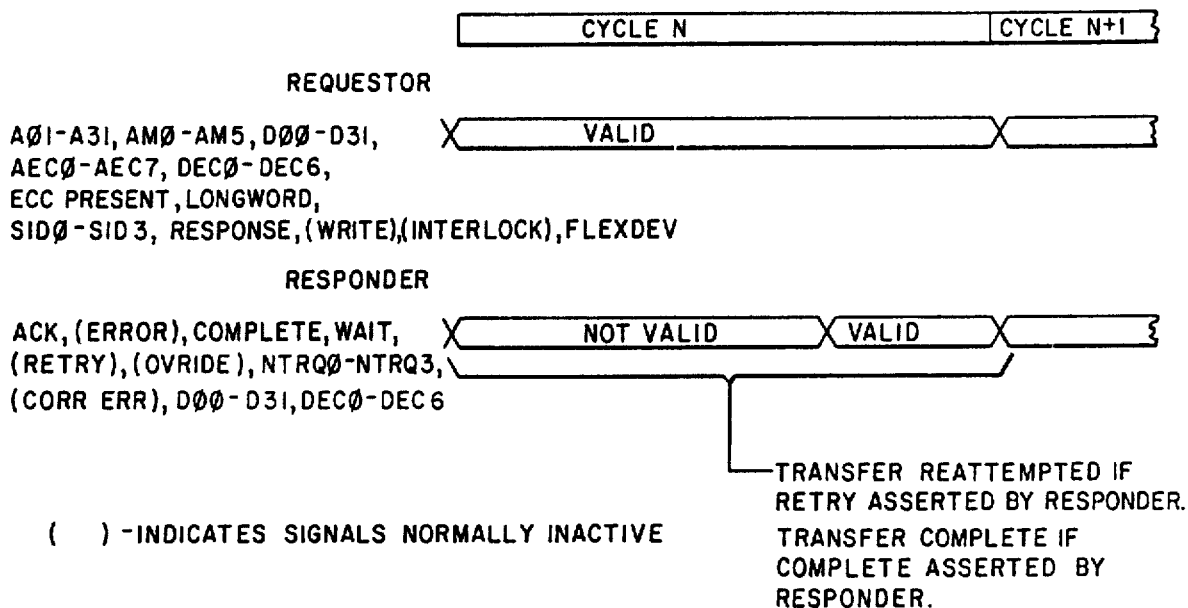
FIG. 32 is a timing diagram illustrating a Common Bus non-interlocked read from fast memory.

FIG. 32 illustrates a non-interlocked read from the common memory. This operation is identical to the write operation with the exception that the DATA lines and DATA ERROR CORRECTION lines are driven by the destination element. The RESPONSE signals from the destination are similar to those for the destination element in the write cycle previously described.

Figure 33:
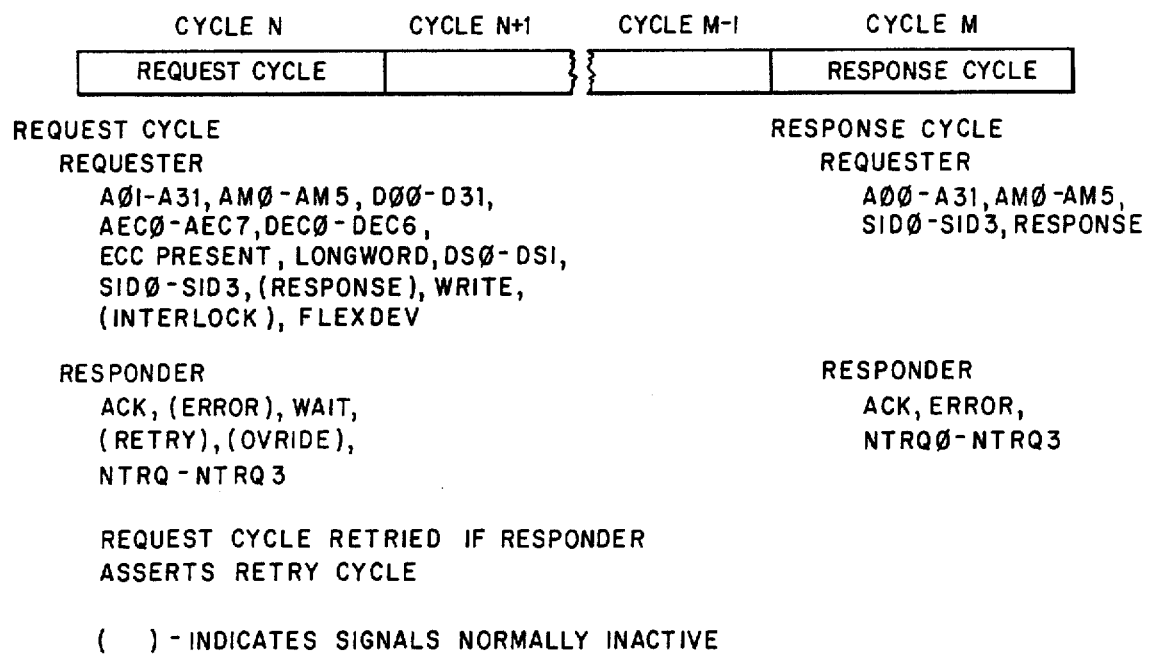
FIG. 33 is a signal transaction chart for a Common Bus non-interlocked write to Local Bus.

FIG. 33 illustrates a non-interlocked write from one Local Bus to another Local Bus. In FIG. 33, the signals listed underneath the REQUESTOR are driven or controlled (i.e. not driven) by the REQUESTOR and likewise for the RESPONDER. This type of operation includes a transfer from one node through the Common Bus to a destination on another Local Bus and always the Local Bus to Common Bus interface for the sending device receives a WAIT reply from the Local Bus to Common Bus interface for the destination device. The transfer to the second Local Bus will eventually occur and the second Local Bus to Common Bus interface will respond causing the first Local Bus to Common Bus interface to send a DATA ACKNOWLEDGE signal to the initiating device. The operation of the initiating device relative to the bus signals is identical to that previously discussed. The destination element will drive the ACKNOWLEDGE line high. The ERROR line will only be active if an error was made. The COMPLETE line will be driven inactive and the RETRY line will be driven active only if the destination is busy completing another operation. The CORRECTED ERROR line is always inactive. The normal response from the destination device is an ACKNOWLEDGE and WAIT line. An ACKNOWLEDGE and ERROR response indicates an error. An ACKNOWLEDGE and RETRY response indicates that the destination element was busy and did not accept the requestors command. Where the destination element accepted the requestors command and the Local Bus/Common Bus interface issued the WAIT signal, the requestors should initiate a time out period and if no response is received from the destination element during that period the requestor should terminate the transfer attempt and noting that an error has occurred. The destination element will internally proceed with the requested access. Any incoming request occurring during that time will be issued a RETRY signal. Upon completion of the requested access, the destination element will generate a Common Bus Cycle to transfer the results of this access to the requesting device.

If the requesting device receives a RETRY, a time out period is initiated. Prior to the time out period expiring, the TNTRQ or RNTRQ lines are monitored during each bus cycle. If the destination device identifier appears on these lines then the requestor will attempt the transfer again. If the time out occurs, the requestor will also attempt to transfer again.

Figure 34:
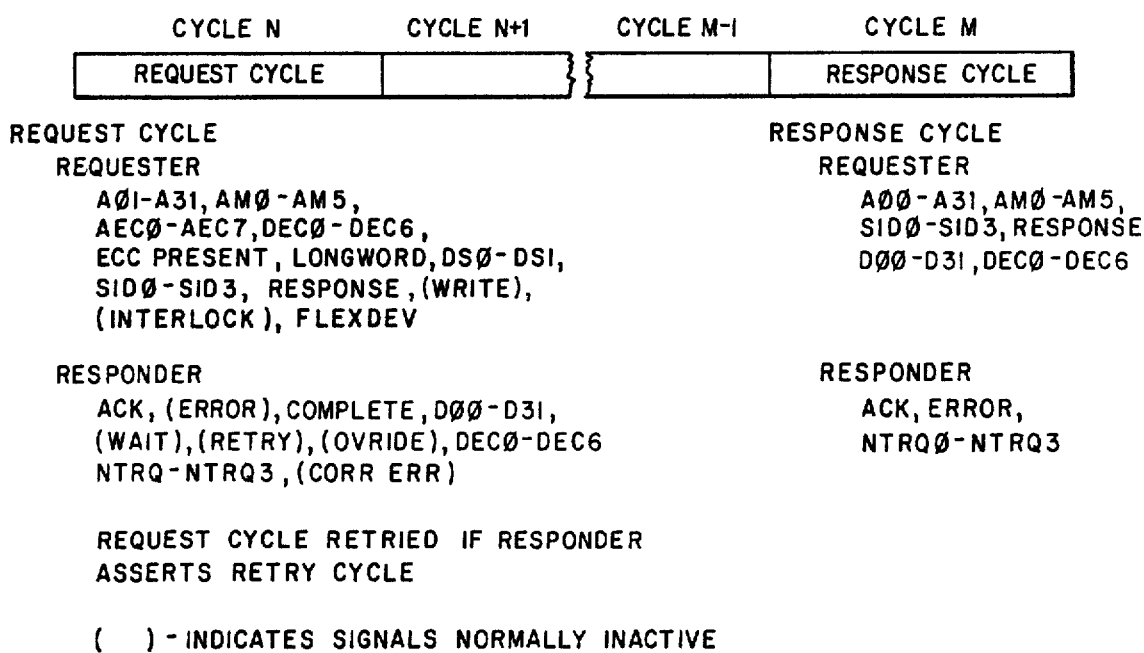
FIG. 34 is a signal transaction chart for a Common Bus non-interlocked read from Local Bus.

FIG. 34 illustrates the READ from one device via the Common Bus to a device attached to another Local Bus. This type of operation is nearly identical to the one previously described. The only difference is that the originating element does not supply the DATA or the DATA ERROR CORRECTION information. The destination element will drive the DATA and DATA ERROR CORRECTION signals in the Response Cycle. The RESPONSE from the destination element will otherwise be identical to that previously described.

FIG. 35 illustrates the READ-MODIFY-WRITE Common Bus transaction between two Common Bus devices (a REQUESTOR and a RESPONDER) such as an interlocked access to fast memory. The REQUESTOR controls the signals indicated including the INTERLOCK (INTLK) signal which serves to interlock the operation of the RESPONDER (such as a section of the Common Memory). During the time this transaction is taking place, other devices attempting to access either the REQUESTOR or RESPONDER will receive a RETRY. At the completion of the interlock operation (cycle 6), the REQUESTOR and RESPONDER send the TRTRQ and RNTRQ signals as previously discussed. Note that the signals in parenthesis indicate normally inactive symbols The Common Bus will support multiple interlocked operations.

The first cycle of this type of operation is identical to that described for the WRITE to common memory or READ from common memory with one exception. That exception is that the INTERLOCK line is driven active. The destination element for this transfer will respond as described previously. However, that element will now latch the interlock status and issue RETRY responses to all other devices requesting access. The cycles following this cycle from the interlock requestor will again be identical to the first until the last cycle of the interlock string is complete. Upon that cycle the INTERLOCK line will not be driven active. Following that cycle the destination element again resume normal operation.

FIG. 36 illustrates an interlocked operation from one node on one Local Bus to another node located on another Local Bus through the Common Bus. This type of operation requires four bus cycles for a two transfer interlock operation and two additional cycles for each interlocked transfer. This type of transfer is composed of several cycles nearly identical to those previously described for the accesses to Local Bus from the Common Bus. The first cycle is identical to that described for the non-interlocked write to the Local Bus and for the non-interlocked read from the Local Bus with the exception that the INTERLOCK LINE is driven active by the requestor. The RESPONSE from the destination elements are identical to those previously described. The destination element will also latch the interlock status of the operation. Requests for access from other devices will result in their receiving a RETRY signal. The Response Cycle generated by the destination element to complete the first transfer will proceed as described for the interlocked common memory access. Additional Interlocked Cycles up to the last Interlocked Cycle will proceed just as described. During this last cycle the requesting element will not drive the INTERLOCK LINE active. The transfer will proceed exactly as described before with the destination device removing the interlock status and later resuming operation in the normal manner.

Devices which have accepted a command will later initiate a Common Bus transfer to send the results of the operation commanded to the requestor. A Response Cycle is always completed in one cycle. If no error has occurred the requestor should be waiting and available to accept the RESPONSE information. A Response Cycle begins with the responding device driving the SOURCE IDENTIFIER (SID) lines to indicate the identification of the responding device. The requesting device latched the identifier of the responding device when the WAIT was received and, has monitored the SDD lines. When the SID is transmitted the requesting device recognizes the transmission as the response. The DATA lines are driven only if the original command was a READ operation. This is also true for the DATA ERROR CORRECTIONS signals and ECC PRESENT signal. SID0 to SID 3 lines are driven to indicate the identification of the element generating the Response Cycle. The RESPONSE line is driven active. The element addressed by the responding device which should be in the WAIT mode responds by driving the ACKNOWLEDGE line active and the TNTRQ or RNTRQ 3 lines. If an ERROR occurs the ERROR line is driven active. The complete WAIT, RETRY and OVERRIDE and CORRECT ERROR lines are driven inactive.

Common Lock Bus

Another section of the Common Bus is called the Common Lock Bus. This bus provides the communication path for the circuitry used to implement the Common Lock architecture elements previously described. The Common Lock provides hardware supported, mutually exclusion for data in common memory, that is shared between different processors and also provides mutual exclusion for other shared devices. The Common Lock eliminates the need for a continuing evaluation of status of these shared devices and relieves the Common Bus from accesses required for these status evaluations by residing on each Local Bus. The circuitry to interface to the Local Bus is located on the Common Access and Common Control Cards. The Common Lock Arbiter is located on the Common Control Card.

The Common Lock Bus is a special purpose bus designed to support a limited number of highly structured message types. This bus will support less traffic than the remainder of the Common Bus and is implemented using a highly multiplexed format with relatively few physical bus lines. These bus lines include thirty-two multiplexed ADDRESS/DATA/ARBITRATION (ADA) lines with the combination of control signals and bus protocol define which group of signals are present on the bus at any one time. This bus also includes two PARITY lines for the ADDRESS signals, a master SYNCHRONIZATION signal defining the start of a new cycle, a READ/WRITE line defining Read and Write cycles, and ACKNOWLEDGE signal to indicate proper reception of information, and a MASTER/SLAVE CONTROL signal which is issued by the MASTER to tell the SLAVES who will generate the next bus transfer.

The Common Lock Bus is implemented with a highly multiplexed protocol in order to allow this implementation with a small number of physical bus lines. The limited number of transaction types on the Common Lock Bus allows the use of very structured message transfers and reduces the number of CONTROL lines necessary.

Each bus transfer on the Common Lock Bus is composed of three phases. The three phases are the Arbitration phase, the Address Transfer phase, and the Data Transfer phase.

The Arbitration phase is composed of one bus cycle. These cycles are the same cycles defined for the Common Bus description. The ARBITRATION on the Common Lock Bus cannot be concurrent with any TRANSFER cycles. Every bus transfer on the Common Lock Bus starts with an arbitration with the exception of the Master Write cycle. During the Arbitration phase any node with a need to communicate with the Common Lock circuitry asserts an active signal on the ADA lines associated with that node, i.e. the Node Identifier. The nodes will release the ADA lines at the end of the first cycle. The Common Lock Arbiter, located on the Common Control Card, will assert an active signal on the ADA lines associated with the node to be granted us of the Common Lock Bus next. Arbitration will be granted on a roundrobin basis. However, it should be apparent to one skilled in the art that other arbitration schemes may be implemented. The Address Transfer phase lasts for one cycle. The Address Information is placed on the ADA lines by the element driving the bus. The Data Transfer phase lasts for one cycle.

There are four message transfer types for the Common Lock Bus and these include LOCK REQUEST, UNLOCK REQUEST, STATUS REQUEST and MASTER WRITE cycle. The transfer of each of these message types requires a Transfer cycle. The start of a new message Transfer cycle is indicated by the SYNC signal becoming active. If the MASTER/SLAVE signal indicates MASTER during that time the following cycle will be a Master Write cycle. If the MASTER/SLAVE signal indicates SLAVE then the next cycle will begin ARBITRATION amongst the SLAVES for the next use of the bus. The Lock Request Message Transfer cycle is illustrated in FIG. 37. This message begins with an Arbitration cycle. FIG. 37 illustrates the case where a bus grant is issued immediately to the element requesting access. If another device had been given a GRANT instead, the requestor being discussed would have to wait for the MASTER to signal the start of a new Slave cycle to request access of the bus again. The second bus cycle illustrated is the ADDR/DATA Transfer Phase. During this phase the LOCK ADDRESS and DATA is transmitted. If the ADDRESS is received by the MASTER with proper PARITY the MASTER will return an ACKNOWLEDGE or an ACK active signal. The second cycle is used in the Data Transfer phase. This cycle is for PARITY by the MASTER with the ACK signal used to indicate proper reception. The format for the information in the data words is shown in FIG. 38. The unlock request is identical to the lock request with the exception of the contents of the function code filed during the ADDR/DATA in cycle as shown in FIG. 38.

The first two phases of the Status Request Message Transfer cycle are identical to those previously described, except that the function code indicates Status Read. This indicates to the MASTER that the status information pertaining to the lock currently being addressed is to be transmitted to the SLAVE in the next bus cycle. The MASTER then transmits this data. The SLAVE will acknowledge the transfers by driving the ACK signal line active.

The Master Write cycle is unique in that no Arbitration cycle is necessary prior to the Information Transfer cycles. This cycle is indicated by the MASTER/SLAVE line indicating a MASTER operation during the SYNC. The first cycle the MASTER transmits is the address of the receiving node. The second cycle is used to transmit the thirty-two bit data word to the Slave Receiver. FIG. 39 illustrates the Master Write cycle.

The application of the Common Lock will now be discussed. The User can utilize 8192 hardware supported locks to protect 8192 data areas or devices that are shared. Locks are accessed through the dedicated Common Lock Bus and are memory mapped within each memory processors Local Address space. There are four hardware registers used to control and request the locks. The READ/WRITE indications are with respect to the users and all registers are available to each processor within its Local Address Space. The first register is the LOCK DATA WORDS (LDW) which contains 8192 32-bit READ/WRITE words to hold the current status of locks and a pending request. The second register is the LOCK OPERATIONS STATUS REGISTERS (LOSR) which includes one READ-ONLY register per internal processor and contains the status of the processor's last request. The third register is the LOCK GRANT FIRST IN FIRST OUT REGISTER (LGF) where each processor includes one READ/ONLY FIRST IN/FIRST OUT (FIFO) register to mold the identifier and status of locks that are granted to a processor. The fourth register is the LOCK OPERATION MODE (LOMR) which is a READ/WRITE register, seen by each processor within its own Local Address Space, to set the Lock Operation mode for each processor.

The LDW register contains a 32 bit word for each lock (or each shared device or shared data area). Within each 32 bit word there are 20 bits to represent single requests from 20 processors (i.e. two processors per Local Bus), and 5 more bits utilized by control software for either the external processors or additional requests from internal processors. Furthermore, there is a LOCK OWNER POINTER (LOP) which is a 5 bit number indicating the corresponding bit number of the processor which currently owns the lock. This structure allows the lock request to be queued if the requested lock is not immediately available. Each lock is Arbitrated between different processors by the Common Lock Arbitrater. The Common Lock Arbitrater sets the processor's corresponding bit in the lock location register word whenever a lock request is received from a processor. This request is ORed with other bits, so previous requests are preserved.

When a lock becomes available (unlocked by previous owner of the lock) the LOCK OWNER POINTER will be updated to hold the new processors corresponding bit number (identifier). Thus, the LOCK OWNER POINTER always points to the processor which currently owns the lock. When an UNLOCKED REQUEST is received, the Lock Arbiter resets the processors bit in the lock word and searches for the next REQUEST in the same word in ascending order. This scheme implements a fair Arbitration, that is, each processor is serviced at least once before another processor is serviced twice. When the next REQUEST is found, the POINTER is updated to show the new processors identifier. It should be apparent to those skilled in the art that other means of Arbitration may be implemented using the information contained in this register. Processes are allowed to READ the data contained in the LOCK DATA WORD register at any time. They can examine the LOCK OWNER POINTER to determine the i.d. or the identifier of the current owner of the lock.

The LOCK OPERATION STATUS register is used to store the result of every request operation. This result is placed in this register immediately and before the completion of the Bus Operation cycle. Thus, each processor is assigned its own Dedicated Status register.

To allow requests for different locks from the same processor, and multiple grants for different locks, a hardware FIRST IN/FIRST OUT (FIFO) register is provided for each processor, called the LOCK GRANT FIFO (LGF) register. When the COMMON LOCK hardware interrupts a processor which is selected to be the new owner of a lock, it places the information regarding the grant of the lock into the FIFO and generates an INTERRUPT to the processor, if the request has been made in the INTERRUPT mode. The interrupted processor can then READ from its FIFO register to determine the lock identifier that has been granted and other associated data. There are two FIFO's per Local Bus (one for each processor). Each FIFO register is seen by its processor within the processors Local Addressing Space. The LOCK GRANT FIFO (LGF) register for each processor includes 128 locations of 16 bits per location. The information stored includes the identification of the lock and its status. The status bits show if the FIFO is empty or if there is an ERROR in requesting the lock.

Each processor can set the LOCK OPERATION mode for its lock request by writing a command into the LOCK OPERATION MODE REGISTER (LOMR). This register is addressed within the processors Local Address Space and there is one LOMR for all processors. Each processor can also READ the LOMR to find out the mode of operation.

The COMMON LOCK circuitry works in three basic modes. Locks can be requested in the POLLING and the INTERRUPT mode plus a third mode called IMMEDIATE REQUEST. The IMMEDIATE REQUEST can be set when initially operating in the INTERRUPT mode. Processors on the Local Bus can use all three modes of operations. Processors external to the Local Bus (i.e. communicating through a bus interface circuit) can only use a POLLING mode when using the locks independently (i.e. not via an internal processor). A User can set the LOCK OPERATION mode for a processor to "POLLING" or "INTERRUPT" by writing into the LOCK OPERATION MODE REGISTER (LOMR). This WRITE operation sets the mode for a single processor and not for a single lock. A User can request to lock or unlock a device by performing a WRITE operation into the Lock Data Word location for that device. The REQUESTED lock may be granted immediately if it is available, otherwise the REQUEST will be queued. If the User issues an immediate REQUEST while operating in a "POLLING" mode, an ERROR will be generated by the Lock Arbiter hardware.

If the "POLLING" mode is selected, then no interrupt is generated and status is not placed in the requestors FIFO register when the lock becomes available. The requestor must perform a READ operation from the lock data word and check the LOCK OWNER POINTER against its processor identifier to see if the lock has been granted.

In the INTERRUPT mode, an INTERRUPT will be generated and a lock status word will be placed in the requestors FIFO register as soon as the lock becomes available (either intermediately or later). The interrupt is applied to the processor via the Common Lock Interrupt line (CLI). Upon detecting the interrupt, the User can read the status from the FIFO register. The User may also read status directly from the Lock Data Word location if desired, but it will not affect the regular INTERRUPT mode operation.

The User can also specify an "IMMEDIATE REQUEST" while operating in INTERRUPT mode. The IMMEDIATE request neither generates an INTERRUPT nor places any status in the FIFO register if the lock is immediately available. However, if the request has to be queued because the lock is unavailable, then an INTERRUPT will be generated and status will be placed in the FIFO register as soon as the lock becomes available. The User can request the lock with an "Immediate Request" code and immediately read the status to see if it is granted, if granted immediately, then the User does not have to handle an unnecessary INTERRUPT at a later time. If the lock is not available then the normal INTERRUPT mode is followed. This feature combines the POLLING and INTERRUPT mode to expedite operation of the lock handler software.

The Lock Handler software, in controlling the Common Lock Operating System, insures that the number of pending requests submitted to the Lock Arbiter does not exceed the depth of the LOCK-GRANT FIRST IN/FIRST OUT register. If more requests are required then the Lock Handler software queues the REQUEST itself until some of the pending REQUESTS within the LOCK GRANT FIFO register are granted. In addition, this software the multiple requests that are issued for the same lock. These requests are then submitted to the Common Lock one at a time. The Lock Handler software also supports the following calls for operating the Common Lock system: LOCK, UNLOCK, SET LOCK OPERATION MODE, READ LAST LOCK OPERATION STATUS, READ FROM LOCK DATA WORD, READ FROM LOCK SENT FIFO REGISTER, ATTACH A LOCK TO A COMMON SHARED DATA BLOCK, and DETACH A LOCK FROM A COMMON SHARED DATA BLOCK.

Common Control Card

Figure 40:
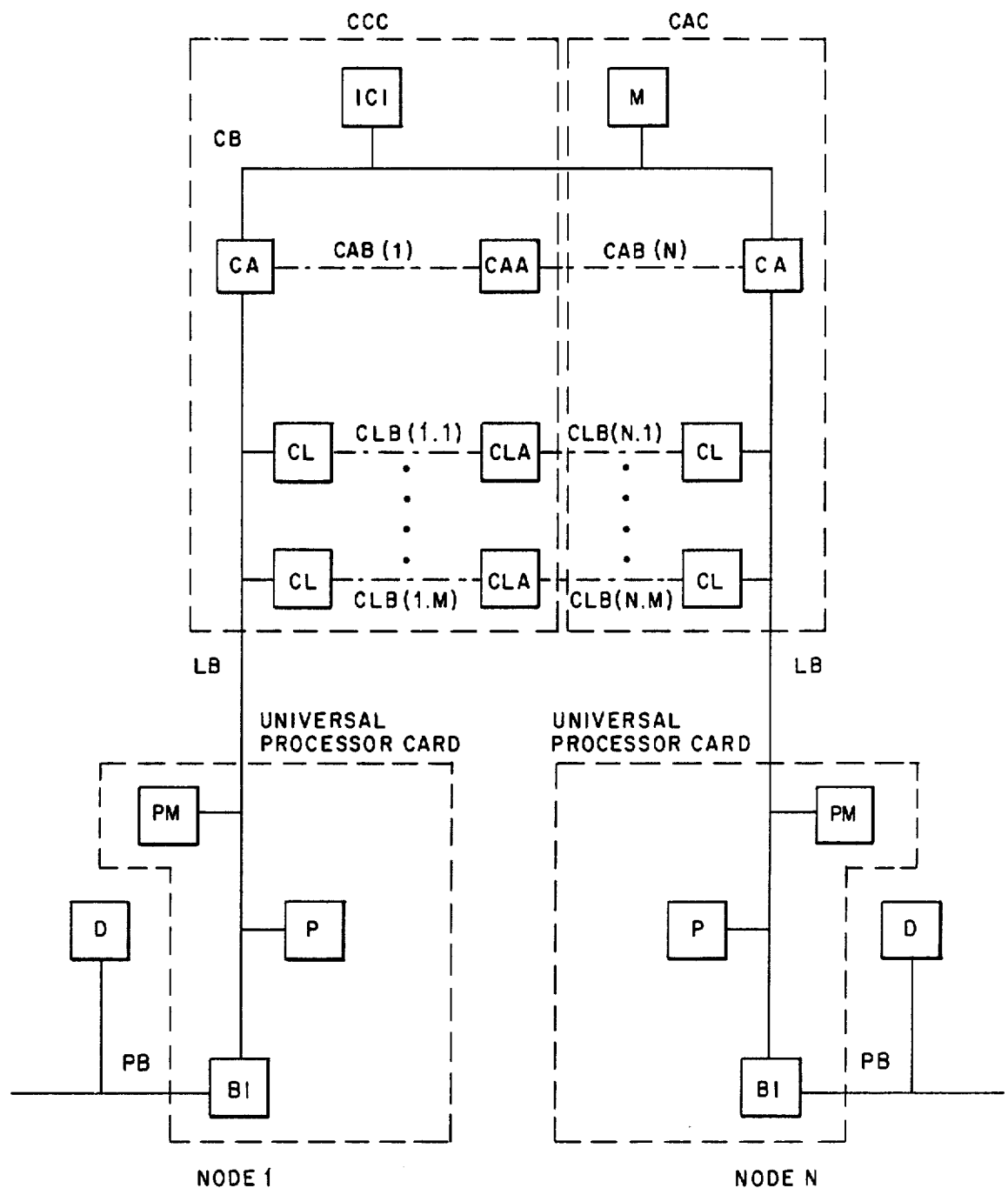
FIG. 40 is a block diagram of the data processing system invention.

Both the Common Control Card (CCC) and the Common Access Cards (CAC) house several of the architectural elements of this invention. FIG. 40 illustrates a simplified architectural diagram of the invention. In the preferred embodiment the invention includes up to 10 Local Buses each of which will support two Universal Cards. The Universal Cards may be processors, memory or any other universal function upon a card that is capable of interfacing with the Local Bus. Each Local Bus (LB) can communicate with several other Local Buses via the Common Bus (CB). By using an External Bus Interface, the Local Bus elements can also communicate with up to 2 peripheral buses per Local Bus. Communication between Local Buses and between elements on the Local Bus and system common resources such as the shared common memory (M) and the InterComputer Interrupts (ICI) occur on the Common Bus.

The interface between each Local Bus and the Common Bus is provided by the circuitry on either a Common Access Card (CAC) or Common Control Card (CCC). The physical location of the circuitry implementing the architectural elements can be described in reference to FIG. 40 which illustrates in general form the architectural structure of the Common Access Card, the Common Control Card and two Universal Processor Cards. Both the Common Control Card and the Common Access Card contain circuitry for enabling communication between the Local Bus and the Common Bus. Additionally, both the Common Access Card and Common Control Card contain the Common Lock (CL) interfaces to each Local Bus (LB). Each Common Lock (CL) interface to a Local Bus is connected through a Common Lock Bus (CLB [1, 1] to CLB [N, M] to a Common Lock Arbiter (CLA). The Common Control Card includes the InterComputer Interrupt (ICI) circuitry, the Common Bus Access Arbiter (CAA) and the Common Lock Arbiter (CLA). Each Common Access Card includes a portion of the common Memory (M). Each Local Bus interface to the Common Bus includes the Local Bus interface to the Common Bus Access circuitry (CA) with the Common Bus Access circuitries show connected via a Common Access Bus (CAB [1] to CAB[N]) to the Common Bus Access Arbiter (CAA). In the preferred embodiment both the Common Access Bus and Common Lock Bus are contained within the Common Bus. The Universal Cards connected to the Local Bus (LB) are shown to include a Processor (P), a Processor Memory (PM) and a Bus Interface (BI) which connects to a Peripheral Bus (PB) including some peripheral Device (D), such as input/output peripheral or other peripheral. It should be noted in FIG. 40 that while only one Universal Card is shown on the local Bus, two Universal Cards may be connected to each Local Bus. Additionally, in the preferred embodiment up to ten Local Buses may be interfaced to the Common Bus.

Figure 41:
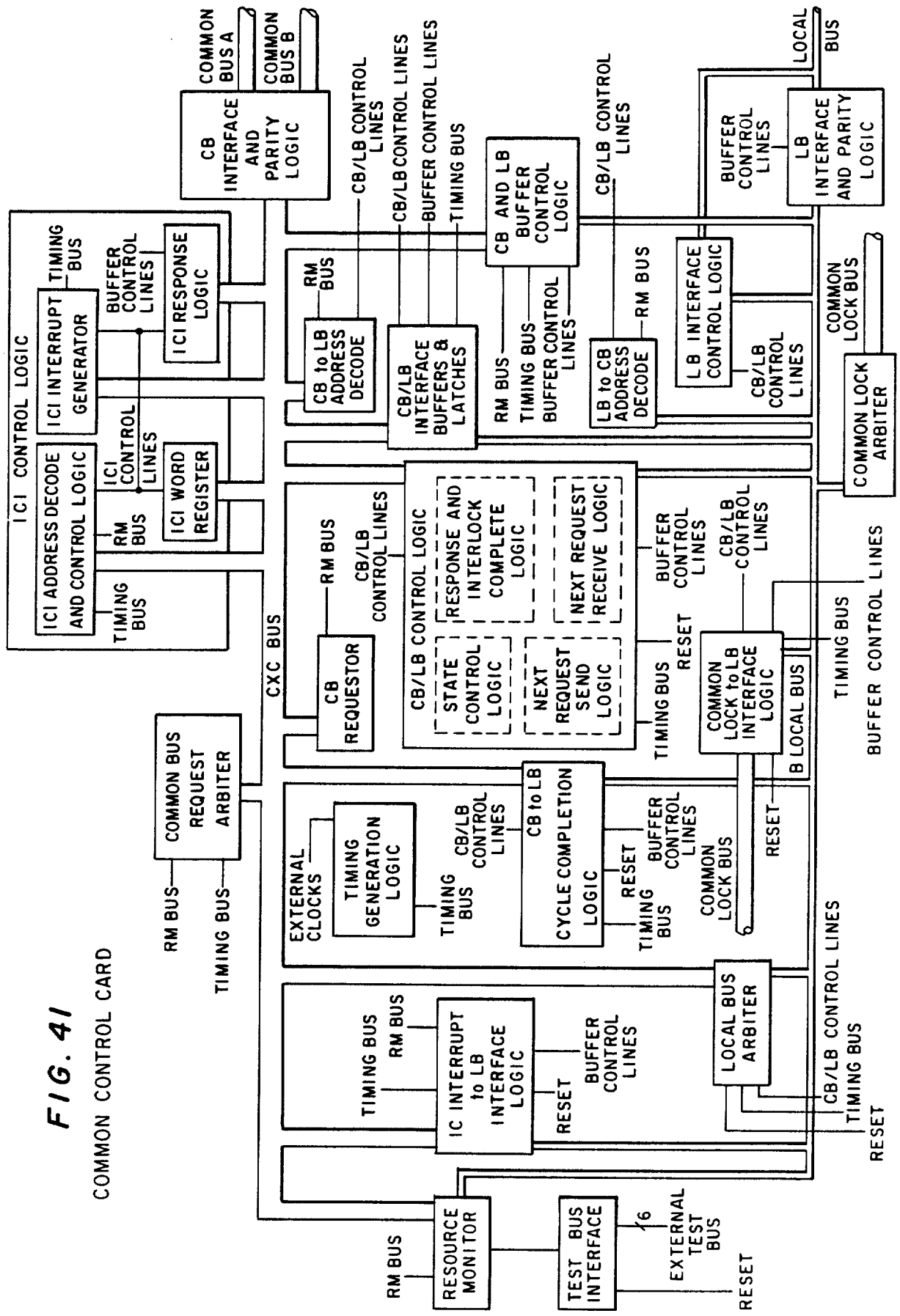
FIG. 41 is a block diagram of the common control card.

FIG. 41 is a functional block diagram illustrating the contents of the Common Control Card. As previously discussed the Common Bus includes dual redundant buses, Common Bus A and Common Bus B. These two buses are connected to the Common Bus Interface and Parity Logic block. This circuitry is further connected to the BUFFER CONTROL LINES and controls the transmission and reception of data over the external COMMON BUS A and COMMON BUS B LINES. The Common Control Card is also connected to the Local Bus as shown through the Local Bus Interface and Parity Logic block which is also connected to the BUFFER CONTROL LINES. Note that the Local Buses are further connected to Local Bus Interface Control Logic block which is controlled by the CB/LB CONTROL LINES. Information internal to the Common Control Card on the Common Bus is placed on the CXC Bus. Likewise, internal information from the Local Bus is contained on the B Local Bus (Buffered Local Bus or B LB). The CXC Bus is connected to the Common Bus to Local Bus Address Decode block which includes CB/LB CONTROL LINES and the RM Bus (Resource Monitor Bus). Likewise, the Local Bus is connected to the Local Bus to Common Bus Address Decode block which is likewise connected to the CB/LB CONTROL LINES and the RM Bus. The function of the address decode circuitry is to decode the ADDRESS LINES on either the CXC Bus or the B Local Bus to determine if the control circuitry is required to respond. The CXC Bus and B Local Bus are also connected to the Common Bus and Local Bus Buffer Control Logic. This logic is further connected to the RM Bus, the Timing Bus and the BUFFER CONTROL LINES. The Buffer Control Logic controls transfers of information between the Common Bus and the Local Bus through the COMMON BUS/LOCAL BUS INTERFACE BUFFERS and LATCHES shown also to interconnect the CXC Bus and B Local Bus. The COMMON BUS/LOCAL BUS INTERFACE and INTERFACE BUFFERS and LATCHES are connected to the CB/LB CONTROL LINES, BUFFER CONTROL LINES and the Timing Bus. The main control for transfers between the Local Bus and Common Bus is contained within the Common Bus/Local Bus CONTROL LOGIC which includes four modules: the STATE CONTROL LOGIC MODULE, the RESPONSE, INTERLOCK COMPLETE LOGIC MODULE, the NEXT REQUEST SEND LOGIC MODULE, and the NEXT REQUEST RECEIVE LOGIC MODULE. The Common Bus/Local Bus CONTROL LOGIC are further connected to the CB/LB CONTROL LINES, the BUFFER CONTROL LINES, the RESET LINE, and the Timer Bus. The Common Bus to Local Bus cycle completion logic is further connected between the CXC Bus and the B Local Bus to provide the completion of protocol cycles for transfers from the Common Bus to the Local Bus. This logic is connected to the CB/LB CONTROL LINES, Timing Bus, RESET LINES, and BUFFER CONTROL LINES. Arbitration upon the Local Bus is accomplished by the Local Bus Arbiter connected to the B Local Bus and the CXC Bus. The Common Lock to Local Bus Interface logic interfaces the Common Lock Bus to the Local Bus. This circuitry is further connected to the CB/LB control lines, the Timing Bus and the RESET line. Each Local Bus is connected to the INTERCOMPUTER INTERRUPT logic through the IC INTERRUPT TO LOCAL BUS interface logic shown connected to the B Local Bus and the CXC Bus. This circuitry is further connected to the Timing Bus, the RM Bus, the RESET line and the BUFFER CONTROL lines. Arbitration on these Common Buses is accomplished through the Local Bus via the Common Bus Requestor. Lastly, the CXC Bus and B Local Bus are connected to the RESOURCE MONITOR which through the RM Bus and the monitoring of the B Local Bus and the CXC Bus monitor the status of the circuitries on the Common Control Card and Common Access Card. The RESOURCE MONITOR is connected to an external Test Bus through the Test Bus interface. This Test Bus interface further provides the RESET signal line and connects the Resource Monitor to the System Performance Monitor. The circuitry on the Common Control Card, as well as the Common Access Card, includes the timing generation logic which is connected to external clocks located on the back panel of the system. The timing and generation logic generate the timing signals on the Timing Bus.

The INTERCOMPUTER INTERRUPT CONTROL logic is shown in FIG. 41 as connected to the CXC Bus and including the ICI ADDRESS DECODE AND CONTROL logic, ICI INTERRUPT GENERATOR circuitry, ICI WORD REGISTER, and ICI RESPONSE logic. The function of the INTERCOMPUTER INTERRUPT (ICI) is to provide a mechanism by which processors can interrupt each other. Each Local Bus has two registers associated with it allowing for each processor to be associated with one register. Any processor can write a 32 bit pattern into the ICI WORD REGISTER and at the completion at that cycle the ICI circuitry will generate an interrupt to the processor residing on the local node which is associated with that register. The interrupted processor will read the register and be able to identify the interrupting processor. More than one processor can request an interrupt in the same register during the same time period and a processor may use the ICI circuitry to interrupt itself. A read from the ICI WORD REGISTER by the interrupted processor will clear the register and the interrupt. The ICI ADDRESS DECODE AND CONTROL logic provides a configuration for these registers to allow the address of two ICI registers to map into any long word location in the four gigabyte address space supported by the Common Bus.

The ICI WORD REGISTER contains the actual 32 bit pattern provided by the interrupting processor. Each 32 bit pattern is ORed with the previous contents of the register. The read operation will clear the register. Control for the ICI register is provided by the ICI control lines.

The Common Lock Arbiter is also connected to the buffered Local Bus in this embodiment. However, the Common Lock Arbiter may reside upon the CXC Bus. This circuit contains and supports the Common Lock memory where all the information pertaining to the current lock status shared devices or shared memory areas are kept. The CL memory contains a 32 bit word for each logical lock. A Common Lock request generated by one of the processors in the system is passed through the Common Lock to LOCAL BUS INTERFACE logic to the Common Lock Arbiter circuitry. The Common Lock Arbiter circuitry interrupts the lock request and accesses the memory locations corresponding to the lock number.

The Common Bus Request Arbiter is shown connected to the CXC Bus and is provided to determine which of the Common Bus Requesting devices will be granted access to the Common Bus. This function is accomplished by monitoring the Common Bus Request lines and selecting one of the Common Bus Request lines and issuing a grant indication. Although a round-robin selection scheme is anticipated to be most frequently used, these may specify and implement almost any priority scheme via configuration through the Common Bus Request Arbiter. The determination of the arbitration scheme is provided through the Resource Monitor Bus.

Figure 42:
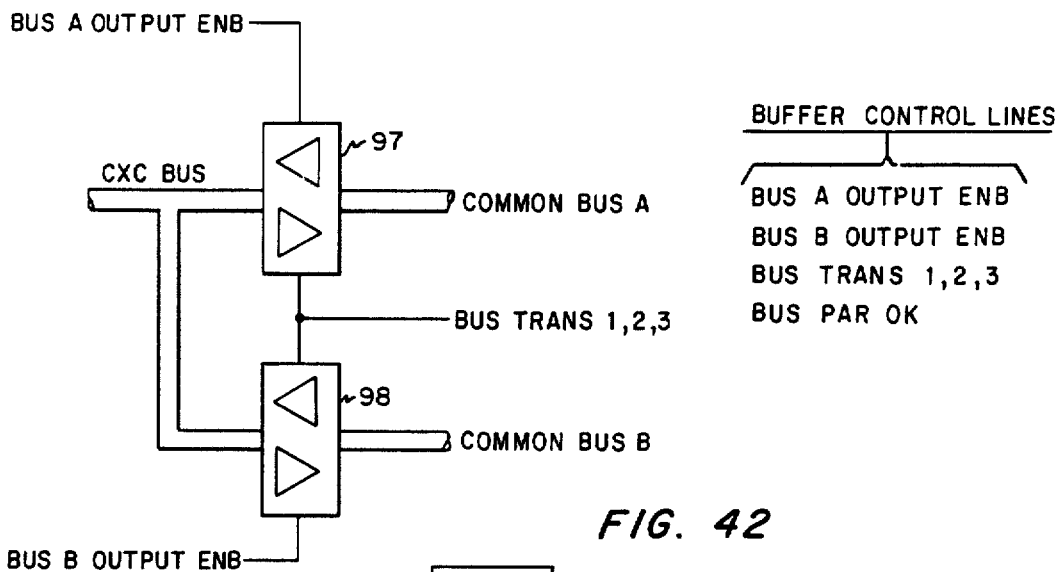
FIG. 42 is a schematic diagram of the Common Bus buffer.
Figure 43:
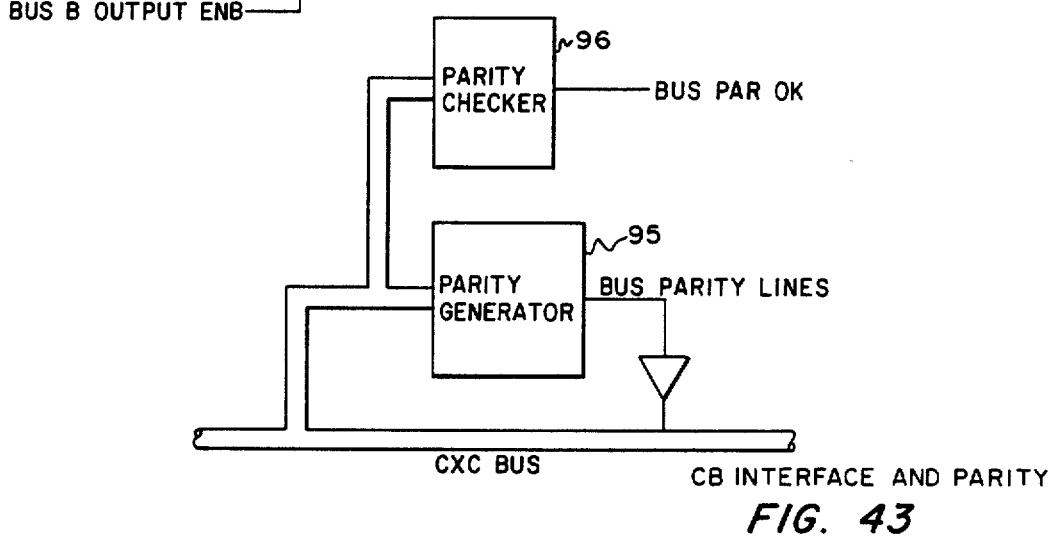
FIG. 43 is a block diagram of Common Bus parity checker/generator.

The detailed schematics of the Common Control Card will now be discussed. FIG. 42 illustrates the schematic diagram of the Common Bus interface. The CXC Bus is connected to two sets of bidirectional drivers 97 and 98 which in turn are connected respectively to the Common Bus A and Common Bus B bus lines for dual redundancy. The transmission control signal is BUS TRANS 1, 2, 3 which are three separate BUS TRANSMISSION signals used for transmitting: (1) the addresses and related information, (2) the data and related information and (3) the response and related information over the Common Bus lines. The selection of the Common Bus A drivers 97 or the Common Bus B drivers 98 is made by the BUS A OUTPUT ENABLE or BUS B OUTPUT ENABLE signals. FIG. 43 illustrates the Parity circuitry and includes a Parity Checker 96 providing the BUS PARITY OKAY signal and the Parity Generator 95 providing the signals on the Bus Parity lines. The BUS OUTPUT ENABLE lines, BUS TRANSMISSION TIMING lines and BUS PARITY OKAY signals are provided throughout the Common Control Card on the BUFFER CONTROL lines.

Figure 44:
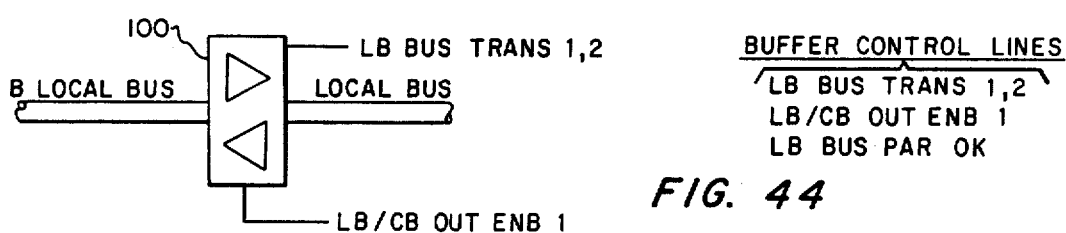
FIG. 44 is a schematic diagram of the Local Bus interface for the Common Bus card.
Figure 45:
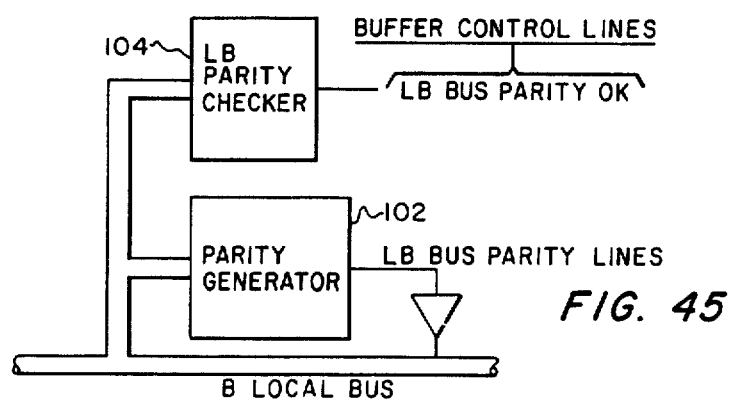
FIG. 45 is a block diagram of the Local Bus parity generator/checker for the Common Bus card.

The LOCAL BUS INTERFACE and PARITY is shown in FIGS. 44 and 45. In FIG. 44 the B Local Bus is connected by a Bidirectional Driver 100 to the Local Bus. The B LOCAL BUS TRANSMISSION signal is provided by the LB BUS TRANS 1 and 2 signals. The drivers 100 are ENABLED by the LB/CB OUTPUT ENABLE 1 line. The Parity circuitry in FIG. 45 includes a Local Bus Parity Generator 102 to provide the Local Bus Parity lines to the Local Bus and the Local Bus Parity Checker 104 which provides the LOCAL BUS PARITY OKAY signal. The LOCAL BUS PARITY OKAY signal along with the LB/CB OUTPUT ENABLE 1 and LOCAL BUS TRANSMISSION signals are provided on the BUFFER CONTROL lines.

The Common Bus and Local Bus BUFFER CONTROL logic is illustrated in FIGS. 46a-f 4, 47, and 48. In FIG. 46a the BUS A AND BUS B OUTPUT ENABLE signals are provided from the BUFFER OUTPUT ENABLE signal from the Timing Bus and the Common Bus A/B* BUS SELECTION line through drivers 106 and 108. [The asterisks indicates an active low signal]. The Common Bus A/B* is generated in FIG. 46b together with the CXC ID 0–3 bits which are the identifier bits for the card. Note that this information is latched from the Resource Monitor Bus over the RESOURCE MONITOR DATA lines under control over the RESOURCE MONITOR SELECT line. The INTERCOMPUTER INTERRUPT RESPONSE ENABLE signal is a NAND function of the RAM READ ENABLE signal from the Timing Bus and the ICI DECODE and BUS PARITY OKAY signals as shown. Likewise, the CXC ERROR*, LOCAL BUS RESPONSE (LB RESPONSE ENABLE) signal and BUS TRANSMIT 3 signals are provided as shown. It should be noted that Appendix B contains the signal list including the figures illustrating the originating circuitry for the different signals referenced by figure number.

Figure 47:
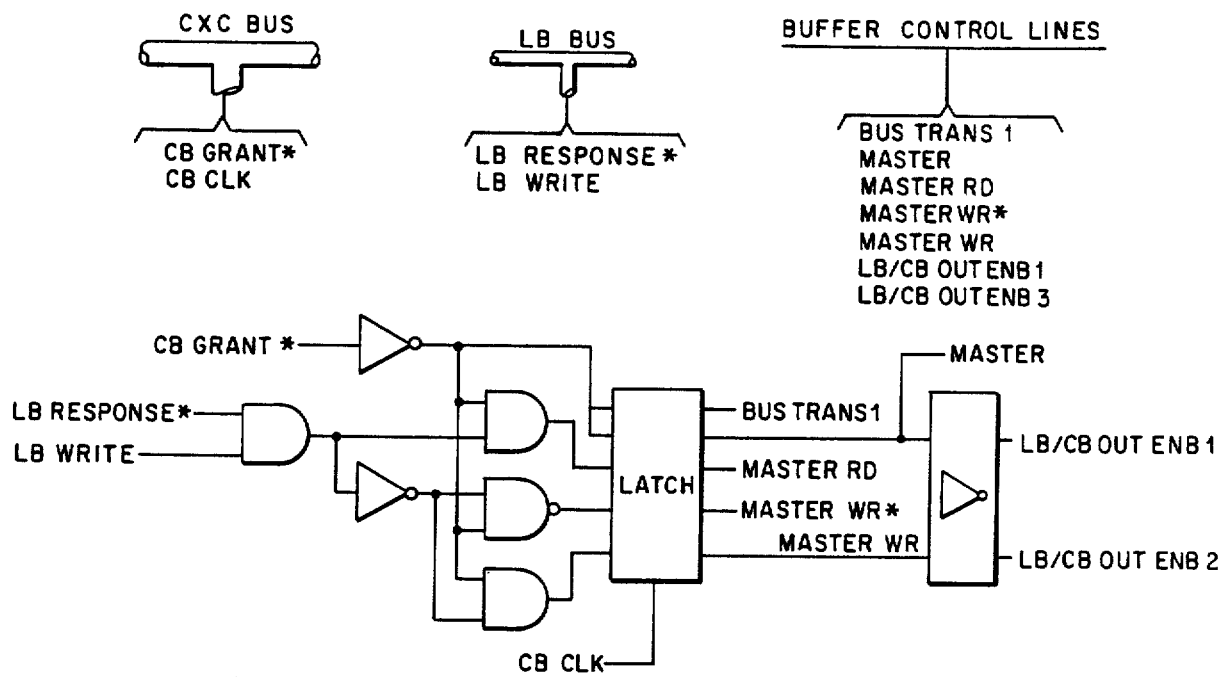
FIG. 47 is a schematic diagram of the buffer enable signal circuit.
Figure 48:
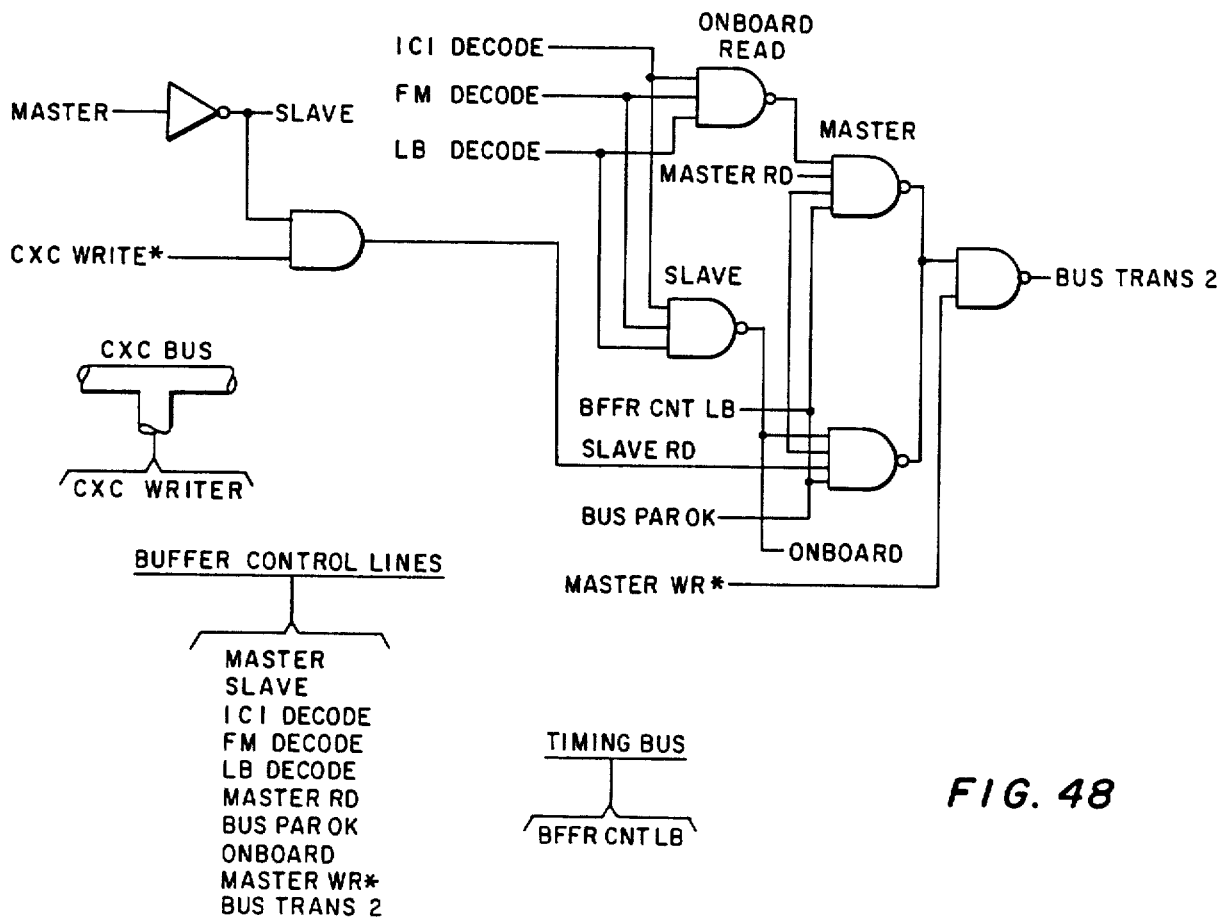
FIG. 48 is a schematic diagram of a buffer control circuit.

FIG. 47 illustrates the generation of the MASTER, BUS TRANSMIT 1, LB/CB OUTPUT ENABLE 1, and LB/CB OUTPUT ENABLE 2 signals. FIG. 48 also illustrates the generation of the BUS TRANSMIT 2 signal.

Figure 49:
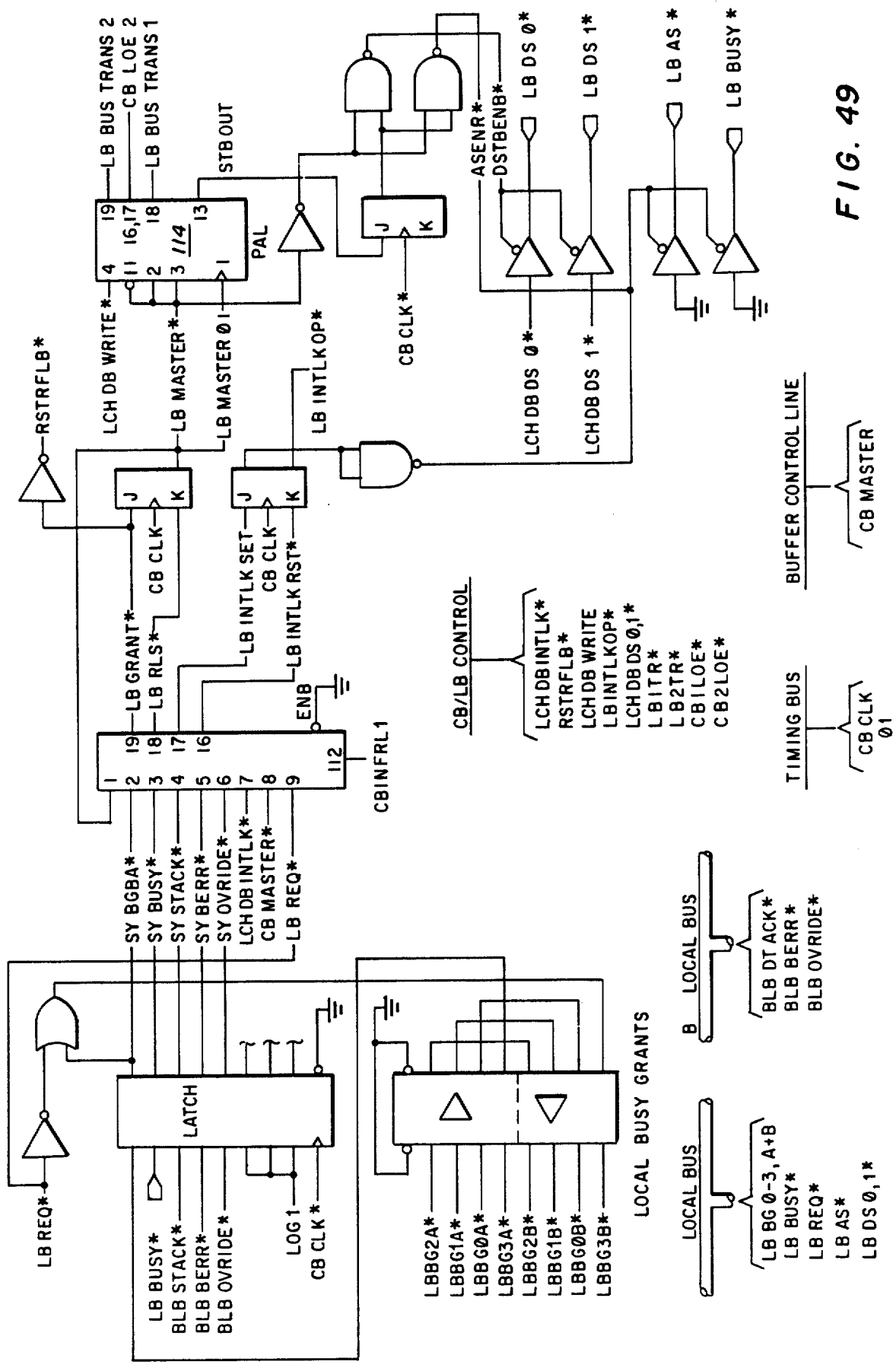
FIG. 49 is a schematic diagram of the Common Bus to Local Bus control.
Figure 50:
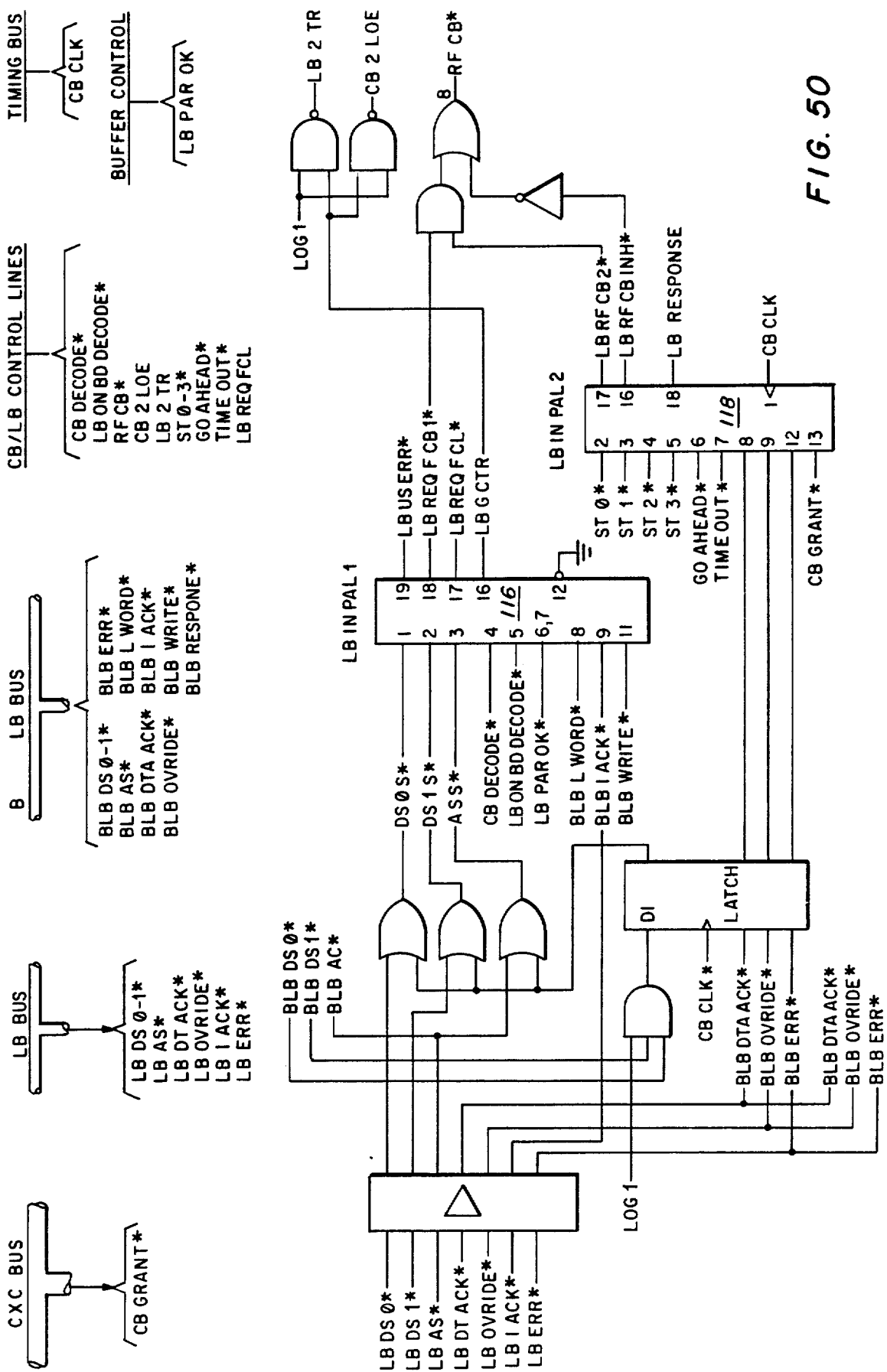
FIG. 50 is a schematic diagram of the Local Bus interface control logic.
Figure 58:
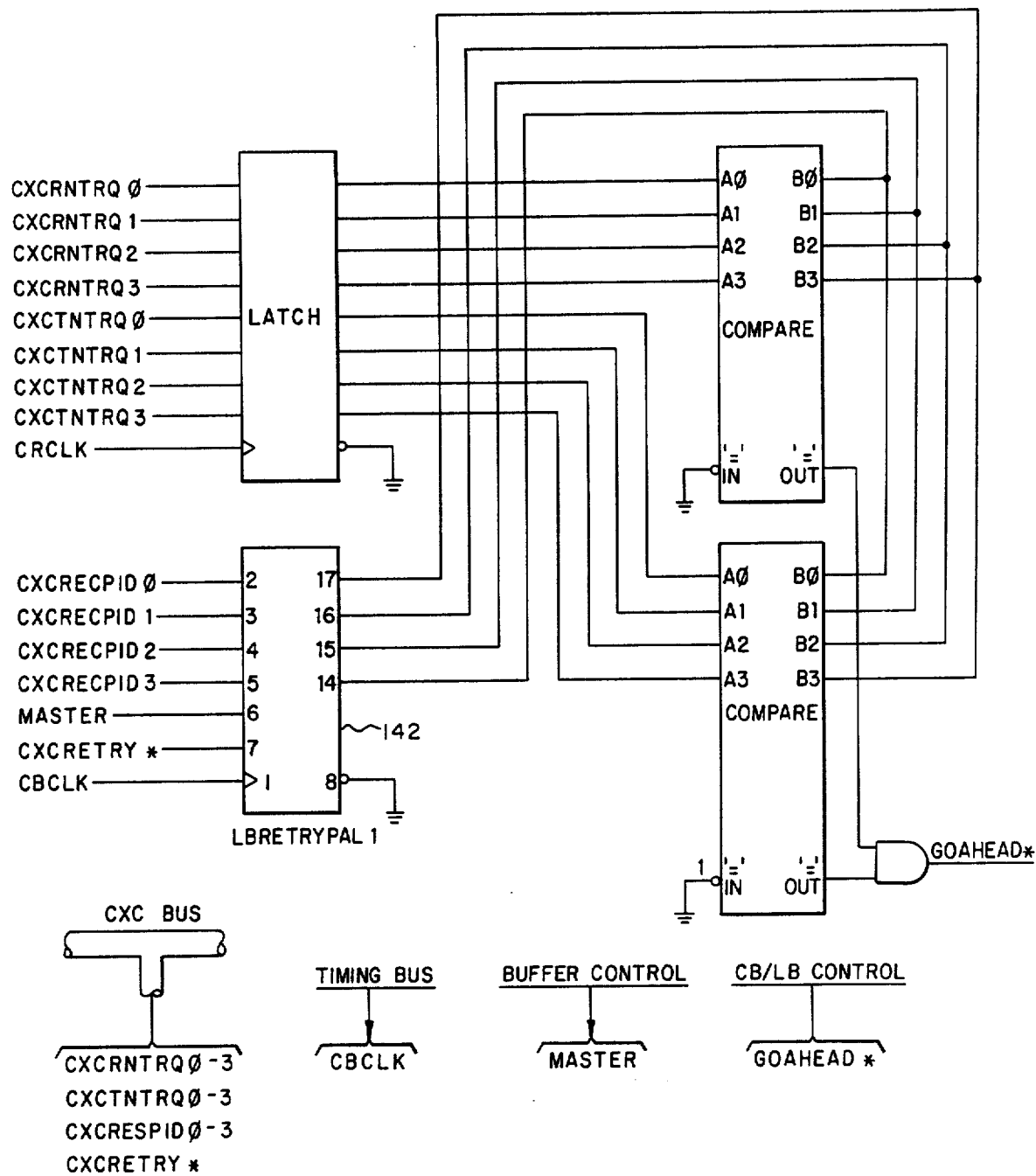
FIG. 58 is a schematic diagram of the Common Bus card next request receive logic.

The LOCAL BUS INTERFACE CONTROL logic is illustrated in FIGS. 49 and 50. In FIG. 49 the LOCAL BUS signals (LB signals) and the B LOCAL BUS signals (B LB signals) are input to produce the RSTRFLB* (RESET REQUEST FOR LOCAL BUS), LOCAL BUS MASTER (LB MASTER), LOCAL BUS TRANSMIT 2 (LB BUS TRANS 2), COMMON BUS LATCH OUTPUT ENABLE 2 (CBLOE 2), LOCAL BUS TRANSMIT 1 (LB BUS TRANS 1), the DATA STROBES (LBDS0*, LBDS1*), the ADDRESS STROBE (LBAS*), and the LOCAL BUS BUSY signal (LBBUSY*). In FIG. 50 the LOCAL BUS TRANSMIT signal (LB2TR) and the COMMON BUS LATCH OUTPUT ENABLE (CB2LOE) signals are produced together with the request for COMMON BUS ACCESS (RFCB*) and the BUFFER LOCAL BUS RESPONSE (BLB RESPONSE*) signals. Note that the blocks 112, 114, 116, 118 are programmed array logic (PAL) modules. Block 112 is a PAL that maintains control of the Local Bus when a Local Bus grant has been received and releases that bus at the completion of the bus cycle. Block 114 controls the Local Bus buffer lines during the Local Bus operation and further provides the control signals shown. In FIG. 50, Block 118 regenerates a request for the Common Bus during a RETRY period by either receiving a timeout indication or an indication from the GO AHEAD logic (see FIG. 58.) The logic for Block 116 is illustrated in table form in Appendix C. The logic in these two figures provide the control for the LOCAL BUS INTERFACE.

The Common Bus/Local Bus Interface buffer and latches circuits are illustrated in FIG. 51A and B. In FIG. 51A, the CXC Bus is shown providing information flow to the Buffered Local Bus through two latches 120 and 122. These latches are connected to latch control circuitry 124. When another Common Bus device is attempting a WRITE cycle upon the Local Bus connected to the present Common Bus device, the data from the CXC Bus is latched in latch 120 and CXCDS0, 1 (data strobes 0 and 1) and CXCAS (address strobe) are input to control logic 124 which evaluates these inputs and requests Local Bus access. When this access is granted CBLOE2 is received (FIG. 49) enabling latch 122 which places the transfer on the Buffered Local Bus for transfer to the information flow from the Buffered Local Bus to the CXC Bus is shown is FIG. 51B under the control of the LB/CB OUTPUT ENABLE 2 signal previously discussed. The Common Bus to Local Bus Address Decode circuitry is shown, including a RAM 126, in FIG. 52. Note that the RAM 126 is loaded via the Resource Monitor Data Bus.

The Local Bus to Common Bus ADDRESS DECODE circuitry is illustrated in FIG. 53 and also includes several RAMs 126, 128, 130 that are loaded initially by the Resource Monitor Bus. The Local Bus addresses in this configuration result in the decoding of the LOCAL BUS ONBOARD signal indicating an address on the circuit board or the COMMON BUS DECODE signal indicating an address space within the Common Bus range.

Figure 54:
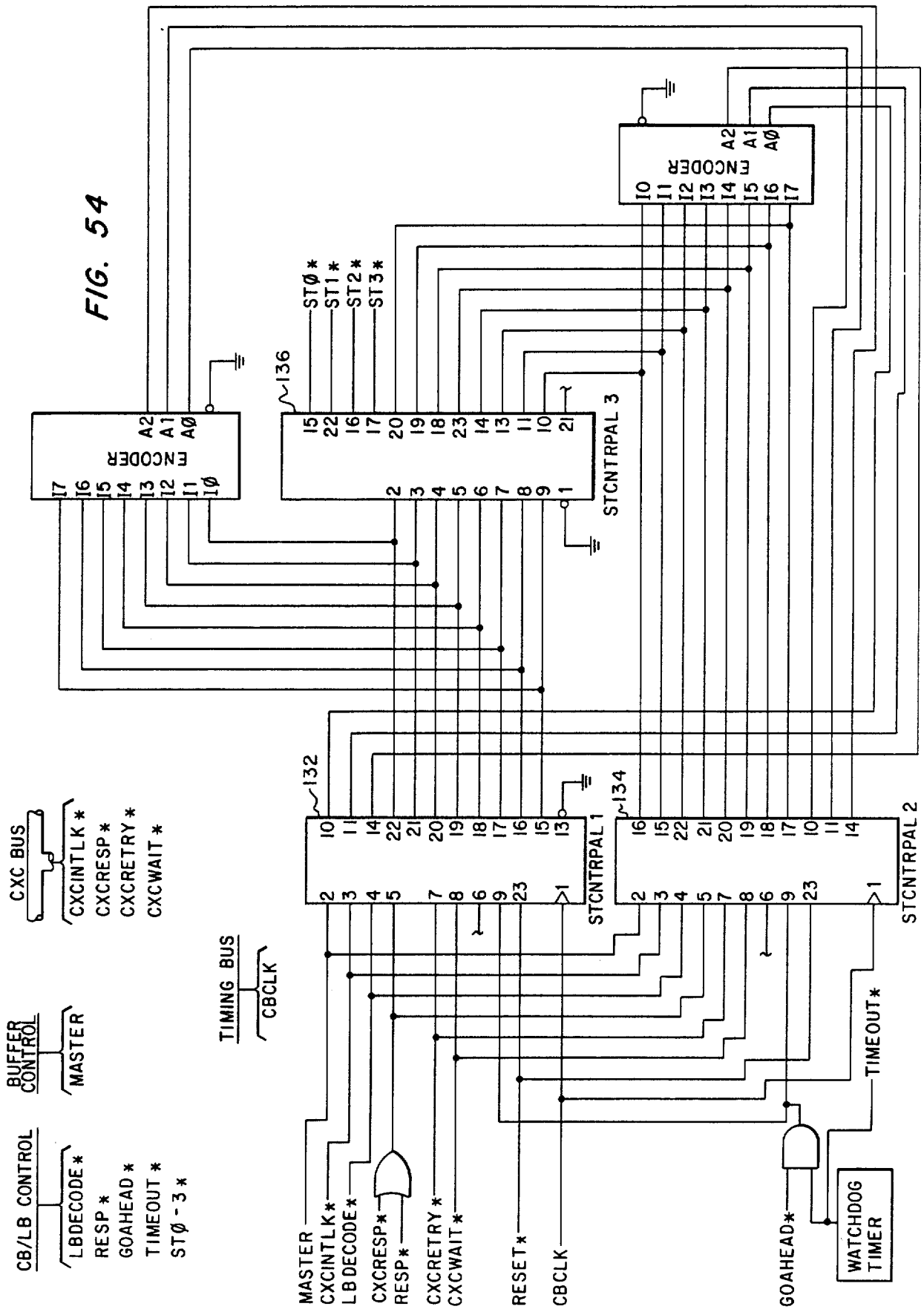
FIG. 54 is a schematic diagram of the Common Bus card state control logic.
Figure 55:
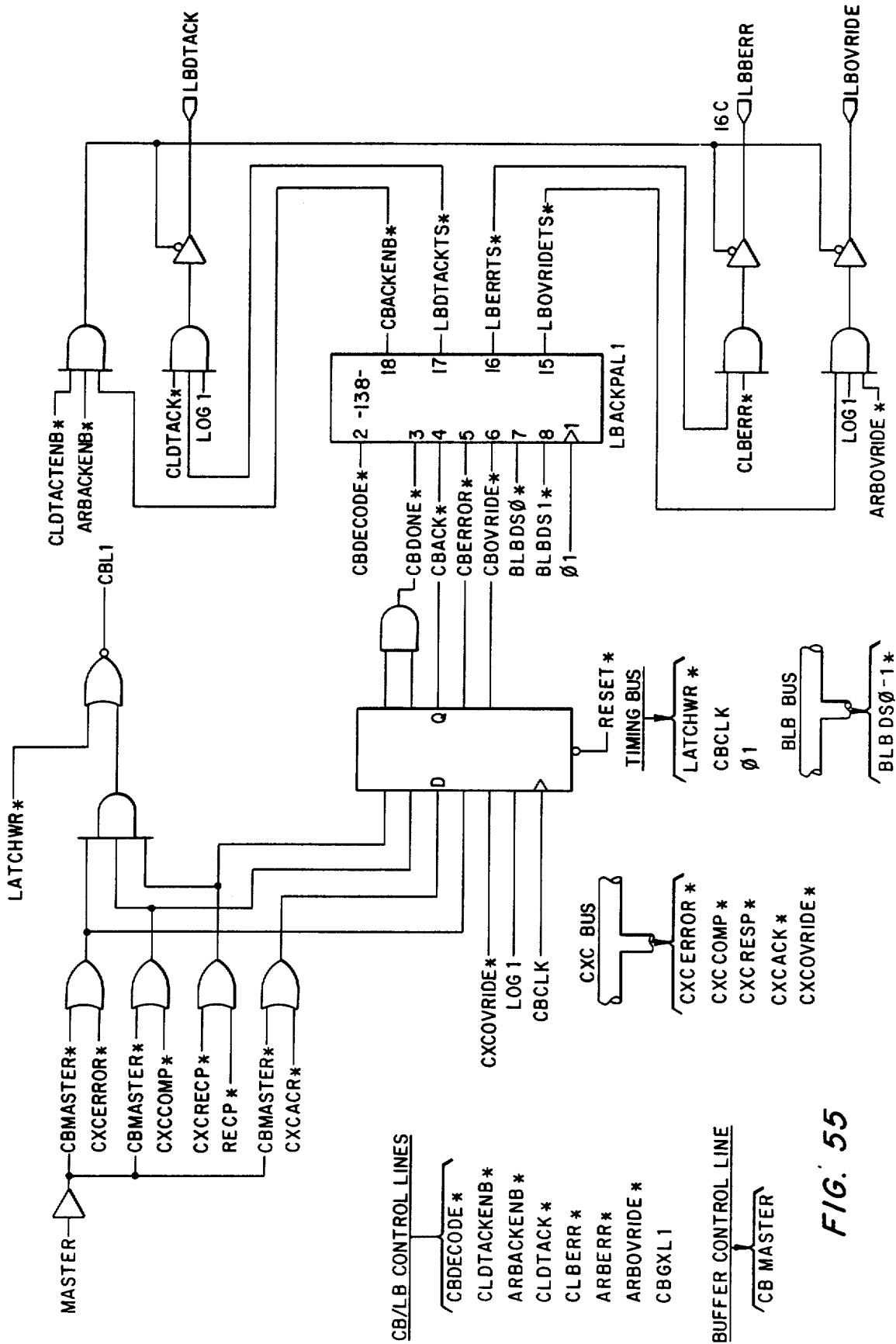
FIG. 55 is a schematic diagram of the Common Bus card Common Bus to Local Bus cycle completion logic.

The Common Bus/Local Bus Control Logic circuits are illustrated in FIGS. 54–58. The key of the control logic is illustrated in FIG. 54 containing the state control circuitry. The output of this circuitry is the control state indicated by ST0* to ST3*. The possible states are illustrated in Appendix D which is a State Table showing the present state and next state given the inputs. The circuitry in FIG. 54 includes three Programmed Array Logic (PAL) circuits 132, 134, 136 which are disclosed in table form in Appendix C. The Response and Interlock Complete logic is illustrated in FIGS. 55 and 56. In FIG. 55, the Common Bus input along with the MASTER Input produces several of the LOCAL BUS signals such as LOCAL BUS DATA ACKNOWLEDGE (LBDTACK), LOCAL BUS ERROR (LBERR), and LOCAL BUS OVERRIDE (LBOVRIDE). This circuitry includes the PAL 138 disclosed in Appendix C. In FIG. 56, the RESPONSE signal is produced together with the LOCAL BUS COMPARE signal (LBINTLKCOMP*). The RESPONSE signal (RESP*) indicates that a device upon which the card has been waiting has responded so that the originator may proceed with the bus request. The (LBINTLKCOMP*) indicates that the second half of an interlock cycle is now ready for completion since the device that placed the circuitry in the interlock status has now returned to complete the access. Latches 420 and 421 are actually PALs that act as latches with set and reset lines as shown.

Figure 57:
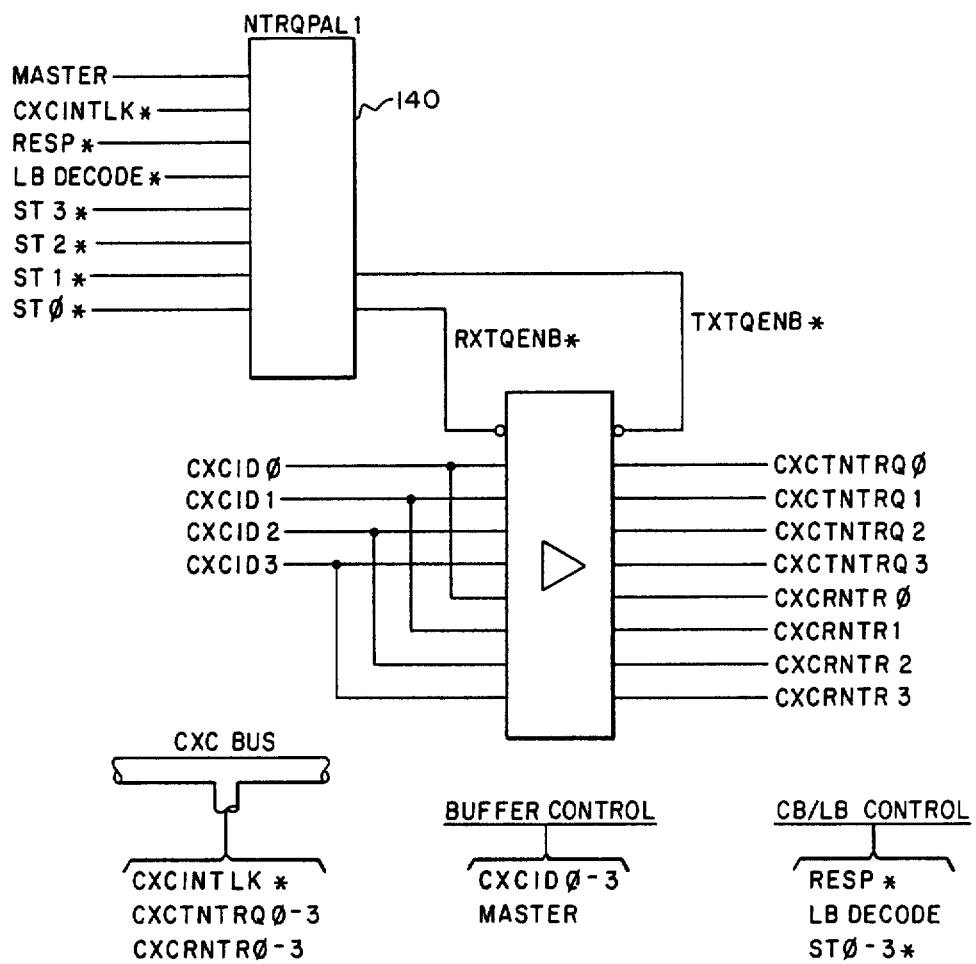
FIG. 57 is a schematic diagram of the Common Bus card next request send logic.

The Next Request Send logic is illustrated in FIG. 57 and includes the determination of whether the identifier will be transmitted for the TNTRQ0-3 or the RNTRQ0-3 (CXCTNTRQ0-3, CXCRNTRQ0-3) lines. The PAL 140 that is connected to receive the state output and other signals shown and controls on which lines the identifier CXCID0-3 is transmitted. Likewise, circuitry in FIG. 58 determines when the RNTRQ or TNTRQ identifiers have been received when the device has received a RETRY as previously discussed. PAL 142 has loaded the RETRY identifier into the two comparators upon the receipt of a RETRY.

Figure 59:
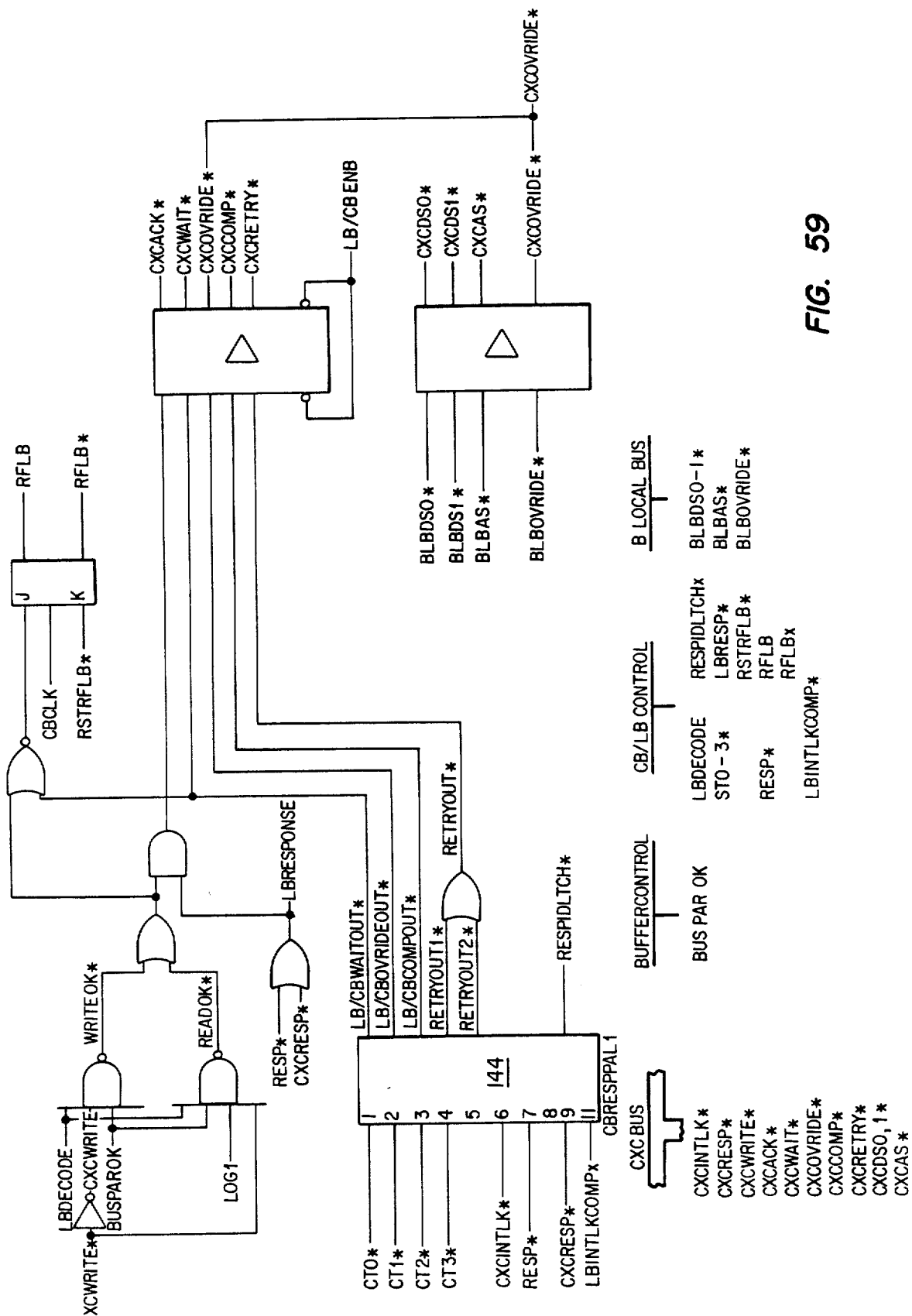
FIG. 59 is a schematic diagram of the Common Bus card Local Bus/Common Bus response logic.

FIG. 59 illustrates the circuitry for the Common Bus to Local Bus Cycle Completion logic which provides the RESPONSE COMPLETION signals on the Common Bus resulting from the state of the CB/LB Control logic. PAL 144 provides the RESPONSE signals as shown based upon the state value and other inputs.

Figure 60:
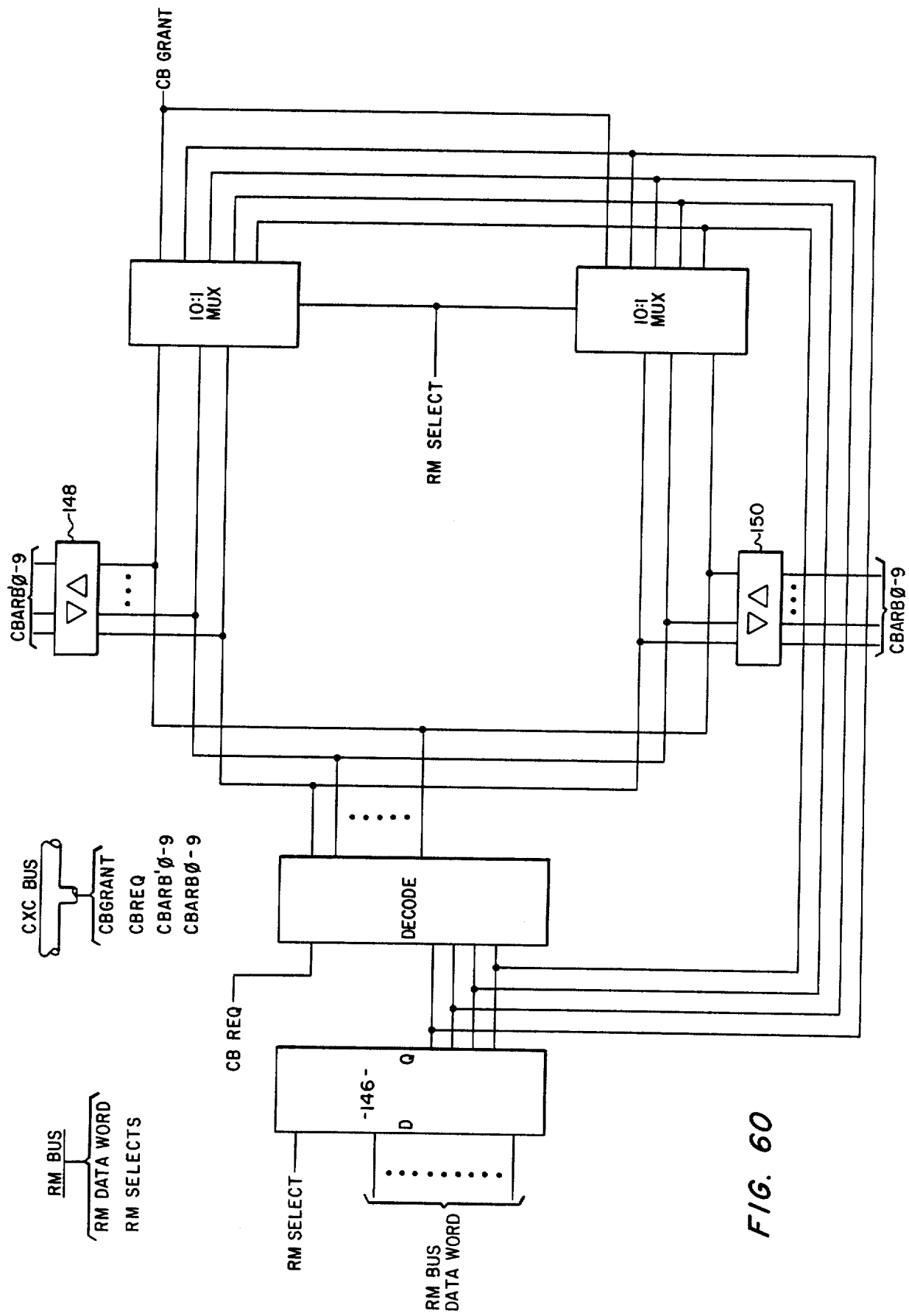
FIG. 60 is a schematic diagram o the Common Bus card Common Bus requestor.

FIG. 60 illustrates the circuitry for these Common Bus Requestor. The Common Bus Requestor when receiving a request on the CBREQ line raises 1 of 10 CBAR0-9 lines to indicate a request for access to the Common Bus. Which of the 10 lines that is raised is determined by the decode circuit which is controlled by a latch 146 connected to the RM Data Bus. The specification of the line is a result of the identifier of the card but it should be noted that this identifier is processed through the Resource Monitor and is thus under software control. The raised CBARB line is then output on both buses as shown through open collector bidirectional buffers 148 and 150. The Common Bus Request Arbiter in the same cycle then lowers all the other GRANT lines for the devices that have not been granted access to the bus. Therefore, in the second half of this cycle the selected CBARB select line is sensed through the multiplex circuits selected under the control of the Resource Monitor (which determines the CBARB lines is sensed) to generate the CB GRANT signal.

Figure 61:
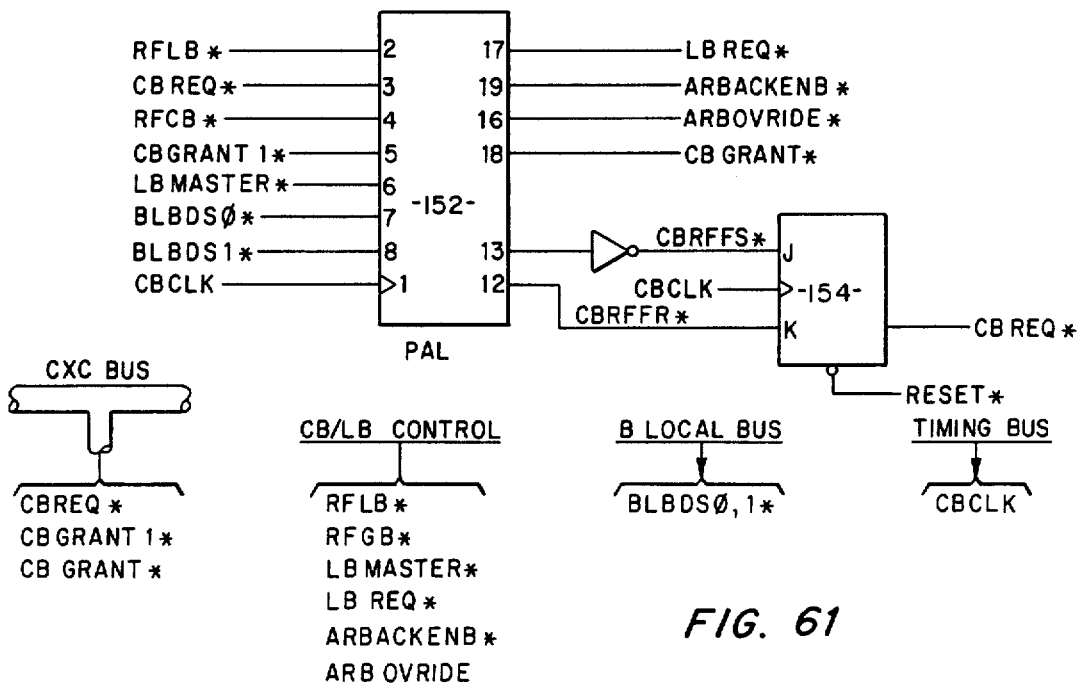
FIG. 61 is a schematic diagram of the Common Bus and Local Bus/Common Bus arbiter.

The Local Bus Arbiter is illustrated in FIG. 61 and is a Programmed Array logic 152 (also in Appendix C). Since the Local Bus and Common Bus are running asynchronously they both contain separate operations that may conflict. Conflicts will result when the Local Bus request Common Bus access but the access is denied because the Common Bus wants Local Bus access. This circuit resolves the contention by always providing that the Common Bus will be provided access (since it is the much faster device). The Common Bus can assert the Arbiter OVERRIDE signal which sends an OVERRIDE down the Local Bus to the Local Bus MASTER who will then relinquish control of the Local Bus. The Arbiter will then assert the LOCAL BUS REQUEST which is granted allowing the Common Bus to take control and finish the cycle on the Local Bus. After this cycle is finished control of the Local Bus is relinquished by the Common Bus. If there is no request for the Local Bus but there is a COMMON BUS REQUEST from the Local Bus then the Arbiter circuitry will hold the Common Bus Request until a GRANT is received i.e. set the latch 154. When the GRANT is received the latch 154 will be RESET. The output of this latch 154 is the input to the Common Bus Requestor previously discussed.

Figure 62:
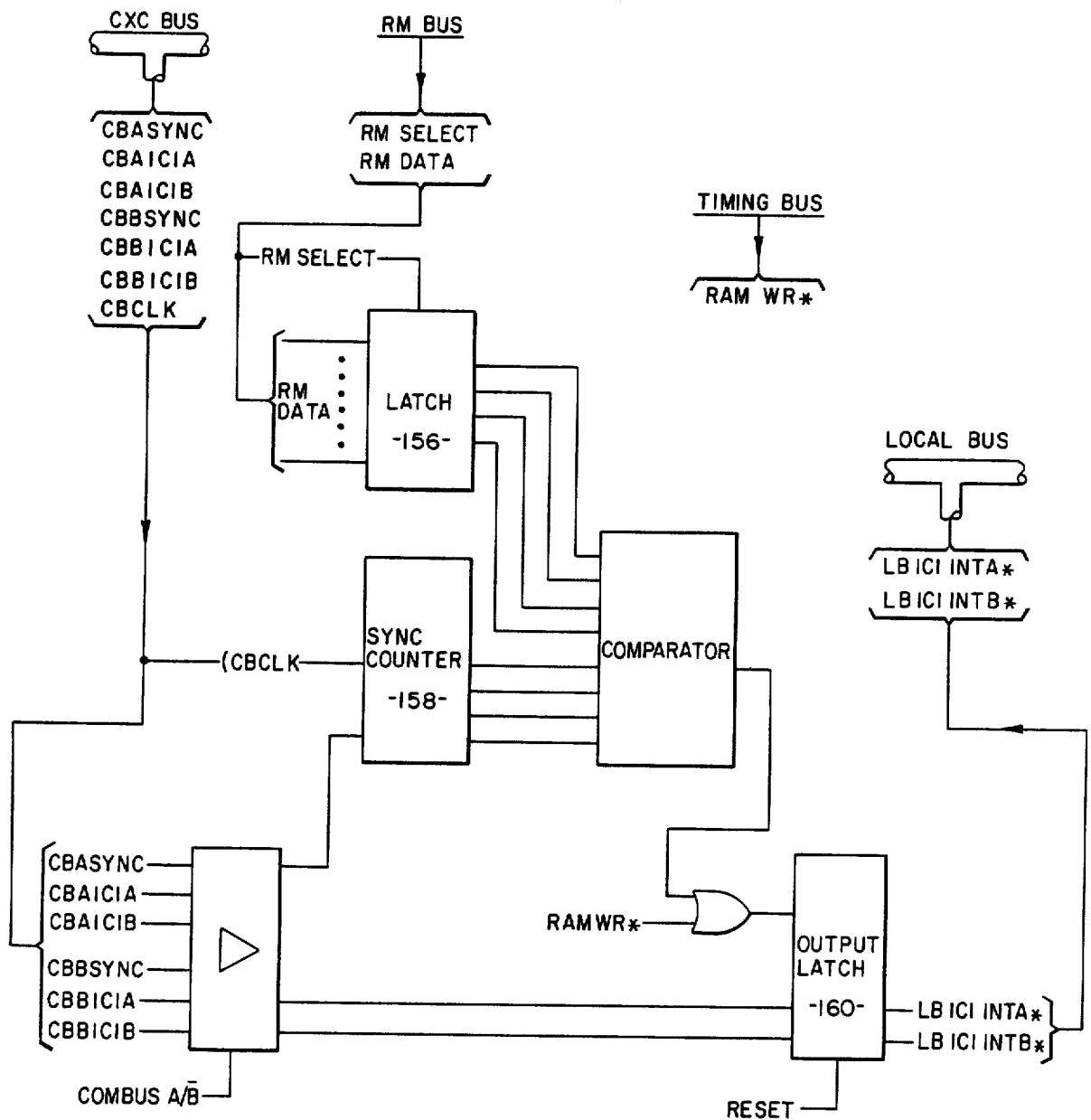
FIG. 62 is a schematic diagram of the Common Bus card interrupt receiver circuitry.

The InterComputer Interrupt to Local Bus Interface logic is illustrated in FIG. 62. The interrupt lines on the Local Bus are LBICINTA* and LBICINTB* which are active low driven to indicate the presence of an interrupt. The interrupts for all the nodes in the system are contained on three lines for each bus as illustrated. One line is the SYNC and the other two are the ICIA and ICIB lines. The Interrupt Information for all of the units is time division multiplexed on these lines. The function of the Intercomputer Interrupt to Local Bus Interface logic is to demultiplex the information on the interrupt lines to provide the interrupt to the Local Bus. Therefore, each Local Bus Interface has a time slot address which is determined by the Resource Monitor and stored in a latch 156 via the Resource Monitor Data Bus. This four bit address is used to address one of ten slots with the SYNC counter 158 that is connected to the CB CLK. Upon the occurrence of the proper time slot, the information on the ICIA and ICIB lines are appropriately latched into an output latch 160 which provides the ICI INTERRUPT A and ICI INTERRUPT B signals to the Local Bus as shown.

Figure 63A:
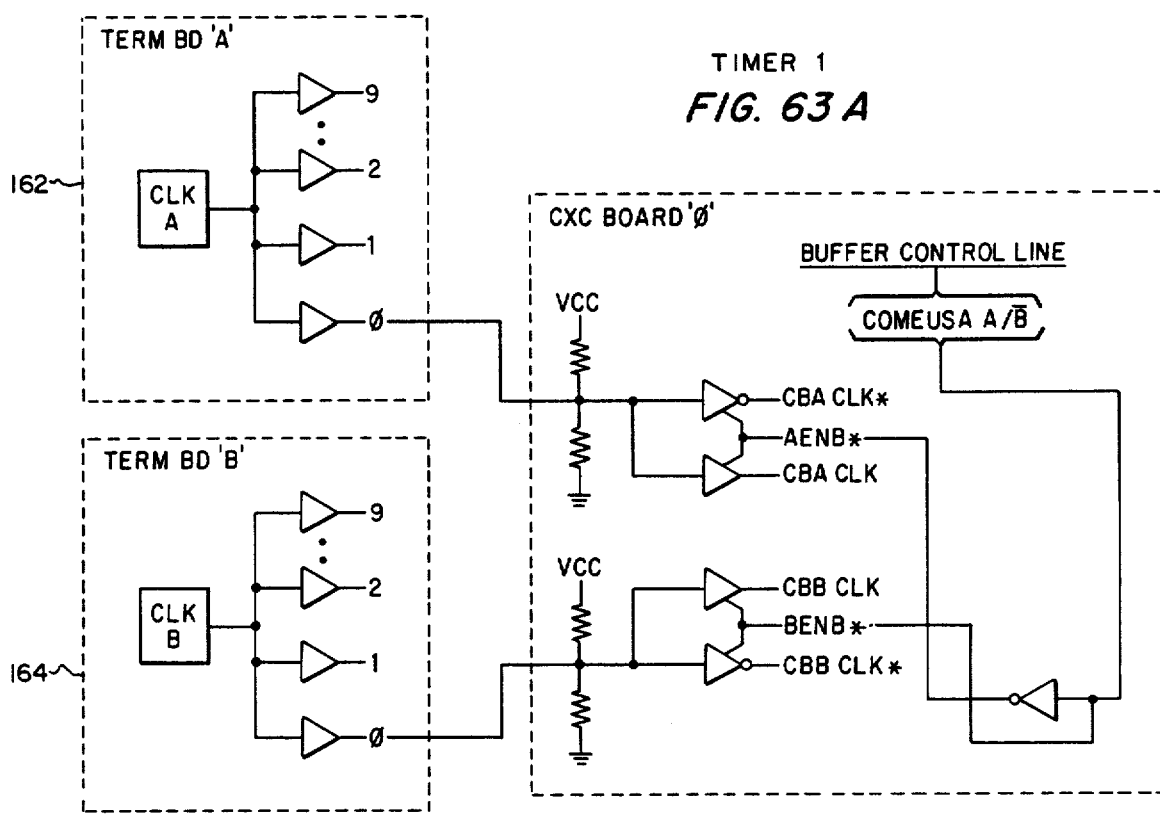
FIG. 63A is a schematic diagram of the timer card for the Common Bus.
Figure 63B:
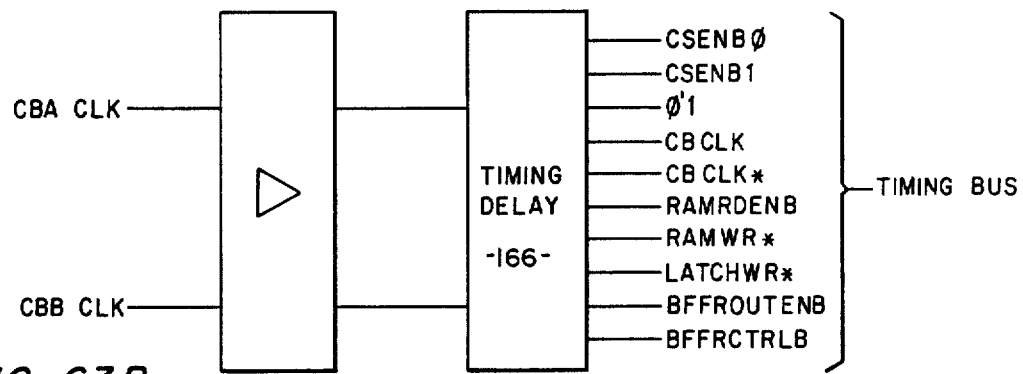
FIG. 63B is a schematic diagram of the clock signal receiving circuitry on the Common Bus card.
Figure 63C:
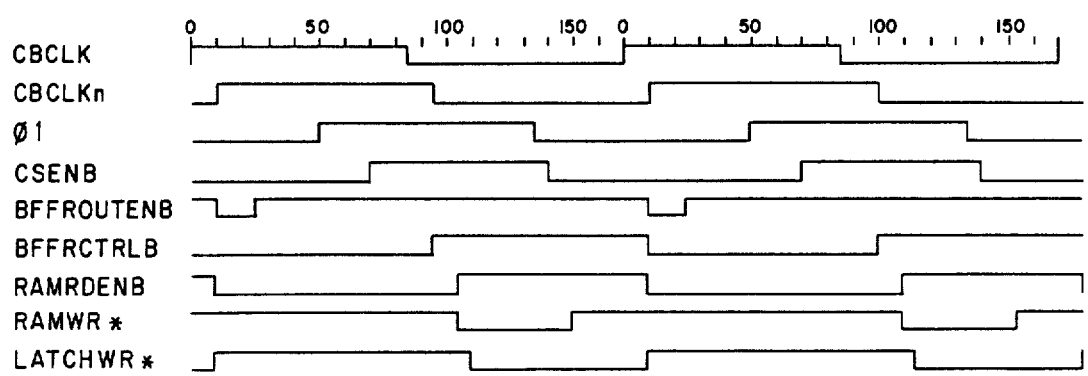
FIG. 63C is timing diagram of the timing signals received and generated by the circuitry in FIG. 63B.

The timing for the circuitry on the Common Bus Interface Cards is provided by circuitry illustrated in FIG. 63a. This circuitry includes two external boards 162 and 164 that are mounted on the back plane and include an oscillator circuit, CLK A or CLK B, each connected to ten drivers. The clocks or CLKS are redundant for reliability. Each Control Card receives the outputs from each CLK as shown. It is important to note that the circuit board arrangement for each of the CLK boards mounted upon the back plane include a physical structure that provides for an equal propogation delay of the CLK signals to each of the Common Bus Cards connected are connected to the Common Bus. This physical configuration for providing equivalent propogation delays will be discussed later. Each of the CLK signals from the CLK boards are received by circuits that provide a CLK and CLK* signal for each of the two circuits yielding a CBA CLK, CBA CLK*, CBB CLK, and CBB CLK* signals. The actual CLK signal is determined in conjunction with the COMBUSA/B* line which determines which of the two Common Buses is to be used as previously discussed. Both the CBA CLK and CBB CLK signals are received by circuitry illustrated in FIG. 63b and input to Timing Delay circuitry 166 which produce these signals indicated. The Timing Delay diagram in FIG. 63c illustrates the output of this Timing Delay circuit. The internal clock cycle of the present embodiment is 166 ns resulting in a 24 megabyte transfer rate.

FIG. 64 illustrates the Common Lock to Local Bus Interface logic which is connected to the buffered Local Bus as illustrated in FIG. 41. This interface is addressable by the processors connected to the Local Bus for each Common Card. When a processor addresses the interface to perform a Common Lock operation as previously discussed, the Local Bus address is first decoded to determine that the transfer is intended for the Common Lock Interface by the Local Bus to the Common Lock Address Decode circuit which is a soft device similar to the Local Bus to Common Bus Address Decode of FIG. 53 and receives the Common Lock Address space from the Resource Monitor Bus. This decode circuitry provides an indication to the Common Lock (CL) Control which decodes the Local Bus control lines and indicates a Common Lock operation to the Common Lock Bus (CLB) requestor which places a request on the appropriate Common Lock Bus line (the request line is specified by the Resource Monitor upon initialization). Upon the grant of the Common Lock Bus, the information from the latches 430 and 431 are transmitted through buffers 440 and 441 with the Common Lock Bus control signals through buffers 442 and 443 via line 445 from the Common Lock control circuit. The Common Lock control circuit controls the operation of latches 430–433 and buffers 440–443 via lines 444 and 447 respectively. These lines control both timing and direction of the buffers and timing of the latches. The Common Lock control circuit also reverses the direction of the buffers 440–443 to receive the response. The information from buffers 440 and 441 is stored in the registers 450 or the FIFO registers 451 or 452 in accordance with the previous discussion. The Common Lock control then response on the Local Bus with the appropriate control signals via lines 446 through either latch 432 or buffer 433 to complete the transaction. The information to the processor is provided by the Local Bus data lines from either the registers 450 or the FIFO's 451 or 452 which ever is appropriate. Note that FIFO's 451 and 452 generate the Common Lock interrupts to their respective processors when data is stored in the FIFO's and when the interrupt ode has been specified.

Figure 65:
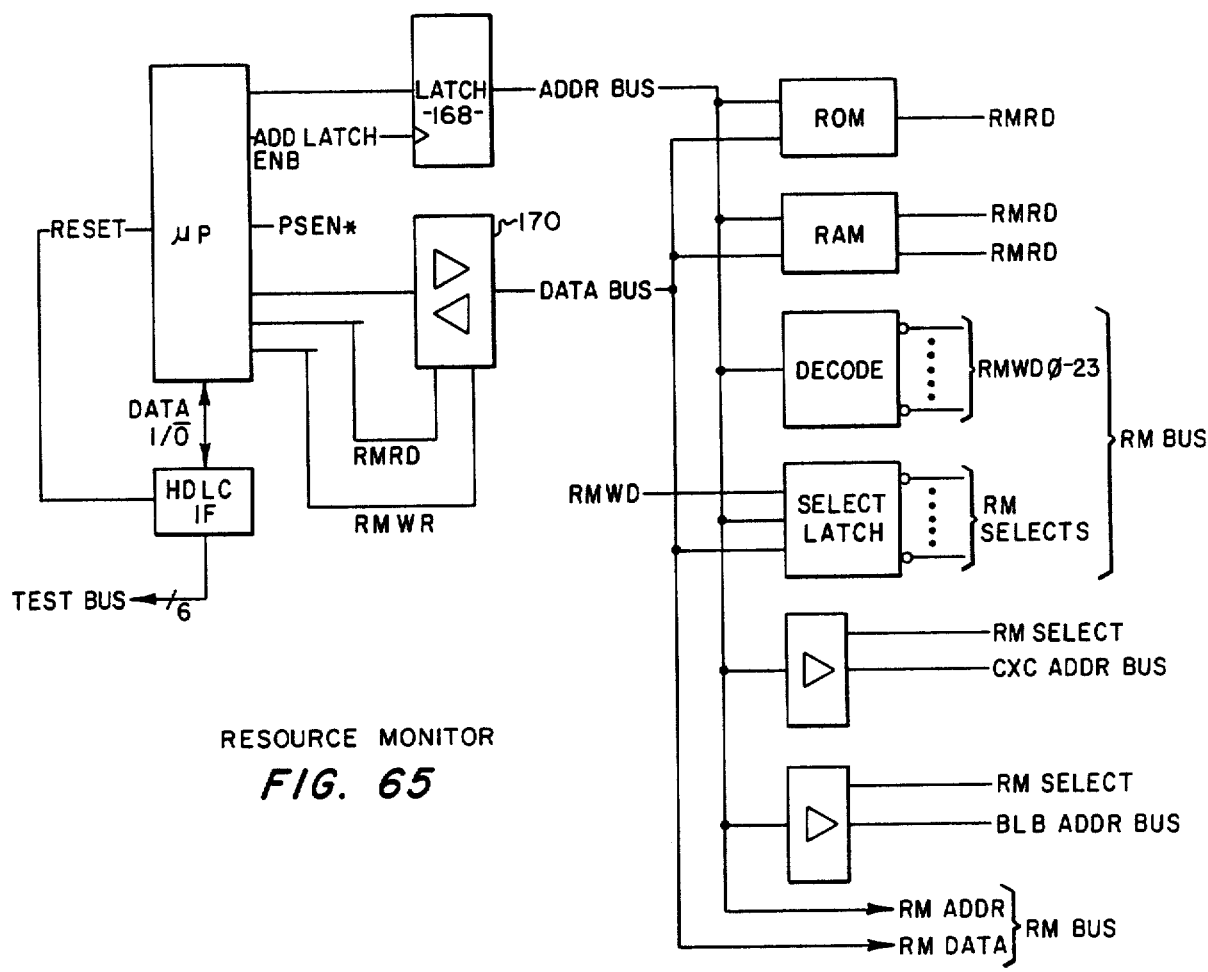
FIG. 65 is a block diagram of the Common Bus card resource monitor.
Figure 66:
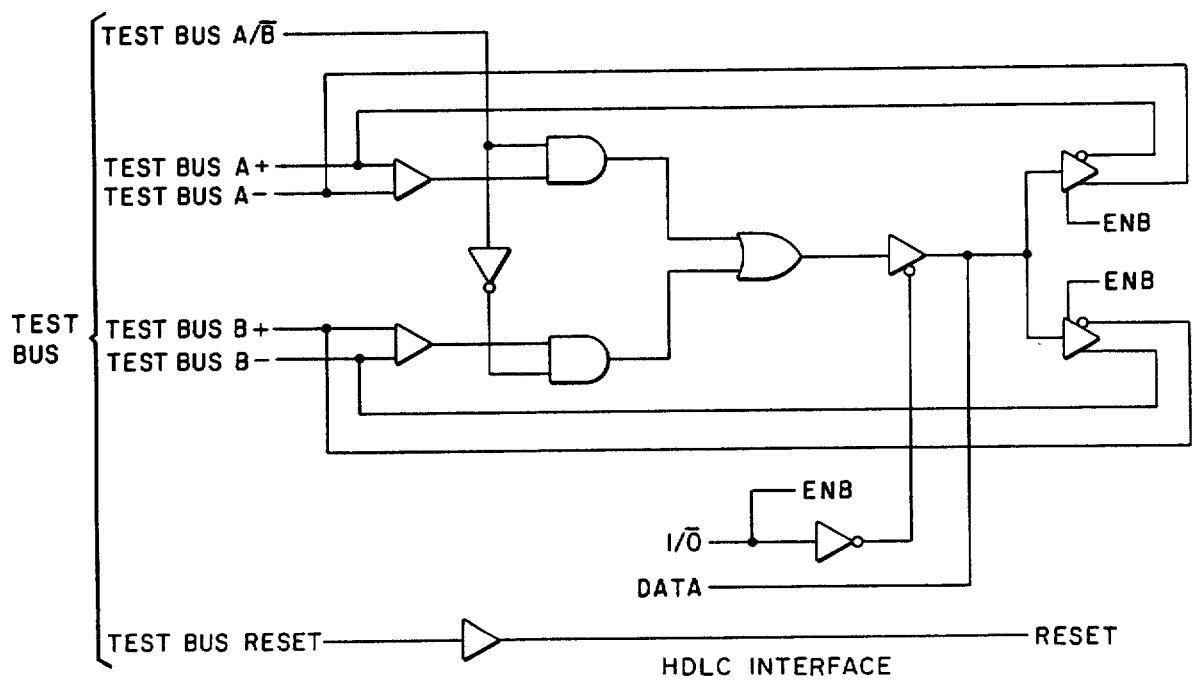
FIG. 66 is a schematic diagram of the Common Bus card resource monitor HDLC interface circuitry.

FIGS. 65 and 66 illustrate the Resource Monitor circuitry and the Test Bus interface. In FIG. 65, the Resource Monitor, in the preferred embodiment, principally includes an INTEL 8344 microprocessor that is connected through a latch 168 to an Address Bus and connected through a set of drivers 170 to a Data Bus which support the Resource Monitor program stored in ROM, SCRATCHPAD RAM, and provide a link to the remainder of the card including the decode lines, the select latch lines, the signals driven to the CXC Bus and the B Local Bus address lines together with the RM Bus consisting of the RM address and the RM data lines. In this embodiment, the Resource Monitor microprocessor is connected to a Test Bus which is a six line bus connected through an HDLC interface. The HDLC interface is illustrated in FIG. 66 and consists of two lines for TEST BUS A and two lines for TEST BUS B (both differentially driven) together with a TEST BUS A/B* select line and a TEST BUS RESET. The Test Bus originates from the Performance Monitor to be discussed and provides control of the Resource Monitor which provides the basic software control of the Common Bus card as discussed.

Figure 67:
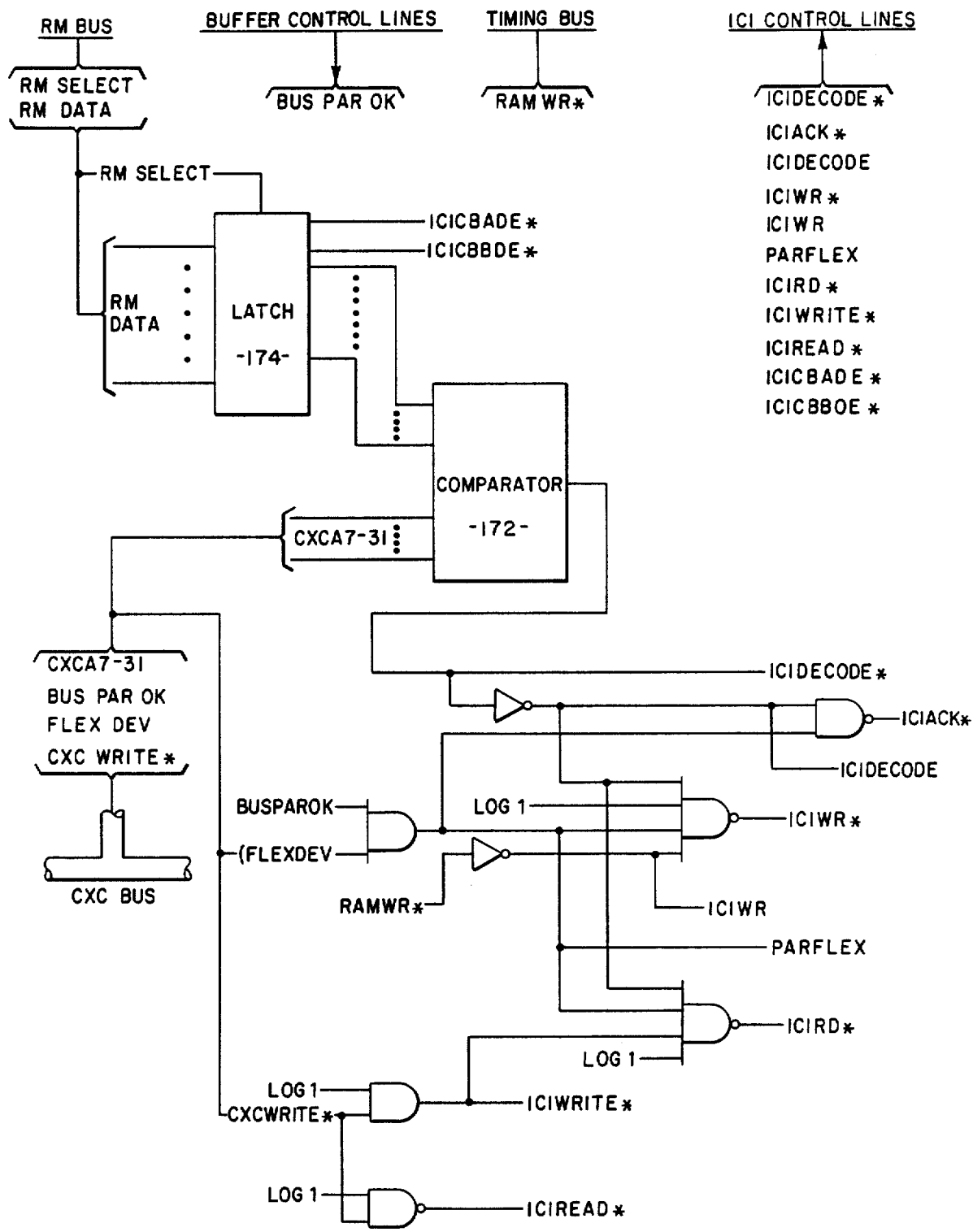
FIG. 67 is a schematic diagram of the InterComputer Interrupt address decode and control logic.

The InterComputer Interrupt Control logic is located on the Common Control Card as illustrated in FIG. 41 and includes the four modules: ICI Address and Decode Logic, ICI Interrupt Generator, ICI Word Register, and the ICI Response Logic. The ICI Address Code and Control Logic is illustrated in FIG. 67. The ICI Control Logic consists of the ICI Word Register which is addressed over the Common Bus by any of the nodes located on the Local Buses. To raise an interrupt, as previously discussed, the requesting device merely writes data into the ICI Word Register. The ICI Address and Decode and Logic partially decodes the address write from CXC A7-31 which is input into a comparator 172 and compared against the address of the ICI circuitry which has been loaded into a latch 174 by the Resource Monitor Bus as shown. If there is a true comparison through this comparator 172 then a node is attempting to write into one of the 32 bit words of the ICI register and will be indicated by the ICI DECODE* line with the associated control signals as illustrated. These control signals are used to provide access to the ICI WORD REGISTER illustrated in FIG. 68 which allows the data to be ORed into the existing 32 bit word that is dedicated to the node to receive the interrupt. This 32 bit word is stored in RAM 176. Each of the 20 nodes has a 32 bit word in the ICI Word Register dedicated to it. When this word is read by its node the ICI Read* line will clear that respective node's word in the ICI Word Register. As discussed writing into the ICI WORD REGISTER will generate an interrupt. This generation circuitry is illustrated in FIG. 69. Since the interrupt is a time division multiplexed interrupt for the 20 nodes, the address latch 178 will produce an interrupt signal which is combined with the SYNC counter 182 through a 20:2 MUX circuit 180 to provide an interrupt on either the ICI A* or ICI B* lines together with the SYNC* signals to be used by the receiving control card to receive the multiplexed interrupt. The ICI RESPONSE LOGIC which provides the response signal for the CXC (or Common Bus) protocol is illustrated in FIG. 70.

Figure 71:
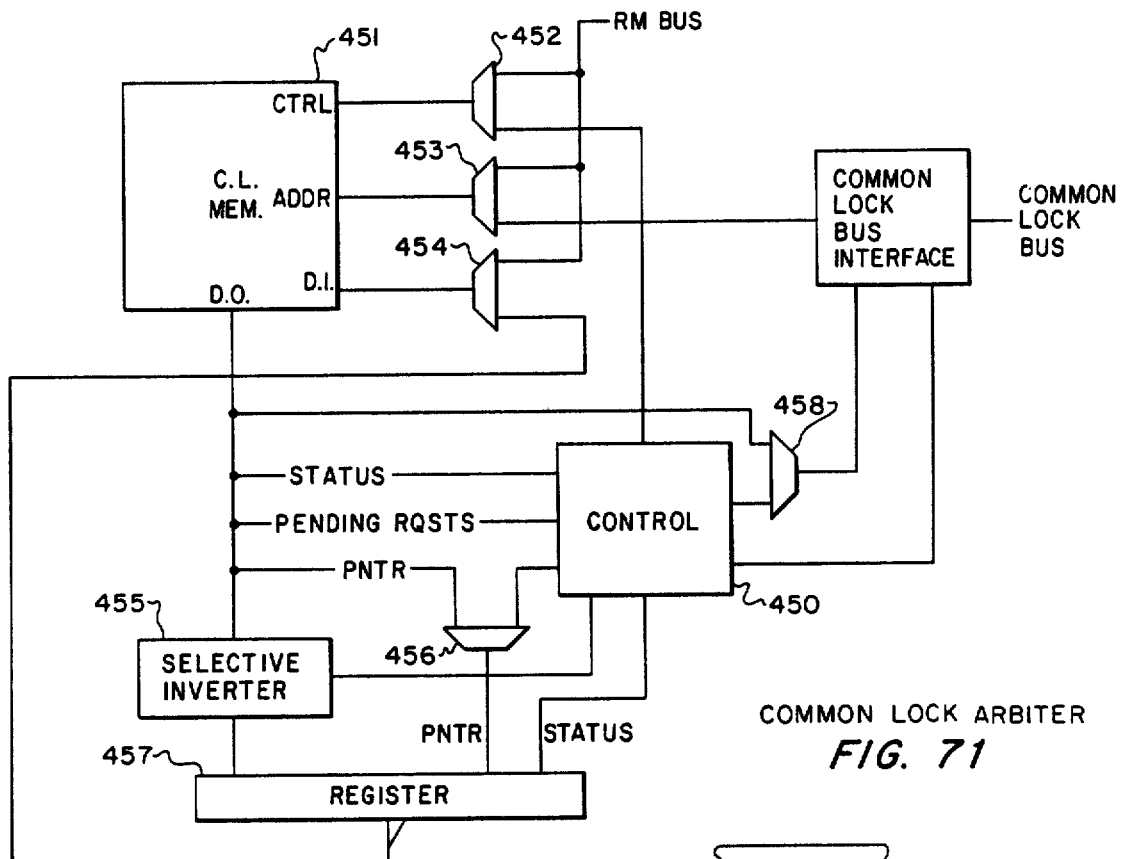
FIG. 71 is a schematic diagram of the common control card common lock arbiter.

The Common Lock Arbiter circuit is illustrated in FIG. 71. FIG. 71 illustrates the Common Lock Arbiter circuit that receives the requests from the Common Lock Interface circuits illustrated in FIG. 64. The Common Lock Arbiter receives the request over the Common Lock Bus through the Common Lock Bus interface which is controlled by the Arbiter Control 450. The Common Lock Memory 451 contains the Common Locks and Lock words. Information from Memory 451 is addressed from the Common Lock Bus under control of Arbiter Control 450. When information from memory 451 is to be transferred over the Common Lock Bus, multiplexer 458 places this information in the interface to be sent over the Common Lock Bus under the control of the Arbiter Control 450. When a lock is reset or set, the address of the lock from the Common Lock Bus via multiplexer 453 and the control of the memory 451 via multiplexer 452 and the control 450 access the lock word. Lock bits are set or reset via the selective invertor 455 by the control 450. The pointer, designating the owner of the lock, is either unchanged from memory 451 or is specified by control 450 from the pending requests and status information and placed in register 457 via multiplexer 456. Register 457 serves to latch the lock words for storage in the memory 451 via multiplexer 454. It should be appreciated that control 450 can also serve to override a lock condition because of a timeout, i.e. lock maintained by a device for too long, or some other error condition.

Figure 72:
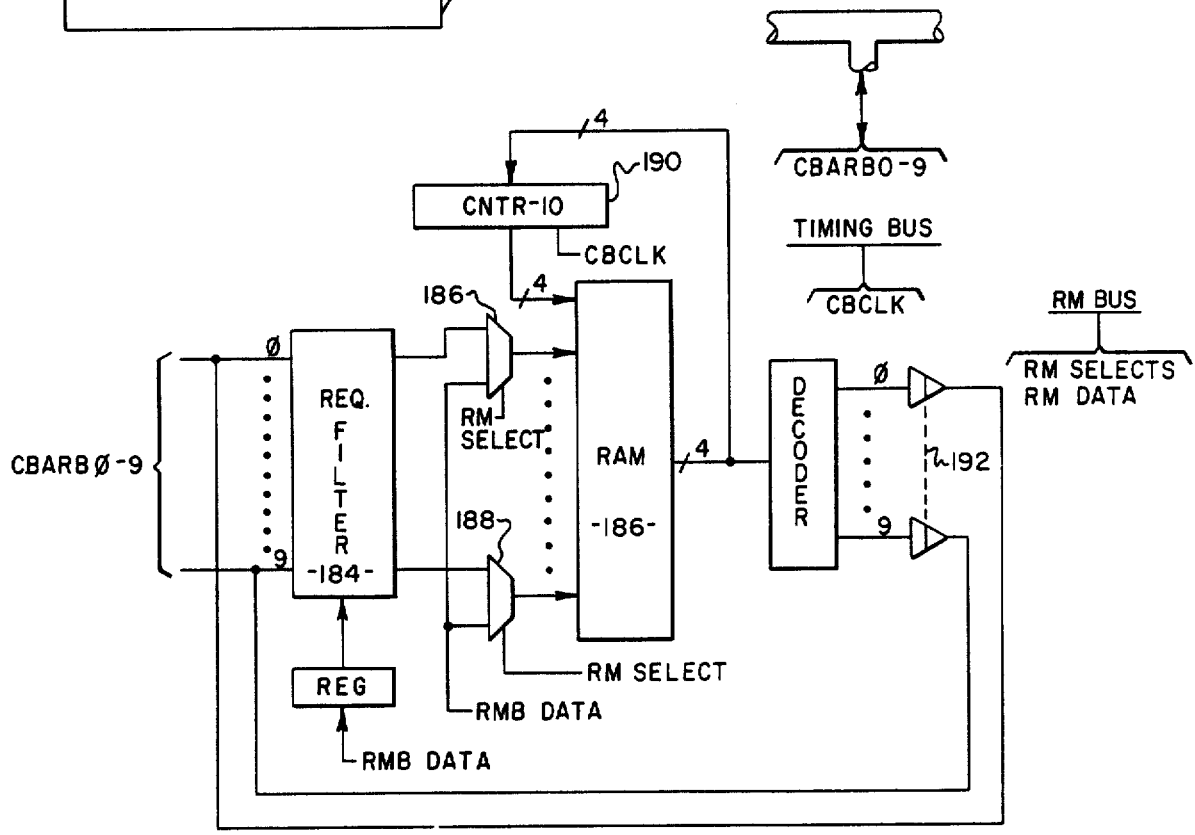
FIG. 72 is a schematic diagram of the common control card Common Bus arbiter circuit.

The Common Bus Request Arbiter circuitry is illustrated in FIG. 72. The arbitration for the Common Bus is accomplished concurrently with the Common Bus transfer by determining the grant for the next cycle during the current cycle. The CBARB0-9 lines are input to a request filter 184 which is controlled by the Resource Monitor and provides a means for the Resource Monitor to turn off any common request lines from an unwanted Common Bus card. The Common Bus Arbitration lines are then input to a RAM 186 for a selection of the line to be granted. The arbitration lines are input through multiplexers 188 which also provides the means for the Resource Monitor to load the RAM 186 with the specific arbitration sequence to be used (i.e. round robin, specific priority, or other). The counter 190 is provided to implement the round robin arbitration sequence. The outputs of the non-selected lines are driven low by the open collector drivers 192 to indicate to their respective cards that they have not been granted access to the Common Bus. Thus, the card that has been granted access to the Common Bus will sense that its arbitration line remains high during the second half of the arbitration cycle.

Common Access Card

Figure 73:
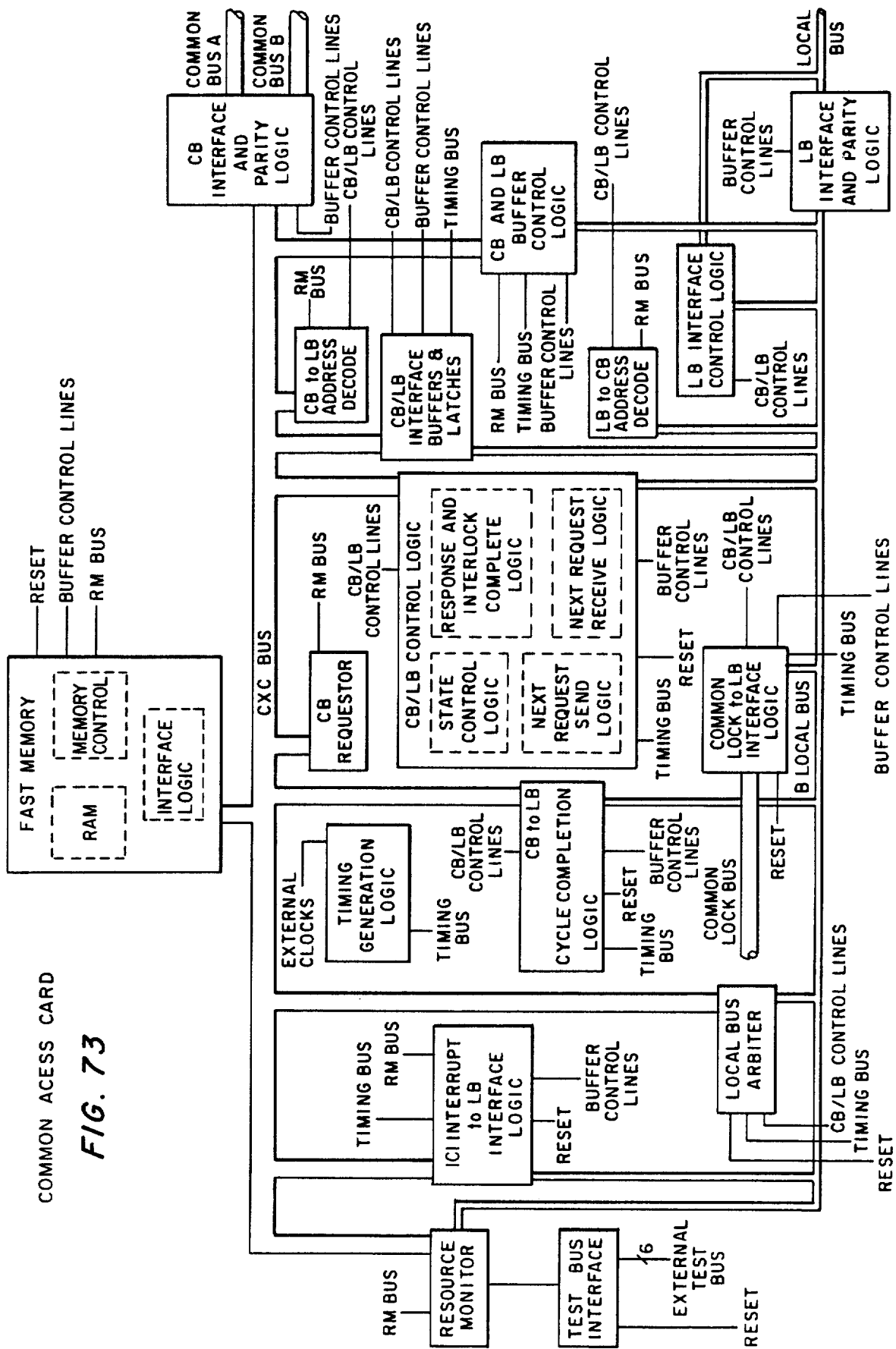
FIG. 73 is a block diagram of the common access card.

FIG. 73 is a functional block diagram of the Common Access Card. It should be noted that the Common Access Card is identical to the Common Control Card except for the portion of circuitry that is located above the CXC Bus. In other words, the Common Access Card does not contain the Common Bus Arbiter, the Common Bus lock Arbiter or the INTERCOMPUTER INTERRUPT control logic. Rather the Common Access Card includes the Fast Memory circuitry as illustrated. The Fast Memory circuitry contains three modules: a RAM, memory control and interface logic. The Fast Memory circuitry is connected to the Common Bus and Local Bus Buffer Control logic through the Buffer Control lines and through the Resource Monitor and Test Bus through the RM Bus and RESET lines. The Fast Memory is a distributed element wherein a portion of the Fast Memory is contained on each of the Common Access Cards. All of the Fast Memory is accessible by any node addressing the Common Bus. It should be recalled that interfacing to a Common Bus by Local Buses will include interfacing to one Common Control Card and at least one Common Access Card. The number of Common Access Cards connected to the Common Bus determines the amount of Fast Memory available. The purpose of the Fast Memory is to serve as a high speed, common memory resource that is shared by every node on the Local Bus.

Figure 74:
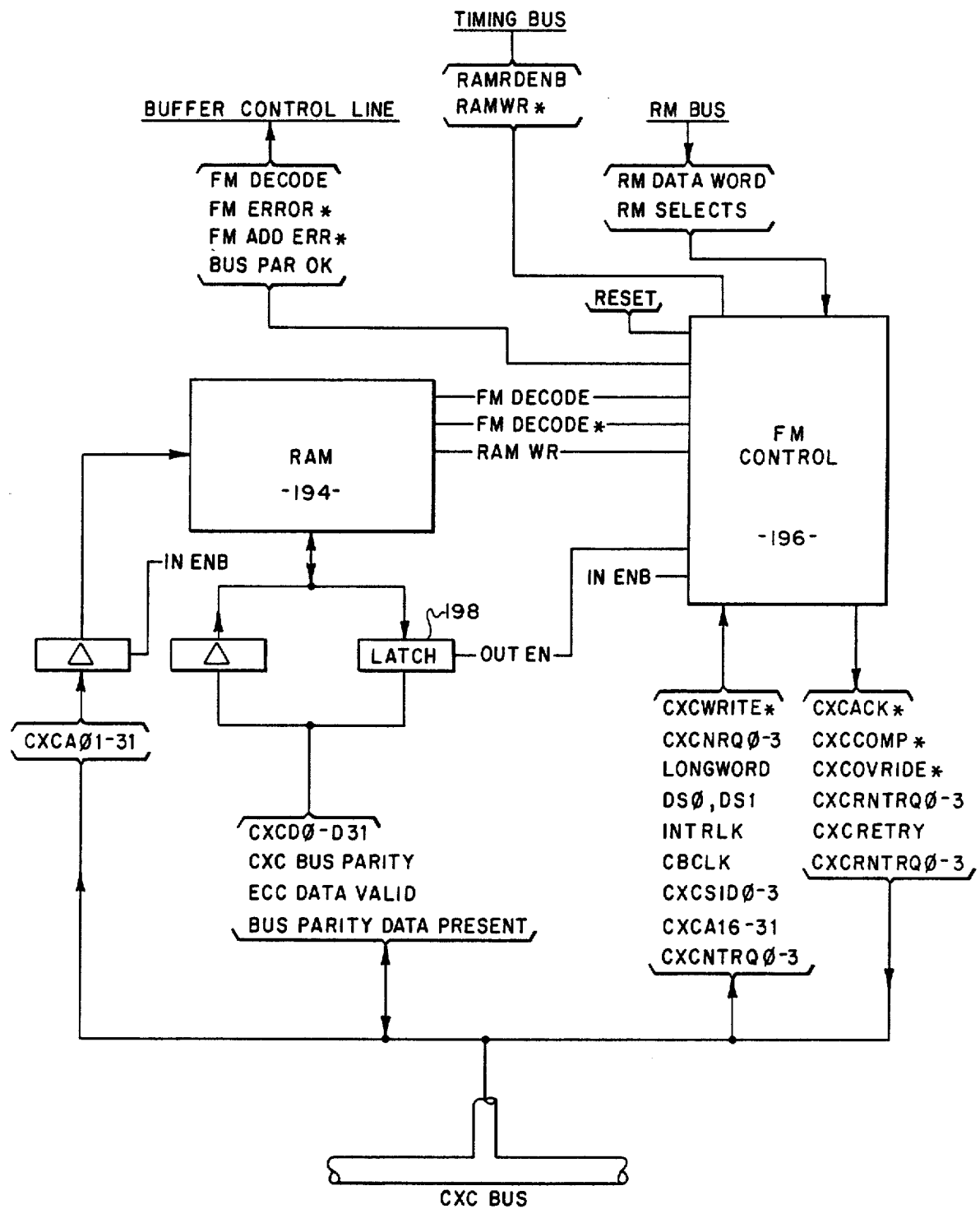
FIG. 74 is a block diagram of the common access card fast memory segment.
Figure 77:
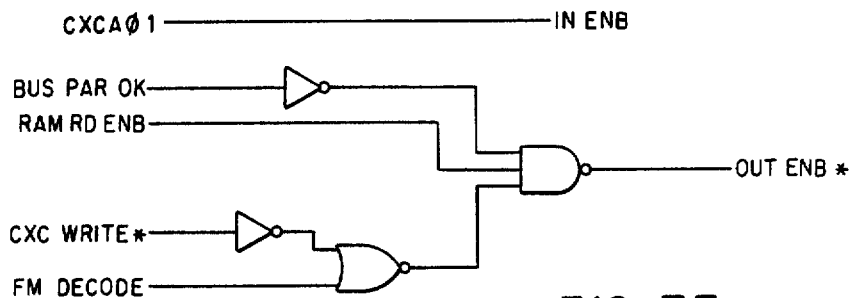
FIG. 77 is a schematic diagram of the fast memory output enable logic.

FIG. 74 illustrates a functional block diagram of the fast memory. The fast memory consists of a RAM 194 connected to the CXC Bus to provide a data input output means via the CXC D0-31 lines and the appropriate error correction and bus information. The address of the locations in RAM 194 is input to the Fast Memory Control 196 (FM control) for decoding. The FM control further provides the OUTPUT ENABLE signal for the RAM Data Output Latch 198 together with the RAM WRITE (RAMWR) signal and the DECODE signals for the RAM 194. The FM Control circuitry 196 also implements the interlock function which permits a node to perform an operation involving more than one Common Bus cycle without locking up the Common Bus continuously. As discussed, the interlock permits the node accessing that portion of Fast Memory on the Common Access Card to interlock that portion of the Fast Memory such that only that device will be able to access that portion of the Fast Memory on a later cycle to complete the operation. This circuitry is provided to implement the Read-Modify-Write instruction. FIG. 75 illustrates the Address Decode Circuitry which is simply a comparison of the CXC A16-31 address lines with the address that has been previously stored in the latch 202 by the Resource Monitor. The remaining CXC address lines are input to the RAM to decode to specific RAM chips. The timing for the RAM write operation is illustrated in FIG. 76A which includes inputs from the CXC Bus into a PAL 202 to provide with other signals, the RAM WR OUTPUT signal to the RAM. The contents of the PAL 202, in schematic form, is illustrated in FIGS. 76B and C. The output from the RAM 194 to the CXC Data Bus is latched with the OUTPUT ENABLE signal as illustrated by the circuitry of FIG. 77. It should be noted that the INPUT ENABLE LINE is merely the CXC A01 line as also illustrated.

Figure 78A:
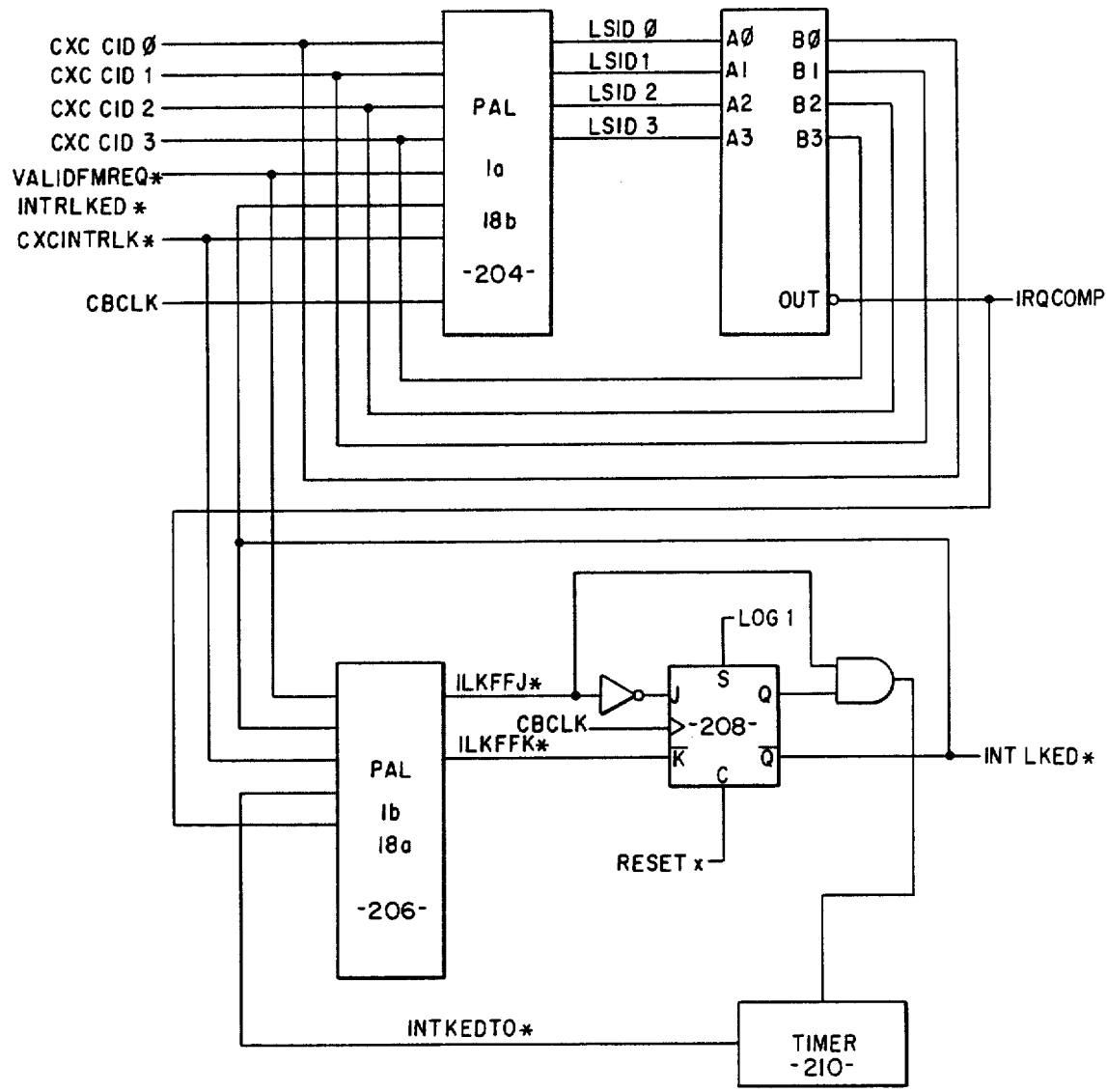
FIG. 78A is a schematic diagram of the fast memory control interlock logic.
Figure 78B:
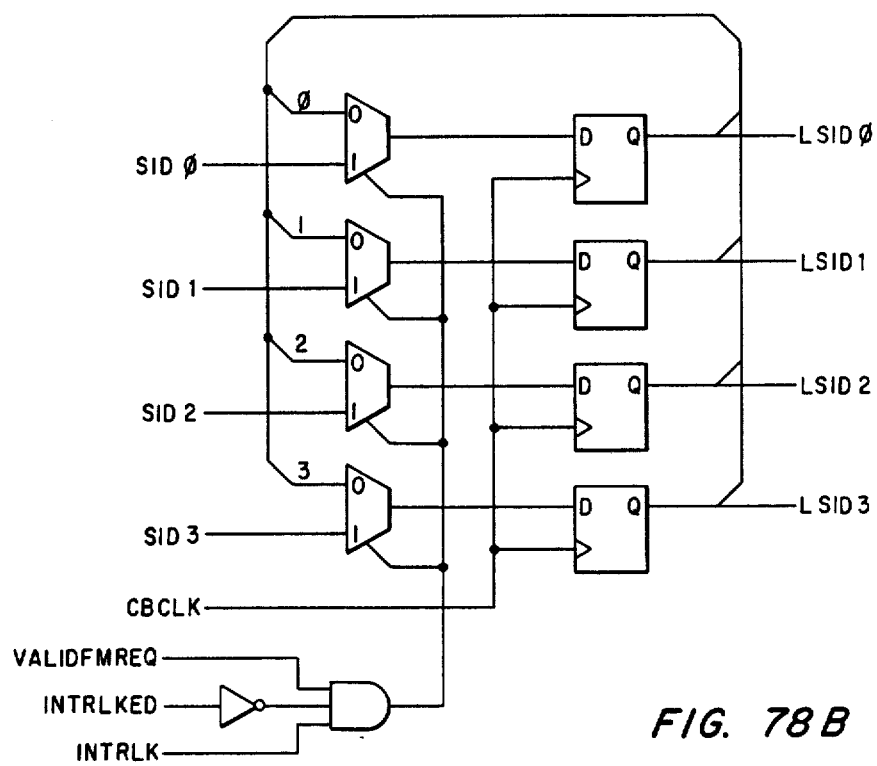
FIGS. 78B and 78C are the schematic diagrams of the programmed array logic 204 and 206 of FIG. 78A.
Figure 78C:
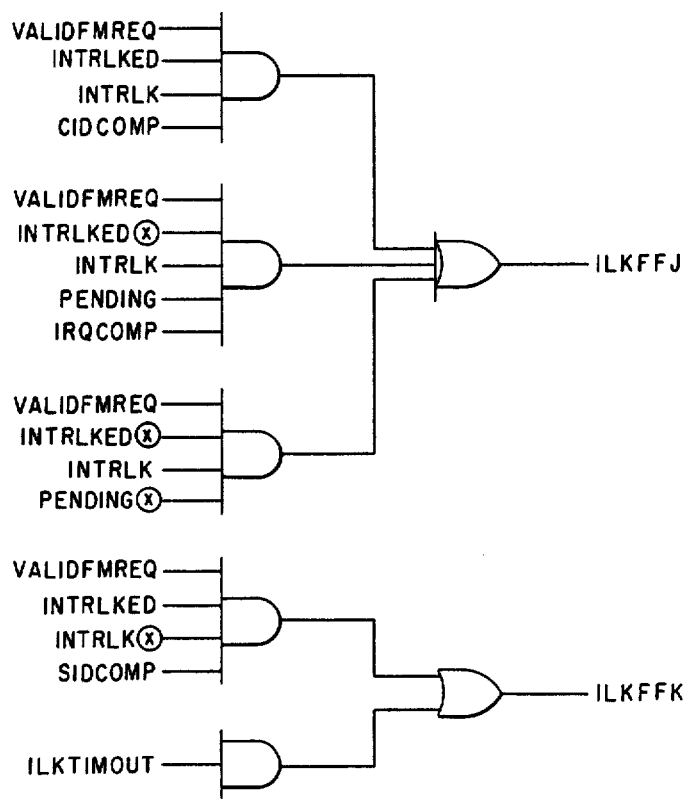
Figure 79:
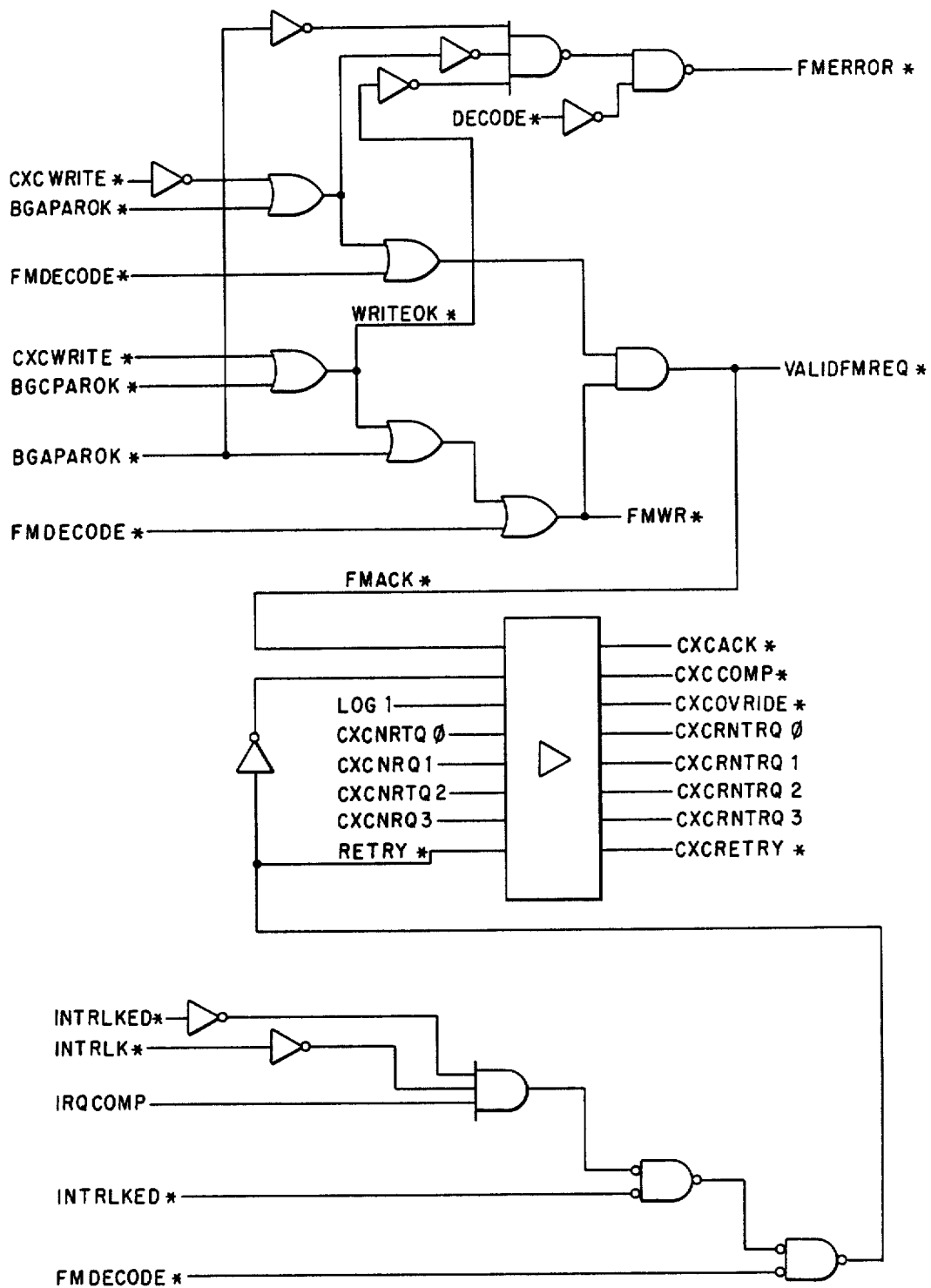
FIG. 79 is a schematic diagram of the fast memory Common Bus response circuitry.

The interlock function is implemented in the Fast Memory by the circuitry contained in FIG. 78A. This circuitry includes a PAL 204 that detects when an interlock operation is being executed. The identifier (CXCSID0-3) of the device interlocking the memory is then stored in PAL 206 and the JK flipflop 208 is set to produce the INTERLOCK signal (INTLKED*). The Fast Memory is then interlocked and any device other than the interlocking device that attempts to access the memory will receive a RETRY signal. The identifier of each device attempting to access the Fast Memory will be compared with the identifier for the interlocking device to determine if the interlocking device is again attempting the access the fast memory to complete the transaction. When the interlocking device has again returned, the circuitry in FIG. 78A produces the IRQ-COMP signal indicating that the interlocking device is present and this access will be allowed. This circuitry further includes a timer 210 which terminates the interlock cycle if the interlocking device does not again access the fast memory within a specified time interval. The contents of the two PALS 204 and 206 in FIGS. 78A are illustrated in schematic form in FIGS. 78B and 78C. The Response logic for the CXC or Common Bus protocol is provided by the circuitry in FIG. 79. The function of this circuitry is to produce either the ERROR indicator (FM ERROR*), the ACKNOWLEDGE signal (CXCACK*), the COMPLETE signal (CXCCOMP*) and the RETRY signal (CXCRETRY*).

System Monitor

The system monitor provided by this invention is a combination of hardware and software that provides three separate levels of functionality. The first level of functionality is the configuration level. On this level, referred to as the basic level, the Test Bus and the system monitor are used to initialize the multicomputer system at program load time. Each module of the system contains upper and lower address registers. In the initial program loading by the system monitor, computers, local memories and common memories may be placed anywhere within the 32 bit address space of the system (anywhere within 4 gigabytes). By the system monitor, each and every module can be bound, configured and reconfigured as appropriate for whatever application a particular user desires to execute. Along with the initial program load capability at the configuration level, the system monitor has the ability to provide automatic shutdown and restart. The automatic shutdown or restart can be initiated by software residing in any computer in the multicomputer system or by the system monitor.

The second level of functionality is the system diagnostics level where there is an automatic and continuous diagnosing of each of the modules or building blocks in the system by the system monitor hardware and software. Each computer, memory and Common Bus Card in the system contains a separate and distinct self-test microprocessor (referred to as the Resource Monitor). This self-test microprocessor continually diagnoses each card to which it is attached. The diagnostic information from each self-test processor is fed back through the self-test mechanism and software via the Test Bus. The self-test software, then, is capable of detecting each fault and isolating that particular fault to allow even a semi-skilled, nonprofessional person to maintain the invention. This same system can be used to verify the proper operation of the system after the fault has been removed and the repair made.

When a fault is detected, the self-test software (which can be located in any computer within the system) can then direct attention to the particular card where the fault has occurred. Then depending on the application and how the system intergrater and developer desires the system to function, the system can shutdown, go to a backup system, or continue in a degraded mode.

The third level of implementation is performance evaluation. Each computer, memory and Common Card contains self-test hardware and self-test software that is continuously monitoring each card and each access from the local memory to common memory. Therefore, performance evaluation software can be provided that traces, or tracks, each process within the multicomputer system. Tracing how and when a process communicates with every other process currently running in the multicomputer allows for overall behavior of the system to be monitored. This enables the performance of the multicomputer system to be tuned to the needs of the particular application.

For example, in a development situation a system developer may want to use a very open, "loose" architecture to provide terminals and tools to a great number of program development people. This developer may want to have, for example, ten computers with each computer having a certain amount of memory and each computer executing the Unix System V Operating System. In this manner, each computer is a system in itself and can provide program development for ten or more online programmers. When all the programs or processes, are developed and debugged, the system developer then may want to simulate concurrency on one or more of the computer modules using a simulator and then integrate certain concurrent processes to test for capability. At this level of test, the system developer may write a concurrent executive that actually exercises all processes and all computers and the entire application can be synchronized. At that point, the performance evaluation software becomes the development tool. By use of this software, a system developer can determine which process and which computers are communicating with other processors and other computers and how much Common Bus availability is being used by these different processes. Thus, for example, if process one in computer A is communicating 86% of the time with process 5 of computer 4, it may be advantageous to put process 5 in a multitasking environment along with processing 1 in a single computer rather than having them communicate by the Common Bus or messaging hardware. By use of this performance evaluation tool, the system developer can in essence tune a working application on a very forgiving computer configuration (optimized for development) into an application running on a very tight, much smaller computer configuration optimized for the implementation of that specific application.

This system monitor configuration can also be used to implement a fault tolerant architecture within the multicomputer system. In some cases, the application may dictate that an entire system be redundant for which the multicomputer unit can support two distinct multicomputers. However, many applications desire fault tolerance, not by two complete computer systems, but by redundancy of functionality or processes. In that case two or three computers within the multicomputer system can be designed in a fault tolerant manner while another computer may run in unison as a hot standby, while still another computer may run with no backup at all simply because its functions are not critical. Thus, the multicomputers system is a system that provides fault tolerance and redundancy tools to the system developer to build a fault tolerant system geared to each application not designated by any particular computer architecture or any particular technique.

Figure 80:
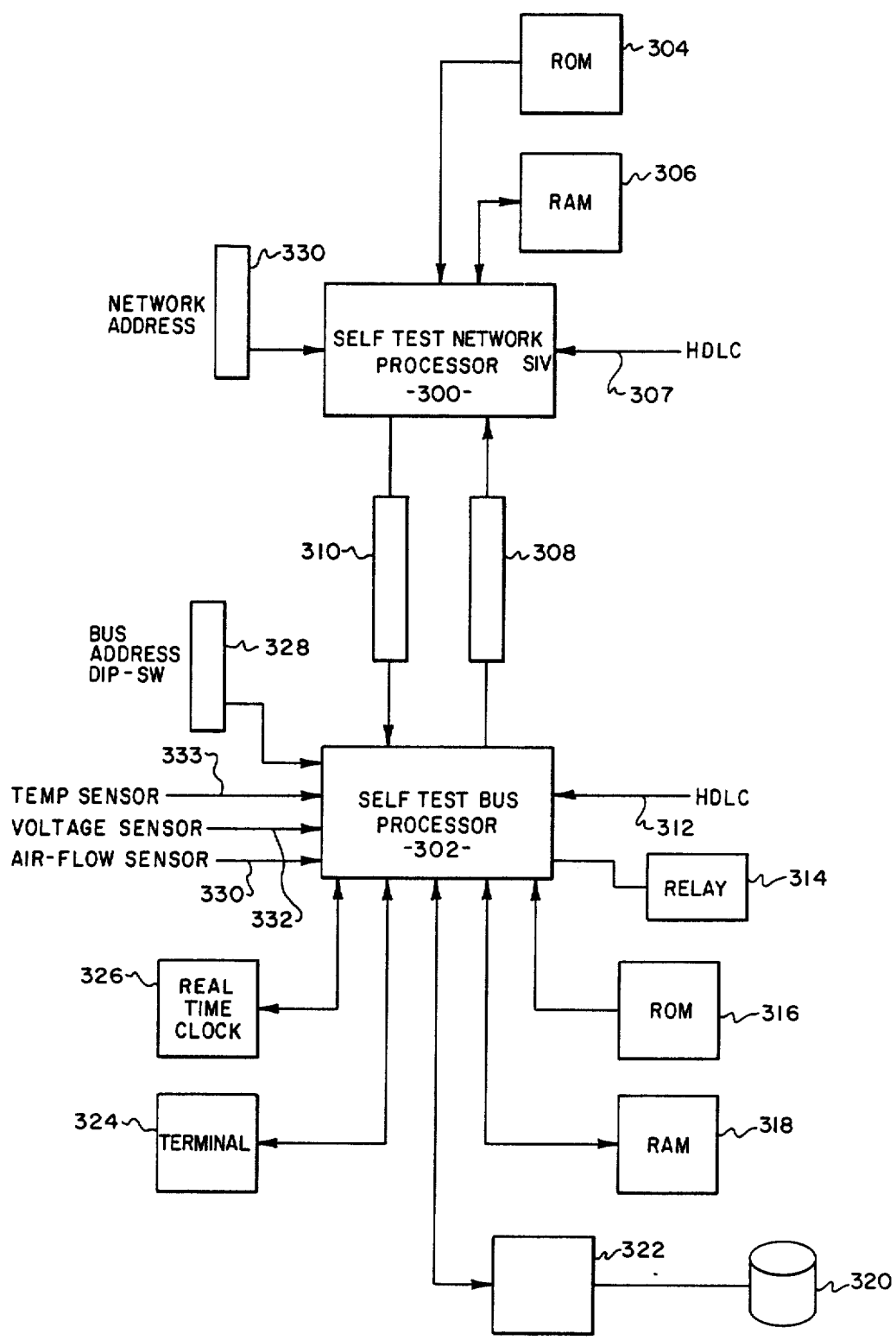
FIG. 80 is a block diagram of the system monitor.

As previously discussed, the Self-Test Bus connects all the Resource Monitor processors onboard the cards (including the Computer Card, Common Access Card, and the Common Control Card) in the multicomputer system. The Test Bus is connected to the System Monitor Card which is illustrated in block diagram in FIG. 80. The System Monitor consists of two microprocessors; the Self-Test Network processor 300 and the Self-Test Bus processor 302. In the preferred embodiment, these two processors are INTEL 8344 microprocessors. The Test Bus is connected to the Self-Test Bus processor 302 via line 312 which is an HDLC Bus as previously discussed. Self-Test processor 302 is connected to a Bus Address switch 328 that in the preferred embodiment is a Dual Inline Package Switch (DIP SWITCH) which is set by the user with the Self-Test processor 302 Address. The Self-Test processor via lines 330, 332 and 333 are connected to an airflow sensor, a voltage sensor and a temperature sensor respectively. These sensors determine the operating environment of the multicomputer system. In the event that any one of these sensors determines that an improper environment exists, the Self-Test processor 302 can remove power from the multicomputer system via relay 314. Self-Test processors 302 is also connected to a terminal 324, a disk 320 via disk interface 322, a Real Time Clock 326, ROM 316 and RAM 318. The Real Time Clock 326 is used to provide a time value to time stamp events recorded by the Self-Test processor 302. Disk 320 includes the overall system configuration for the multicomputer system with specific entries for each of the cards connected in the system. The ROM 316 and RAM 318 contain the operational software for the Self-Test processor and work space memory. The operator communicates with the multicomputer system through Self-Test processor 302 through the terminal 324. The multicomputer system contained with a single cabinet (including 20 slots for computer cards or memory cards and 10 slots for Common Bus cards as previously discussed) may be connected to other multicomputer cabinets to form a total networking system. This is possible by the interconnection of line 307 that is connected to the Self-Test Network processor 300. Line 307 is an HDLC Bus that would connect to another System Monitor Card on another multicomputer system having a Self-Test Network processor. The Self-Test Network processor 300 further includes the network address switch 330 and the memory ROM and RAM 304 and 306. The Self-Test Network processor 300 communicates with the Self-Test Bus processor 302 and the remainder of the multicomputer system via two First-In-First-Out unidirectional buffers 310 and 308. In the preferred embodiment, these buffers are 256 by 8 bits in size. In this embodiment, both processors 300 and 302 are the INTEL 8344 Microprocessors including the Serial Interface Unit implementing the SDLC protocol. The system communicates over the HDLC Test Bus by sending and receiving message packets of 64 bytes each. A description of the INTEL 8344 and the operations of its onboard communication controller is contained in the INTEL Microcontroller Handbook dated 1984 and herein incorporated by reference.

During initialization, the System Monitor Card, and specifically the Self-Test Bus processor 302 initializes the system through the Test Bus and the Resource Monitors contained on the individual cards. Specifically, the configurations for each of these cards is stored in a program on the disk 320. The Self-Test Bus processor 302 communicates to each of the card Resource Monitors by the Test Bus 312 sending packets of information to configure each of the cards in conformance with the configuration contained in disk 320. Initially, the Self-Test Bus processor 302 will send packets of information to all the card slot addresses to determine which cards are present. This is accomplished by sending the packets to each of the individual card addresses and waiting for a response. For each card addressed, if the message process times out without a response, the Self-Test Bus processor 302 assumes that a card is not present at that address. It should be noted that each card address is hardwired at the card slot and read by that cards Resource Monitor, however the Resource Monitor can be programmed to respond to another address resulting in increased flexibility by not requiring specific cards to occupy specific slots along each respective bus. After all the cards have been initialized, the Self-Test Bus processor 302 issues the execute commands to the individual cards for them to being execution of their respective programs.

As previously described, the Resource Monitors located on the individual cards along with the Self-Test Bus processor 302 then are able to perform a performance monitoring function. The listing and flowcharts of the software contained in the computer Resource Monitor ROM is contained in Appendix F. A listing and flowcharts of the software in the Common Bus Interface Resource Monitor ROM is contained in Appendix G. A listing and flowcharts of the software in the System Monitor ROM 316 is contained in Appendix H. This software is written in APL.

The software for the Resource Monitors for the computer cards and the Common Bus cards provide the instructions for execution by the Resource Monitor microprocessor for configuring the card upon initialization, in addition to detecting errors within the card itself, correcting single bit errors, and determining the state of the card upon the occurrence of some event such as a processor failure. In addition, the Resource Monitor software serves to supervise the operation of the cards over the bus when certain error conditions have occurred. The software for the System Monitor processors insure the proper operation of the protocol over the Test Bus and conduct polling of the connected cards. Additionally, the System Monitor software provides for the proper loading of the configuration for all the cards, including the loading of information which designates address spaces for the address decoders, arbitration schemes and the other information provided to the soft programmable components previously discussed.

From a top level view point, this software of the Resource Monitors and the System Monitor provide for basic monitoring, auto-restart and shutdown together with diagnostic and faul isolation capability for the operation of this digital processing system. Additionally the maintenance of the System Monitor can be called upon to do periodic evaluation of the behavior of the individual components, or the system altogether. In a preferred embodiment, one of the onboard processors can be assigned the task of evaluating data provided to it through the Test Bus in order to compute a performance evaluation of the system. Performance evaluation can include both error detection and correction plus evaluation of the interprocessor communications via the Local Buses and the Common Bus. Additionally, the System Monitor may through the Test Bus and the Common Bus interfaces implement a dual Common Bus system wherein both Common Buses transfer information simultaneously between differing Common Bus devices. This configuration would be advantageous if the traffic over the Common Bus becomes too high. Additionally, performance evaluation can be used to determine when connections between individual processors may be advisable. In other words, if one processor on one Local Bus accesses information from another processor on a second Local Bus many times to the point of affecting both Local Bus and Common Bus traffic, a Peripheral Bus connection (i.e. connecting one processors peripheral port to another processors peripheral port) may be advisable to reduce the traffic load on the Common Bus and Local Bus.

Therefore, the Resource Monitor software and System Monitor software provide the capability to not only vary the different configurations possible because of the soft programmable components of the system, but also provides a window into the operation of the data processing system that is heretofore been unavailable.

Timing

Figure 81:
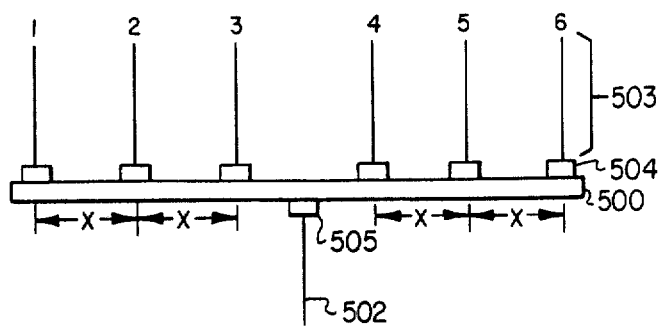
FIG. 81 is a top view of the Common Bus mother board including conductors with Common Bus cards and the timing card.

FIG. 81 illustrates a top view of the mother board 500 for the Common Bus which contains the Common Bus timing propogation lines that are connected to several Common Bus card connectors such as 504 and the Common Bus Cards themselves such as 503. Additionally, mother board 500 includes a connector 505 which is connected to a Timing Card 502. Timing Card 502 provides the timing pulses to the cards numbered 1-6. Note that card 1 is spaced from card 2 by a distance X. Likewise, card 2 is spaced by a distance X from card 3 and so forth as illustrated in FIG. 81. Therefore, timing signals transmitted from Timing Card 502 would reach cards 3 and 4 before the same timing pulses would reach cards 1 and 6. The result being that the cards 1-6 will never be truly synchronized since their synchronizing timing signals are actually arriving at different times as a result of the different distances.

Figure 82:
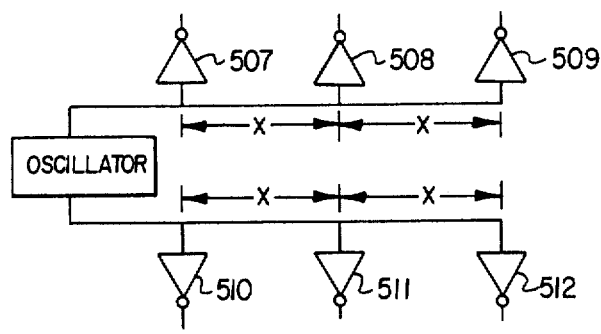
FIG. 82 is a schematic diagram of the timing card circuitry.

In an effort to solve this problem, the present invention includes a Timing Card that is especially configured to equalize this propogation distance for the timing signals so that the timing pulses to cards 1 and 6 of FIG. 81 will reach these cards at approximately the same time that the pulses reach cards 3 and 4 which are located closer to the Timing Card 502. In FIG. 82, the Timing Card consists of an oscillator 506 connected to several drivers 507 through 512. The propogation distance on the card 502 between driver 507 and 508 is symbolically represented in FIG. 82 as the distance X and is to be the same distance as the X of the mother card 500 illustrated in FIG. 81. In one embodiment the oscillator 506 provides the TIMING signals on two branches to provide equal timing to the two sets of three daughter cards 503 of FIG. 81. Therefore, if drivers 507, 508 and 509 were to drive cards 4, 5 and 6, driver 507, the closest driver to the oscillator 506, would drive card 6 which is the card furtherest away from the Timing Card 502. Conversely, driver 509, the furtherest driver from the oscillator 506, would drive card 4, the closest card to the Timing Card 502. In this manner, the distances on the mother board 500 would be simulated on the Timing Card 502, such that the propogation times to the different daughter cards 503 would be approximately equal to one another.

Figure 83:
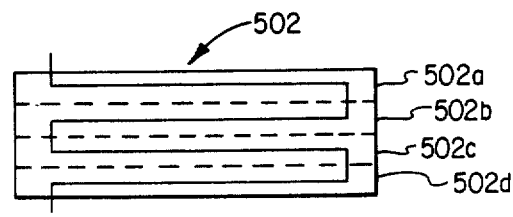
FIG. 83 is a cross sectional representation of the timing bus card.

FIG. 83 illustrates how the distances on the Timing Card 502 are configured. Card 502 is illustrated as three errors of a printed circuit board with printed circuit runs that are connected to provide a loop back run to physically provide additional distance within a small space. By configuring these printed circuit runs on the layers as shown and connecting these layers as shown, the propogation distances to the drivers on the Timing Card may be varied in order to match the propogation distances of the mother card 500 shown in FIG. 81.

In the preferred embodiment, the propogation velocity along with the other characteristics of the Timing Card 502 printed circuit board is matched to be similar to the mother board 500 characteristics in order that the distance loops within card 502 will resemble the true distances of the mother board 500.

Hot Card Insert

In the operation of a data processing system including several cards inserted into a mother board, often times it becomes advantageous to add or remove cards from the system. Normally, this is done by powering down the system and removing or adding the cards. Many times, it is inconvenient to power down the system to reconfigure the system.

The present invention includes a card cabinet with several printed circuit board slots enabling the user to configure the system to fit a specific application. It becomes advantageous to be able to reconfigure the system. Since this data processing system is intended for industrial automation, it becomes very inconvenient to power down the system and thus, completely halt all work supported by this data processing system in order to reconfigure.

Figure 84:
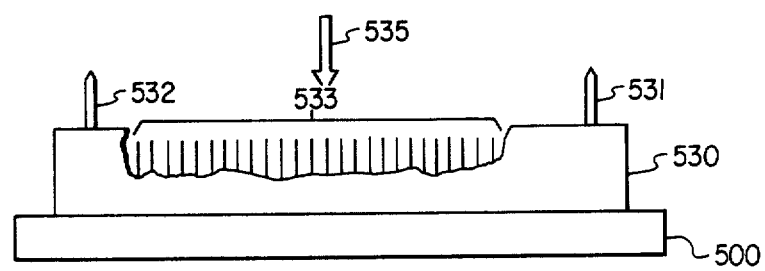
FIG. 84 is a side pictorial view of the printed circuit board with a printed circuit card connector.

To solve this problem this invention includes a unique feature that allows for the insertion of cards into the system while the system is functioning. First, it should be noted that when a card is added to the system that the mere surge in power to the card may generate electromagnetic interference that would disturb adjacent cards in the system. To overcome this problem, this invention provides for the power up of a card inserted while the system is running, in a manner that will not disturb the signals on the bus connection and will not provide power surges within the printed circuit card itself that would disturb adjacent cards. FIG. 84 illustrates a side view of the mother board 500 with a Common Bus Card connector 530 that contains several Common Bus pins 533 and two pins 531 and 532 which both have a higher profile. In the normal environment, pins 531 and 532 are used for alignment and static discharge. However, in the present invention pins 531 and 532 are used to provide power to the Common Bus Card that is being connected. Since pins 531 and 532 have a higher profile then pins 533, a card inserted onto connector 530 in a direction 535 will first contact pins 531 and 532 before making contact with pins 533.

Figure 85:
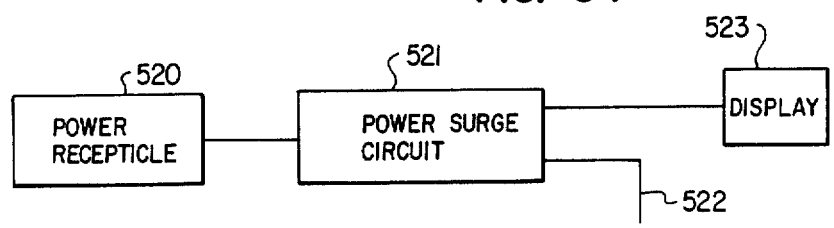
FIG. 85 is block diagram of the hot card insertion circuitry resident on a printed circuit card.

FIG. 85 illustrates the circuitry that is contained on each of the Common Bus Cards to permit hot card insertion. Pin receptacle 520 are the receptacles that actually make contact with the pins such as 531 and 532 and immediately provide power to a power surge circuit 521. In the preferred embodiment, the power surge circuit includes a SURGISTER which is a nonlinear resistance that initially displays a high resistance characteristic but when the SURGISTER warms due to current flow and after a short period of time the resistance drops. In this application, the SURGISTER of the power surge circuit 521 will provide a time regulater powering of the card. In operation the person inserting the card would insert the card until the power pins have made contact which would be indicated by one light emitting diode of the light emitting diode display 523. Once this contact has been made the card is not inserted further until a second light emitting diode indicates that the voltage has reached a 95% point meaning that the circuitry onboard the Common Bus circuit board has been sufficiently powered to insure the proper operation of the circuitry. At this time the Common Bus circuit board is then inserted all the way into the connector 530 such that it makes contact with the pins 533 which include the signal pins for the Common Bus. By providing this dual indication, orderly insertion of the cards will insure that there will be no power surge to disturb the surrounding cards through electromagnetic interference and further that the circuitry onboard the inserted card is stable before the contacts on the inserted card make contact with the Common Bus connector.

Although preferred embodiments of the invention have been described in detail, it is to be understood that various changes, substitutions and alterations can be made therein without departing from the spirit of the invention as defined by the appended claims.

What is claimed is:

1. A data processing system comprising:
   A. a first bus including a plurality of signal lines for the transfer of power and address, data, control and interrupt information in accordance with a first bus protocol that defines the timing, formats for the address, data, control and interrupt information, and response format, for an information transfer between a requestor device and a responder device of a plurality of devices connected to the first bus, said control signals including;
      (1) an INTERLOCK signal from said requestor to the responder defining an interlock period, wherein the responder locks out all other information transfers to it except for information transfers with the requestor until the requestor information transfer does not include the INTERLOCK control signal, during the interlock period the responder is to transmit a RETRY control signal to all devices attempting access, all devices receiving a RETRY control signal are to store an identifier code of the device sending the RETRY control signal, lock out all other access attempts responding with a RETRY control signal, monitor all information transfers on the first bus and determined if the responder's identifier code is contained in the control signals, and upon occurrence of the code, an error indication or a timeout indication reinitiate the transfer to that responder device;
      (2) a WAIT control signal from the responder in response to an access from the requestor and defining a requestor WAIT period, wherein the requestor locks out all attempted accesses responding with a RETRY control signal, monitors a plurality of control signals representing the source identifier code of the responder, responds only to access with theresponder's source identifier code, and remains in the WAIT period until the responder has transmitted a COMPLETE control signal or until an error indication or a timeout indication;
      (3) an OVERRIDE control signal defining that a device receiving the OVERRIDE control signal must relinquish control of the first bus and reinitiate its bus transaction after the transaction by the device transmitting the OVERRIDE control signal; and
      (4) a TYPE control signal indicating a process wherein the transmitter of the TYPE control signal will properly respond to the INTERLOCK, RETRY, WAIT, COMPLETE and OVERRIDE control signals;
   said first bus including a first plurality of serially coupled connectors along said first bus lines;
   B. at least two second buses including a plurality of signal lines for the transfer of power and address, data, control and interrupt information in accordance with a second bus protocol that defines the timing formats for the addresss, data, control and interrupt information, and response format, an information transfer between a requestor and a responder device of a plurality of devices connected to the second buses, said control signal including:
      (1) an INTERLOCK signal from said requestor to the responder defining an INTERLOCK period when the responder is only to respond to information transfers from the requestor until the information transfer from the requestor does not include the INTERLOCK signal or until an error indication or a timeout indication;
      (2) an OVERRIDE control signal defining a process wherein a device receiving the OVERRIDE control signal must relinquish control of the second bus and reinitiate its bus transaction after the transaction by the device sending the OVERRIDE signal; and
      (3) a TYPE control signal indicating that the transmitter of the TYPE control signal will properly respond to the INTERLOCK and OVERRIDE control signals;
   each of said second buses including a second plurality of connectors serially coupled to said second bus lines;
   C. An input/output Bus,
   D. a test bus including a plurality of lines for the serial transfer of information;
   E. a plurality of computer units, each connected to one of the plurality of second buses and including:
      (1) a Resource Monitor circuit connected to the test bus for controlling and monitoring the computer unit circuitry;
      (2) a processor including a processor address decode means controlled by said Resource Monitor for providing addressable access to the processor for an internal bus;

(3) a computer unit clock means for providing at least one timing signal to the computer units circuitry;

(4) bus gate means for controlling the transfer of information between the internal bus, the second bus and the input/output bus;

(5) bus address decode means for decoding addresses from either the second bus or the input/output bus, and indicating when the address is within an address space provided by the Resource Monitor;

(6) an interrupt handler for receiving interrupts from the second or input/output buses and accordingly generating signals to the processor;

(7) a bus requestor for receiving requests for access to either the second or the input/output bus and interfacing with an arbiter circuit provided to generate bus access grants in accordance with an arbitration scheme from the Resource Monitor;

(8) access control means for controlling the transfer of information between the internal bus, the input/output bus, the processor, a memory, and the second bus by (a) generating enabling signals to enable transfer of information from either the second or input/output bus, the processor or the memory along the internal bus, (b) providing an appropriate response to transfers received from either the input/output bus or the second bus, (c) providing the appropriate signals to either the input/output bus or the second bus for a transfer of information from said processor, and (d) providing the appropriate signals for a transfer of information from either the second or input/output bus to the other;

F. a first bus control unit connected to the first bus and a unique one of the plurality of second buses and;

G. at least one first bus access unit connected to the first bus and each connected to a unique one of the remaining second buses;

said first bus control unit and first bus access unit each including;

(1) a bus requestor for transmitting a request for access to either the first or second bus and receiving access grants in response thereto;

(2) a bus address decode means for decoding addresses on either bus and indicating a transfer between buses;

(3) bus information interface means for transferring information from one bus to the other in response to control signals;

(4) protocol logic for (a) receiving address indications, (b) transmitting access requests in response thereto, (c) generating control signals to provide an information transfer (d) generating a response to the received address transfer;

(5) a unit Resource Monitor for controlling and monitoring the unit circuitry and connected to the Test Bus;

(6) a common lock interface for providing data to either bus, said data including the accessibility status of system addressable devices and for transmitting requests to access the devices;

(7) second bus arbiter for receiving second bus access requests and for providing grants for access to the second bus;

(8) an interrupt interface means connected to receive a time division multiplexed interrupt signal from the first bus and generate an interrupt to a computer unit on the second bus;

said first bus control unit further including;

(1) bus request arbitration logic means for receiving first bus access requests and providing first bus grants;

(2) a common lock arbitration means for receiving requests to access system addressable devices and for granting these requests in accordance with a device access arbitration scheme;

(3) InterComputer interupt control logic connected to the first bus and including (a) interrupt address decode means for indicating that a first bus information transfer is an interrupt control logic access, (b) an interrupt word register for storing of interrupt status information for each computer unit, the status accessible to first bus information transfers, (c) interrupt generation means to generate a time division multiplexed signal including an interrupt to a computer unit when its respective word register receives data from an information transfer, and (d) interrupt response logic for generating appropriate protocol responses to information transfers to the interrupt control logic unit;

said first bus access unit further including a memory connected to the first bus for responding to information transfers addressed thereto;

H. a system monitor including processing means connected to the Test Bus for monitoring and controlling system operation and further including a mass memory device for the storage of system configuration information and system monitoring information, and a network interface connectable to other system monitor units of other data processing systems.

2. A data processing system comprising:

A. a Common Bus including a plurality of signal lines for the transfer of power and address, data, control and interrupt information in accordance with a Common Bus protocol that defines the timing and formats for the address, data, control and interrupt information, and response, for an information transfer between a requestor device and a responder device of a plurality of devices connected to the Common Bus, said control information including;

(1) an INTERLOCK signal from said requestor to the responder defining an interlock period, wherein the responder locks out all other information transfers to it except for information transfers with the requestor until the requestor information transfer does not include the INTERLOCK control signal, during the interlock period the responder is to transmit a RETRY control signal to all devices attempting access, all devices receiving a RETRY control signal are to store an identifier code of the device sending the RETRY control signal, lock out all other access attempts responding with a RETRY control signal, monitor all information transfers on the Common Bus and determine if the responder's identifier code is contained in the control signals, and upon occurrence of the code, an error indication or a timeout indication reinitiate the transfer to that responder device;

(2) a WAIT control signal from the responder is response to an access from the requestor and defining a requestor WAIT period, wherein the requestor locks out all attempted accesses responding with a RETRY control signal, monitors a plurality of control signals representing the source identifier code of the responder, responds only to accesses with the responder's source identifier code, and remains in the WAIT period until the responder has transmitted a COMPLETE control signal or until an error indication or a timeout indication;

(3) an OVERRIDE control signal defining a process wherein a device receiving the OVERRIDE control signal must relinquish control of the Common Bus and reinitiate its bus transaction after the transaction by the device transmitting the OVERRIDE control signal; and (4) a TYPE control signal indicating that the transmitter of the TYPE control signal will properly respond to the INTERLOCK, RETRY, WAIT, COMPLETE and OVERRIDE control signals.

said Common Bus including a first plurality of serially coupled connectors along said Common Bus lines;

B. at least two Local Buses including a plurality of signal lines for the transfer of power and address, data, control and interrupt information in accordance with a Local Bus protocol that defines the timing, formats for the address, data, control and interrupt information, and response format, and information transfer between a requestor and a responder device of a plurality of devices connected to the Local Buses, said control signals including:

(1) an INTERLOCK signal from said requestor to the responder defining an INTERLOCK period when the responder is only to respond to information transfers from the requestor until the information transfer from the requestor does not include the INTERLOCK signal or until an error indication or a timeout indication;

(2) an OVERRIDE control signal defining a process wherein a device receiving the OVERRIDE control signal must relinquish control of the Local Bus and reinitiate its bus transaction after the transaction by the device sending the OVERRIDE signal; and (3) a TYPE control signal indicating that the transmitter of the TYPE control signal with properly respond to the INTERLOCK and OVERRIDE control signals;

each of said Local Buses including a second plurality of connector serially coupled to said Local Bus lines;

C. a Peripheral Bus including a plurality of signal lines for the transfer of power and address, data, control and interrupt information in accordance with a protocol similar to the Local Bus protocol;

D. a Test Bus including a plurality of lines for the serial transfer of information, said Test Bus serially connected to a selected plurality of said Local Bus connectors;

E. each of said Local Bus connectors positioned to receive a computer unit including:

(1) a Resource Monitor circuit connected to the Test Bus for controlling said monitoring the computer unit circuitry;

(2) a processor for independently executing instructions on data and connected to the Resource Monitor and a computer unit Internal Bus and further including an address decode circuit for receiving a processor address space from the Resource Monitor and for providing a signal to the processor when an address present on the Internal Bus is within the processor address space;

(3) a computer unit clock means for providing at least one timing signal to the computer unit circuitry;

(4) bus gate means for controlling the transfer of information between the Peripheral Bus and Local Bus and a computer unit Internal Bus;

(5) bus address decode means for receiving address information from either said Local Bus or Peripheral Bus, comparing the address with a computer unit address space provided from said Resource Monitor, determining when the address is within the address space, accordingly, generating an address decode signal;

(6) an Internal Bus gate means connected to the Local Bus and Peripheral Bus for controlling the transfer of information to an Internal Bus;

(7) an interrupt handler for receiving interrupt signals from either the Peripheral Bus or the Local Bus and generating signals to the processor indicating the reception of the interrupt, and generating response signals for transmission on the Peripheral Bus or Local bus indicating acknowledgement of the receipt of the interrupt;

(8) a bus requestor and arbiter means for receiving signals from said processor or one of the buses indicating a request for access to the other bus and for receiving signals from the Resource Monitor designating which one of a plurality of arbitration lines to transmit the request and further including an arbitration circuit for receiving request signals from the arbitration lines and for generating a signal indicating a grant of bus access on one of the arbitration lines, said Resource monitor controlling the operation of the arbiter means and controlling which of a plurality of arbitration schemes within the arbitration means determines which of the received requests is granted bus access;

(9) access control means for providing a plurality of control signals to regulate the transfer of information between the processor, a memory, the Local Bus and the Peripheral Bus and including;

(a) bus control signal circuitry means (i) and (A) receiving a plurality of control signals from either the processor or one bus representing a request for generating an information transfer on the other bus, (B) transmitting the request to the other bus requestor, (C) generating signals for an information transfer on the other bus in accordance with bus protocol, (d) generating control signals to the other bus gate means for transferring the information to the other bus upon the receipt of the grant, or, (ii) in response to information on the other bus, (A) generating control signals to the other bus gate means and Internal Bus gate means for receiving information from the other bus, (B) receiving the indication from the other bus address decode means and, (C) in accordance with such indication, (I) generating a plurality of synchronization signals to either the processor or the memory for the reception of information from said bus, or (II) for (a) generating control signals to initiate bus transfer from other bus to the bus gate means for the transfer of information from the other bus, (b) transmitting a request for access to the one bus requestor; (c) generating a response on the other bus to respond to the received information and (d) generating control signals to the one bus buffer for gating the information, in accordance with an access grant;

(b) an Internal Bus control means for regulating the information flow on the Internal Bus by controlling access to the Internal Bus by the processor, the memory, the Peripheral Bus and the Local Bus and including an internal arbiter for receiving Internal Bus request signals from the processor, the bus address decoder, the interrupt handler, and the bus requestor, and for generating an Internal Bus grant signal in accordance with a predetermined arbitration scheme, and providing enabling signals to Internal Bus gate logic for an information transfer over the Internal Bus;

F. a Common Bus control unit connected to the Common Bus and a unique one of the plurality of Local Buses and;

G. at least one Common Bus access unit connected to the Common Bus and each connected to a unique one of the remaining Local Buses;

said Common Bus control unit and Common Bus access unit each including;

(1) a Common Bus buffer means for gating the transfer of information between the Common Bus and a unit Internal Common Bus in accordance with received control signals;

(2) a Local Bus buffer means for gating information between the Local Bus and the buffered Local Bus in accordance with received control signals;

(3) a Common Bus requestor means for receiving a request for Common Bus access and for transmitting the request on one of a plurality of request lines, said lines selected by a unit Resource Monitor, and for receiving a grant indication upon the selected line;

(4) a Common Bus address decode means for receiving Common bus signals including a Common Bus address, comparing the received Common Bus address with a Local Bus address space provided from the unit Resource Monitor, determining when the Common Bus address is within the Local Bus address space and, accordingly, generating a signal indicating that the information present on the Common Bus is to be transferred to the connected Local Bus;

(5) a Local Bus to Common Bus address decode means for receiving Local Bus signals including a Local Bus address, comprising the received local Bus address with a Common Bus address space provided by the Resource Monitor, determining when the Local bus address is within the Common Bus address space and, accordingly, generating a signal indicating the information present on the connected Local Buses is to be transferred to the Common Bus;

(6) Common Bus/Local Bus interface means for latching information for transfer from the Internal Common Bus to the buffered Local Bus and for gating information from the buffered Local Bus to Common Bus in accordance with received control signals;

(7) a Local Bus requestor and arbiter for receiving signals indicating an access request Local Bus, transmitting the request to a connected arbitration circuit for generating a signal indicating a grant of Local Bus access, said Resource Monitor controlling the operation of the arbitration circuit by indicating which one of the plurality of arbitration schemes within the arbitration circuit determines which one of the received requests is granted Local Bus access;

(8) protocol signal control logic means for, (A) in response to information on the connected Local Bus;
  (1) generating control signals to the Local Bus buffer means for receiving information onto the buffered Local Bus;
  (2) receiving said decode indication and, in accordance therewith;
  (3) transmitting a request for Common Bus access,
  (4) generating control signals to the Common Bus/Local Bus interface to transfer information;
  (5) generating a response to the Local Bus;
  (6) generating control signals to the Common Bus buffer for gating the information on the Internal Common Bus to the Common Bus in accordance with a grant;
  and for, (B) in response to information on the Common Bus,
  (1) generating control signals to the Common Bus buffer means for receiving information onto the Internal Common Bus;
  (2) receiving said decode indication and, in accordance therewith;
  (3) transmitting a request for Local Bus access;
  (4) generating control signals to the Common Bus/Local Bus interface means to latch information;
  (5) generating a response to the Common Bus;
  (6) generating control signals to the Local Bus buffer for gating the information on the buffered Local Bus to the Local Bus in accordance with a grant signal form the Local Bus requestor;

(9) a unit Resource Monitor including means for controlling and monitoring unit circuitry and connected to the Test Bus;

(10) a unit clock means for providing at least one timing signal to the Common Bus control unit circuitry;

(11) common lock interface means connected to the buffered Local Bus for responding to the addresses specified by the Resource Monitor and providing status information of individual system addressable devices and further connected to a Lock Bus for transmitting requests for access to the individual system addressable devices and for receiving grants of such requests;

(12) an InterComputer interrupt interface means connected to the common Bus and the Local Bus for receiving a time division multiplexed interrupt signal, and including circuitry that receives inputs from the Resource Monitor for demultiplexing the interrupt signal and generating an InterComputer interrupt signal on the Local Bus in response thereto;

said Common Bus control unit further including;

(1) common lock arbitration means connected to the Lock Bus for receiving said requests and for providing grants to access the individual system addressable device in accordance with information from the Resource Monitor;

(2) Common Bus request arbitration logic means connected to receive requests for access to the Common Bus and for granting Common Bus requests in accordance with information from the Common Bus control unit Resource Monitor;

(13) Intercomputer interrupt control logic connected to the Internal Common Bus and including;

(a) interrupt control address decode means to receive address information from the Common Bus, comparing the received address with an InterComputer interrupt control address space provided by the Resource Monitor, determining when the received address is within the address space, and accordingly generating a signal indicating the information present on the Common Bus is to be received by the InterComputer interrupt control logic;

(b) interrupt word register means for receiving said indication signal and selecting one of a plurality of registers in accordance with said received address, and either, ORing the contents of the selected register with the Common Bus data and storing the ORed results in the register for a write operation, or clearing the contents of the register after a read operation;

(c) interrupt generation means for receiving said indication signal from the InterComputer interrupt decoder means, and, for a write operation, generating at time division multiplex signal including an interrupt in accordance with the received address, and transmitting the time division multiplexed interrupt signal on the Common Bus;

(d) InterComputer interrupt response logic means to generate response signals to the received Common Bus address, in accordance with the Common Bus protocol;

said Common Bus access unit further including;

(14) Common bus memory circuit including;

(a) Common Bus memory address decode means for receiving Common bus signals including a Common Bus address, comparing the received Common Bus address with a Common Bus memory address space provided by the Resource Monitor determining, when the received Common Bus address is within the Common Bus memory address space, and, accordingly generating a signal indicating that the information on the Common bus is to be transferred to the Common Bus memory;

(b) Common Bus memory interface logic means for receiving the indicating signal, generating access signals to the Common Bus memory for providing access to the Common Bus memory in accordance with the Common Bus address, data and control signals;

(c) Common Bus memory response logic means for generating a response on the Internal Common Bus to the Common Bus information and generating control signals to the Common Bus buffer for the transfer of the response from the Internal Common bus to the Common Bus;

H. a system monitor means including a first processor for transferring information via the Test bus to the Resource Monitors of the computer units, Common Bus access units and Common Bus control unit and connected to at least one environmental sensor, a first address specification device, a real time clock, a power relay for controlling power to the data processing system, a mass memory for storing program information including the configuration information for each Common Bus control unit, Common Bus access unit, and computer unit, and a first processor memory means for storing a program of instructions for execution by the first processor for (1) the transfer of the configuration information by the Test Bus to each Resource Monitor, (2) for monitoring the system operation from the Resource Monitors, (3) for receiving information from and providing information to an operator terminal, (4) for regulating power to the data processing system through the power relay in accordance with information received from the environmental sensor, said first processor connected to first and second data buffers, said data buffers further connected to a second processor, said first data buffer providing storage of data from said first processor to said second processor and said second data buffer providing storage of data from said second processor to said first processor, said second processor connected to a second address specification device, a network bus, and a second processor memory which includes instructions for execution by said second processor to provide: (1) transfer of information with said first processor via the first and second data buffers and (2) transfer of information via the network bus.

3. A data processing system comprising:

A. a Common Bus including a plurality of signal lines for the transfer of power and address, data, control and interrupt information in accordance with a Common Bus protocol that defines the timing and formats for the address, data, control and interrupt information, and response format, for an information transfer between a requestor device and a responder device of a plurality of devices connected to the Common Bus, said control information including;

(1) an INTERLOCK signal from said requestor to the responder defining an interlock period, wherein the responder locks out all other information transfers to it except for information transfers with the requestor until the requestor information transfer does not include the INTERLOCK control signal, during the interlock period the responder is to transmit a RETRY control signal to all devices attempting access, all devices receiving the RETRY control signal are to store an identifier code of the device sending the RETRY control signal, lock out all other access attempts responding with a RETRY control signal, monitor all information transfers on the Common Bus and determine if the responder's identifier code is contained in the control signals, and upon occurrence of the code, an error indication or timeout indication reinitiates the transfer to that responder device;

(2) a WAIT control signal from the responder in response to an access from the requestor and defining a requestor WAIT period, wherein the requestor locks out all attempted accesses responding with a RETRY control signal, monitors a plurality of control signals representing the source identifier code of the responder, responds only to accesses with the responder's source identifier code, and remains in the WAIT period until the responder has transmitted a COMPLETE control signal or until an error indication or a timeout indication;

(3) an OVERRIDE control signal defining a process wherein a device receiving the OVERRIDE control signal must relinquish control of the Common bus and reinitiate its bus transaction after the transaction by the device transmitting the OVERRIDE control signal; and (4) a TYPE control signal indicating that the transmitter of the TYPE control signal will propelly respond to the INTERLOCK, RETRY, WAIT COMPLETE and OVERRIDE control signals;

said Common bus including a first plurality of serially coupled connectors along said Common Bus lines;

B. at least two Local Buses including a plurality of signal lines for the transfer of power and address, data, control and interrupt information in accordance with a Local bus protocol that defines the timing and formats for the address, data, control and interrupt information, and response format, an information transfer between a requestor and a responder device of a plurality of devices connected to the Local Buses, said control signals including:

(1) an INTERLOCK signal from said requestor to the responder defining an INTERLOCK period when the responder is only to respond to information transfers from the requestor until the information transfers from the requestor does not include the INTERLOCK signal or until an error indication or a timeout indication;

(2) an OVERRIDE control signal defining a process wherein a device receiving the OVERRIDE control signal must relinquish control of the Local Bus and reinitiate its bus transaction after the transaction by the device sending the OVERRIDE signal; and (3) a TYPE control signal indicating that the transmitter of the TYPE control signal will properly respond to the INTERLOCK and OVERRIDE control signals;

each of said Local Buses including a second plurality of connectors serially coupled to said Local Bus lines, and said Local Bus positioned approximately orthogonally to said Common Bus lines;

C. a Peripheral Bus including a plurality of signal lines for the transfer of power and address, data, control and interrupt information in accordance with the Local Bus protocol;

D. a Test Bus including a plurality of lines for the serial transfer of information, said Test Bus serially connected to a selected plurality of said Local bus connectors;

E. each of said Local Bus connectors positioned to receive a computer unit including:

(1) a Resource Monitor circuit connected to the Test Bus for controlling and monitoring the computer unit circuitry;

(2) a processor for independently executing instructions on data and connected to the Resource Monitor and a computer unit Internal Bus and further including an address decode circuit for receiving a processor address space from the Resource Monitor and for providing a signal to the processor when an address present on the Internal Bus is within the processor address space;

(3) a computer unit clock means for providing at least one timing signal to the computer unit circuitry;

(4) Peripheral Bus gate means for controlling the transfer of information between the Peripheral Bus and a computer unit Internal Peripheral Bus;

(5) a Local Bus gate means for controlling the transfer of information between the Local Bus and a computer unit Internal Local Bus;

(6) a Peripheral Bus address decoding circuit means for receiving Peripheral Bus signals including a Peripheral Bus address, comparing the received Peripheral Bus address with a computer unit Peripheral Bus address space and when the Peripheral Bus address is within the address space, generating a signal indication that the information present on the Peripheral Bus is to be transferred to the Internal Bus, said Peripheral Bus decoding means including circuitry connected to receive the address space from the Resource Monitor;

(7) a Local Bus address decoding circuit means for receiving Local Bus signals including a Local Bus address, comparing the received Local Bus address with a computer unit Local bus address space and when the Local Bus address is within the address space, generating a signal indicating that the information present on the Local Bus is to be transferred to the Internal Bus, said Local Bus decoding means including circuitry connected to receive the address space from the Resource Monitor;

(8) a Peripheral Bus interface means connected to the Internal Local Bus and the Internal Peripheral Bus for storing address translation information provided from the Resource Monitor and for providing a translated address to the Internal Local Bus in response to an address present on the Internal Peripheral Bus;

(9) an Internal Bus gate means connected to the Internal Local Bus, the Internal Peripheral Bus through the Peripheral Bus address interface means and the Internal Bus, for controlling the transfer of information from either the Internal Local Bus or the Internal Peripheral Bus to the Internal Bus;

(10) an interrupt handler for receiving interrupt signals from either the Peripheral Bus or the Local Bus and generating signals to the processor indicating the reception of the interrupt, and generating response signals for transmission indicating acknowledgement of the receipt of the interrupt;

(11) a Local Bus requestor and arbiter means for receiving signals form said processor or the Peripheral Bus indicating a request for access to the Local Bus and for receiving signals from the Resource Monitor designating which one of a plurality of arbitration lines to transmit the request and further including an arbitration circuit for receiving request signals from the arbitration lines and for generating a signal indicating a grant of Local Bus access on one of the arbitration lines, said Resource Monitor controlling the operation of the arbitration circuit controlling which of a plurality of arbitration schemes within the arbitration means determines which of the received requests is granted Local Bus access;

(12) a Peripheral Bus requestor and arbiter means for receiving signals from said processor of said Local Bus indicating a request for access to the Peripheral Bus and for receiving signals from the Resource monitor designating which one of a plurality of arbitration lines to transmit the request and further including an arbitration circuit for receiving request signals from the arbitration lines and for generating a signal indicating a grant of Peripheral Bus access on one of the arbitration lines, said Resource Monitor controlling the operation of the arbitration circuit and controlling which of a plurality of arbitration schemes within the arbitration circuit determines which one of the received requests is granted a Peripheral Bus access;

(13) access control means for providing a plurality of control signals to regulate the transfer of information between the processor, a memory, the Local Bus and the Peripheral Bus and including;

(a) Peripheral Bus control signal circuitry means (i) for (A) receiving a plurality of control signals from either the processor representing a request for generating an information transfer on the peripheral Bus, (B) transmitting the request to the Peripheral Bus requestor, (C) generating signals for an information transfer on the Peripheral Bus in accordance with Peripheral Bus protocol, (D) generating control signals to the Peripheral Bus gate means for transferring the information to the Peripheral Bus upon the receipt of the Peripheral Bus grant from the Peripheral Bus requestor and arbiter means and, (ii) in response to information on the Peripheral bus, (A) generating control signals to the Peripheral Bus gate means and Internal Bus gate means for receiving information from the Peripheral Bus, (B) receiving the indication signal from the Peripheral Bus address decode circuit means and, (C) in accordance with such indication signal, (I) generating a plurality of synchronization signals to either the processor or the memory for the reception of information from said Peripheral Bus, or (II) for (a) generating control signals to initiate a Local Bus transfer and to the Local Bus gate means for the transfer of information from the Peripheral Bus to the Local Bus, (b) transmitting a request for access to the Local Bus to the Local bus requestor, (c) generating a response on the Peripheral Bus to respond to the received Peripheral Bus information and to the Peripheral Bus gate means to enable the transfer of the response information, and (d) generating control signals to the Local Bus buffer for gating the information to the Local bus, in accordance with a grant from the Local Bus requestor, (b) Local bus control signal circuitry means (i) for (A) receiving a plurality of control signals from the processor representing a request for generating an information transfer on the Local Bus, (B) transmitting the request to the Local bus requestor, (C) generating signals for an information transfer on the Local Bus in accordance with Local bus protocol, (D) generating control signals to the Local Bus gate means for transferring the information to the Local bus upon the receipt of the Local Bus grant from the Local Bus requestor and arbiter means or, (ii) in response to information on the Local Bus, (a) generating control signals to the Local Bus gate means and Internal Bus gate means for receiving information from the Local Bus, (B) receiving the indication from the Local Bus address decode circuit means and, (C) in accordance with such indication, (I) generating a plurality of synchronization signals to either the processor or the memory for the reception of information from said Local Bus, or (II) for (a) generating control signals to initiate a Peripheral Bus transfer and generating control signals to the Peripheral Bus gate means for the transfer of information from the Local Bus to the Peripheral Bus, (b) transmitting a request for access to the Peripheral Bus to the Peripheral Bus requestor, (c) generating a response on the Local bus to respond to the received Local Bus information and to the Local Bus gate means to enable the transfer of the response information, and (d) generating control signals to the Peripheral Bus buffer for gating the information to the Peripheral Bus in accordance with a grant from the Peripheral Bus requestor;

(c) an Internal Bus control means for regulating the information flow on the Internal Bus by controlling access to the Internal Bus by the processor, the memory, the Internal Peripheral Bus and the Internal Local Bus and including an internal arbiter for receiving Internal Bus request signals from the processor, the Local Bus address decoder, the Peripheral Bus address decoder, the interrupt handler, the Local bus requestor and the Peripheral bus requestor, and for generating an Internal Bus access grant in accordance with a predetermined arbitration scheme, and providing enabling signals to Internal Bus gate logic for an information transfer over the Internal Bus;

(14) address processing circuit means for providing an address interface between the processor and the Internal Bus and including an address extension means initialized by the Resource monitor, and connected to the Internal Bus and the processor for providing a plurality of noncontiguous address spaces for the processor, and an address modifier means initialized by the Resource monitor, for providing additional address information for either the Peripheral Bus or Local Bus; and

(15) the memory for storage of information and connected to the Internal Bus and a memory control means, the memory control means connected to receive control signals from the access control means for enabling information to be read from and written to the memory via the Internal Bus, said memory control means further generating an access to the memory upon every operations cycle and completing the access if memory is being accessed via the Internal bus or providing a refresh signal to the memory if the memory is not being accessed by the Internal Bus;

F. a Common Bus control unit connected to the Common bus and a unique one of the plurality of Local Buses and including;
  (1) a Common Bus buffer means for gating the transfer of information between the Common Bus and a unit Internal Common Bus in accordance with received control signals;
  (2) a Local Bus buffer means for gating information between the Local Bus and the buffered Local Bus in accordance with received control signals;
  (3) a Common bus requestor means for receiving a signal indicating a request for access to the Common Bus and for transmitting the request on one of a plurality of request lines, said line selected by a Common bus control unit Resource Monitor, and for receiving an access grant indication signal upon the selected line;
  (4) a Common bus to Local Bus address decode means for receiving Common Bus signals including a Common Bus address, comparing the received Common Bus address with a Local Bus address space, determining when the common bus address is within the Local Bus address space, and accordingly, generating a signal indicating that the information present on the Common Bus is to be transferred to the connected Local Bus, said decoding means including circuitry connected to receive the Local Bus address space from the Resource Monitor;
  (5) a Local Bus to Common Bus address decode means for receiving Local Bus signals including a Local Bus address, comparing the received Local Bus address with a Common bus address space, determining when the Local Bus address is within the Common bus address space and, accordingly, generating a signal indicating the information present on the connected Local Buses is to be transferred to the Common Bus, said decoding means including circuitry connected to receive the Common bus address space from the Resource monitor;
  (6) Common Bus/Local Bus interface means for latching information for transfer from the Internal Common Bus to the buffered Local Bus and for gating information from the buffered Local Bus to Common Bus in accordance with received control signals;
  (7) a Local Bus requestor and arbiter for receiving signals indicating a request for access to the connected Local Bus and for receiving signals from the Common Bus control unit Resource Monitor designating which one of a plurality of arbitration lines to transmit the request and further including an arbitration circuit for receiving request signals from the arbitration lines and for generating a signal indicating a grant of Local Bus access on one of the arbitration lines, said Resource Monitor controlling the operation of the arbitration circuit by indicating which one of the plurality of arbitration schemes within the arbitration circuit determines which one of the received requests is granted Local Bus access;
  (8) protocol signals control logic means for, (A) in response to information on the connected Local Bus,
    (1) generating control signals to the Local Bus buffer means for receiving information onto the buffered Local Bus,
    (2) receiving said indication signal from the Local Bus to Common Bus address decode means and, in accordance with such indication,
    (3) transmitting a request for Common bus access to the Common Bus requestor means,
    (4) generating control signals to the Common Bus/Local Bus interface means for transferring information from the buffered Local Bus to the Internal Common Bus,
    (5) generating a response on the buffered Local Bus and generating control signals to the Local Bus buffer for transfer of the response from the buffered Local Bus to the Local Bus,
    (6) generating control signals to the Common Bus buffer for gating the information on the Internal Common bus to the Common Bus in accordance with a grant signal from the Common Bus requestor;
  or, (B) in response to information on the Common Bus,
    (1) generating control signals to the Common Bus buffer means for receiving information onto the Internal Common Bus;
    (2) receiving said indication from the Common Bus to Local Bus address decode means and in accordance with such indication;
    (3) transmitting a request for Local Bus access to the Local Bus requestor means;
    (4) generating control signals to the Common Bus/Local Bus interface means for latching information from the Internal Common Bus to the buffered Local Bus;
    (5) generating a response on the Internal Common Bus and generating control signals to the Common Bus buffer for the transfer of the response from the Internal Common bus to the Common bus;
    (6) generating control signals to the Local Bus buffer for gating the information on the buffered Local Bus to the Local Bus in accordance with a grant signal from the Local Bus requestor;
  (9) the Common Bus control unit Resource Monitor including means for controlling and monitoring the Common Bus control unit circuitry and connected to the Test bus;
  (10) Common bus control unit clock means for providing at least one timing signal to the Common Bus control unit circuitry;
  (11) common lock interface means connected to the buffered Local Bus for responding to addresses specified by the Resource Monitor, providing status information of individual system addressable devices, and further connected to a Lock Bus for transmitting requests for access to the individual system addressable devices and for receiving grants to such requests;

(12) common lock arbitration means connected to the Lock Bus for receiving said requests and for providing grants to access the individual system addressable devices in accordance with information from the Resource Monitor;

(13) Common Bus request arbitration logic means connected to receive requests for access to the Common Bus and for granting Common Bus requests in accordance with information from the Common Bus control unit Resource Monitor;

(14) InterComputer interrupt control logic connected to the Internal Common Bus and including:

(a) interrupt control address decode means to receive address information from the Common Bus, comparing the received address with an InterComputer interrupt control address space provided by the Resource Monitor for determining when the received address is within the address space, and accordingly generating a signal indicating that information present on the Common Bus is to be received by the InterComputer interrupt control logic;

(b) interrupt word register means for receiving said indication signal and selecting one of a plurality of registers in accordance with said received address, and either, ORing the contents of the selected register with the Common Bus data and storing the ORed results in the register for a write operation, or clearing the contents of the register after a read operation;

(c) interrupt generation means for receiving said indication signal from the InterComputer interrupt decoder means, and, for a write operation, generating a time division multiplex signal including an interrupt signal in accordance with the received address, and transmitting the time division multiplexed interrupt signal on the Common Bus;

(d) InterComputer interrupt response logic means to generate response signals to the received Common Bus address, in accordance with the Common bus protocol;

(15) an InterComputer interrupt interface means connected to the Common Bus and the Local Bus for receiving a time division multiplexed interrupt signal, and including circuitry that receives inputs from the Resource Monitor for demultiplexing the interrupt signal and generating an InterComputer interrupt signal on the Local bus to a designated computer unit in response thereto;

G. at least one Common Bus access unit connected to the Common Bus and each connected to a unique one of the remaining plurality of Local Buses and including;

(1) a Common bus buffer means for gating the transfer of information between the Common Bus and a unit Internal Common Bus in accordance with received control signals;

(2) a Local Bus buffer means for gating information between the Local Bus and the buffered Local Bus in accordance with received control signals;

(3) a Common bus requestor means for receiving a signal indicating a request for access to the Common bus and for transmitting the request on one of a plurality of request lines, said lines selected by a Common Bus access unit Resource Monitor, and for receiving a grant indication upon the selected line;

(4) a Common bus to Local Bus address decode means for receiving Common Bus signals including a Common Bus address, comparing the received Common Bus address with a Local Bus address space, determining when the Common Bus address is within the Local Bus address space and, accordingly, generating a signal indicating that the information present on the Common bus is to be transferred to the connected Local Bus, said decoding means including circuitry connected to receive the Local Bus address space from the Resource Monitor;

(5) a Local Bus to Common Bus address decode means for receiving Local Bus signals including a Local Bus a !dress, comparing the received Local Bus address with a Common Bus address space, determining when the Local Bus address is within the Common bus address space and accordingly generating a signal indicating the information present on the connected Local Buses is to be transferred to the Common Bus, said decoding means including circuitry connected to receive the Common Bus address space from the Resource Monitor;

(6) Common Bus/Local Bus interface means for latching information for transfer from the Common Bus to the Buffered Local bus and for gating information from the buffered Local Bus to Common Bus in accordance with received control signals;

(7) a Local Bus requestor and arbiter for receiving signals indicating a request for access to the connected Local bus and for receiving signals from the Common Bus access unit Resource Monitor designating which one of a plurality of arbitration lines to transmit the request and further including an arbitration circuit for receiving request signals from the arbitration lines and for generating a signal indicating a grant of Local Bus access on one of the arbitration lines, said Resource Monitor controlling the operation of the arbitration circuit by indicating which one of the plurality of arbitration schemes within the arbitration circuit determines which one of the received requests is granted Local Bus access;

(8) protocol signal control logic means for, (A) in response to information on the connected Local Bus;

(1) generating control signals to the Local Bus buffer means for receiving information onto the buffered Local Bus;

(2) receiving said indication from the Local Bus to Common bus address decode means and in accordance with such indication;

(3) transmitting a request for Common Bus access to the Common Bus requestor means;

(4) generating control signals to the Common Bus/Local Bus interface means for transferring information from the buffered Local Bus to the Internal Common Bus;

(5) generating a response on the buffered Local Bus and generating control signals to the Local Bus buffer for transfer of the response from the buffered Local Bus to the Local Bus;

(6) generating control signals to the Common bus buffer for gating the information on the Internal Common bus to the Common Bus in accordance with a grant signal from the Common bus requestor;

or, (B) in response to information on the Common Bus, (1) generating control signals to the Common Bus buffer means for receiving information onto the Common Bus;

(2) receiving said indication from the Common Bus to Local Bus address decode means and in accordance with such indication;

(3) transmitting a request for Local Bus access to the Local bus requestor means;

(4) generating to the Common Bus/Local Bus interface means for latching information from the Internal Common bus to the buffered Local Bus;

(5) generating a response on the Internal Common Bus and generating control signals to the Common Bus buffer for the transfer of the response from the Internal Common Bus to the Common Bus;

(6) generating control signals to the Local Bus buffer for gating the information on the buffered Local Bus to the Local bus in accordance with a grant signal from the Local Bus requestor;

(9) the Common Bus access unit Resource Monitor including means for controlling and monitoring the Common Bus control unit circuitry and connected to the Test Bus;

(10) Common Bus control unit clock means for providing at least one timing signal to the Common Bus control unit circuitry;

(11) common lock interface means connected to the buffered Local Bus for responding to addresses specified by the Resource Monitor, providing status information of individual system addressable devices, and further connected to a Lock bus for transmitting requests for access to the individual system addressable devices and for receiving grants to such requests;

(12) an InterComputer interrupt interface means connected to the Common bus and the Local Bus for receiving a time division multiplexed interrupt signal, and including circuitry that receives inputs from the Resource Monitor, said circuitry for demultiplexing the interrupt signal and generating an InterComputer interrupt signal on the Local Bus in response thereto;

(13) a Common Bus memory circuit including:

(a) Common Bus memory address decode means for receiving Common bus signals including a Common Bus address, comparing the received Common Bus address with a Common Bus memory address space provided by the Resource Monitor, determining when the received Common Bus address is within the Common Bus memory address space, and accordingly, generating a signal indicating that the information on the Common Bus is to be transferred to the Common Bus memory;

(b) Common Bus memory interface logic means for receiving the indicating signal, generating access signals to the Common Bus memory for providing access to the Common Bus memory in accordance with the Common Bus address, data and control signals;

(c) Common Bus memory response logic means for generating a response on the Internal Common Bus to the Common Bus information and generating control signals to the Common Bus buffer for the transfer of the response from the Internal Common Bus to the Common Bus; and H. a system monitor means including a first processor for transferring information via the Test Bus to the Resource Monitors of the computer units, Common Bus access units and Common Bus control unit and connected to at least one environmental sensor, a first address specification device, a real time clock, a power relay for controlling power to the data processing system, a mass memory for storing program information including the configuration information for each Common Bus control unit, Common Bus access unit, and computer unit, and a first processor memory means for storing a program of instructions for execution by the first processor for: (1) the transfer of the configuration information by the Test Bus to each Resource Monitor, (2) for monitoring the system operation from the Resource Monitors, (3) for receiving information from and providing information to an operator terminal, (4) for regulating power to the data processing system through the power relay in accordance with information received from the environmental sensor, said first processor connected to first and second data buffers, said data buffers further connected to a second processor, said first data buffer providing storage of data from said first processor to said second processor and said second data buffer providing storage of data from said second processor to said first processor, said second processor connected to a second address specification device, a network bus, and a second processor memory which includes instructions for execution by said second processor to provide: (1) transfer of information with said first processor via the first and second data buffers and (2) transfer of information via the network bus.

4. A data processing apparatus comprising:

a plurality of comptuer means, a plurality of memories, a plurality of local buses, a plurality of bus interface means, a common bus, a shared memory means, and an intercomputer interrupt means;

said plurality of computer means being connected to the plurality of memories, the plurality of interface means and the common bus by the plurality of local buses, and the shared memory and intercomputer interrupt means connected to the common bus for information transfers over the common bus between the plurality of computer means, plurality of bus interface means, shared memory and intercomputer interrupt means;

said plurality of computer means coacting with the plurality of memory means for forming a plurality of individual data processor units, each computer means having an address and a protocol means for sending the addresses of processor units as access requests on a corresponding local bus to a corresponding one of the plurality of interface means; and said shared memory means including a memory having a plurality of segments corresponding to the addresses of the plurality of connector means;

said plurality of interface means including a common bus arbitration protocol including means selectively linking together the plurality of interface means ina a desired arbitrating order, means for defining a common bus access cycle, means for sequentially cycling the common bus access cycle and monitoring the local buses for computer means addresses occurring during each cycle, means coacting with the shared memory means for detecting signals addressing address spaces of selected computer means on local buses or devices resident on the common bus, said signal representing common bus access requests for information transfers, means for determining those information transfer requests requiring more than one cycle for completion, and interlocking means for interlocking memory segments requiring more than one cycle for transfer for response only to an access by the requesting computer means during subsequent cycles for completing the transfer of information, thereby providing for the unobstructed flow of data transfer information sequentially over the common bus to corresponding ones of the linked plurality of interface means in arbitration of the access requests;

said intercomputer interrupt means including protocol means for providing interrupts to computer means connected to the local buses for interrupting access requests generated subsequently to an access request by a computer means when an information transfer is ready in response to a prior access request of the computing means;

wherein the plurality of computer means protocols further include: means responsive to an access request for sending a wait signal when a response will take longer than one bus cycle, means responsive to a wait signal for entering a state wherein the computer means is accessible only by a device sending the received wait signal, means for sending a retry signal to any other device requesting access during the wait state, means responsive to receipt of a retry signal for identifying the retry sending device and means for reintiating an access request to the retry sending device; and each protocol means of the intercomputer interrupt means including means for issuing an override signal to a local bus device sending an access signal while the common bus is attempting to access the local bus device for resolving bus contentions between the common bus and local bus device in favor or the one having the faster transfer rate.

5. A data processing apparatus comprising:

a plurality of computer means, a plurality of memories, a plurality of local buses, a plurality of bus interface means, a common bus, a shared memory means, and an intercomputer interrupt means;

said plurality of computer means being connected to the plurality of memories, the plurality of interface means and the common bus by the plurality of local buses, and the shared memory and intercomputer interrupt means connected to the common bus for information transfers over the common bus between the plurality of computer means, plurality of bus interface means, shared memory and intercomputer interrupt means;

said plurality of computer means coacting with the plurality of memory means for forming a plurality of individual data processor units, each computer means having an address and a protocol means for sending the addresses of processor units as access requests on a corresponding local bus to a corresponding one of the plurality of interface means; and said shared memory means including a memory having a plurality of segments corresponding to the addresses of the plurality of connector means and further includes a programmable decoder means for detecting when access to the common bus is required, said programmable decoder being programmable: for altering the address positions of the common bus, common bus devices, other local buses and other local bus devices; for allowing read only access to devices accessible via the common bus; and for preventing access to selected devices of the system;

said plurality of interface means including a common bus arbitration protocol including means selectively linking together the plurality of interface means in a desired arbitrating order, means for defining a common bus access cycle, means for sequentially cycling the common bus access cycle and monitoring the local buses for computer means addresses occurring during each cycle, means coacting with the shared memory means for detecting signals addressing address spaces of selected computer means on local buses or devices resident on the common bus, said signals representing common bus access requests for information transfers, means for determining those information transfer requests requiring more than one cycle for completion, and interlocking means for interlocking memory segments requiring more than one cycle for transfer for response only to an access by the requesting computer means during subsequent cycles for completing the transfer of information, thereby providing for the unobstructed flow of data transfer information sequentially over the common bus to corresponding ones of the linked plurality of interface means in arbitration of the access requests; and said intercomputer interrupt means including protocol means for providing interrupts to computer means connected to the local buses for interrupting access requests generated subsequently to an access request by a computer means when an information transfer is ready in response to a prior access request of the computing means.

6. A data processing apparatus comprising:

a plurality of computer means, a plurality of memories, a plurality of local buses, a plurality of bus interface means, a common bus, a shared memory means, and an intercomputer interrupt means;

said plurality of computer means being connected to the plurality of memories, the plurality of interface means and the common bus by the plurality of local buses, and the shared memory and intercomputer interrupt means connected to the common bus for information transfers over the common bus between the plurality of computer means, plurality of bus interface means, shared memory and intercomputer interrupt means;

said plurality of computer means coacting with the plurality of memory means for forming a plurality of individual data processor units, each computer means having an address and a protocol means for sending the addresses of processor units as access requests on a corresponding local bus to a corresponding one of the plurality of interface means; and said shared memory means including a memory having a plurality of segments corresponding to the addresses of the plurality of connector means;

said plurality of interface means including a common bus arbitration protocol including means selectively linking together the plurality of interface means in a desired arbitrating order, means for defining a common bus access cycle means for sequentially cycling the common bus access cycle and monitoring the local buses for computer means addresses occurring during each cycle, means coacting with the shared memory means for detecting signals addressing address spaces of selected computer means on local buses or devices resident on the common bus, said signals representing common bus access requests for information transfers, means for determining those information transfer requests requiring more than one cycle for completion, and interlocking means for interlocking memory segments requiring more than one cycle for transfer for response only to an access by the requesting computer means during subsequent cycles for completing the transfer of information, thereby providing for the unobstructed flow of data transfer information sequentially over the common bus to corresponding ones of the linked plurality of interface means in arbitration of the access requests and further includes a plurality of common lock devices connected to the plurality of local buses of the plurality of local buses, said lock devices for providing status information of devices connected to the system and being addressable on each local bus for permitting devices resident on that local bus to request access to devices on the common bus or other local buses without having to access the common bus or other local buses to determine if these devices are available; and said intercomputer interrupt means including protocol means for providing interrupts to computer means connected to the local buses for interrupting access requests generated subsequently to an access request by a computer means when an information transfer is ready in response to a prior access request of the computing means.

7. A data processing apparatus comprising:

a plurality of computer means, a plurality of memories, a plurality of local buses, a plurality of bus interface means, a common bus, a shared memory means, and an intercomputer interrupt means;

said plurality of computer means being connected to the plurality of memories, the plurality of interface means and the common bus by the plurality of local buses, and the shared memory and intercomputer interrupt means connected to the common bus for information transfers over the common bus between the plurality of computer means, plurality of bus interface means, shared memory and intercomputer interrupt means;

said plurality of computer means coacting with the plurality of memory means for forming a plurality of individual data processor units, each computer means having an address and a protocol means for sending the addresses of processor units as access requests on a corresponding local bus to a corresponding one of the plurality of interface means; and said shared memory means including a memory having a plurality of segments corresponding to the addresses o the plurality of connector means;

said plurality of interface means including a common bus arbitration protocol including means selectively linking together the plurality of interface means in a desired arbitrating order, means for defining a common bus access cycle, means for sequentially cycling the common bus access cycle and monitoring the local buses for computer means addresses occurring during each cycle, means coacting with the shared memory means for detecting signals addressing address spaces of selected computer means on local buses or devices resident on the common bus, said signals representing common bus access requests for information transfers, means for determining those information transfer requests requiring more than one cycle for completion, and interlocking means for interlocking memory segments requiring more than one cycle for transfer for response only to an access by the requesting computer means during subsequent cycles for completing the transfer of information, thereby providing for the unobstructed flow of data transfer information sequentially over the common bus to corresponding one of the linked plurality of interface means in arbitration of the access requests; and said intercomputer interrupt means including protocol means for providing interrupts to computer means connected to the local buses for interrupting access requests generated subsequently to an access request by a computer means when an information transfer is ready in response to a prior access request of the computing means and wherein the intercomputer interrupt means is connected to the common bus or local bus and includes a register designated for each of the plurality of computer means, said intercomputer interrupt device for addressing by any device and providing an interrupt signal at the time information is written into the register and is cleared when the interrupted device reads its register.

8. A data processing apparatus comprising;

a plurality of computer means, a plurality of memories, a plurality of local buses, a plurality of bus interface means, a common bus, a shared memory means, and an intercomputer interrupt means;

said plurality of computer means being connected to the plurality of memories, the plurality of interface means and the common bus by the plurality of local buses, and the shared memory and intercomputer interrupt means connected to the common bus for information transfers over the common bus between the plurality of computer means, plurality of bus interface means, shared memory and intercomputer interrupt means;

said plurality of computer means coacting with the plurality of memory means for forming a plurality of individual data processor units, each computer means having an address and a protocol means for sending the addresses of processor units as access requests on a corresponding local bus to a corresponding one of the plurality of interface means; and said shared memory means including a memory having a plurality of segments corresponding to the addresses of the plurality of connector means;

said plurality of interface means including a common bus arbitration protocol including means selectively linking together the plurality of interface means in a desired arbitrating order, means for defining a common bus access cycle, means for sequentially cycling the common bus access cycle and monitoring the local buses for computer means addresses occurring during each cycle, means coacting with the shared memory means for detecting signals addressing address spaces of selected computer means on local buses or decides resident on the common bus, said signals representing common bus access requests for information transfers, means for determining those information transfer requests requiring more than one cycle for completion, and interlocking means for interlocking memory segments requiring more than one cycle for transfer for response only to an access by the requesting computer means during subsequent cycles for completing the transfer of information, thereby providing for the unobstructed flow of data transfer information sequentially over the common bus to corresponding ones of the linked plurality of interface means in arbitration of the access requests;

said intercomputer interrupt means including protocol means for providing interrupts to computer means connected to the local buses for interrupting access requests generated subsequently to an access request by a computer means when an information transfer is ready in response to a prior access request of the computing means; and further including a plurality of resource monitors for the plurality of computer means, a system monitor connected to the plurality of resource monitors, and a mass storage device connected to the system monitor, each of said plurality of resource monitors including means for monitoring and controlling the operation of a corresponding computer means, and the system monitor including means for evaluating the system operation and detecting an error on the buses, and means for stopping operation of a failed computer means and replacing a failed computer means by another computer means by loading the information of the failed computer means into the other computer means.

9. A data processing apparatus comprising:

a plurality of computer means, a plurality of memories, a plurality of local buses, a plurality of bus interface means, a common bus, a shared memory means, and an intercomputer interrupt means;

said plurality of computer means being connected to the plurality of memories, the plurality of interface means and the common bus by the plurality of local buses, and the shared memory and intercomputer interrupt means connected to the common bus for information transfers over the common bus between the plurality of computer means, plurality of bus interface means, shared memory and intercomputer interrupt means;

said plurality of computer means coacting with the plurality of memory means for forming a plurality of individual data processor units including a plurality of peripheral device means, and a peripheral bus interconnecting the pluralities of computer means and peripheral device means for adding peripheral equipment to the system and providing an alternative interconnection between the computer cards selectable by an override signal of the common bus interface means protocol means for resolving contentions between the local bus devices and the peripheral bus devices, each computer means having an address and a protocol means for sending the addresses of processor units as access requests on a corresponding local bus to a corresponding one of the plurality of interface means; and said shared memory means including a memory having a plurality of segments corresponding to the addresses of the plurality of connector means;

said plurality of interface means including a common bus arbitration protocol including means selectively linking together the plurality of interface means in a desired arbitrating order, means for defining a common bus access cycle, means for sequentially cycling the common bus access cycle and monitoring the local buses for computer means addresses occurring during each cycle, means coacting with the shared memory means for detecting signals addressing address spaces of selected computer means on local buses or decides resident on the common bus, said signals representing common bus access requests for information transfers, means for determining those information transfer requests requiring more than one cycle for completion, and interlocking means for interlocking memory segments requiring more than one cycle for transfer for response only to an access by the requesting computer means during subsequent cycles for completing the transfer of information, thereby providing for the unobstructed flow of data transfer information sequentially over the common bus to corresponding ones of the linked plurality of interface means in arbitration of the access requests; and said intercomputer interrupt means including protocol means for providing interrupts to computer means connected to the local buses for interrupting access requests generated subsequently to an access request by a computer means when an information transfer is ready in response to a prior access request of the computing means.

* * * * *